US009972427B2

(12) United States Patent
Kondo et al.

(10) Patent No.: US 9,972,427 B2
(45) **Date of Patent: *May 15, 2018**

(54) CHIP COMPONENT AND METHOD OF PRODUCING THE SAME

(71) Applicant: ROHM CO., LTD., Kyoto (JP)

(72) Inventors: Yasuhiro Kondo, Kyoto (JP); Hiroshi Tamagawa, Kyoto (JP); Hiroki Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/271,882

(22) Filed: Sep. 21, 2016

(65) Prior Publication Data

US 2017/0076842 A1 Mar. 16, 2017

Related U.S. Application Data

(63) Continuation of application No. 14/376,417, filed as application No. PCT/JP2013/050082 on Jan. 8, 2013, now Pat. No. 9,484,135.

(30) Foreign Application Priority Data

| | | |
|---|---|---|
| Feb. 3, 2012 | (JP) | 2012-022296 |
| Feb. 28, 2012 | (JP) | 2012-042300 |
| Mar. 23, 2012 | (JP) | 2012-067970 |
| Mar. 30, 2012 | (JP) | 2012-081627 |
| Dec. 19, 2012 | (JP) | 2012-277079 |

(51) Int. Cl.

| | |
|---|---|
| ***H01C 10/00*** | (2006.01) |
| ***H01C 13/02*** | (2006.01) |

(Continued)

(52) U.S. Cl.

CPC ............... *H01C 13/02* (2013.01); *H01C 1/14* (2013.01); *H01C 10/50* (2013.01); *H01C 17/006* (2013.01);

(Continued)

(58) Field of Classification Search

CPC ........ H01C 13/02; H01C 1/14; H01C 17/006; H01C 17/06

(Continued)

(56) References Cited

U.S. PATENT DOCUMENTS

| | | |
|---|---|---|
| 3,778,886 A | 12/1973 | Shields et al. |
| 4,228,418 A | 10/1980 | Piedmont et al. |

(Continued)

FOREIGN PATENT DOCUMENTS

| | | |
|---|---|---|
| CN | 1245340 A | 2/2000 |
| JP | S57-170568 A | 10/1982 |

(Continued)

*Primary Examiner* — Kyung Lee

(74) *Attorney, Agent, or Firm* — Rabin & Berdo, P.C.

(57) ABSTRACT

A chip resistor includes a substrate, and a plurality of resistor elements each having a resistive film provided on the substrate and an interconnection film provided on the resistive film in contact with the resistive film. An electrode is provided on the substrate. Fuses disconnectably connect the resistor elements to the electrode. The resistive film is made of at least one material selected from the group of NiCr, NiCrAl, NiCrSi, NiCrSiAl, TaN, $TaSiO_2$, TiN, TiNO and TiSiON.

10 Claims, 86 Drawing Sheets

(51) Int. Cl.

| | |
|---|---|
| ***H01C 1/14*** | (2006.01) |
| ***H01C 17/06*** | (2006.01) |
| ***H01G 4/40*** | (2006.01) |
| ***H01G 2/16*** | (2006.01) |
| ***H01C 10/50*** | (2006.01) |
| ***H01C 17/00*** | (2006.01) |
| ***H01F 27/40*** | (2006.01) |
| ***H01G 5/38*** | (2006.01) |
| ***H01L 27/02*** | (2006.01) |
| ***H01L 27/08*** | (2006.01) |
| ***H01F 29/00*** | (2006.01) |
| ***H01G 5/019*** | (2006.01) |
| ***H01L 23/525*** | (2006.01) |
| ***H01L 49/02*** | (2006.01) |

(52) U.S. Cl.
CPC .......... *H01C 17/06* (2013.01); *H01F 27/402* (2013.01); *H01F 29/00* (2013.01); *H01G 2/16* (2013.01); *H01G 4/40* (2013.01); *H01G 5/019* (2013.01); *H01G 5/38* (2013.01); *H01L 23/5256* (2013.01); *H01L 27/0207* (2013.01); *H01L 27/0814* (2013.01); *H01L 28/20* (2013.01); *H01L 2224/16225* (2013.01); *Y10T 29/49099* (2015.01)

(58) Field of Classification Search
USPC ................................................ 338/195, 22 R
See application file for complete search history.

(56) References Cited

U.S. PATENT DOCUMENTS

| | | | |
|---|---|---|---|
| 4,298,856 | A | 11/1981 | Schuchardt |
| 4,500,902 | A | 2/1985 | Herberg |
| 4,862,136 | A | 8/1989 | Birkner |
| 5,612,664 | A | 3/1997 | Hilgenberg et al. |
| 6,060,760 | A | 5/2000 | Tan |
| 6,153,256 | A | 11/2000 | Kambara et al. |
| 6,507,272 | B1 | 1/2003 | Nicholson et al. |
| 6,529,116 | B2 | 3/2003 | Van Den Broek et al. |
| 7,592,855 | B2 | 9/2009 | Kamatani |
| 7,737,817 | B2 | 6/2010 | Tuinhout et al. |
| 7,764,109 | B2 | 7/2010 | Goto |
| 7,825,768 | B2 | 11/2010 | Onishi |
| 7,889,048 | B2 | 2/2011 | Owen et al. |
| 9,136,216 | B2 * | 9/2015 | Nishimura .......... H01L 23/5228 |
| 2005/0212650 | A1 | 9/2005 | Shovlin et al. |
| 2006/0097340 | A1 | 5/2006 | Tsukda et al. |
| 2008/0252333 | A1 | 10/2008 | Nakajima |
| 2009/0295462 | A1 | 12/2009 | Itoh |
| 2010/0072574 | A1 | 3/2010 | Ohshima |
| 2011/0018677 | A1 | 1/2011 | Yoneda |

FOREIGN PATENT DOCUMENTS

| | | | |
|---|---|---|---|
| JP | S63-65601 | A | 3/1988 |
| JP | H2-298049 | A | 12/1990 |
| JP | H07-249501 | A | 9/1995 |
| JP | 2001-076912 | A | 3/2001 |
| JP | 2003-535466 | A | 11/2003 |
| JP | 2004-186541 | A | 7/2004 |
| JP | 2007-232598 | A | 9/2007 |
| JP | 2007-233922 | A | 9/2007 |
| JP | 2008-047556 | A | 2/2008 |
| JP | 2008-118622 | A | 5/2008 |
| JP | 2009-224723 | A | 10/2009 |
| JP | 2009231359 | A | 10/2009 |
| JP | 2010-103508 | A | 5/2010 |
| JP | 2010-161401 | A | 7/2010 |
| JP | 2011-086750 | A | 4/2011 |

* cited by examiner

12
B
R
R
R
R
F
F
C
13
B 12
21
20
19
11
22
23
21
Al
POLYIMIDE
SiO2
Si
SiN
(F)
21
13
Al
TiN
or
TiON
or
TiSiON

CHIP COMPONENT AND METHOD OF PRODUCING THE SAME

This is a Continuation of U.S. application Ser. No. 14/376,417, filed on Aug. 1, 2014, and allowed on Jul. 8, 2016, which was a National Stage application of PCT/JP2013/050082, filed on Jan. 8, 2013. Furthermore, this application claims the foreign priority benefit of Japanese Application No. 2012-022296, filed on Feb. 3, 2012, Japanese Application No. 2012-042300, filed on Feb. 28, 2012, Japanese Application No. 2012-067970, filed on Mar. 23, 2012, Japanese Application No. 2012-081627, filed on Mar. 30, 2012, and Japanese Application No. 2012-277079, filed on Dec. 19, 2012, the subject matters of which are incorporated herein by reference.

TECHNICAL FIELD

The present invention relates to a discrete chip component such as a chip resistor, a chip capacitor, a chip inductor or a chip diode, and a method of producing the same.

BACKGROUND ART

A chip resistor as an exemplary prior-art chip component, for example, includes an insulative substrate such as of ceramic, a resistive film formed by screen-printing a material paste on a surface of the insulative substrate, and an electrode connected to the resistive film. In order to adjust the resistance of the chip resistor at a target resistance value, a trimming trench is carved in the resistive film by applying a laser beam to the resistive film through laser trimming (see PTL1).

Another exemplary prior-art chip resistor is disclosed in PTL2. The disclosed chip resistor is configured such that a pair of electrodes are provided in spaced relation on a lower surface of a chip-shaped resistor made of a metal. The resistance of the chip resistor cannot be adjusted at a desired resistance value.

CITATION LIST

Patent Literature

PTL1: JP2001-76912A1
PTL2: JP2004-186541A1

SUMMARY OF INVENTION

Technical Problem

Since the resistance of the prior-art chip resistor is adjusted at the target resistance value through the laser trimming, the chip resistor cannot be adapted for a wide range of resistance. With a trend toward progressive size reduction of the chip resistor, therefore, the limitation of the area of the resistive film makes it difficult to impart the chip resistor with a higher resistance even if an attempt is made to develop a higher-resistance chip resistor. Without improvement in shape and dimensional accuracy, the chip resistor is susceptible to transportation error and other trouble when being mounted on a mount substrate. Therefore, the improvement in shape and dimensional accuracy and improvement in micro-processing accuracy are important issues for the production of the chip resistor.

These are also important issues to be solved for a chip capacitor, a chip inductor, a chip diode and other types of chip components. In view of the foregoing, it is a principal object of the present invention to provide a highly-reliable and small-size chip component having an accurate characteristic value. It is another object of the present invention to provide a method of producing a highly-reliable and small-size chip component having an accurate characteristic value.

Solution to Problem

According to an inventive aspect of the invention, there is provided a chip component which includes a substrate, a plurality of functional elements each having an aluminum-containing interconnection film portion provided on the substrate, an electrode provided on the substrate, and a plurality of fuses each having an aluminum-containing interconnection film portion integral with the aluminum-containing interconnection film portion of the functional element and disconnectably connecting the functional element to the electrode. According to an inventive aspect of the invention, the functional elements each include a resistor element having a resistive film portion provided on the substrate, and an aluminum-containing interconnection film portion provided in contact with the resistive film portion, and the chip component is a chip resistor.

According to an inventive aspect of the invention, the functional elements each include a capacitor element having a capacitive film portion provided on the substrate, and an aluminum-containing interconnection film portion connected to the capacitive film portion, and the chip component is a chip capacitor. According to an inventive aspect of the invention, the functional elements each include a coil element having a coil formation film portion provided on the substrate, and an aluminum-containing interconnection film portion connected to the coil formation film portion, and the chip component is a chip inductor.

According to an inventive aspect of the invention, the functional elements each include a unidirectionally conductive element having a junction structure provided on the substrate, and an aluminum-containing interconnection film portion connected to the junction structure, and the chip component is a chip diode. According to an inventive aspect of the invention, the chip component further includes an electrode pad having an aluminum-containing interconnection film portion integral with the aluminum-containing interconnection film portions of the fuses, and the electrode contacts the electrode pad.

According to an inventive aspect of the invention, at least one of the fuses is disconnected, and the chip component further includes an insulative protective film provided on the substrate as covering a disconnected portion of the disconnected fuse. According to an inventive aspect of the invention, there is provided a chip component production method, which includes the steps of: forming a functional element on a substrate; forming an aluminum-containing interconnection film in contact with the functional element; patterning the functional element and the aluminum-containing interconnection film to form a plurality of functional elements each including a functional element portion and an aluminum-containing interconnection film portion and a plurality of fuses each including an aluminum-containing interconnection film portion and respectively disconnectably connected to the functional elements; and forming an electrode on the substrate so as to electrically connect the electrode to the fuses.

According to an inventive aspect of the invention, an electrode pad is formed from the aluminum-containing interconnection film in contact with the electrode in the step of patterning the functional element and the aluminum-containing interconnection film in the chip component production method. According to an inventive aspect of the invention, the step of forming the functional element includes the step of forming a resistive film in the chip component production method.

According to an inventive aspect of the invention, the chip component production method further includes the steps of measuring an overall resistance value of the chip component, selecting a to-be-disconnected fuse based on the measured overall resistance value, and disconnecting the selected fuse. According to an inventive aspect of the invention, the chip component production method further includes the step of performing a heat treatment for stabilizing characteristic properties of the functional elements before the measurement of the overall resistance value of the chip component.

According to an inventive aspect of the invention, the chip component production method further includes the step of forming an insulative protective film on the substrate to cover a disconnected portion of the disconnected fuse. According to an inventive aspect of the invention, there is provided a chip resistor production method, which includes the steps of: forming a resistive film on a substrate having a plurality of chip resistor regions; forming an aluminum-containing interconnection film in contact with the resistive film; patterning the resistive film and the aluminum-containing interconnection film to form a plurality of resistor elements each including a resistive film portion and an aluminum-containing interconnection film portion and a plurality of fuses each having an aluminum-containing interconnection film portion and disconnectably connected to the resistor elements in each of the chip resistor regions; simultaneously measuring overall resistance values in the respective chip resistor regions by a multi-probing method; selecting a to-be-disconnected fuse in each of the chip resistor regions based on the results of the measurement of the overall resistance values; disconnecting the selected fuse; forming an electrode in each of the chip resistor regions so as to electrically connect the electrode to the fuses; and cutting the substrate along a boundary region defined between the chip resistor regions to divide the substrate into a plurality of chip resistors.

According to an inventive aspect of the invention, the chip resistor production method further includes the step of simultaneously measuring overall resistance values in the respective chip resistor regions by a multi-probing method after the fuse disconnecting step in the chip resistor production method. According to an inventive aspect of the invention , an electrode pad is formed from the aluminum-containing interconnection film in the step of patterning the resistive film and the aluminum-containing interconnection film, and the electrode is formed in contact with the electrode pad in the chip resistor production method.

According to an inventive aspect of the invention, the chip resistor production method further includes the step of performing a heat treatment for stabilizing characteristic properties of the resistor elements before the measurement of the overall resistance values in the respective chip resistor regions. According to an inventive aspect of the invention, the chip resistor production method further includes the step of forming an insulative film on the substrate to cover a disconnected portion of the disconnected fuse.

Advantageous Effects of Invention

According to an inventive aspect of the invention, the chip component includes the plurality of fuses for connecting the respective functional elements to the electrode, and the characteristic property of the chip component is adjusted at the desired level by disconnecting desired ones of the fuses. Therefore, the chip component can be customized based on the same design concept so as to have any of various levels of the characteristic property. The fuses are formed from the aluminum-containing interconnection film. Therefore, the fuses can be formed in a minute layout pattern, and the processing accuracy can be improved in the disconnecting step. Further, the inventive chip component can be discretely produced by utilizing a semiconductor device production apparatus and facility.

According to another inventive aspect of the invention, the chip resistor, the chip capacitor, the chip inductor or the chip diode can be provided which has the advantageous effects described above. According to another inventive aspect of the invention, the electrode can be easily provided. Thus, the chip component can be provided which includes the electrode accurately provided on the minute substrate. The chip component can be discretely produced by utilizing the semiconductor device production apparatus and facility.

According to another inventive aspect of the invention, the disconnected fuse is covered with the insulative protective film, so that the chip component is improved in water resistance. According to another inventive aspect of the invention, the functional elements and the fuses can be accurately formed in a fine layout pattern. Thus, the chip component can be produced as having a stable characteristic value. Further, the chip component can be produced, which can be customized based on the same design concept so as to have any of various levels of the characteristic property.

According to another inventive aspect of the invention, the smaller-size chip component can be produced in which the electrode is accurately located at a position defined by the patterning of the electrode pad for easy mounting. According to another inventive aspect of the invention, the functional elements and the fuses can be accurately formed in a fine layout pattern. Thus, the chip resistor can be produced as having a stable characteristic value. Further, the chip resistor can be produced, which can be customized based on the same design concept so as to have any of various levels of the characteristic property.

According to another inventive aspect of the invention, the fuse can be reliably disconnected, so that the chip component can be produced as having an accurate resistance value. According to another inventive aspect of the invention, the characteristic property of the resistor elements can be stabilized, so that the chip component having a stable resistance value can be provided. According to another inventive aspect of the invention, the chip component production method is provided which improves the water resistance and the reliability of the chip component.

According to another inventive aspect of the invention, a highly efficient production method is provided which can produce a multiplicity of discrete chip resistors by utilizing a semiconductor device production apparatus and facility. Further, the chip resistors thus produced each have an accurate resistance value. According to another inventive aspect of the invention, the resistance values are measured again after the fuse disconnecting step. Therefore, the disconnection of the fuses can be reliably achieved, so that the chip resistors thus produced are improved in the reliability of the resistance value.

According to another inventive aspect of the invention, the chip resistor production method is provided which ensures proper formation of the external connection electrode. According to another inventive aspect of the invention, the resistance characteristics of the chip resistors can be stabilized. Thus, the chip resistors can be produced which each have a smaller size and an accurate resistance value. According to another inventive aspect of the invention, the production method can eliminate a problem associated with debris which may otherwise occur when the fuses are disconnected. Further, the chip resistors can be produced which are improved in water resistance.

DESCRIPTION OF EMBODIMENTS

Figure 1A:
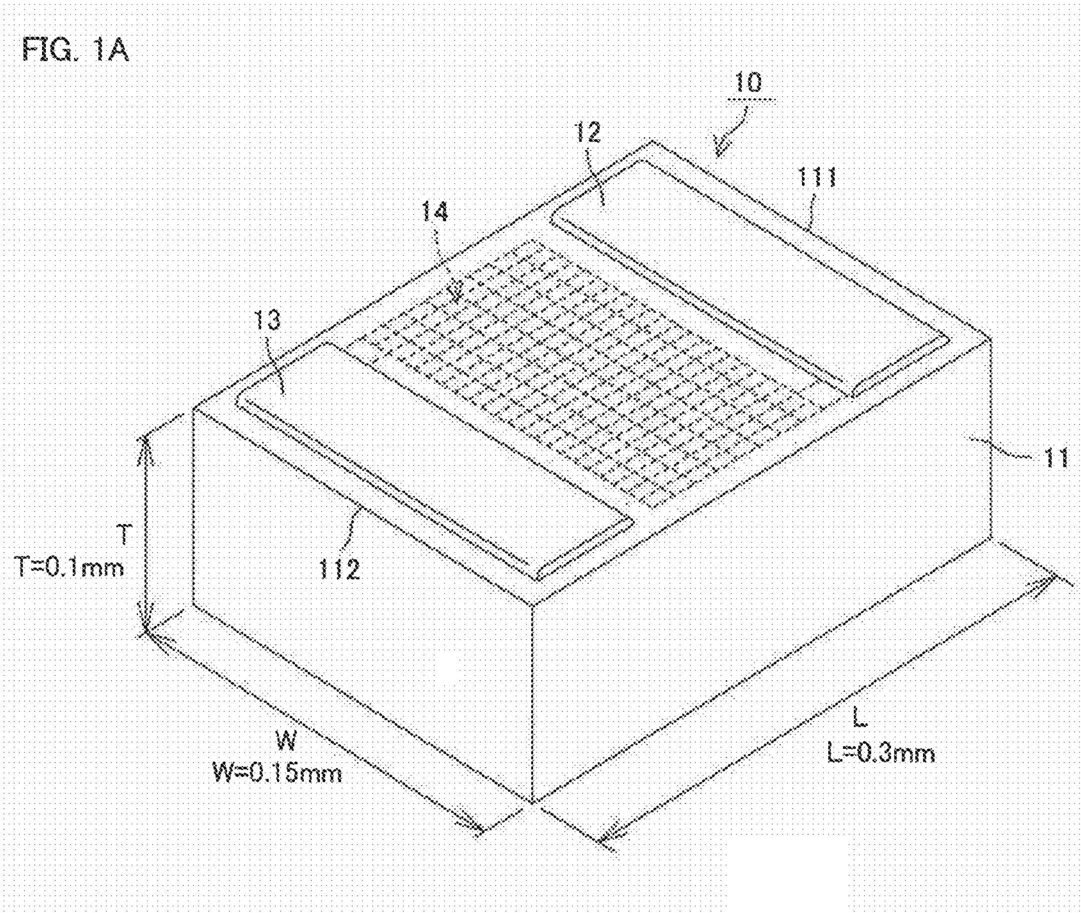
FIG. 1A is a schematic perspective view showing the appearance of a chip resistor 10 according to one embodiment of the present invention.
Figure 1B:
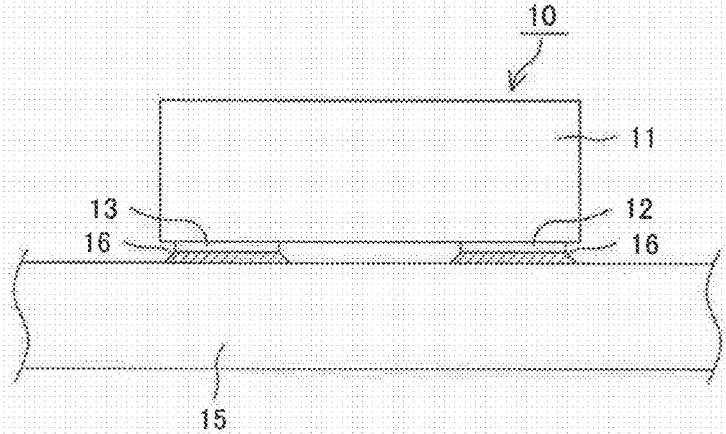
FIG. 1B is a side view of the chip resistor 10, which is mounted on a substrate.

Embodiments of the present invention will hereinafter be described in detail with reference to the attached drawings. In the following embodiment, a chip resistor will be specifically described as an exemplary chip component. FIG. 1A is a schematic perspective view showing the appearance of the chip resistor 10 according to the embodiment of the present invention, and FIG. 1B is a side view of the chip resistor 10, which is mounted on a substrate.

Referring to FIG. 1A, the chip resistor 10 according to the embodiment of the present invention includes a first connection electrode 12, a second connection electrode 13, and a resistor circuit network 14 which are provided on a substrate 11. The substrate 11 is a minute rectangular prismatic chip having a generally rectangular plan shape and, for example, has a length L of about 0.3 mm as measured longitudinally thereof, a width W of about 0.15 mm as measured widthwise thereof and a thickness T of about 0.1 mm. The substrate 11 may have rounded corners as seen in plan. The substrate may be made of, for example, silicon, glass, ceramic or the like. In the embodiment described below, the substrate 11 is a silicon substrate by way of example.

Figure 18:
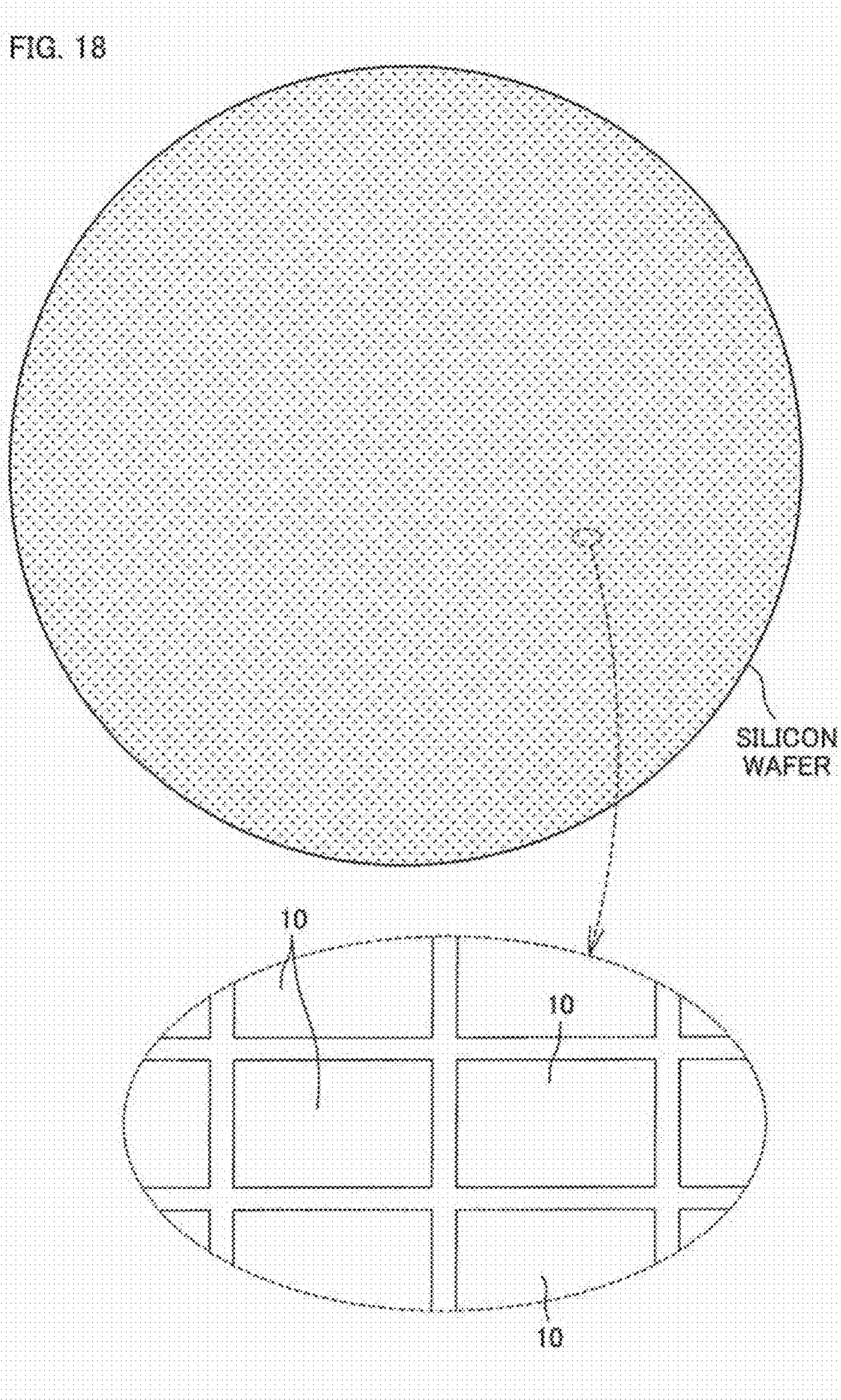
FIG. 18 is schematic diagram for explaining how to separate the chip resistors from the semiconductor wafer (silicon wafer).

The chip resistor 10 is obtained by forming a multiplicity of chip resistors 10 in a lattice form on a semiconductor wafer (silicon wafer), and cutting the semiconductor wafer (silicon wafer) into the individual chip resistors 10 as shown in FIG. 18. The first connection electrode 12 is a rectangular electrode provided on the silicon substrate 11 alongside one shorter edge 111 of the silicon substrate 11 and elongated in the direction of the shorter edge 111. The second connection electrode 13 is a rectangular electrode provided on the silicon substrate 11 alongside the other shorter edge 112 of the silicon substrate 11 and elongated in the direction of the shorter edge 112. The resistor circuit network 14 is provided on a middle region (a circuit formation surface or a device formation surface) of the silicon substrate 11 between the first connection electrode 12 and the second connection electrode 13. One end of the resistor circuit network 14 is electrically connected to the first connection electrode 12, and the other end of the resistor circuit network 14 is electrically connected to the second connection electrode 13. The first connection electrode 12, the second connection electrode 13 and the resistor circuit network 14 can be provided on the silicon substrate 11 by a semiconductor device production process. In other words, the chip resistor 10 can be discretely produced by utilizing an apparatus and facility for producing a semiconductor device. Particularly, the resistor circuit network 14 can be formed as having a minute and precise layout pattern by utilizing a photolithography process to be described later.

The first connection electrode 12 and the second connection electrode 13 each function as an external connection electrode. With the chip resistor 10 mounted on a circuit substrate 15, as shown in FIG. 1B, the first connection electrode 12 and the second connection electrode 13 are electrically and mechanically connected to a circuit (not shown) of the circuit substrate 15 by solder. The first connection electrode 12 and the second connection electrode 13 each functioning as the external connection electrode are desirably made of gold (Au) or surface-plated with gold for improvement of solder wettability and for improvement of reliability.

Figure 2:
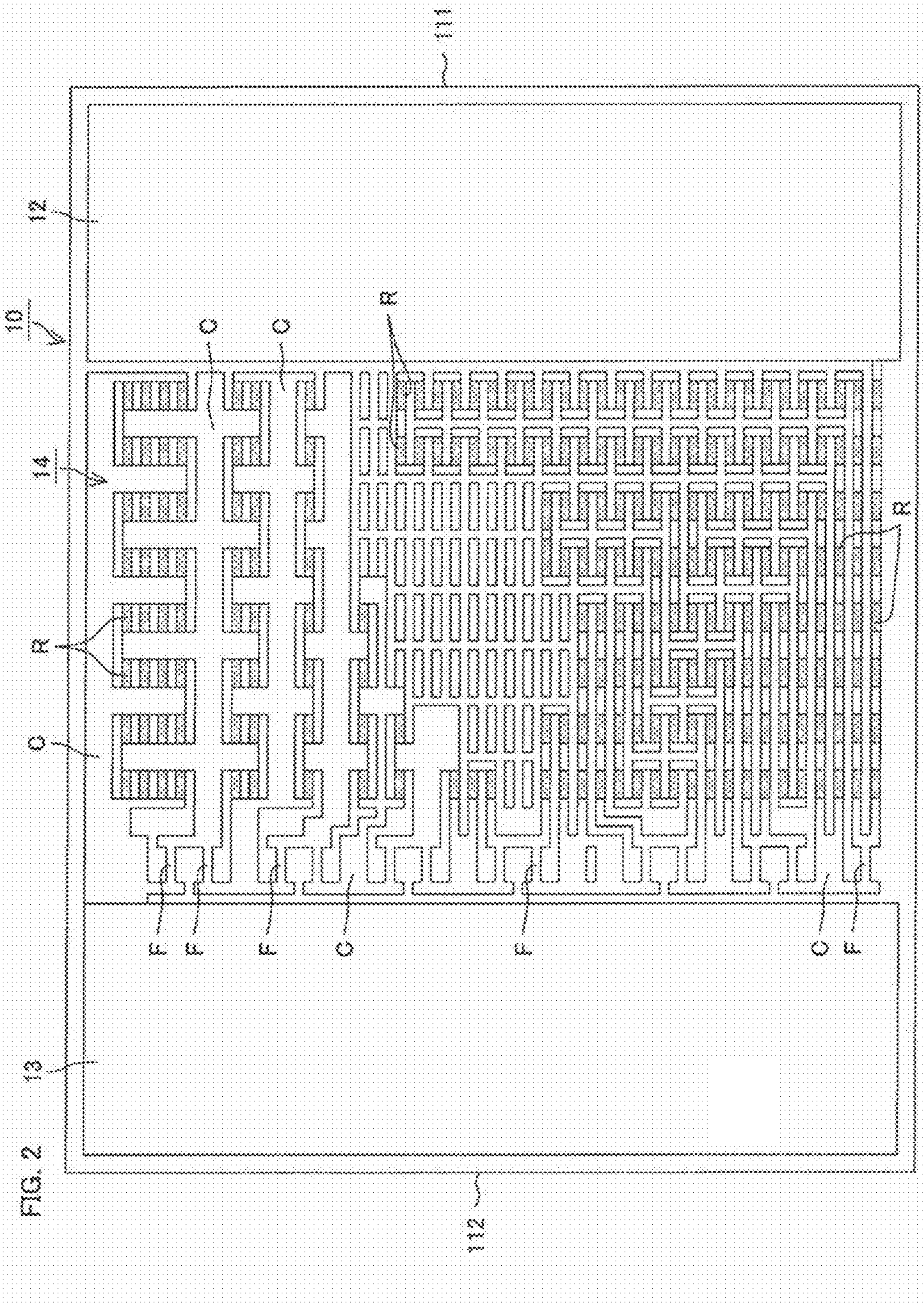
FIG. 2 is a plan view of the chip resistor 10, showing the layout of a first connection electrode 12, a second connection electrode 13 and a resistor circuit network 14, and the configuration of the resistor circuit network 14 as viewed in plan.

FIG. 2 is a plan view of the chip resistor 10, showing the layout of the first connection electrode 12, the second connection electrode 13 and the resistor circuit network 14, and the configuration (layout pattern) of the resistor circuit network 14 as viewed in plan. In the chip resistor 10, referring to FIG. 2, the first connection electrode 12 has a longer edge extending along the one shorter edge 111 of the upper surface of the silicon substrate, and has a generally rectangular shape as seen in plan. The second connection electrode 13 has a longer edge extending along the other shorter edge 112 of the upper surface of the silicon substrate, and has a generally rectangular shape as seen in plan. The resistor circuit network 14 is provided in the rectangular region between the first connection electrode 12 and the second connection electrode 13 as seen in plan.

The resistor circuit network 14 includes a multiplicity of unit resistor bodies R arranged in a matrix array on the silicon substrate 11 and each having the same resistance value (in FIG. 2, the resistor circuit network 14 is configured to include 352 unit resistor bodies R in total with 8 unit resistor bodies R aligned in each row (longitudinally of the silicon substrate) and with 44 unit resistor bodies R aligned in each column (widthwise of the silicon substrate)). The multiplicity of unit resistor bodies R are grouped into predetermined numbers, and a predetermined number of unit resistor bodies R (1 to 64 unit resistor bodies R) in each group are electrically connected to one another (by portions of an interconnection film made of an aluminum-containing metal such as Al, AlSi, AlSiCu or AlCu), whereby plural types of resistor circuits are formed according to the numbers of the connected unit resistor bodies R. The plural types of resistor circuits thus formed are connected to one another in a predetermined form via conductor films C (portions of the interconnection film made of the aluminum-containing metal such as Al, AlSi, AlSiCu or AlCu).

Further, a plurality of fusible fuse films F (portions of the interconnection film made of the aluminum-containing metal such as Al, AlSi, AlSiCu or AlCu, and hereinafter sometimes referred to simply as "fuses") are provided for electrically incorporating the resistor circuits into the resistor circuit network 14 or electrically isolating the resistor circuits from the resistor circuit network 14. The fuse films F are arranged in a linear region alongside an inner edge of the second connection electrode 13. More specifically, the fuse films F and the connection conductor films C are arranged in adjacent relation, and the arrangement direction extends linearly.

Figure 3A:
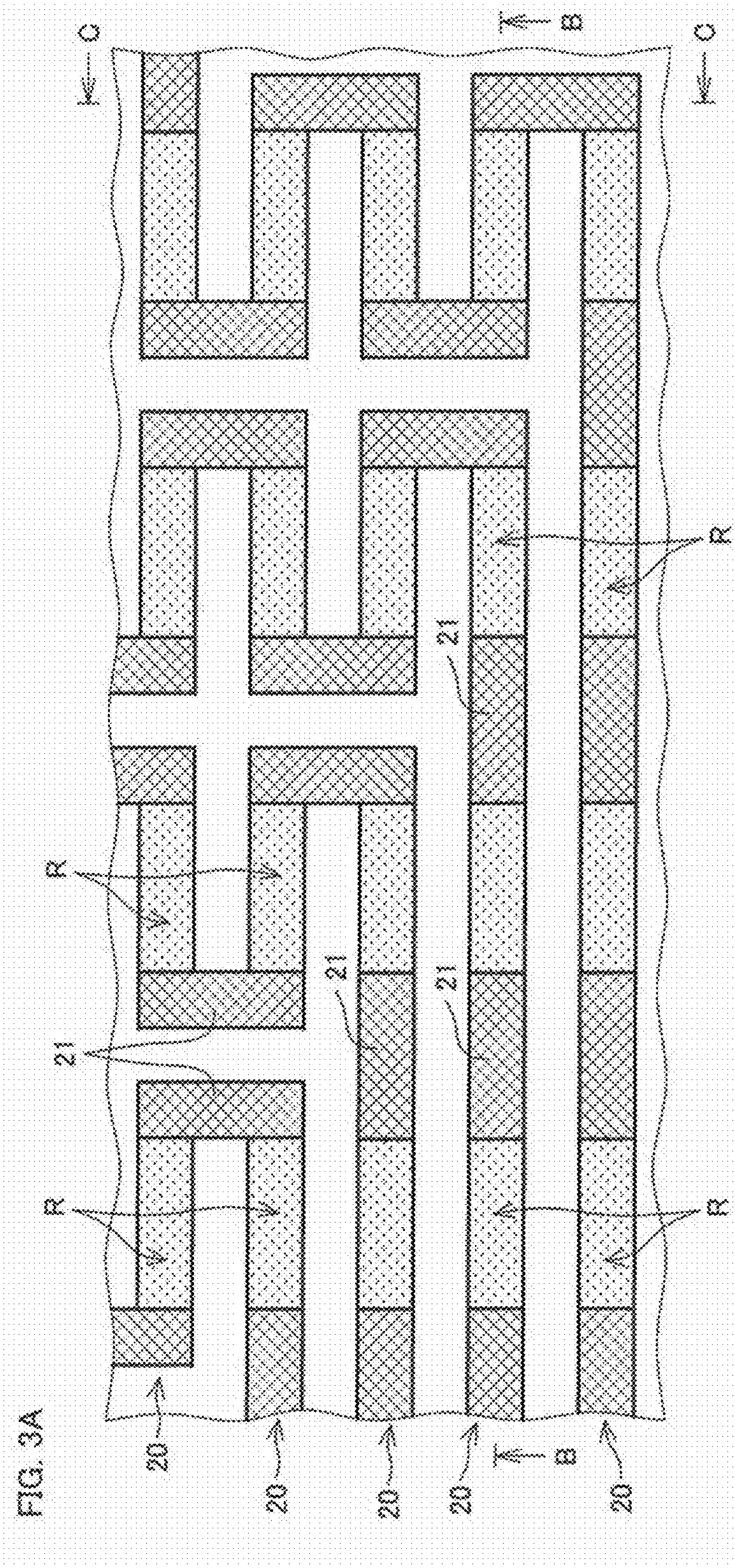
FIG. 3A is a plan view illustrating a part of the resistor circuit network 14 shown in FIG. 2 on an enlarged scale.
Figure 3B:
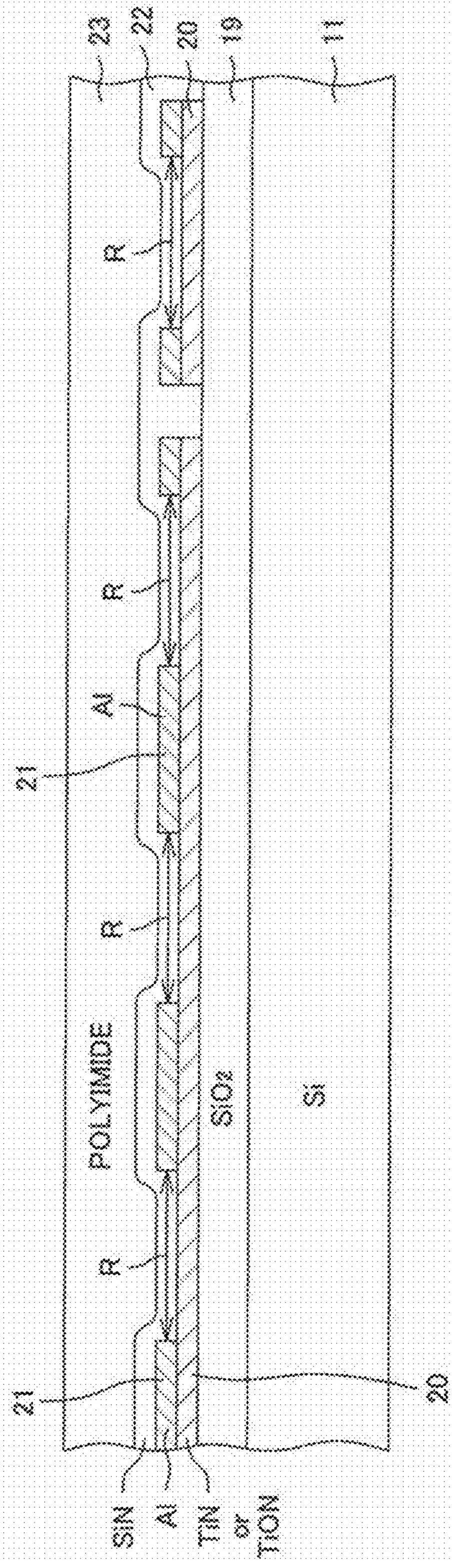
FIG. 3B is a longitudinal vertical sectional view for explaining the structure of resistor bodies R of the resistor circuit network 14.
Figure 3C:
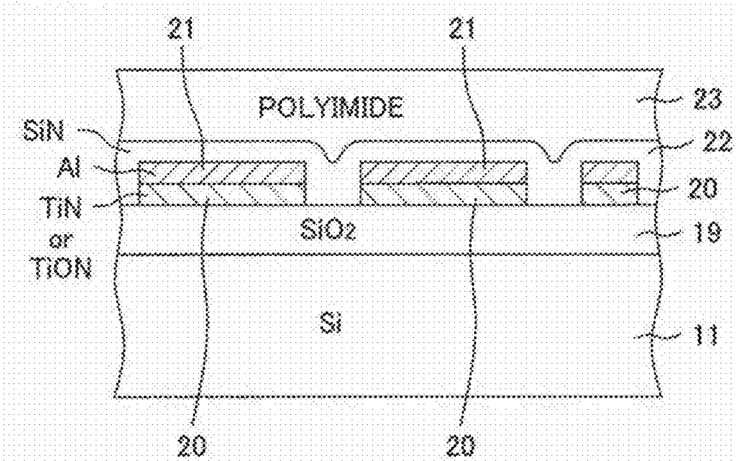
FIG. 3C is a widthwise vertical sectional view for explaining the structure of the resistor bodies R of the resistor circuit network 14.

FIG. 3A is a plan view illustrating a part of the resistor circuit network 14 shown in FIG. 2 on an enlarged scale. FIGS. 3B and 3C are a longitudinal vertical sectional view and a widthwise vertical sectional view, respectively, for explaining the structure of the unit resistor bodies R of the resistor circuit network 14. Referring to FIGS. 3A, 3B and 3C, the structure of the unit resistor bodies R will be described. An insulative layer (of $SiO_2$) 19 is provided on the upper surface of the silicon substrate 11 as a substrate, and a resistive film 20 is provided on the insulative layer 19. The resistive film 20 is made of TiN, TiON or TiSiON. The resistive film 20 includes a plurality of resistive film portions (hereinafter referred to as "resistive film lines") linearly extending parallel to each other between the first connection electrode 12 and the second connection electrode 13. Some of the resistive film lines 20 are cut at predetermined positions with respect to a line extending direction. Conductive film pieces 21 (e.g., aluminum film pieces) are provided on the resistive film lines 20. The conductive film pieces 21 are spaced a predetermined distance R in the line extending direction on the resistive film lines 20.

Figure 4A:
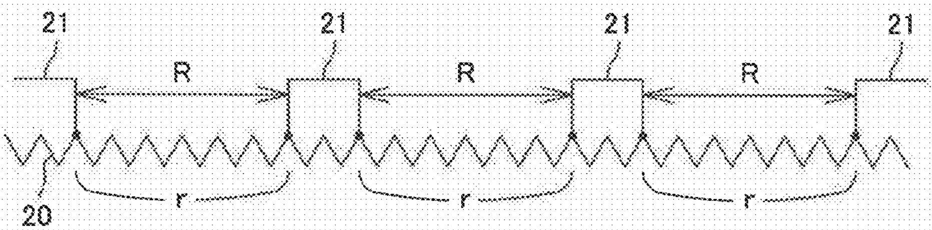
FIGS. 4A to 4C are diagrams showing the electrical characteristic features of a resistive film line 20 and a conductor film 21 by way of circuit symbols and electric circuit diagrams.
Figure 4B:
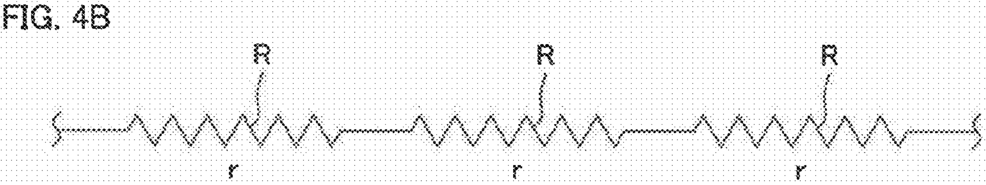
Figure 4C:
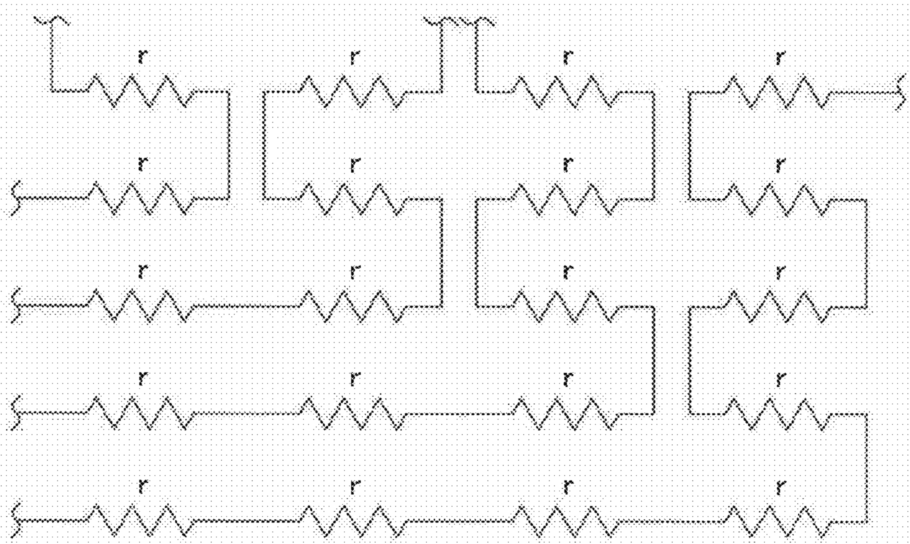

In FIGS. 4A to 4C, the electrical characteristic features of the resistive film lines 20 and the conductive film pieces 21 of this arrangement are shown by way of circuit symbols. As shown in FIG. 4A, portions of each of the resistive film lines 20 present between the conductive film pieces 21 spaced the predetermined distance R from one another each serve as a single unit resistor body R having a predetermined resistance value r. The conductive film pieces 21 cause short circuit in regions of the resistive film lines 20 on which the conductive film pieces 21 are provided. Thus, a resistor circuit is provided, in which unit resistor bodies R each having a resistance value r are connected in series as shown in FIG. 4B.

Further, adjacent resistive film lines 20 are connected to each other by the resistive film lines 20 and the conductive film pieces 21, so that a resistor circuit network shown in FIG. 3A constitutes a resistor circuit shown in FIG. 4C. In the schematic sectional views shown in FIGS. 3B and 3C, the reference numeral 11 designates the silicon substrate, and the reference numeral 19 designates the silicon dioxide ($SiO_2$) insulative layer. The reference numeral 20 designates the resistive film of TiN, TiON or TiSiON provided on the insulative layer 19, and the reference numeral 21 designates an aluminum (Al) interconnection film. A reference numeral 22 designates an SiN protective film, and a reference numeral 23 designates a polyimide protective layer. The interconnection film 21 may be formed of an aluminum-containing metal such as AlSi, AlSiCu or AlCu, rather than formed of Al. By thus forming the interconnection film 21 (including the fuse films F) from the aluminum-containing metal film, the processing accuracy can be improved.

A production process for the resistor circuit network 14 having the aforementioned structure will be detailed later. In this embodiment, the unit resistor bodies R included in the resistor circuit network 14 provided on the silicon substrate 11 are constituted by the resistive film lines 20 and the plurality of conductive film pieces 21 spaced the predetermined distance from one another in the line extending direction on the resistive film lines 20. Portions of the resistive film lines 20 not provided with the conductive film pieces 21 spaced the predetermined distance R from one another each define a single unit resistor body R. The portions of the resistive film lines 20 defining the unit resistor bodies R each have the same shape and the same size. Therefore, the multiplicity of unit resistor bodies R arranged in the matrix array on the silicon substrate 11 have the same resistance value. This is based on a characteristic feature that resistive film portions formed on a substrate as having the same shape and the same size have the same resistance value.

Figures 5A, 5B:
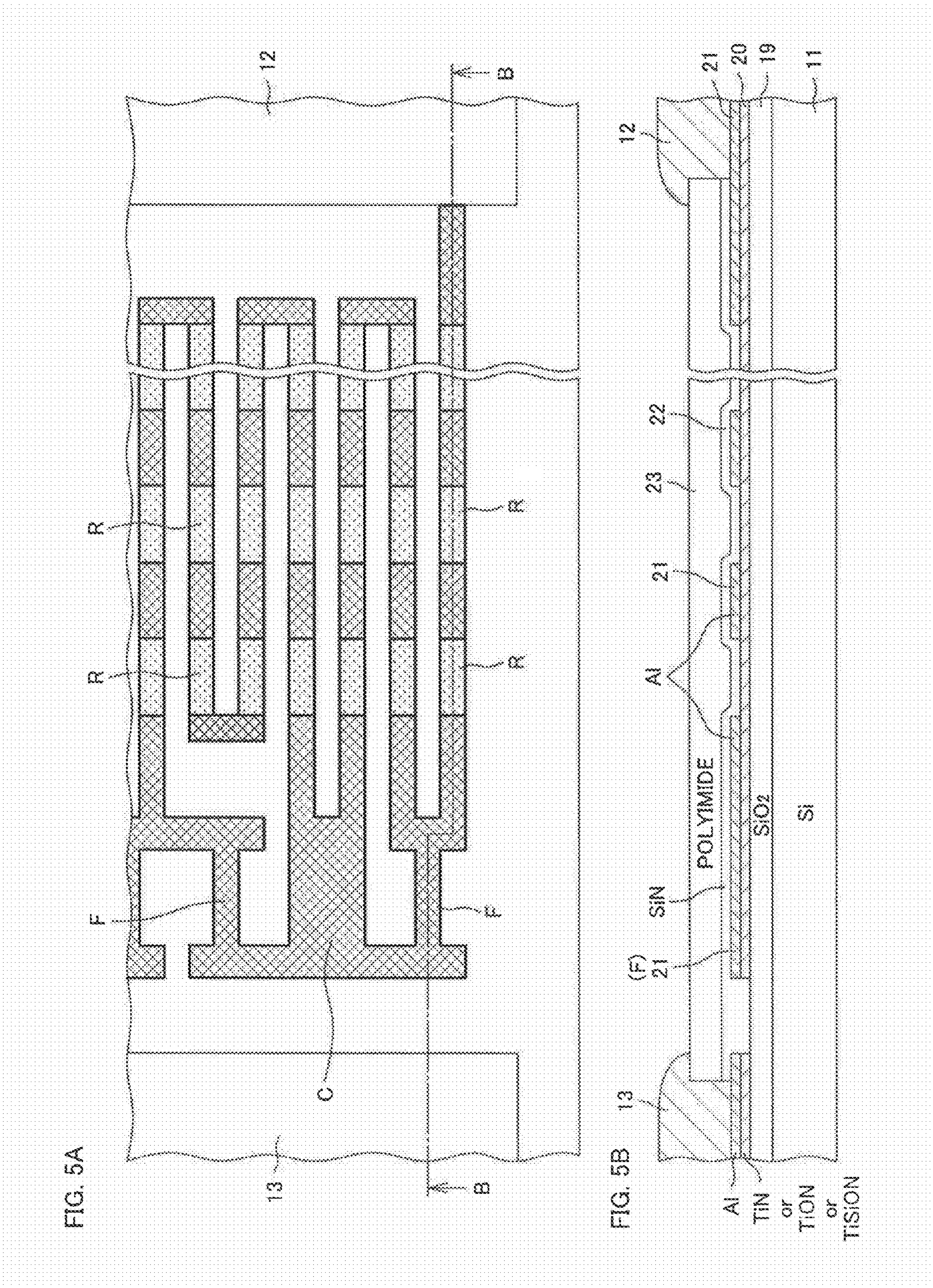
FIG. 5A is an enlarged partial plan view illustrating a region of the chip resistor including fuse films F shown in a part of the plan view of FIG. 2 on an enlarged scale.
FIG. 5B is a diagram showing a sectional structure taken along a line B-B in FIG. 5A.

The conductive film pieces 21 provided on the resistive film lines 20 define the unit resistor bodies R, and also serve as connection interconnection films for connecting the unit resistor bodies R to one another to provide the resistor circuits. FIG. 5A is an enlarged partial plan view illustrating a region of the chip resistor 10 including the fuse films F shown in a part of the plan view of FIG. 2 on an enlarged scale, and FIG. 5B is a diagram showing a sectional structure taken along a line B-B in FIG. 5A.

As shown in FIGS. 5A and 5B, the fuse films F are formed from the interconnection film 21 provided on the resistive film 20. That is, the fuse films F are formed of aluminum (Al), which is the same metal material as for the conductive film pieces 21 provided on the resistive film lines 20 to define the unit resistor bodies R, and provided at the same level as the conductive film pieces 21. As described above, the conductive film pieces 21 serve as the connection conductor films C for electrically connecting the plurality of unit resistor bodies R to form the resistor circuits.

That is, interconnection film portions for defining the unit resistor bodies R, connection interconnection film portions for forming the resistor circuits, connection interconnection film portions for forming the resistor circuit network 14, the fuse films, interconnection film portions for connecting the resistor circuit network 14 to the first connection electrode 12 and the second connection electrode 13 are provided at the same level on the resistive film 20, and formed from the same aluminum-containing metal material (e.g., aluminum) by the same production process (e.g., a sputtering and photolithography process). This simplifies the production process for this chip resistor 10. These interconnection film portions can be simultaneously formed by utilizing the same mask. Further, the interconnection film portions can be aligned with the resistive film 20 with higher alignment accuracy.

Figure 6:
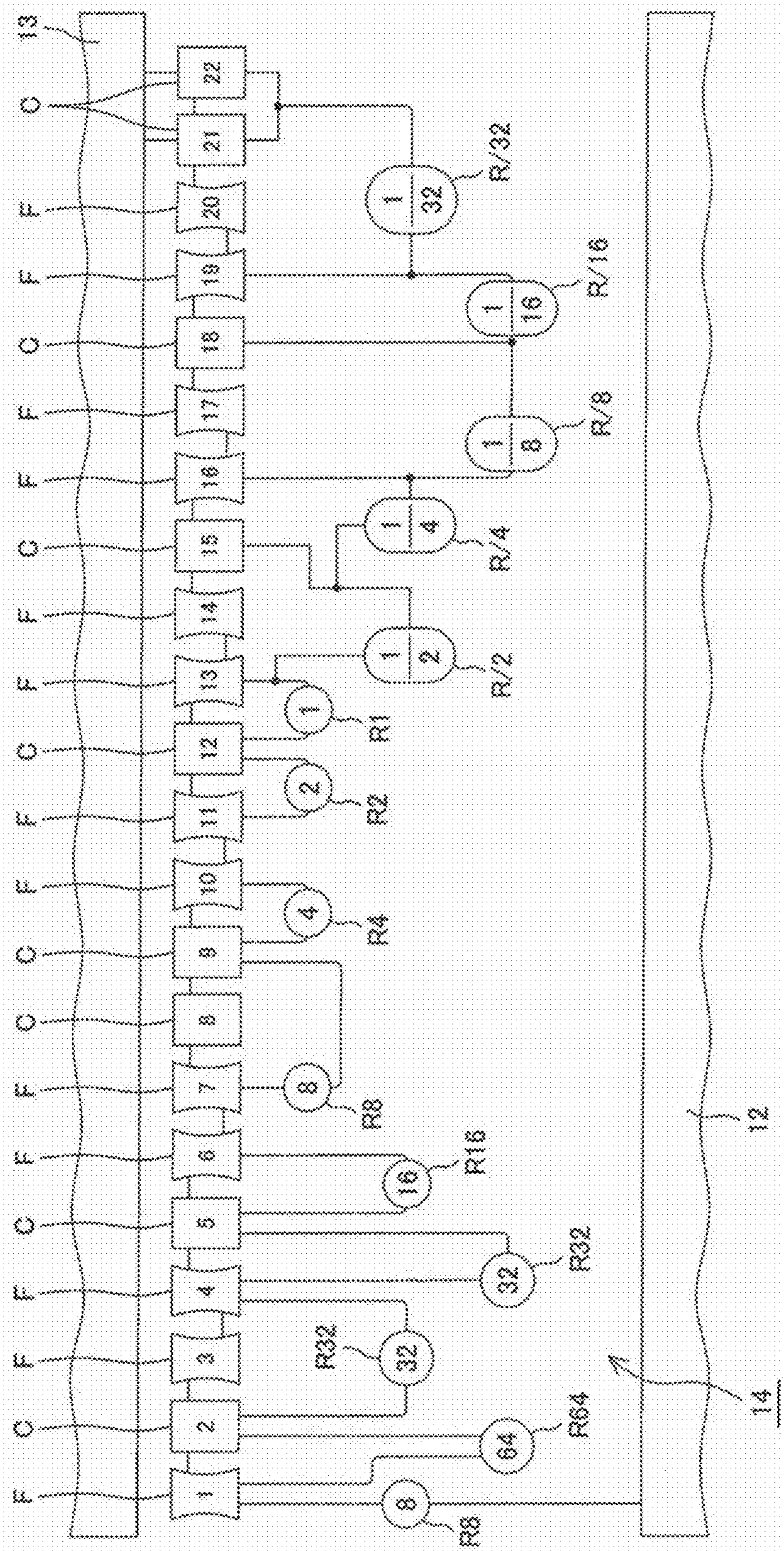
FIG. 6 is a schematic diagram showing the layout of connection conductor films C and fuse films F which connect plural types of resistor units in the resistor circuit network 14 shown in FIG. 2, and the connection of the plural types of resistor units to the connection conductor films C and the fuse films F.

FIG. 6 is a schematic diagram showing the layout of the connection conductor films C and the fuse films F which connect the plural types of resistor circuits in the resistor circuit network 14 shown in FIG. 2, and the connection of the plural types of resistor circuits to the connection conductor films C and the fuse films F. Referring to FIG. 6, one end of a reference resistor circuit R8 of the resistor circuit network 14 is connected to the first connection electrode 12. The reference resistor circuit R8 includes 8 unit resistor bodies R connected in series, and the other end of the reference resistor circuit R8 is connected to a fuse film F1.

A resistor circuit R64 including 64 unit resistor bodies R connected in series is connected at its opposite ends to the fuse film F1 and a connection conductor film C2. A resistor circuit R32 including 32 unit resistor bodies R connected in series is connected at its opposite ends to the connection conductor film C2 and a fuse film F4. Another resistor circuit R32 including 32 unit resistor bodies R connected in series is connected at its opposite ends to the fuse film F4 and a connection conductor film C5.

A resistor circuit R16 including 16 unit resistor bodies R connected in series is connected at its opposite ends to the connection conductor film C5 and a fuse film F6. A resistor circuit R8 including 8 unit resistor bodies R connected in series is connected at its opposite ends to a fuse film F7 and a connection conductor film C9. A resistor circuit R4 including 4 unit resistor bodies R connected in series is connected at its opposite ends to the connection conductor film C9 and a fuse film F10.

A resistor circuit R2 including 2 unit resistor bodies R connected in series is connected at its opposite ends to a fuse film F11 and a connection conductor film C12. A resistor circuit R1 including a single unit resistor body R is connected at its opposite ends to the connection conductor film C12 and a fuse film F13. A resistor circuit R/2 including 2 unit resistor bodies R connected in parallel is connected at its opposite ends to the fuse film F13 and a connection conductor film C15.

A resistor circuit R/4 including 4 unit resistor bodies R connected in parallel is connected at its opposite ends to the connection conductor film C15 and a fuse film F16. A resistor circuit R/8 including 8 unit resistor bodies R connected in parallel is connected at its opposite ends to the fuse film F16 and a connection conductor film C18. A resistor circuit R/16 including 16 unit resistor bodies R connected in parallel is connected at its opposite ends to the connection conductor film C18 and a fuse film F19.

A resistor circuit R/32 including 32 unit resistor bodies R connected in parallel is connected at its opposite ends to the fuse film F19 and a connection conductor film C22. The fuse films F and the connection conductor films C including the fuse film F1, the connection conductor film C2, the fuse film F3, the fuse film F4, the connection conductor film C5, the fuse film F6, the fuse film F7, the connection conductor film C8, the connection conductor film C9, the fuse film F10, the fuse film F11, the connection conductor film C12, the fuse film F13, the fuse film F14, the connection conductor film C15, the fuse film F16, the fuse film F17, the connection conductor film C18, the fuse film F19, the fuse film F20, the connection conductor film C21 and the connection conductor film C22 are linearly arranged and connected in series. Where a fuse film F is fused off, electrical connection between that fuse film and an adjacent connection conductor film C connected to that fuse film F is cut off.

Figure 7:
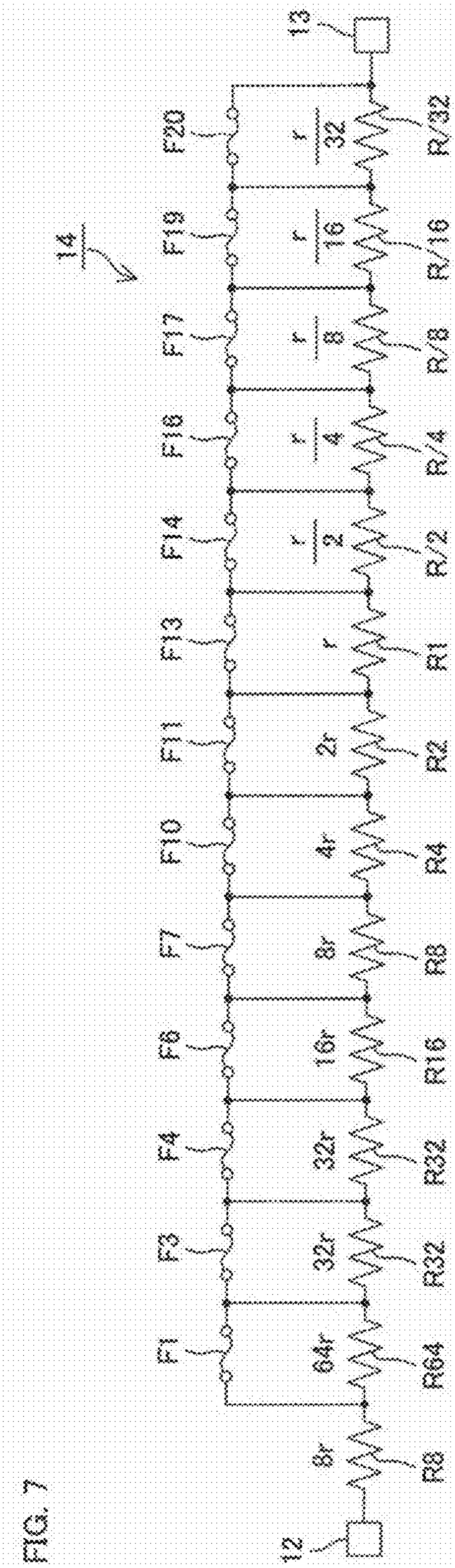
FIG. 7 is an electric circuit diagram of the resistor circuit network 14.

This configuration is represented by an electric circuit diagram of FIG. 7. That is, with none of the fuse films F fused off, the resistor circuit network 14 is configured such that the reference resistor circuit R8 (having a resistance value of 8r) including 8 unit resistor bodies R connected in series is provided between the first connection electrode 12 and the second connection electrode 13. Where the unit resistor bodies R each have a resistance value r of r=80Ω, for example, the chip resistor 10 is configured such that the first connection electrode 12 and the second connection electrode 13 are connected to each other through a resistor circuit having a resistance value of 8r=640Ω.

Except the reference resistor circuit R8, the plural types of resistor circuits to which the corresponding fuse films F are connected in parallel are short-circuited by the corresponding fuse films F. That is, 12 types of 13 resistor circuits R64 to R/32 are connected in series to the reference resistor circuit R8, but are short-circuited by the fuse films F connected in parallel thereto. Therefore, the each of resistor circuits is not electrically incorporated in the resistor circuit network 14.

In the chip resistor 10 according to this embodiment, the fuse films F are selectively fused off, for example, by a laser beam according to the required resistance value. Thus, a resistor circuit connected in parallel to a fused fuse film F is incorporated in the resistor circuit network 14. Therefore, the resistor circuit network 14 has an overall resistance value which is controlled by connecting, in series, resistor circuits incorporated by fusing off the corresponding fuse films F.

In other words, the chip resistor 10 according to this embodiment is configured such that the plural types of resistor circuits can be selectively incorporated in the resistor circuit network by selectively fusing off the fuse films provided in association with the plural types of resistor circuits (for example, a serial connection circuit including the resistor circuits R64, R32, R1 can be incorporated by fusing off the fuse films F1, F4, F13). Since the plural types of resistor circuits each have a predetermined resistance value, the resistance value of the resistor circuit network 14 can be controlled in a so-called digital manner to provide the chip resistor 10 having the required resistance value.

Further, the plural types of resistor circuits include plural types of serial resistor circuits which respectively include 1, 2, 4, 8, 16, 32 and 64 unit resistor bodies R (whose number increases in a geometrically progressive manner) each having the same resistance value and connected in series, and plural types of parallel resistor circuits which respectively include 2, 4, 8, 16 and 32 unit resistor bodies R (whose number increases in a geometrically progressive manner) each having the same resistance value and connected in parallel. These resistor circuits are connected in series in a short-circuited state by the fuse films F. Therefore, the overall resistance value of the resistor circuit network 14 can be controlled to a desired resistance value in a wide range from a lower resistance level to a higher resistance level by selectively fusing off the fuse films F.

Figure 8:
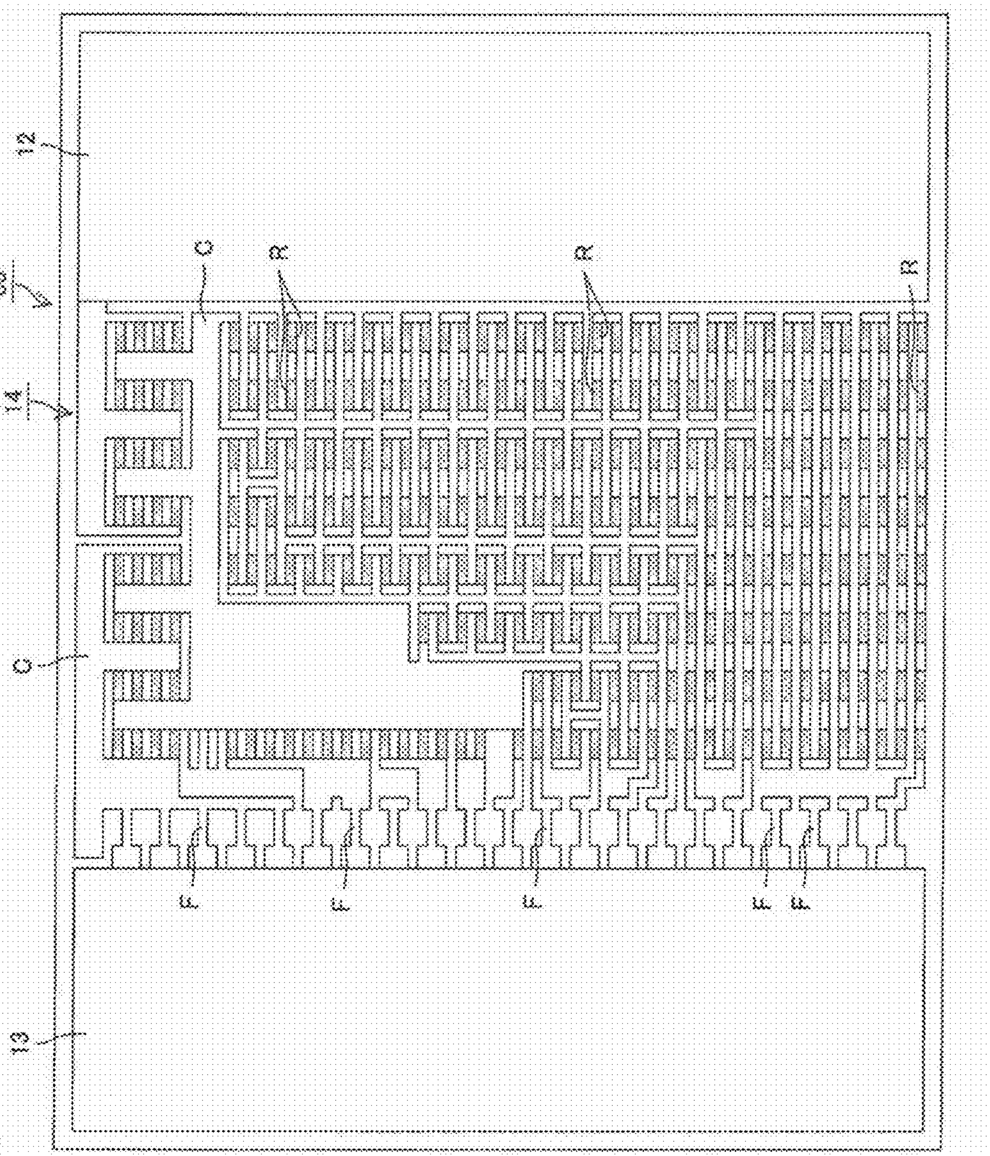
FIG. 8 is a plan view of a chip resistor 30, showing the layout of a first connection electrode 12, a second connection electrode 13 and a resistor circuit network 14, and the configuration of the resistor circuit network 14 as viewed in plan.

FIG. 8 is a plan view of a chip resistor 30 according to another embodiment of the present invention, showing the layout of a first connection electrode 12, a second connection electrode 13 and a resistor circuit network 14, and the configuration of the resistor circuit network 14 as viewed in plan. The chip resistor 30 is different from the chip resistor 10 in that the unit resistor bodies R are connected in a different manner in the resistor circuit network 14.

More specifically, the resistor circuit network 14 of the chip resistor 30 includes a multiplicity of unit resistor bodies R arranged in a matrix array on a silicon substrate and each having the same resistance value (in FIG. 8, the resistor circuit network 14 is configured to include 352 unit resistor bodies R in total with 8 unit resistor bodies R aligned in each row (longitudinally of the silicon substrate) and with 44 unit resistor bodies R aligned in each column (widthwise of the silicon substrate)). The multiplicity of unit resistor bodies R are grouped into predetermined numbers, and a predetermined number of unit resistor bodies R (1 to 128 unit resistor bodies R) in each group are electrically connected to one another, whereby plural types of resistor circuits are formed. The plural types of resistor circuits thus formed are connected in parallel to one another via a conductor film and fuse films F serving as circuit network connection means. The fuse films F are arranged in a linear region alongside an inner edge of the second connection electrode 13. With a fuse film F fused off, a resistor circuit connected to that fuse film is electrically isolated from the resistor circuit network 14.

Figure 9:
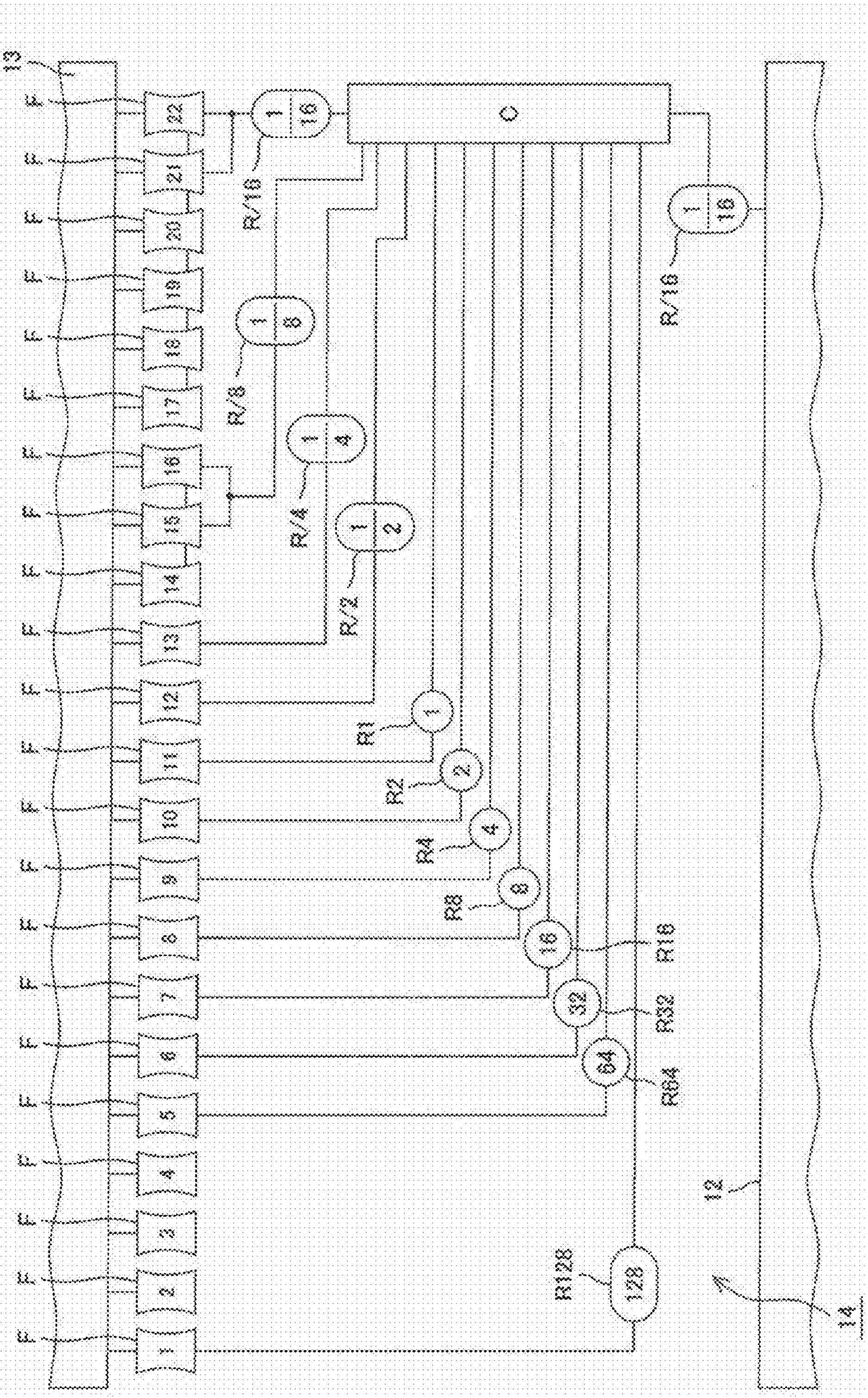
FIG. 9 is a schematic diagram showing the layout of a connection conductor film C and fuse films F which connect plural types of resistor units in the resistor circuit network 14 shown in FIG. 8, and the connection of the plural types of resistor units to the connection conductor film C and the fuse films F.

The multiplicity of unit resistor bodies R of the resistor circuit network 14, the connection conductor film and the fuse films F each have the same structure as those of the aforementioned chip resistor 10 and, therefore, duplicate description will be omitted. FIG. 9 is a schematic diagram showing the connection of the plural types of resistor circuits in the resistor circuit network shown in FIG. 8, the layout of the fuse films F connecting the resistor circuits, and the connection of the plural types of resistor circuits to the fuse films F.

Referring to FIG. 9, one end of a reference resistor circuit R/16 of the resistor circuit network 14 is connected to the first connection electrode 12. The reference resistor circuit R/16 includes 16 unit resistor bodies R connected in parallel, and the other end of the reference resistor circuit R/16 is connected to a connection conductor film C to which the other resistor circuits are connected. A resistor circuit R128 including 128 unit resistor bodies R connected in series is connected at its opposite ends to a fuse film F1 and the connection conductor film C.

A resistor circuit R64 including 64 unit resistor bodies R connected in series is connected at its opposite ends to a fuse film F5 and the connection conductor film C. A resistor circuit R32 including 32 unit resistor bodies R connected in series is connected at its opposite ends to a fuse film F6 and the connection conductor film C. A resistor circuit R16 including 16 unit resistor bodies R connected in series is connected at its opposite ends to a fuse film F7 and the connection conductor film C.

A resistor circuit R8 including 8 unit resistor bodies R connected in series is connected at its opposite ends to a fuse film F8 and the connection conductor film C. A resistor circuit R4 including 4 unit resistor bodies R connected in series is connected at its opposite ends to a fuse film F9 and the connection conductor film C. A resistor circuit R2 including 2 unit resistor bodies R connected in series is connected at its opposite ends to a fuse film F10 and the connection conductor film C.

A resistor circuit R1 including a single unit resistor body R is connected at its opposite ends to a fuse film F11 and the connection conductor film C. A resistor circuit R/2 including 2 unit resistor bodies R connected in parallel is connected at its opposite ends to a fuse film F12 and the connection conductor film C. A resistor circuit R/4 including 4 unit resistor bodies R connected in parallel is connected at its opposite ends to a fuse film F13 and the connection conductor film C.

Fuse films F14, F15, F16 are electrically connected together, and a resistor circuit R/8 including 8 unit resistor bodies R connected in parallel is connected at its opposite ends to the fuse films F14, F15, F16 and the connection conductor film C. Fuse films F17, F18, F19, F20, F21 are electrically connected together, and a resistor circuit R/16 including 16 unit resistor bodies R connected in parallel is connected at its opposite ends to the fuse films F17 to F21 and the connection conductor film C.

The fuse films F include 21 fuse films F1 to F21, which are all connected to the second connection electrode 13. With this arrangement, when a fuse film F is fused off, a resistor circuit connected at its one end to that fuse film F is electrically isolated from the resistor circuit network 14.

Figure 10:
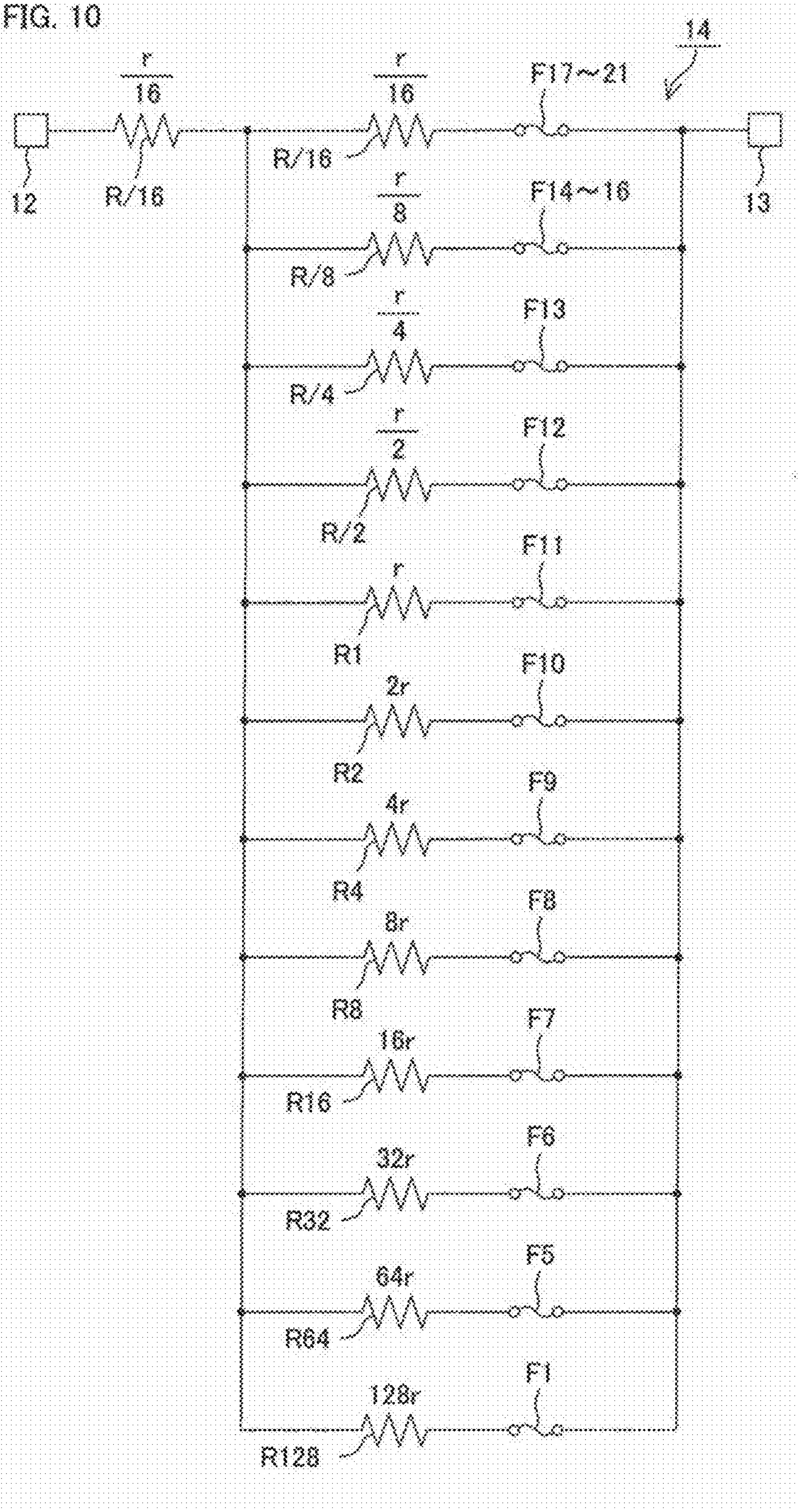
FIG. 10 is an electric circuit diagram of the resistor circuit network 14.

The configuration of FIG. 9, i.e., the configuration of the resistor circuit network 14 of the chip resistor 30, is represented by an electric circuit diagram shown in FIG. 10. With none of the fuse films F fused off, the resistor circuit network 14 is configured such that a parallel connection circuit including 12 types of resistor circuits R/16, R/8, R/4, R/2, R1, R2, R4, R8, R16, R32, R64, R128 is connected in series to the reference resistor circuit R/16 between the first connection electrode 12 and the second connection electrode 13.

The fuse films F are respectively connected in series to the 12 types of resistor circuits except the reference resistor circuit R/16. In the chip resistor 30 having this resistor circuit network 14, the fuse films F are selectively fused off, for example, by a laser beam according to the required resistance value. Thus, a resistor circuit associated with the fused fuse film F (a resistor circuit connected in series to the fused fuse film F) is electrically isolated from the resistor circuit network 14, whereby the resistance value of the chip resistor 30 can be adjusted.

In other words, the chip resistor 30 according to this embodiment is also configured such that the plural types of resistor circuits can be selectively electrically isolated from the resistor circuit network by selectively fusing off the fuse films provided in association with the plural types of resistor circuits. Since the plural types of resistor circuits each have a predetermined resistance value, the resistance value of the resistor circuit network 14 can be controlled in a so-called digital manner to provide the chip resistor 30 having the required resistance value.

Further, the plural types of resistor circuits include plural types of serial resistor circuits which respectively include 1, 2, 4, 8, 16, 32, 64 and 128 unit resistor bodies R (whose number increases in a geometrically progressive manner) each having the same resistance value and connected in series, and plural types of parallel resistor circuits which respectively include 2, 4, 8 and 16 unit resistor bodies R (whose number increases in a geometrically progressive manner) each having the same resistance value and connected in parallel. Therefore, the overall resistance value of the resistor circuit network 14 can be finely and digitally adjusted at a desired resistance value by selectively fusing off the fuse films F.

Figure 11A:
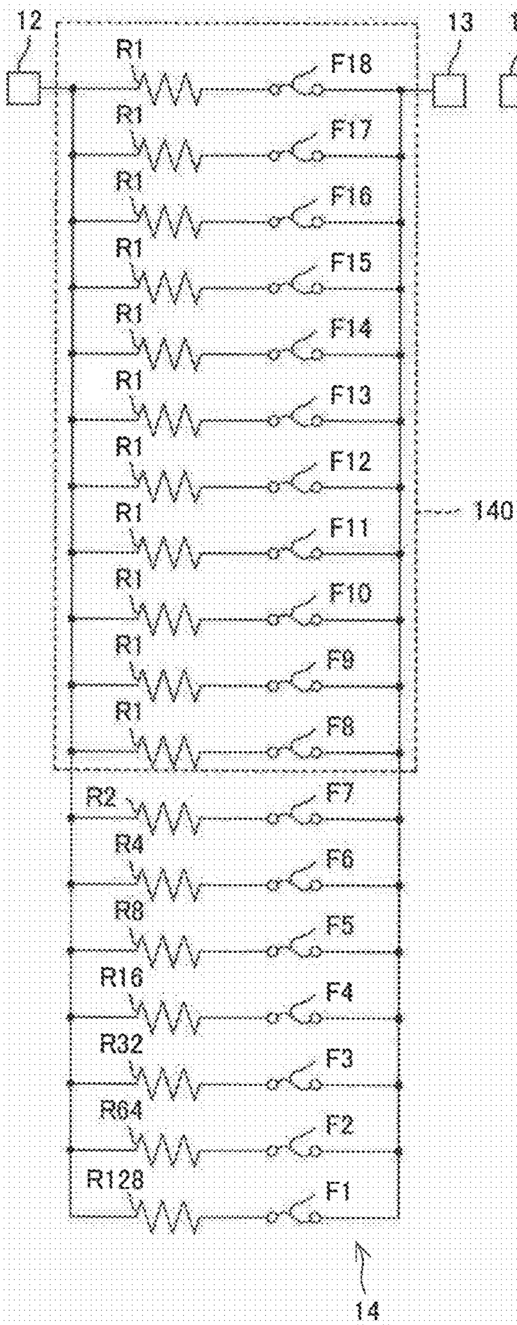
FIGS. 11A and 11B are electric circuit diagrams showing a modification of the electric circuit shown in FIG. 10.

In an electric circuit shown in FIG. 10, lower resistance resistor circuits out of the reference resistor circuit R/16 and the resistor circuits connected in parallel are liable to suffer from overcurrent. Therefore, the lower resistance resistor circuits should be designed to have a higher rated current in the setting of the resistance. For distribution of electric current, the connection configuration of the resistor circuit network may be changed from the electric circuit shown in FIG. 10 to an electric circuit configuration as shown in FIG. 11A. That is, the resistor circuit network is modified with the reference resistor circuit R/16 eliminated to include a circuit configuration 140 such that a plurality of unit resistor bodies R1 each having a minimum resistance value of r are connected in parallel.

Figure 11B:
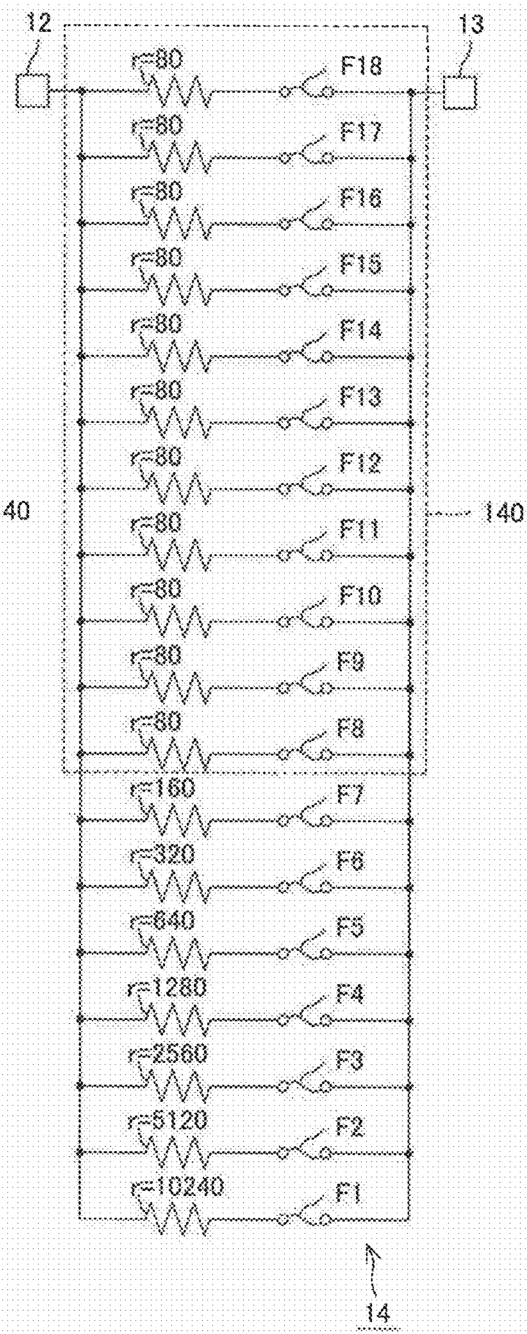

FIG. 11B is an electric circuit diagram with specific resistance values, showing a configuration 140 such that a plurality of serial connections each including a 80Ω unit resistor body and a fuse film F are connected in parallel. Thus, the electric current flowing through the resistor circuit can be distributed.

Figure 12:
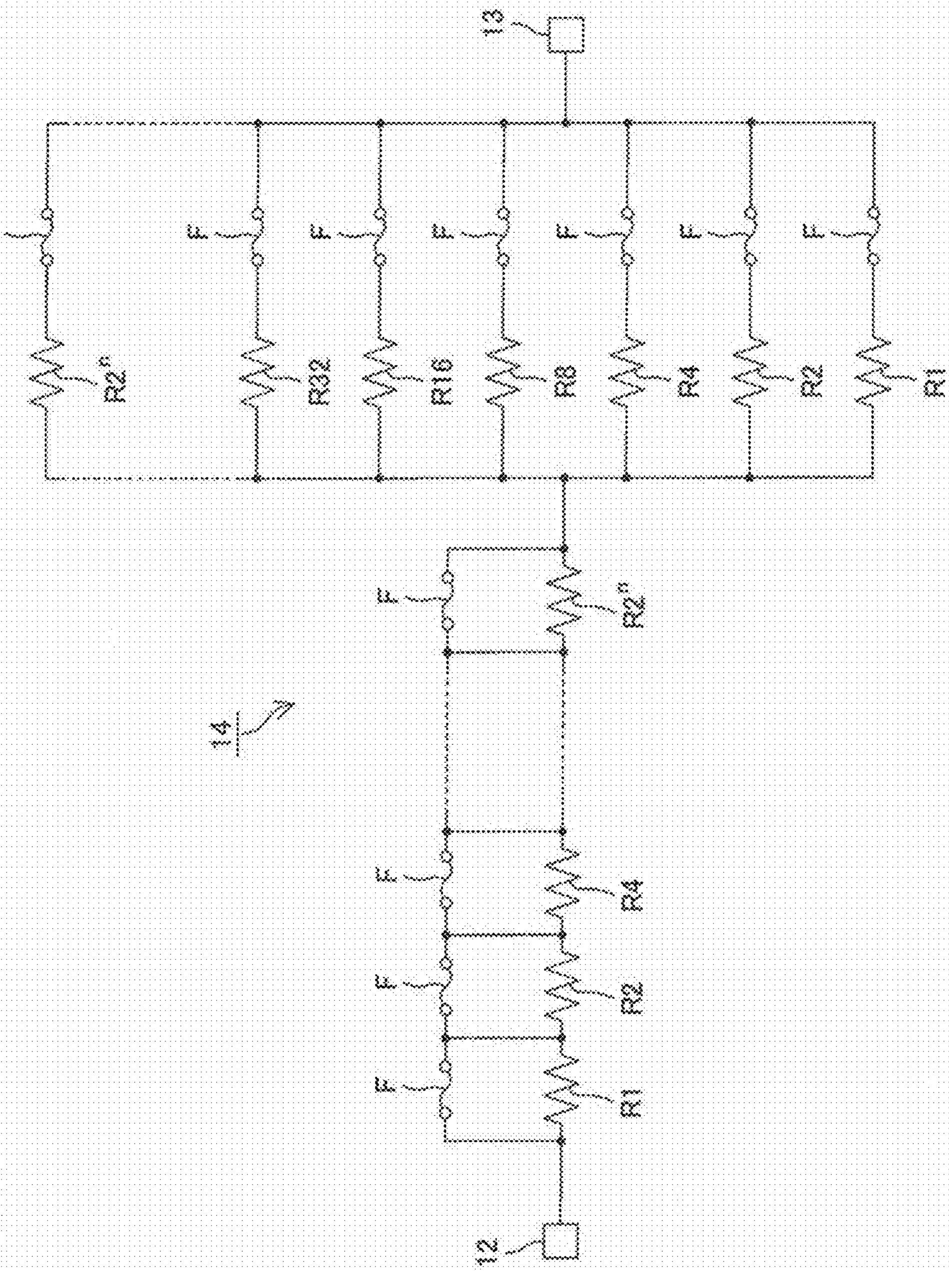
FIG. 12 is an electric circuit diagram of a resistor circuit network 14 according to another embodiment of the present invention.

FIG. 12 is an electric circuit diagram showing a circuit configuration of a resistor circuit network 14 provided in a chip resistor according further another embodiment of the present invention. The resistor circuit network 14 shown in FIG. 12 has a characteristic circuit configuration such that serial connection of plural types of resistor circuits is connected in series to parallel connection of plural types of resistor circuits.

As in the previous embodiment, a fuse film F is connected in parallel to each of the plural types of resistor circuits connected in series, and all the plural types of resistor circuits connected in series are short-circuited by the fuse films F. With a fuse film F fused off, therefore, a resistor circuit which has been short-circuited by that fuse film F is electrically incorporated in the resistor circuit network 14. On the other hand, a fuse film F is connected in series to each of the plural types of resistor circuits connected in parallel. With a fuse film F fused off, therefore, a resistor circuit connected in series to that fuse film F is electrically isolated from the parallel connection of the resistor circuits.

With this arrangement, a resistance of smaller than 1 kΩ may be formed in the parallel connection side, and a resistor circuit of 1 kΩ or greater may be formed in the serial connection side. Thus, a resistor circuit having a resistance value in a wide range from a smaller resistance value on the order of several ohms to a greater resistance value on the order of several megaohms can be produced from a resistor circuit network 14 designed based on the same basic design concept. For more accurate setting of the resistance value, a fuse film associated with a resistor circuit having a resistance value closer to the required resistance value in the serial connection side may be preliminarily cut. Thus, the resistance value can be finely controlled by selectively fusing off the fuse films associated with the resistor circuits in the parallel connection side, whereby the resistance value can be more accurately adjusted at the required resistance value.

Figure 13:
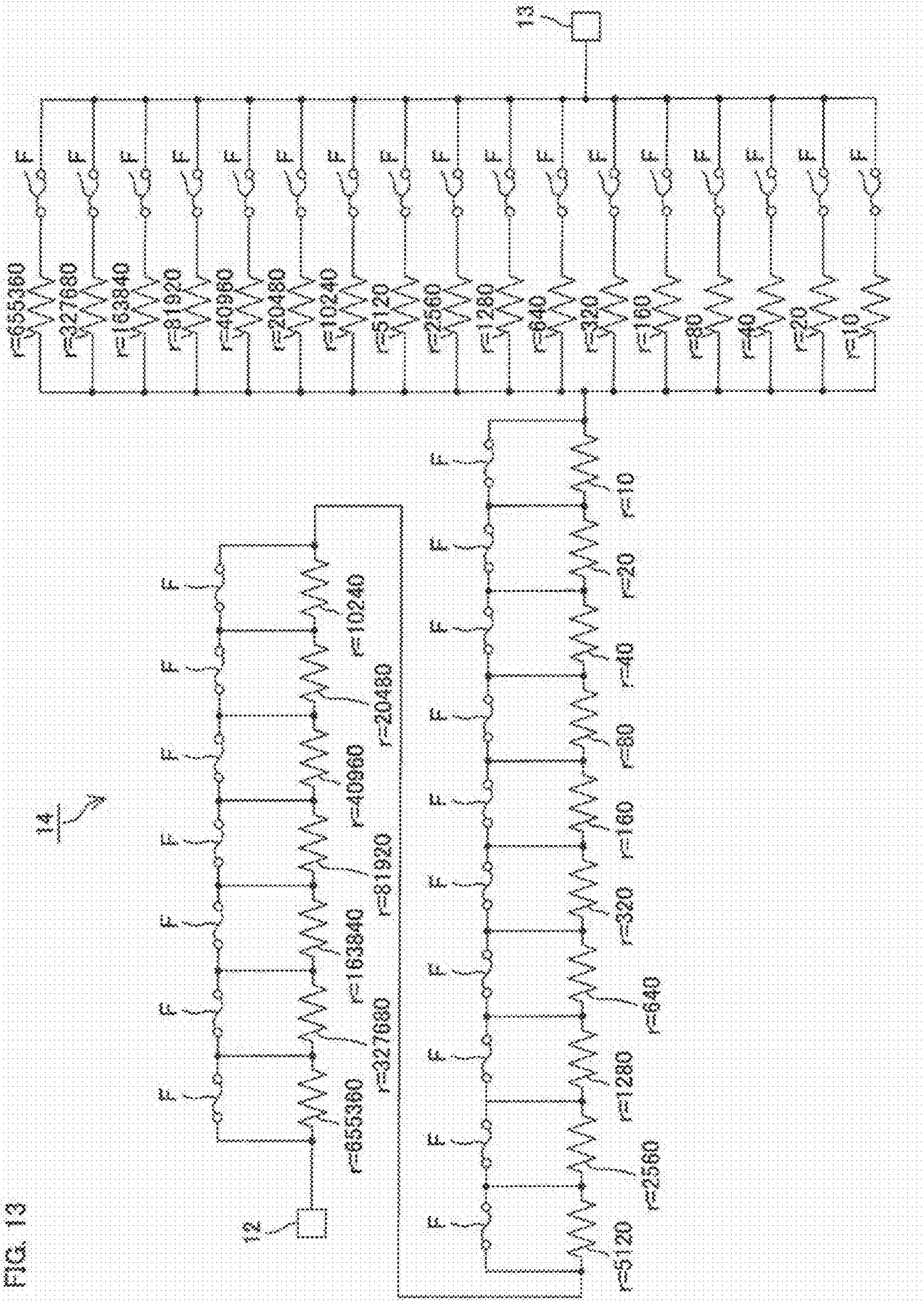
FIG. 13 is an electric circuit diagram showing an exemplary configuration of a resistor circuit network of the chip resistor with specific resistance values.

FIG. 13 is an electric circuit diagram showing an exemplary configuration of a resistor circuit network 14 of a chip resistor having a resistance value of 10Ω to 1 MΩ. The resistor circuit network 14 shown in FIG. 13 also has a circuit configuration such that serial connection of plural types of resistor circuits short-circuited by fuse films F is connected in series to parallel connection of plural types of resistor circuits each connected in series to a fuse film F.

In the resistor circuit shown in FIG. 13, the resistance can be set at a desired resistance value in a range of 10 to 1 kΩ within an accuracy of 1% in the parallel connection side. Further, the resistance can be set at a desired resistance value in a range of 1 k to 1 MΩ within an accuracy of 1% in the serial connection side. Where the resistor circuits in the serial connection side are used for the setting, the resistance can be advantageously adjusted at the desired resistance value with a higher accuracy by preliminarily fusing off a fuse film F associated with a resistor circuit having a resistance value closer to the desired resistance value.

In the above description, the fuse films F are located at the same level as the connection conductor films C, but an additional conductor film may be provided on the respective connection conductor films C to reduce the resistance values of the connection conductor films C. Alternatively, portions of the resistive film underlying the connection conductor films C may be obviated. Even in this case, the fusibility of the fuse films F is not reduced as long as the additional conductor film is not present on the fuse films F.

Figure 14A:
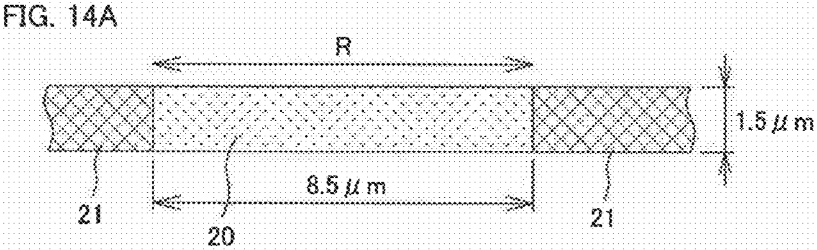
FIGS. 14A and 14B are schematic plan views for explaining the structure of a major portion of a chip resistor 90 according to further another embodiment of the present invention.
Figure 14B:
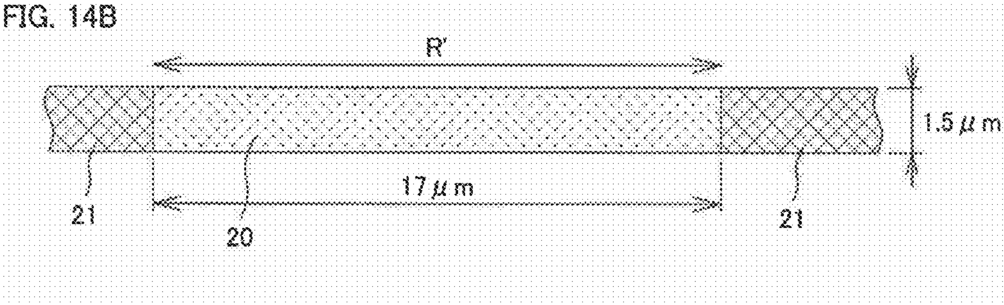

FIGS. 14A and 14B are schematic plan views for explaining the structure of a major portion of a chip resistor 90 according to further another embodiment of the present invention. In the chip resistor 10 (see FIGS. 1A to 1B and 2) and the chip resistor 30 (see FIG. 8), for example, a resistive film line 20 and conductive film pieces 21 of a resistor circuit are configured in a relationship as shown in plan in FIG. 14A. That is, as shown in FIG. 14A, a portion of the resistive film line 20 defined between the conductive film pieces 21 spaced the predetermined distance R defines a unit resistor body R having a predetermined resistance value r. The conductive film pieces 21 are provided on the resistive film line 20 on opposite sides of the unit resistor body R to cause short circuit in the resistive film line 20.

In the chip resistor 10 and the chip resistor 30 described above, the portion of the resistive film line 20 defining the unit resistor body R has a length of, for example, 12 μm. The resistive film line 20 has a width of, for example, 1.5 μm and a unit resistance (sheet resistance) of 10Ω/□. Therefore, the resistance value r of the unit resistor body R is r=80Ω. There is a demand for increasing the resistance of the chip resistor 10 shown in FIGS. 1A to 1B and 2, for example, by increasing the resistance value of the resistor circuit network 14 without increasing the area of the resistor circuit network 14.

In the chip resistor 90 according to this embodiment, the layout of the resistor circuit network 14 is changed, and the unit resistor bodies of the respective resistor circuits of the resistor circuit network are each configured and dimensioned as shown in plan in FIG. 14B. Referring to FIG. 14B, the resistive film line 20 includes a resistive film line 20 linearly extending and having a width of 1.5 μm. A portion of the resistive film line 20 defined between conductive film pieces 21 spaced a predetermined distance R' defines a unit resistor body R' having a predetermined resistance value r'. The unit resistor body R' has a length of, for example, 17 μm. Thus, the unit resistor body R' has a resistance value r' of 160Ω which is generally twice that of the unit resistor body R shown in FIG. 14A.

Further, the conductive film pieces 21 provided on the resistive film line 20 each have the same length in FIGS. 14A and 14B. Therefore, the resistance of the chip resistor 90 can be increased by changing the layout of the unit resistor bodies R' of the respective resistor circuits of the resistor circuit network 14 so that the unit resistor bodies R' can be connected in series.

Figure 15:
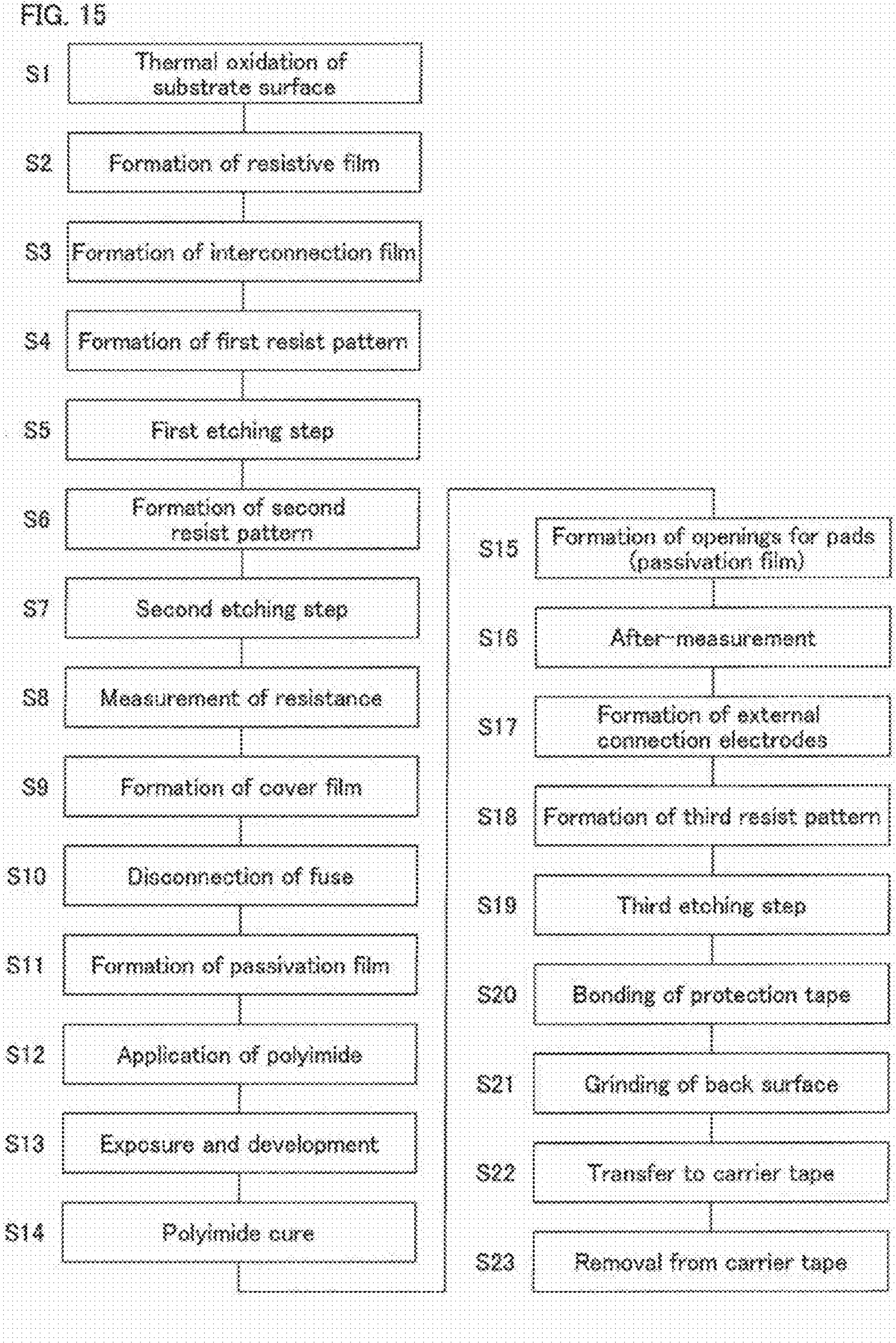
FIG. 15 is a flow diagram showing an exemplary production process for the chip resistor 10.

FIG. 15 is a flow diagram showing an exemplary production process for the chip resistor 10 described with reference to FIGS. 1A to 7. A production method for the chip resistor 10 will be described in detail according to the production process of the flow diagram and, as required, referring to FIGS. 1A to 7.

Step S1: First, a substrate 11 (in practice, a silicon wafer (see FIGS. 17A to 17F) before being divided into individual chip resistors 10) is placed in a predetermined treatment chamber, and a silicon dioxide ($SiO_2$) layer is formed as an insulative layer 19 in a surface of the substrate 11, for example, by a thermal oxidation method.

Step S2: Then, a resistive film 20 of TiN, TiON or TiSiON is formed on the entire surface of the insulative layer 19, for example, by a sputtering method.

Step S3: In turn, an interconnection film 21 such as of aluminum (Al) is formed on the entire surface of the resistive film 20, for example, by a sputtering method. The total thickness of the resistive film 20 and the interconnection film 21 thus formed may be about 8000 Å. The interconnection film 21 may be formed from an aluminum-containing metal film such as of AlSi, AlSiCu or AlCu, rather than formed from Al. The processing accuracy can be improved by forming the interconnection film 21 from the aluminum-containing metal film such as of Al, AlSi, AlSiCu or AlCu.

Step S4: Subsequently, a resist pattern corresponding to the plan configuration of resistor circuit networks 14 (a layout pattern including conductor films C and fuse films F) is formed on the surface of the interconnection film 21 by a photolithography process (first resist pattern forming step).

Step S5: Then, a first etching step is performed. That is, the resistive film 20 and the interconnection film 21 formed in a double layer structure are etched, for example, by reactive ion etching (RIE) with the use of the first resist pattern formed in Step S4 as a mask. After the etching, the first resist pattern is removed.

Step S6: A second resist pattern is formed by a photolithography process. The second resist pattern formed in Step S6 is a pattern for selectively removing the interconnection film 21 formed on the resistive film 20 to define unit resistor bodies R (each indicated by a finely dotted area in FIG. 2).

Step S7: Only the interconnection film 21 is selectively etched, for example, by wet etching with the use of the second resist pattern formed in Step S6 as a mask (second etching step). After the etching, the second resist pattern is removed. Thus, the layout pattern of the resistor circuit networks 14 each shown in FIG. 2 is provided.

Step S8: At this stage, the resistance (overall resistance value) of each of the resistor circuit networks 14 formed on the substrate surface is measured. The measurement is performed, for example, by bringing multi-probe pins into contact with an end of the resistor circuit network 14 to be connected to the first connection electrode 12 and the fuse films and an end of the resistor circuit network 14 to be connected to the second connection electrode 13. Through the measurement, the initial state of each of the resistor circuit networks 14 thus produced is checked.

Step S9: Then, a cover film 22*a* of, for example, a nitride film is formed over the entire surface of the resistor circuit networks 14 formed on the substrate 11. The cover film 22*a* may be an oxide film ($SiO_2$ film) rather than the nitride film (SiN film). The formation of the cover film 22*a* may be achieved by a plasma CVD method. The cover film 22*a* may be, for example, a silicon nitride film (SiN film) having a thickness of about 3000 Å. The cover film 22*a* covers the interconnection film 21, the resistive film 20 and the fuse films F previously patterned.

Figure 16A:
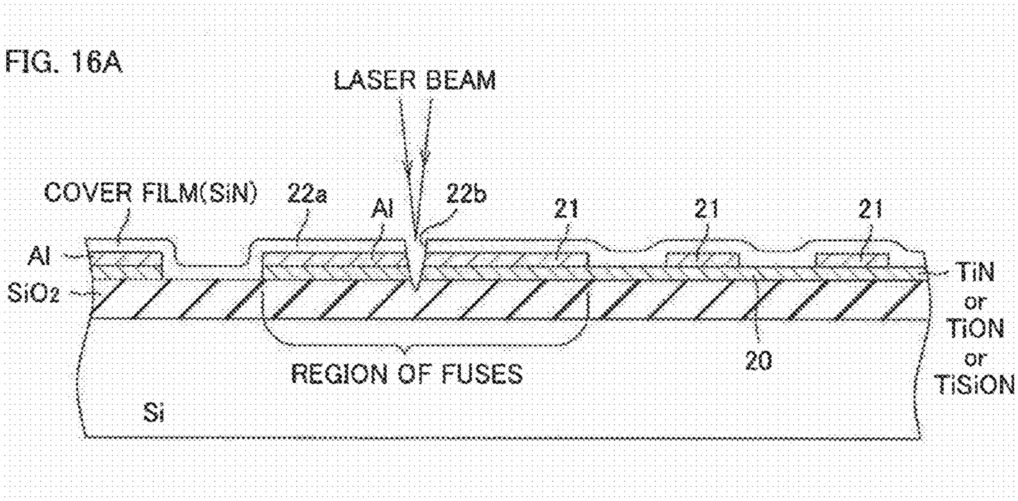
FIGS. 16A to 16C are schematic sectional views showing the step of fusing off a fuse film F, and a passivation film 22 and a resin film 23 to be formed after the fusing-off step.

Step S10: In this state, the fuse films F are selectively fused off by laser trimming for adjusting the resistance of each of the chip resistors 10 at a desired resistance value. That is, as shown in FIG. 16A, a laser beam is applied to a fuse film F selected according to the results of the measurement of the overall resistance value in Step S8 to fuse off the selected fuse film F and a portion of the resistive film 20 underlying the fuse film F. Thus, a resistor circuit which has been short-circuited by that fuse film F is incorporated into the resistor circuit network 14, so that the resistance of the resistor circuit network 14 can be adjusted at the desired resistance value. When the laser beam is applied to the fuse film F, the energy of the laser beam is accumulated around the fuse film F by the function of the cover film 22*a*, whereby the fuse film F and the underlying portion of the resistive film 20 are fused off.

Figure 16B:
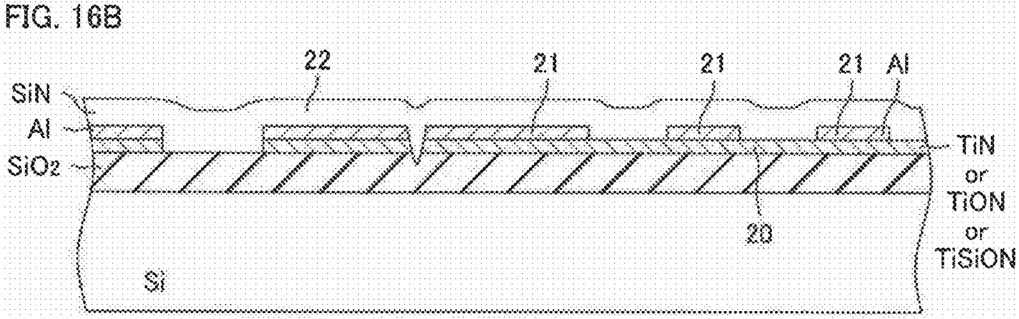

Step S11: Then, as shown in FIG. 16B, a silicon nitride film is deposited on the cover film 22*a*, for example, by a plasma CVD method, whereby a passivation film 22 is formed. The cover film 22*a* described above is finally unified with the passivation film 22 to form a part of the passivation film 22. The passivation film 22 formed after the fuse-off of the fuse film F and the underlying resistive film portion 20 partly enters a hole 22*b* formed in the cover film 22*a* when the cover film 22*a* is partly broken during the fuse-off of the fuse film F and the underlying resistive film portion 20, and protects broken surfaces of the fuse film F and the underlying resistive film portion 20. Therefore, the passivation film 22 prevents foreign matter and moisture from intruding into the fuse-off portion of the fuse film F. The passivation film 22 may have an overall thickness of, for example, about 1000 to about 20000 Å (e.g., about 8000 Å). As described above, the passivation film 22 may be a silicon oxide film.

Figure 16C:
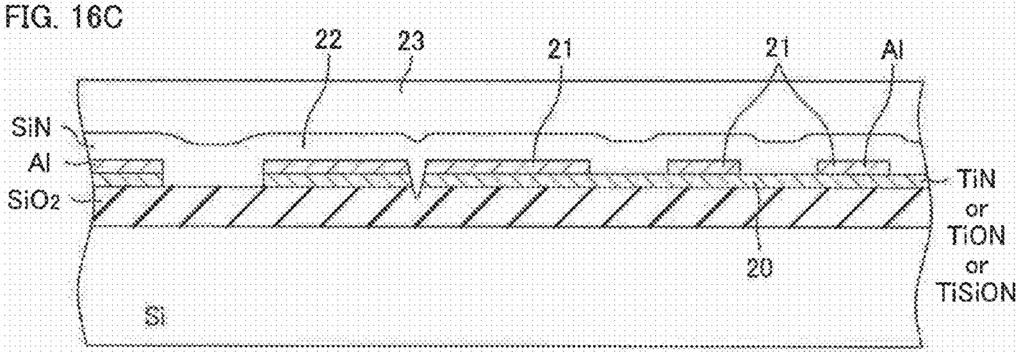

Step S12: Then, as shown in FIG. 16C, a resin film 23 is applied over the resulting substrate. A photosensitive polyimide coating film 23, for example, is used as the resin film 23.

Step S13: The resin film 23 is patterned by photolithography by exposing regions of the resin film 23 corresponding to openings for first and second connection electrodes 12, 13 and then developing the resulting resin film 23. Thus, pad openings for the first and second connection electrodes 12, 13 are formed in the resin film 23.

Step S14: Thereafter, the resin film 23 is heat-treated to be cured (polyimide curing). Thus, the polyimide film 23 is stabilized by the heat treatment. The heat treatment may be performed at a temperature of, for example, about 170° C. to about 700° C. As a result, the characteristic properties of the resistor bodies (the resistive film 20 and the patterned interconnection film 21) are advantageously stabilized.

Step S15: Then, the polyimide film 23 having the through-holes in regions to be formed with the first and second connection electrodes 12, 13 is used as a mask to etch the passivation film 22. Thus, pad openings for exposing portions of the interconnection film 21 to be formed with the first and second connection electrodes 12, 13 are formed in the passivation film 22. The etching of the passivation film 22 may be achieved by reactive ion etching (RIE).

Step S16: The resistance is measured (after-measurement is performed) with the multi-probe pins in contact with the portions of the interconnection film 21 exposed from each pair of pad openings for confirming that the chip resistors each have a desired resistance value. By performing the after-measurement, i.e., by sequentially performing the initial measurement, the fuse-off of the fuse film F (laser repair) and the after-measurement, the trimming process efficiency for the chip resistors 10 is significantly improved.

Step S17: The first and second connection electrodes 12, 13 are formed as external connection electrodes in the each pair of pad openings, for example, by an electroless plating method.

Step S18: Thereafter, a third resist pattern is formed by photolithography for separating the multiplicity of chip resistors (e.g., 500,000 chip resistors) formed on the wafer surface from each other. The resist film is configured such that the chip resistors 10, for example, shown in FIG. 18 can be protected on the wafer surface and a region of the wafer surface defined between the respective chip resistors 10 can be etched.

Step S19: Then, plasma dicing is performed. The plasma dicing is an etching method by which a trench having a predetermined depth as measured from the surface of the silicon wafer (substrate) is formed between the chip resistors 10 in the silicon wafer with the use of the third resist pattern as a mask. Thereafter, the resist film is removed.

Figure 17A:
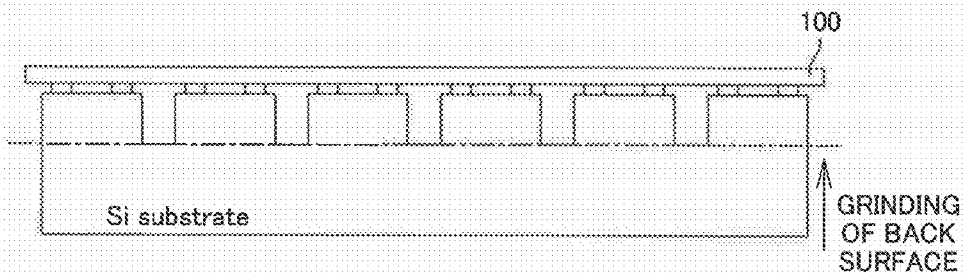
FIGS. 17A to 17F are schematic diagrams showing the step of separating individual chip resistors from a semiconductor wafer.

Step S20: Then, a protective tape 100 is bonded to a front surface of the resulting substrate as shown in FIG. 17A.

Figure 17B:
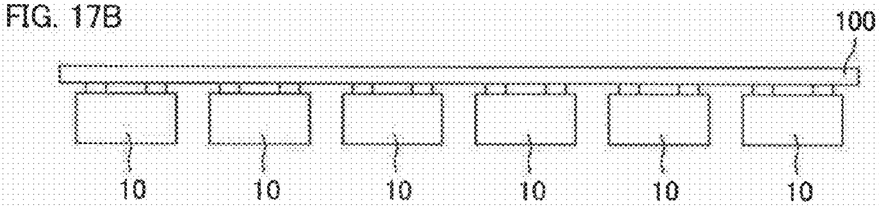

Step S21: Subsequently, a back surface of the silicon wafer is ground to separate the chip resistors 10 from each other (FIGS. 17A and 17B).

Figure 17C:
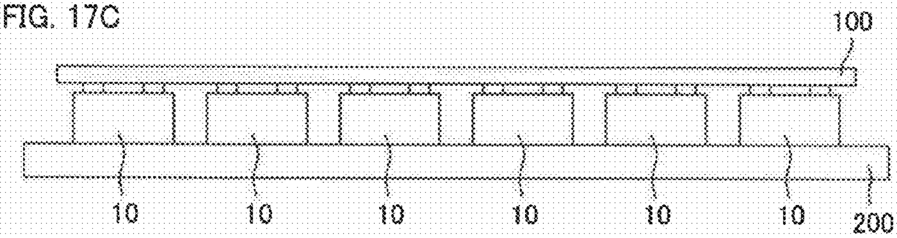
Figure 17D:
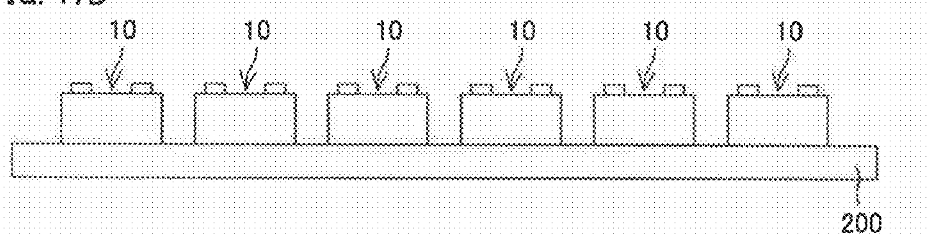

Step S22: Then, as shown in FIG. 17C, a carrier tape (thermally foamable sheet) 200 is bonded to the back surface, whereby the multiplicity of chip resistors 10 separated from each other are held in an array on the carrier tape 200. On the other hand, the protective tape is removed from the front surface (FIG. 17D).

Figure 17E:
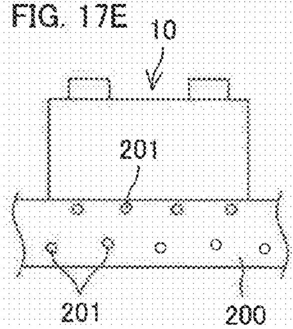
Figure 17F:
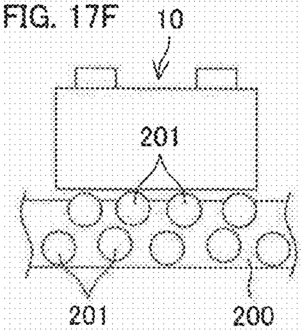

Step S23: When the thermally foamable sheet 200 is heated, thermally expandable particles 201 contained in the thermally foamable sheet 200 are expanded, whereby the chip resistors 10 bonded to the surface of the carrier tape 200 are removed from the carrier tape 200 to be separated from each other (FIGS. 17E and 17F). While the chip resistors have thus been described according to the embodiments of the present invention, the invention is applicable to chip components other than the chip resistors.

Another example of the chip component is a chip capacitor. The chip capacitor includes a substrate, a first external electrode provided on the substrate, and a second external electrode provided on the substrate. The first external electrode and the second external electrode are disposed, for example, on longitudinally opposite end portions of the substrate, and a capacitor provision region is provided between the first external electrode and the second external electrode. A plurality of capacitor elements are provided as functional elements in the capacitor provision region. The capacitor elements are electrically connected to the first external electrode via a plurality of fuses.

The present invention is applied to this chip capacitor, whereby interconnections and the fuses are integrally formed from an aluminum-containing interconnection film to eliminate the aforementioned problem. Further another example of the chip component is a chip inductor. The chip inductor has a multilevel interconnection structure provided on a substrate, and inductor elements (coils) and associated interconnections are provided in the multilevel interconnection structure. The chip inductor is configured such that desired ones of the inductor elements in the multilevel interconnection structure are incorporated into a circuit or isolated from the circuit by operating the fuses. A smaller-size and higher-performance chip inductor (chip component) can be provided by integrally forming interconnections and the fuses from an aluminum-containing interconnection film.

Still another example of the chip component is a chip diode. The chip diode has a multilevel interconnection structure on a substrate, and a plurality of diode elements and associated interconnections are provided in the multilevel interconnection structure. The chip diode is configured such that desired ones of the diode elements in the multilevel interconnection structure are incorporated into a circuit or isolated from the circuit by operating the fuses. The rectification characteristics of the chip diode can be changed or adjusted by selectively incorporating the diode elements. Further, the voltage drop characteristic (resistance) of the chip diode can be properly set. Where the chip diode is a chip LED (light emitting diode) including LED elements, the light emitting color of the chip LED can be selected by selectively incorporating the LED elements in a circuit. A smaller-size, higher-performance and easy-to-handle chip diode and chip LED (chip components) can be provided by integrally forming interconnections and the fuses from an aluminum-containing interconnection film.

It should be understood that the present invention be not limited to the production method according to the aforementioned embodiment, but various design modifications may be made within the scope of the present invention defined by the appended claims. For example, production process steps not specified by the claims may be modified, obviated or added within the scope of the present invention.

First Reference Embodiment of Present Invention

(1) Inventive Features of First Reference Embodiment

The first reference embodiment has, for example, the following inventive features (A1) to (A11):

(A1) A chip resistor is provided, which includes a substrate, a plurality of resistor elements each having a resistive film provided on the substrate and an interconnection film provided on the resistive film in contact with the resistive film, an electrode provided on the substrate, and a plurality of fuses disconnectably connecting the resistor elements to the electrode, wherein the resistive film is made of at least one material selected from the group consisting of NiCr, NiCrAl, NiCrSi, NiCrSiAl, TaN, $TaSiO_2$, TiN, TiNO and TiSiON.

With this arrangement, the resistive film is made of at least one material selected from the group consisting of NiCr, NiCrAl, NiCrSi, NiCrSiAl, TaN, $TaSiO_2$, TiN, TiNO and TiSiON and, therefore, is suitable for micro-processing. Further, the chip resistor has an accurate resistance that is less likely to be influenced by temperature characteristics.

(A2) In the chip resistor of the feature (A1), the resistive film has a temperature coefficient of less than 1000 ppm/° C.

With this arrangement, the temperature coefficient of the resistive film is less than 1000 ppm/° C. and, therefore, the resistance is substantially free from the influence of the temperature characteristics.

(A3) In the chip resistor of the feature (A2), the temperature coefficient of the resistive film is 50 ppm/° C. to 200 ppm/° C. With this arrangement, the chip resistor has an accurate resistance that is less likely to be influenced by the temperature characteristics.

(A4) In the chip resistor of any one of the features (A1) to (A3), the resistive film has a thickness of 300 Å to 1 μm.

Where the resistive film has a thickness in this range, a temperature coefficient of 50 ppm/° C. to 200 ppm/° C. can be achieved.

(A5) In the chip resistor of any one of the features (A1) to (A4), the resistor elements each include a linear element having a line width of 1 μm to 1.5 μm. With this arrangement, the chip resistor has micro-processed elements.

(A6) In the chip resistor of the feature (A5), the resistor elements each include conductive film pieces provided on the resistive film and spaced a predetermined distance from each other in a linear element extending direction, and a portion of the resistive film not provided with the conductive film pieces spaced the predetermined distance from each other functions as a single unit resistor body.

With this arrangement, the chip resistor may include unit resistor bodies connected in series to be thereby imparted with an accurate resistance value.

(A7) In the chip resistor of any one of the features (A1) to (A6), the conductive film pieces provided on the resistive film and the fuses are metal films provided at the same level and made of the same material.

With this arrangement, the metal films (conductor films) having different functions can be simultaneously easily formed by a simplified production process having a smaller number of process steps.

(A8) In the chip resistor of the feature (A6) or (A7), unit resistor bodies are connected in series to one another to form a resistor circuit. With this arrangement, the chip resistor can be provided, which has a resistance value easily adjusted at a higher resistance level.

(A9) In the chip resistor of the feature (A8), the resistor circuit includes plural types of resistor circuits which include plural types of serial resistor circuits each including unit resistor bodies whose number is defined by an increasing geometric progression, the unit resistor bodies being connected in series to one another and having the same resistance value.

With this arrangement, the chip resistor can be provided, which has a resistance value easily adjusted at a higher resistance value.

(A10) In the chip resistor of the feature (A8), the resistor circuit includes plural types of resistor circuits which include plural types of parallel resistor circuits each including unit resistor bodies whose number is defined by an increasing geometric progression, the unit resistor bodies being connected in parallel to one another and having the same resistance value.

With this arrangement, the chip resistor can be provided, which has a resistance value easily adjusted at a lower resistance level.

(A11) In the chip resistor of the feature (A8), the resistor circuit includes plural types of resistor circuits which include plural types of serial resistor circuits each including unit resistor bodies whose number is defined by an increasing geometric progression, the unit resistor bodies of each of the serial resistor circuits being connected in series to one another and having the same resistance value, and plural types of parallel resistor circuits each including unit resistor bodies whose number is defined by an increasing geometric progression, the unit resistor bodies of each of the parallel resistor circuits being connected in parallel to one another and having the same resistance value.

With this arrangement, the chip resistor can be provided, which has a resistance value easily adjusted at various resistance levels.

(2) Examples of First Reference Embodiment of Present Invention

Examples of the first reference embodiment will hereinafter be described in detail with reference to the attached drawings. Reference characters shown in FIGS. 19A to 38 are effective only in FIGS. 19A to 38, so that components designated by these reference characters could be different from those designated by the same reference characters in other embodiments.

Figure 19A:
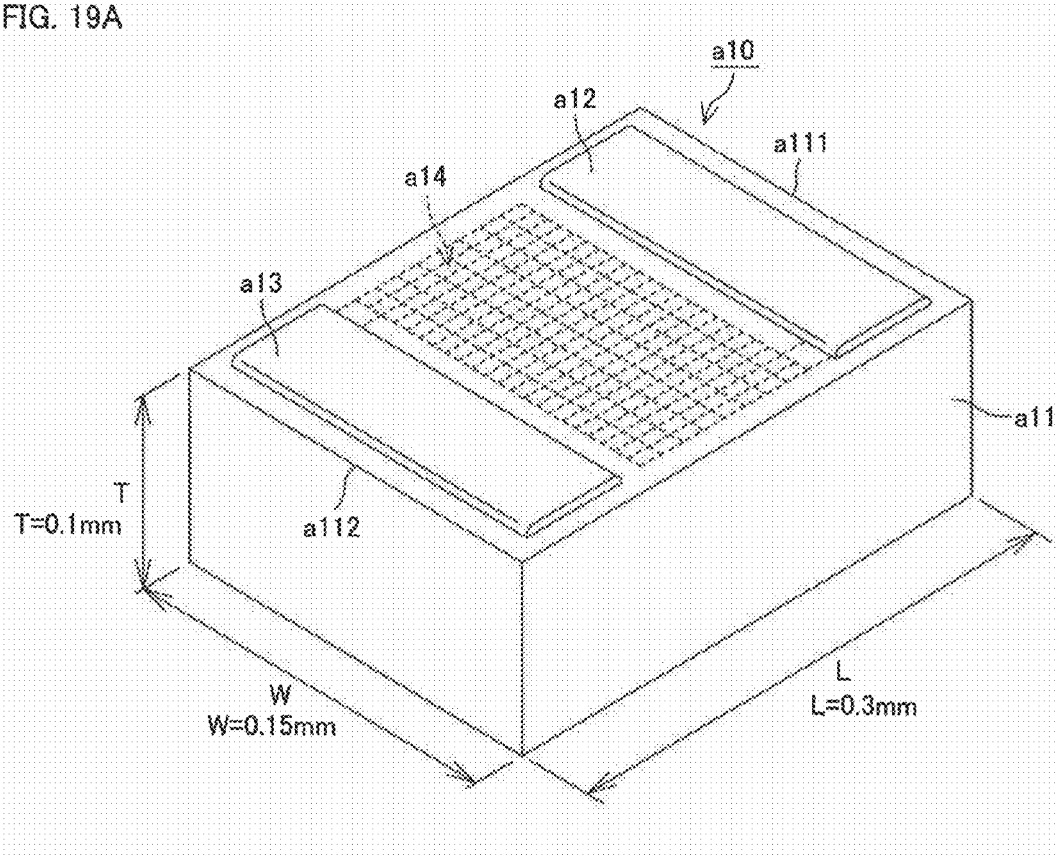
FIG. 19A is a schematic perspective view showing the appearance of a chip resistor a10 according to an example of a first reference embodiment.
Figure 19B:
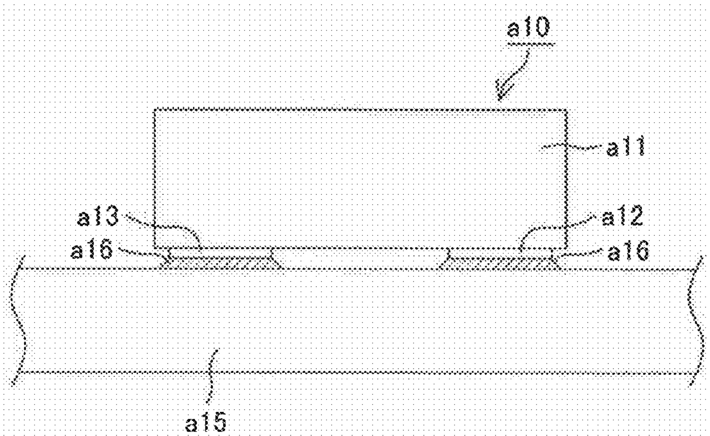
FIG. 19B is a side view of the chip resistor a10, which is mounted on a substrate.

FIG. 19A is a schematic perspective view showing the appearance of a chip resistor a10 according to an example of the first reference embodiment, and FIG. 19B is a side view of the chip resistor a10, which is mounted on a substrate. Referring to FIG. 19A, the chip resistor a10 according to the example of the first reference embodiment includes a first connection electrode a12, a second connection electrode a13, and a resistor circuit network a14 which are provided on a substrate a11. The substrate a11 is a minute rectangular prismatic chip having a generally rectangular plan shape and, for example, has a length L of about 0.3 mm as measured longitudinally thereof, a width W of about 0.15 mm as measured widthwise thereof and a thickness T of about 0.1 mm. The substrate a11 may have rounded corners as seen in plan. The substrate may be made of, for example, silicon, glass, ceramic or the like. In the following example, the substrate a11 is a silicon substrate by way of example.

Figure 36:
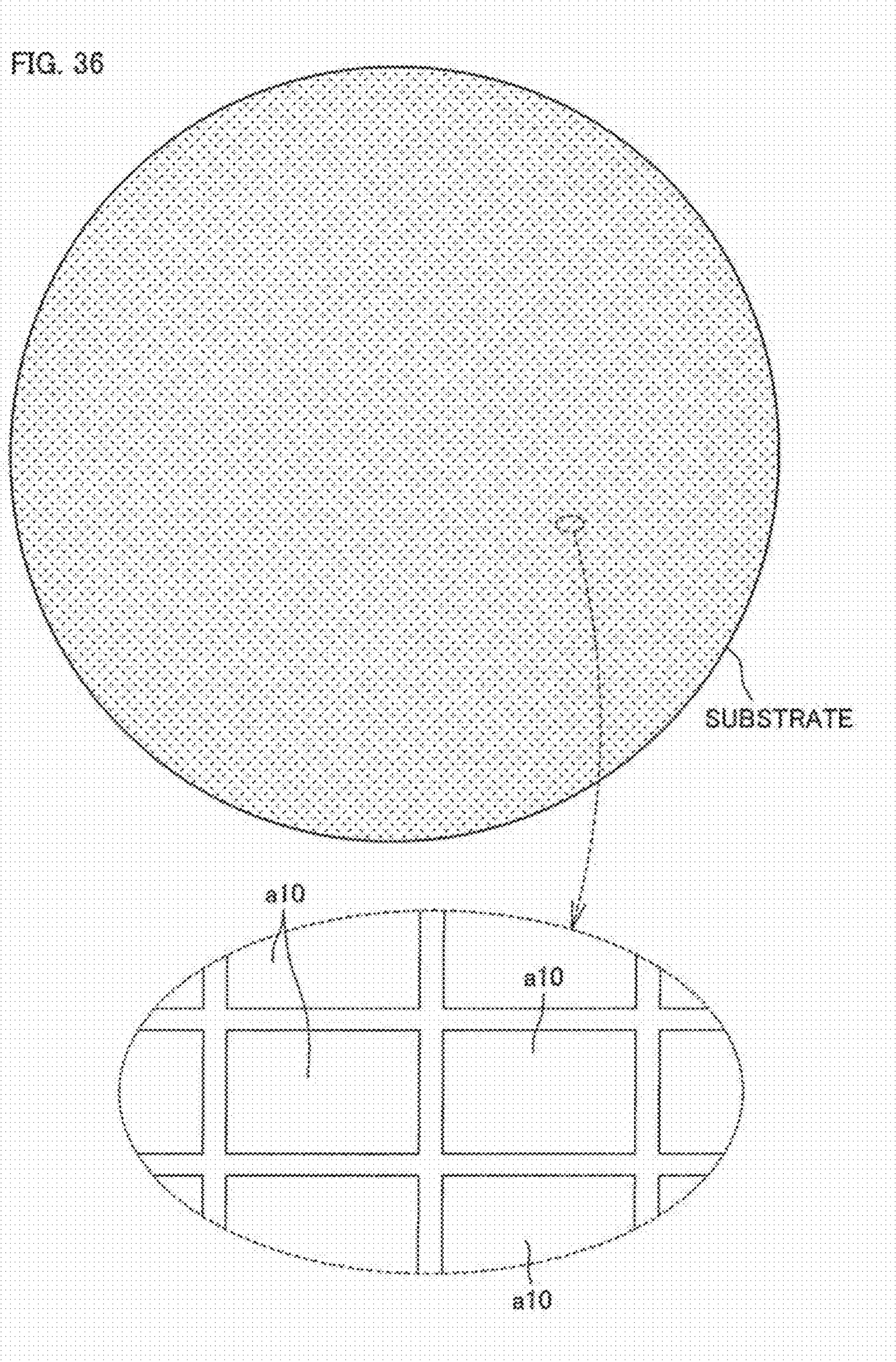
FIG. 36 is schematic diagram for explaining how to separate the chip resistors from the substrate.

The chip resistor a10 is obtained by forming a multiplicity of chip resistors a10 in a lattice form on a substrate, and cutting the substrate into the individual chip resistors a10 as shown in FIG. 36. The first connection electrode a12 is a rectangular electrode provided on the substrate a11 alongside one shorter edge a111 of the substrate a11 and elongated in the direction of the shorter edge a111. The second connection electrode a13 is a rectangular electrode provided on the substrate a11 alongside the other shorter edge a112 of the substrate a11 and elongated in the direction of the shorter edge a112. The resistor circuit network a14 is provided on a middle region (a circuit formation surface or a device formation surface) of the substrate a11 between the first connection electrode a12 and the second connection electrode a13. One end of the resistor circuit network a14 is electrically connected to the first connection electrode a12, and the other end of the resistor circuit network a14 is electrically connected to the second connection electrode a13. The first connection electrode a12, the second connection electrode a13 and the resistor circuit network a14 can be provided on the substrate a11, for example, by a microprocessing process. Particularly, the resistor circuit network a14 can be formed as having a minute and precise layout pattern by utilizing a photolithography process to be described later.

The first connection electrode a12 and the second connection electrode a13 each function as an external connection electrode. With the chip resistor a10 mounted on a circuit substrate a15, as shown in FIG. 19B, the first connection electrode a12 and the second connection electrode a13 are electrically and mechanically connected to a circuit (not shown) of the circuit substrate a15 by solder. At least surface portions of the first connection electrode a12 and the second connection electrode a13 each functioning as the external connection electrode are desirably made of gold (Au) or plated with gold for improvement of solder wettability and for improvement of reliability.

Figure 20:
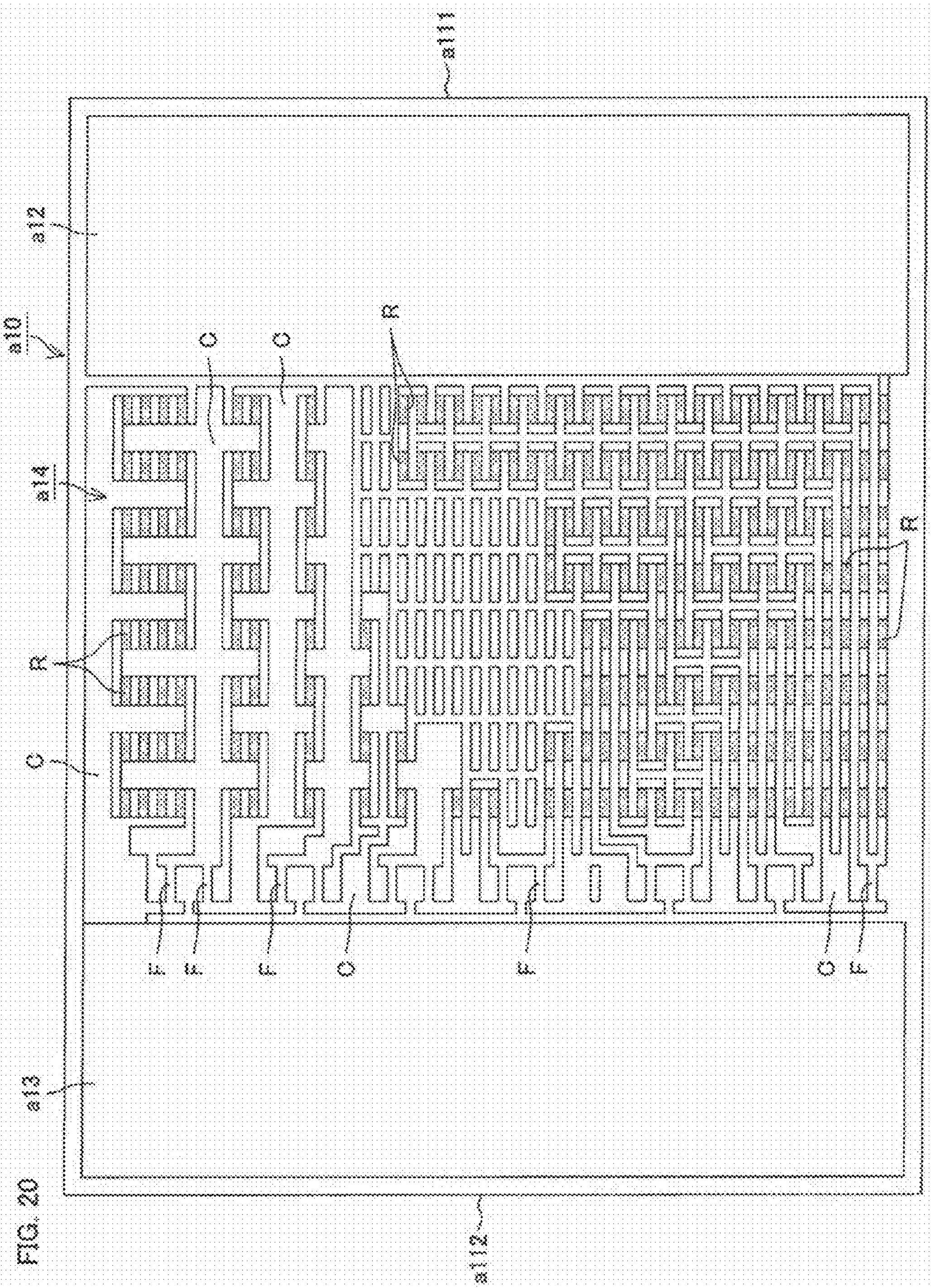
FIG. 20 is a plan view of the chip resistor a10, showing the layout of a first connection electrode a12, a second connection electrode a13 and a resistor circuit network a14, and the configuration of the resistor circuit network a14 as viewed in plan.

FIG. 20 is a plan view of the chip resistor a10, showing the layout of the first connection electrode a12, the second connection electrode a13 and the resistor circuit network a14, and the configuration (layout pattern) of the resistor circuit network a14 as viewed in plan. In the chip resistor a10, referring to FIG. 20, the first connection electrode a12 has a longer edge extending along the one shorter edge a111 of the upper surface of the substrate a11, and has a generally rectangular shape as seen in plan. The second connection electrode a13 has a longer edge extending along the other shorter edge a112 of the upper surface of the substrate a11, and has a generally rectangular shape as seen in plan. The resistor circuit network a14 is provided in the rectangular region between the first connection electrode a12 and the second connection electrode a13 as seen in plan.

The resistor circuit network a14 includes a multiplicity of unit resistor bodies R arranged in a matrix array on the substrate a11 and each having the same resistance value (in FIG. 20, the resistor circuit network a14 is configured to include 352 unit resistor bodies R in total with 8 unit resistor bodies R aligned in each row (longitudinally of the substrate a11) and with 44 unit resistor bodies R aligned in each column (widthwise of the substrate a11)). The multiplicity of unit resistor bodies R are grouped into predetermined numbers, and a predetermined number of unit resistor bodies R (1 to 64 unit resistor bodies R) in each group are electrically connected to one another by conductor films C (which are portions of an interconnection film made of an aluminum-containing metal such as Al, AlSi, AlSiCu or AlCu), whereby plural types of resistor circuits are formed according to the numbers of the connected unit resistor bodies R.

Further, a plurality of fusible fuse films F (preferably, portions of the interconnection film made of the aluminum-containing metal such as Al, AlSi, AlSiCu or AlCu which is the same material as for the conductor films C, and hereinafter sometimes referred to simply as "fuses") are provided for electrically incorporating the resistor circuits into the resistor circuit network a14 or electrically isolating the resistor circuits from the resistor circuit network a14. The fuse films F are arranged in a linear region alongside an inner edge of the second connection electrode a13. More specifically, the fuse films F and connection conductor films C are arranged in adjacent relation, and the arrangement direction extends linearly.

Figure 21A:
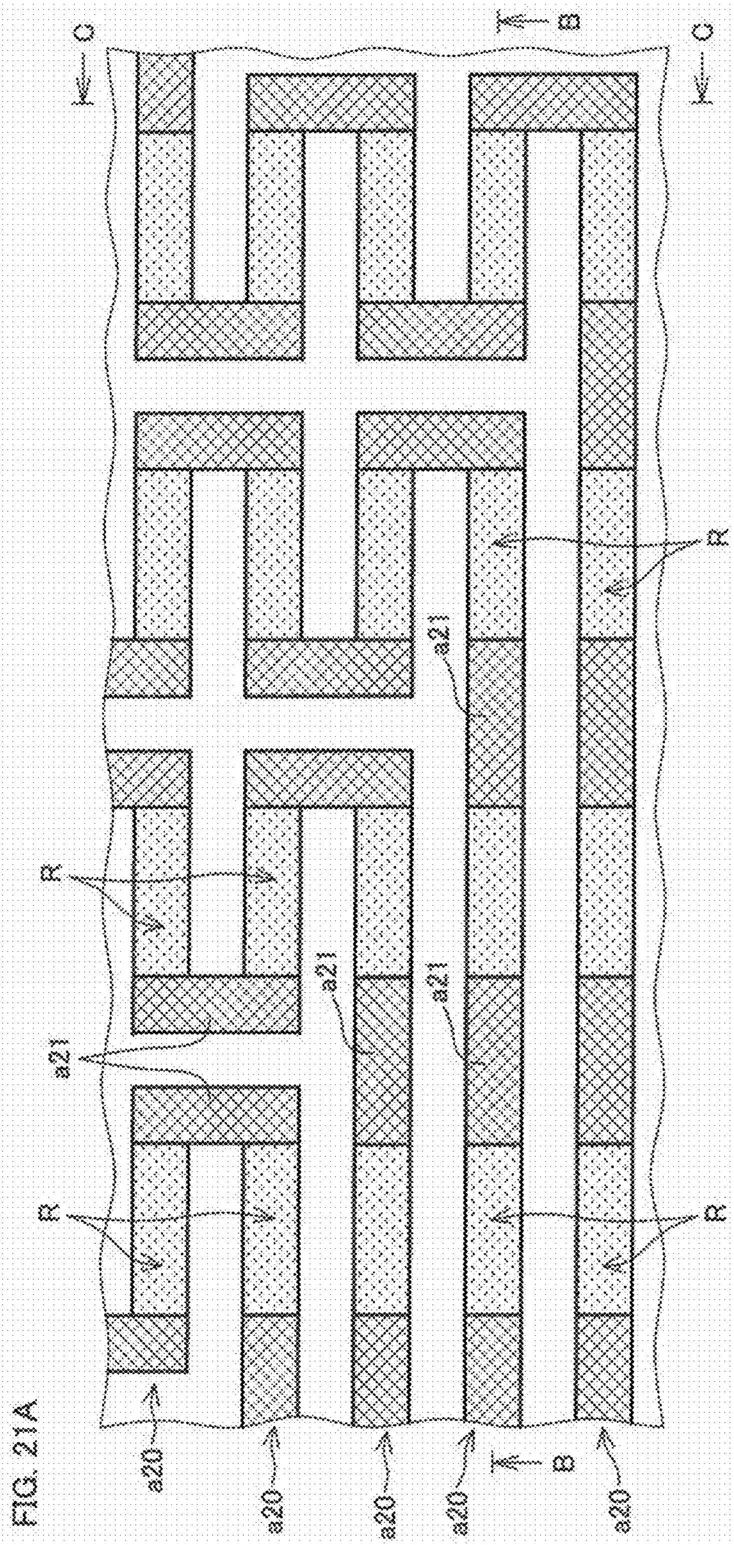
FIG. 21A is a plan view illustrating a part of the resistor circuit network a14 shown in FIG. 20 on an enlarged scale.
Figure 21B:
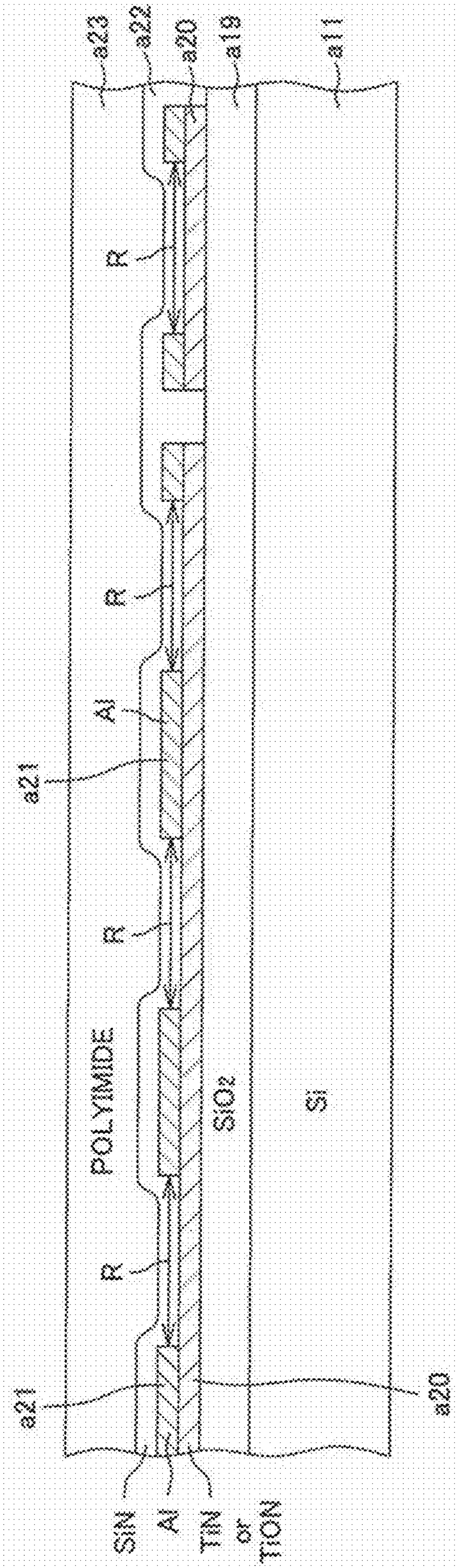
FIG. 21B is a longitudinal vertical sectional view for explaining the structure of resistor bodies R in the resistor circuit network a14.
Figure 21C:
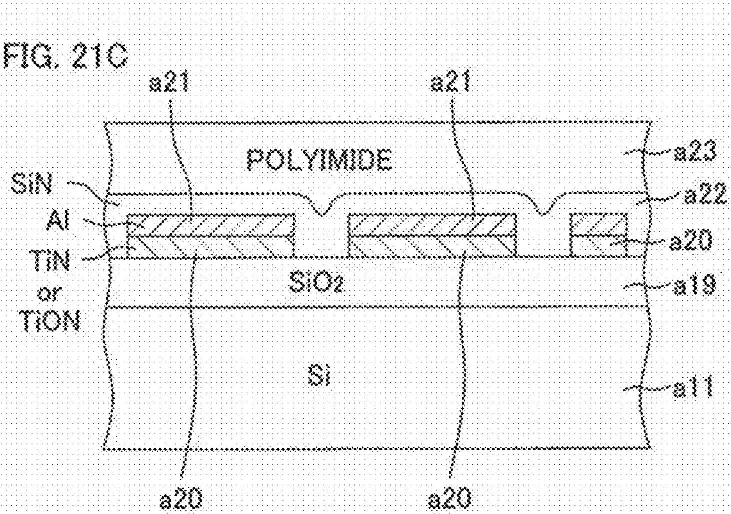
FIG. 21C is a widthwise vertical sectional view for explaining the structure of the resistor bodies R in the resistor circuit network a14.

FIG. 21A is a plan view illustrating a part of the resistor circuit network a14 shown in FIG. 20 on an enlarged scale. FIGS. 21B and 21C are a longitudinal vertical sectional view and a widthwise vertical sectional view, respectively, for explaining the structure of the unit resistor bodies R of the resistor circuit network a14. Referring to FIGS. 21A, 21B and 21C, the structure of the unit resistor bodies R will be described.

An insulative layer (of $SiO_2$) a19 is provided on the upper surface of the substrate a11, and a resistive film a20 is provided on the insulative layer a19. The resistive film a20 is made of at least one material selected from the group consisting of NiCr, NiCrAl, NiCrSi, NiCrSiAl, TaN, $TaSiO_2$, TiN, TiON and TiSiON. The resistive film a20, which is made of any of these materials, can be microprocessed by the photolithography. Further, the chip resistor can be produced as having an accurate resistance that is less likely to be influenced by temperature characteristics. The resistive film a20 includes a plurality of resistive film portions (hereinafter referred to as "resistive film lines") linearly extending parallel to each other between the first connection electrode a12 and the second connection electrode a13. Some of the resistive film lines a20 are cut at predetermined positions with respect to a line extending direction. Conductive film pieces a21 (e.g., aluminum film pieces) are provided on the resistive film lines a20. The conductive film pieces a21 are spaced a predetermined distance R in the line extending direction on the resistive film lines a20.

Figure 22A:
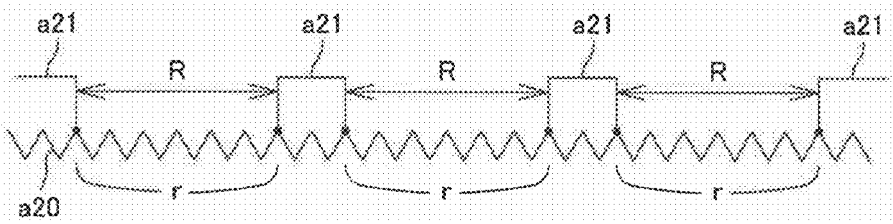
FIGS. 22A to 22C are diagrams showing the electrical characteristic features of a resistive film line a20 and a conductor film a21 by way of circuit symbols and electric circuit diagrams.
Figure 22B:
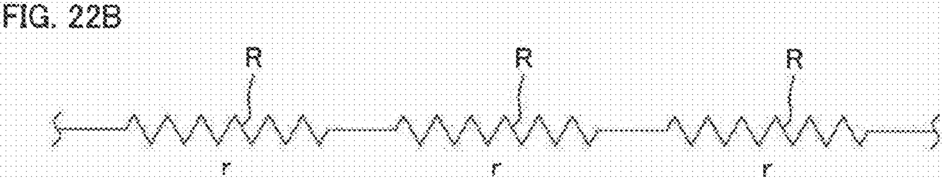
Figure 22C:
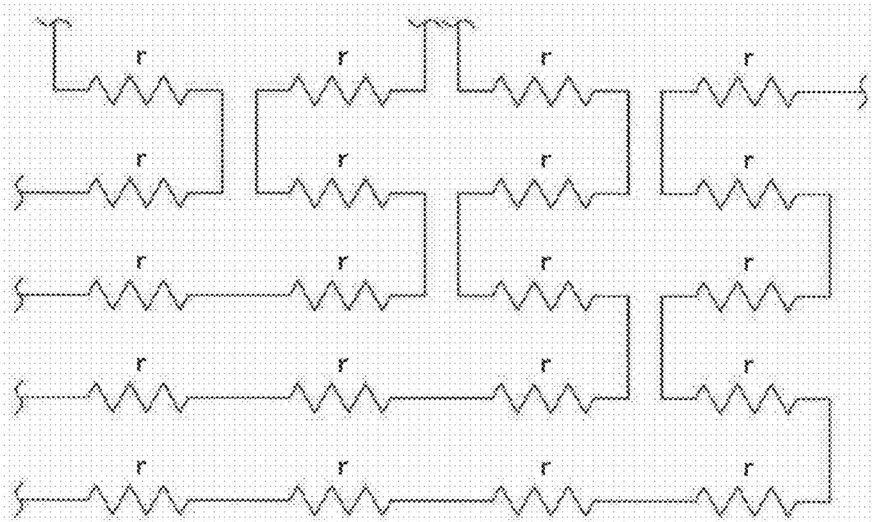

In FIGS. 22A to 22C, the electrical characteristic features of the resistive film lines a20 and the conductive film pieces a21 of this arrangement are shown by way of circuit symbols. As shown in FIG. 22A, portions of each of the resistive film lines a20 present between the conductive film pieces a21 spaced the predetermined distance R from one another each serve as a single unit resistor body R having a predetermined resistance value r. The conductive film pieces a21 cause short circuit in regions of the resistive film lines a20 on which the conductive film pieces a21 are provided. Thus, a resistor circuit is provided, in which unit resistor bodies R each having a resistance value r are connected in series as shown in FIG. 22B.

Further, adjacent resistive film lines a20 are connected to each other by the resistive film lines a20 and the conductive film pieces a21, so that a resistor circuit network shown in FIG. 21A constitutes a resistor circuit shown in FIG. 22C. In the schematic sectional views shown in FIGS. 21B and 21C, the reference numeral a11 designates the substrate, and the reference numeral a19 designates the silicon dioxide ($SiO_2$) insulative layer. The reference numeral a20 designates the resistive film provided on the insulative layer a19, and the reference numeral a21 designates an aluminum (Al) interconnection film. A reference numeral a22 designates an SiN protective film, and a reference numeral a23 designates a polyimide protective layer.

The material for the resistive film a20 is at least one material selected from the group consisting of NiCr, NiCrAl, NiCrSi, NiCrSiAl, TaN, $TaSiO_2$, TiN, TiON and TiSiON as described above. The resistive film a20 desirably has a thickness of 300 Å to 1 μm. Where the resistive film a20 has a thickness in this range, the resistive film a20 can have a temperature coefficient of 50 ppm/° C. to 200 ppm/° C. Thus, the chip resistor is less likely to be influenced by the temperature characteristics.

Where the temperature coefficient of the resistive film a20 is less than 1000 ppm/° C., the chip resistor is practically advantageous. Further, the resistive film a20 desirably includes linear elements each having a line width of 1 μm to 1.5 μm. Thus, the resistor circuits can be formed as having a minute configuration and advantageous temperature characteristics. The interconnection film a21 may be formed from an aluminum-containing metal film such as of AlSi, AlSiCu or AlCu, rather than formed of Al. By thus forming the interconnection film a21 (including the fuse films F) from the aluminum-containing metal film, the processing accuracy can be improved.

A production process for the resistor circuit network a14 having the aforementioned structure will be detailed later. In this example, the unit resistor bodies R included in the resistor circuit network a14 provided on the substrate a11 are constituted by the resistive film lines a20 and the plurality of conductive film pieces a21 spaced the predetermined distance from one another in the line extending direction on the resistive film lines a20. Portions of the resistive film lines a20 not provided with the conductive film pieces a21 spaced the predetermined distance R from one another each define a single unit resistor body R. The portions of the resistive film lines a20 defining the unit resistor bodies R each have the same shape and the same size. Therefore, the multiplicity of unit resistor bodies R arranged in the matrix array on the substrate a11 have the same resistance value. This is based on a characteristic feature that resistive film portions formed on a substrate as having the same shape and the same size have the same resistance value.

Figures 23A, 23B:
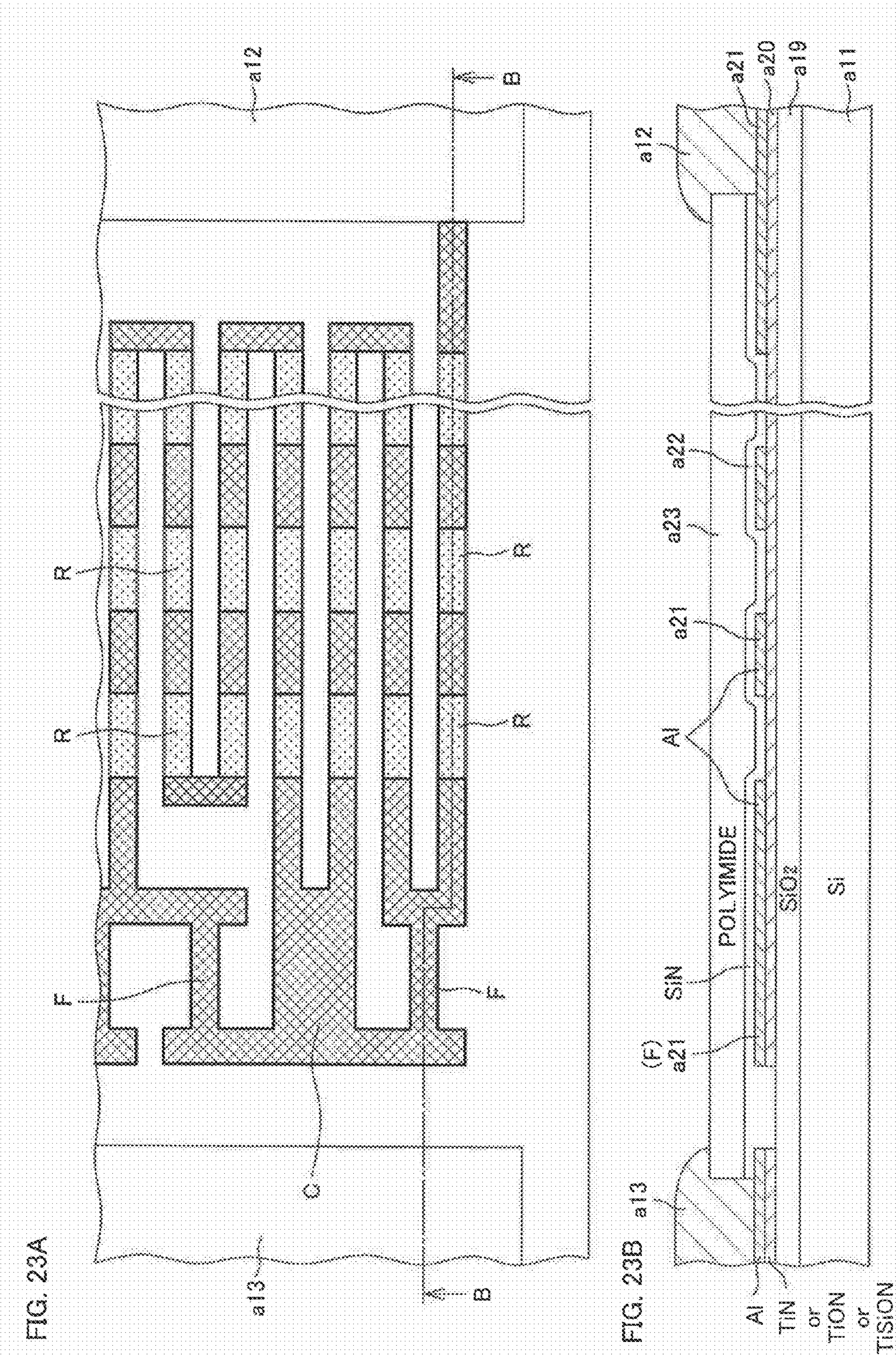
FIG. 23A is an enlarged partial plan view illustrating a region of the chip resistor including fuse films F shown in a part of the plan view of FIG. 20 on an enlarged scale.
FIG. 23B is a diagram showing a sectional structure taken along a line B-B in FIG. 23A.

The conductive film pieces a21 provided on the resistive film lines a20 define the unit resistor bodies R, and also serve as connection interconnection films for connecting the unit resistor bodies R to one another to provide the resistor circuits. FIG. 23A is an enlarged partial plan view illustrating a region of the chip resistor a10 including the fuse films F shown in a part of the plan view of FIG. 20 on an enlarged scale, and FIG. 23B is a diagram showing a sectional structure taken along a line B-B in FIG. 23A.

As shown in FIGS. 23A and 23B, the fuse films F are formed from the interconnection film a21 provided on the resistive film a20. That is, the fuse films F are formed of aluminum (Al), which is the same metal material as for the conductive film pieces a21 provided on the resistive film lines a20 to define the unit resistor bodies R, and provided at the same level as the conductive film pieces a21. As described above, the conductive film pieces a21 also serve as the connection conductor films C for electrically connecting the plurality of unit resistor bodies R to form the resistor circuits.

That is, interconnection film portions for defining the unit resistor bodies R, connection interconnection film portions for forming the resistor circuits, connection interconnection film portions for forming the resistor circuit network a14, the fuse films, and interconnection film portions for connecting the resistor circuit network a14 to the first connection electrode a12 and the second connection electrode a13 are provided at the same level on the resistive film a20, and formed from the same aluminum-containing metal material (e.g., aluminum) by the same production process (e.g., a sputtering and photolithography process). This simplifies the production process for this chip resistor a10. These interconnection film portions can be simultaneously formed by utilizing the same mask. Further, the interconnection film portions can be aligned with the resistive film a20 with higher alignment accuracy.

Figure 24:
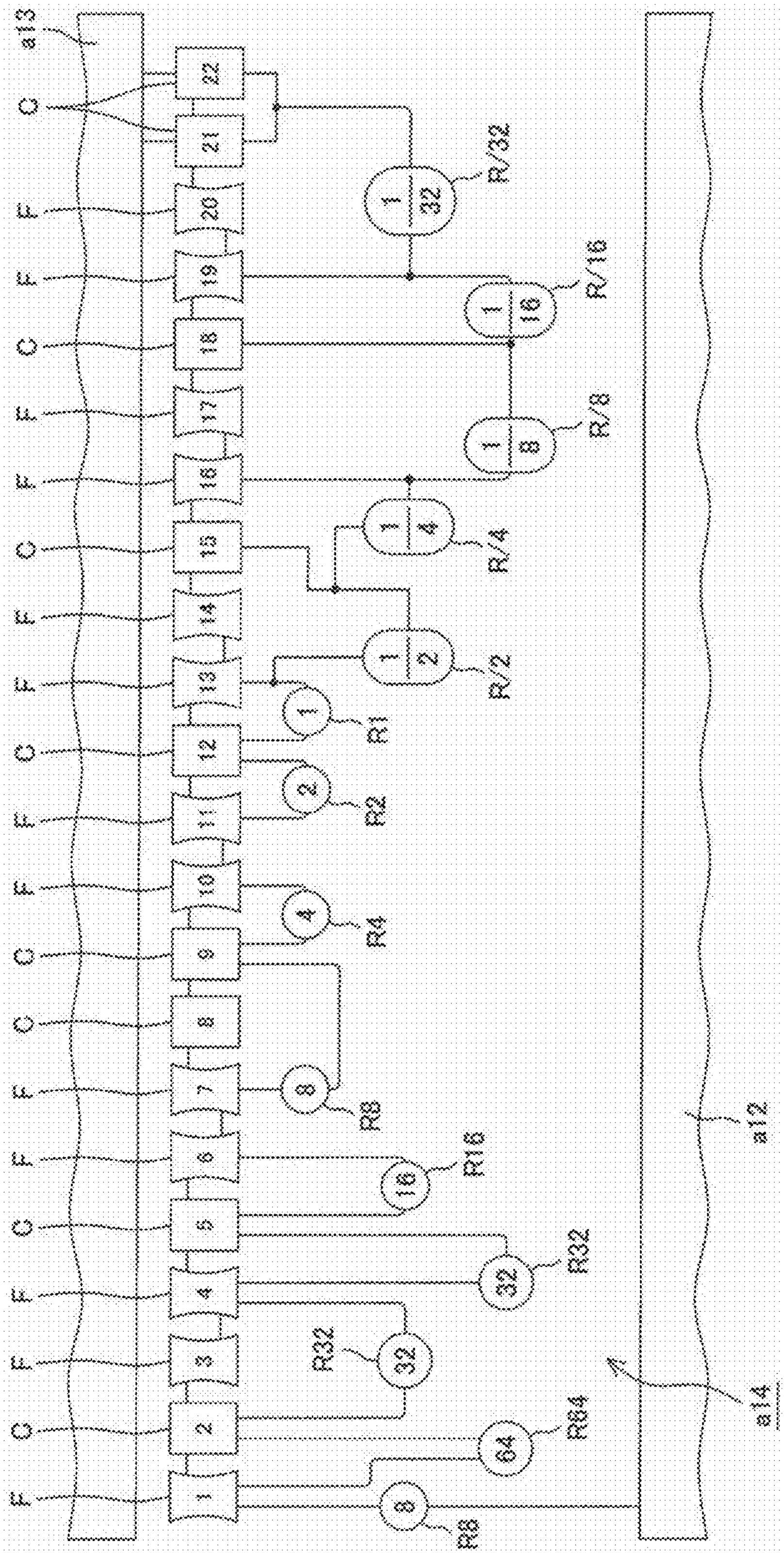
FIG. 24 is a schematic diagram showing the layout of connection conductor films C and fuse films F which connect plural types of resistor units in the resistor circuit network a14 shown in FIG. 20, and the connection of the plural types of resistor units connected via the connection conductor films C and the fuse films F.

FIG. 24 is a schematic diagram showing the layout of the connection conductor films C and the fuse films F which connect the plural types of resistor circuits in the resistor circuit network a14 shown in FIG. 20, and the connection of the plural types of resistor circuits to the connection conductor films C and the fuse films F. Referring to FIG. 24, one end of a reference resistor circuit R8 of the resistor circuit network a14 is connected to the first connection electrode a12. The reference resistor circuit R8 includes 8 unit resistor bodies R connected in series, and the other end of the reference resistor circuit R8 is connected to a fuse film F1.

A resistor circuit R64 including 64 unit resistor bodies R connected in series is connected at its opposite ends to the fuse film F1 and a connection conductor film C2. A resistor circuit R32 including 32 unit resistor bodies R connected in series is connected at its opposite ends to the connection conductor film C2 and a fuse film F4. Another resistor circuit R32 including 32 unit resistor bodies R connected in series is connected at its opposite ends to the fuse film F4 and a connection conductor film C5.

A resistor circuit R16 including 16 unit resistor bodies R connected in series is connected at its opposite ends to the connection conductor film C5 and a fuse film F6. A resistor circuit R8 including 8 unit resistor bodies R connected in series is connected at its opposite ends to a fuse film F7 and a connection conductor film C9. A resistor circuit R4 including 4 unit resistor bodies R connected in series is connected at its opposite ends to the connection conductor film C9 and a fuse film F10.

A resistor circuit R2 including 2 unit resistor bodies R connected in series is connected at its opposite ends to a fuse film F11 and a connection conductor film C12. A resistor circuit R1 including a single unit resistor body R is connected at its opposite ends to the connection conductor film C12 and a fuse film F13. A resistor circuit R/2 including 2 unit resistor bodies R connected in parallel is connected at its opposite ends to the fuse film F13 and a connection conductor film C15.

A resistor circuit R/4 including 4 unit resistor bodies R connected in parallel is connected at its opposite ends to the connection conductor film C15 and a fuse film F16. A resistor circuit R/8 including 8 unit resistor bodies R connected in parallel is connected at its opposite ends to the fuse film F16 and a connection conductor film C18. A resistor circuit R/16 including 16 unit resistor bodies R connected in parallel is connected at its opposite ends to the connection conductor film C18 and a fuse film F19.

A resistor circuit R/32 including 32 unit resistor bodies R connected in parallel is connected at its opposite ends to the fuse film F19 and a connection conductor film C22. The fuse films F and the connection conductor films C including the fuse film F1, the connection conductor film C2, the fuse film F3, the fuse film F4, the connection conductor film C5, the fuse film F6, the fuse film F7, the connection conductor film C8, the connection conductor film C9, the fuse film F10, the fuse film F11, the connection conductor film C12, the fuse film F13, the fuse film F14, the connection conductor film C15, the fuse film F16, the fuse film F17, the connection conductor film C18, the fuse film F19, the fuse film F20, the connection conductor film C21 and the connection conductor film C22 are linearly arranged and connected in series. Where a fuse film F is fused off, electrical connection between that fuse film F and an adjacent connection conductor film C connected to that fuse film F is cut off.

Figure 25:
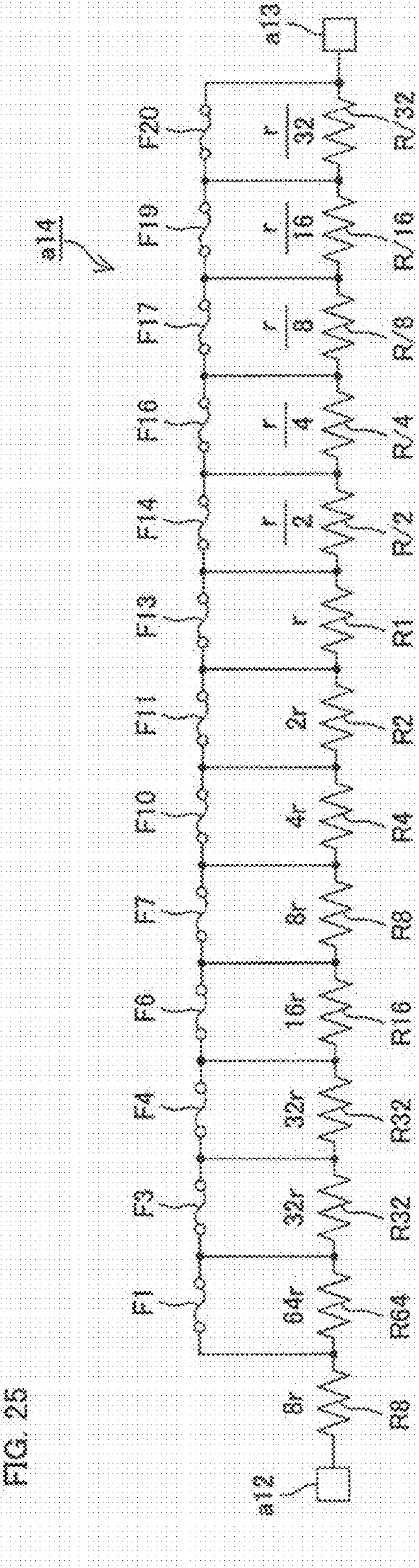
FIG. 25 is an electric circuit diagram of the resistor circuit network a14.

This configuration is represented by an electric circuit diagram of FIG. 25. That is, with none of the fuse films F fused off, the resistor circuit network a14 is configured such that the reference resistor circuit R8 (having a resistance value of 8r) including 8 unit resistor bodies R connected in series is provided between the first connection electrode a12 and the second connection electrode a13. Where the unit resistor bodies R each have a resistance value r of r=80Ω, for example, the chip resistor a10 is configured such that the first connection electrode a12 and the second connection electrode a13 are connected to each other through a resistor circuit having a resistance value of 8r=640Ω.

Except the reference resistor circuit R8, the plural types of resistor circuits to which the corresponding fuse films F are connected in parallel are short-circuited by the corresponding fuse films F. That is, 12 types of 13 resistor circuits R64 to R/32 are connected in series to the reference resistor circuit R8, but are short-circuited by the fuse films F connected in parallel thereto. Therefore, the resistor circuits are not electrically incorporated in the resistor circuit network a14.

In the chip resistor a10 according to this example, the fuse films F are selectively fused off, for example, by a laser beam according to the required resistance value. Thus, a resistor circuit connected in parallel to a fused fuse film F is incorporated in the resistor circuit network a14. Therefore, the resistor circuit network a14 has an overall resistance value which is controlled by connecting, in series, resistor circuits incorporated by fusing off the corresponding fuse films F.

In other words, the chip resistor a10 according to this example is configured such that the plural types of resistor circuits can be selectively incorporated in the resistor circuit network by selectively fusing off the fuse films provided in association with the plural types of resistor circuits (for example, a serial connection circuit including the resistor circuits R64, R32, R1 can be incorporated by fusing off the fuse films F1, F4, F13). Since the plural types of resistor circuits each have a predetermined resistance value, the resistance value of the resistor circuit network a14 can be controlled in a so-called digital manner to provide the chip resistor a10 having the required resistance value.

Further, the plural types of resistor circuits include plural types of serial resistor circuits which respectively include 1, 2, 4, 8, 16, 32 and 64 unit resistor bodies R (whose number increases in a geometrically progressive manner) each having the same resistance value and connected in series, and plural types of parallel resistor circuits which respectively include 2, 4, 8, 16 and 32 unit resistor bodies R (whose number increases in a geometrically progressive manner) each having the same resistance value and connected in parallel. These resistor circuits are connected in series in a short-circuited state by the fuse films F. Therefore, the overall resistance value of the resistor circuit network a14 can be controlled to a desired resistance value in a wide range from a lower resistance level to a higher resistance level by selectively fusing off the fuse films F.

Figure 26:
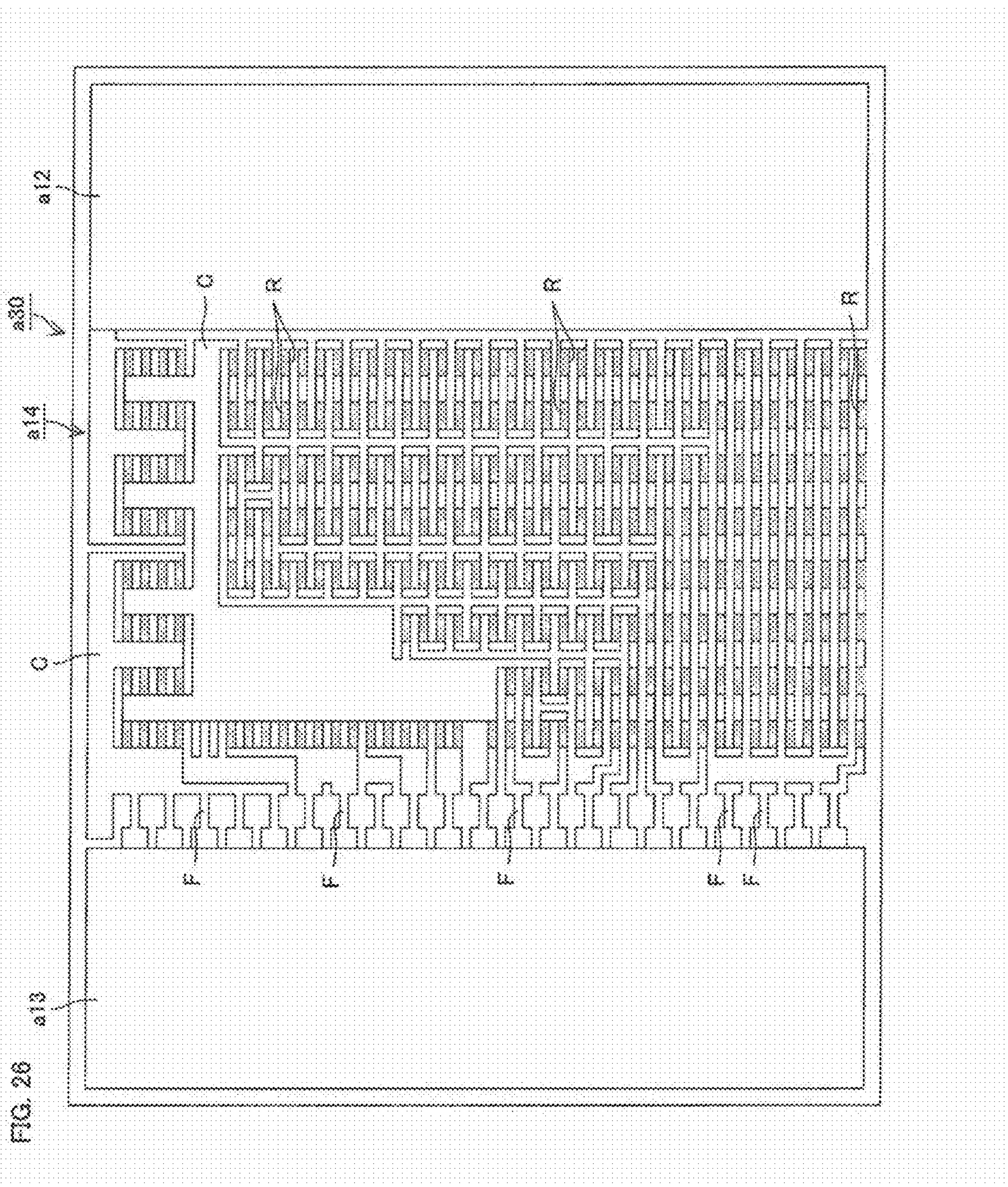
FIG. 26 is a plan view of a chip resistor a30, showing the layout of a first connection electrode a12, a second connection electrode a13 and a resistor circuit network a14, and the configuration of the resistor circuit network a14 as viewed in plan.

FIG. 26 is a plan view of a chip resistor a30 according to another example of the first reference embodiment, showing the layout of a first connection electrode a12, a second connection electrode a13 and a resistor circuit network a14, and the configuration of the resistor circuit network a14 as viewed in plan. The chip resistor a30 is different from the chip resistor a10 in that the unit resistor bodies R are connected in a different manner in the resistor circuit network a14.

More specifically, the resistor circuit network a14 of the chip resistor a30 includes a multiplicity of unit resistor bodies R arranged in a matrix array on a substrate a11 and each having the same resistance value (in FIG. 26, the resistor circuit network a14 is configured to include 352 unit resistor bodies R in total with 8 unit resistor bodies R aligned in each row (longitudinally of the substrate a11) and with 44 unit resistor bodies R aligned in each column (widthwise of the substrate a11)). The multiplicity of unit resistor bodies R are grouped into predetermined numbers, and a predetermined number of unit resistor bodies R (1 to 128 unit resistor bodies R) in each group are electrically connected to one another, whereby plural types of resistor circuits are formed. The plural types of resistor circuits thus formed are connected in parallel to one another via a conductor film and fuse films F serving as circuit network connection means. The fuse films F are arranged in a linear region alongside an inner edge of the second connection electrode a13. With a fuse film F fused off, a resistor circuit connected to that fuse film is electrically isolated from the resistor circuit network a14.

Figure 27:
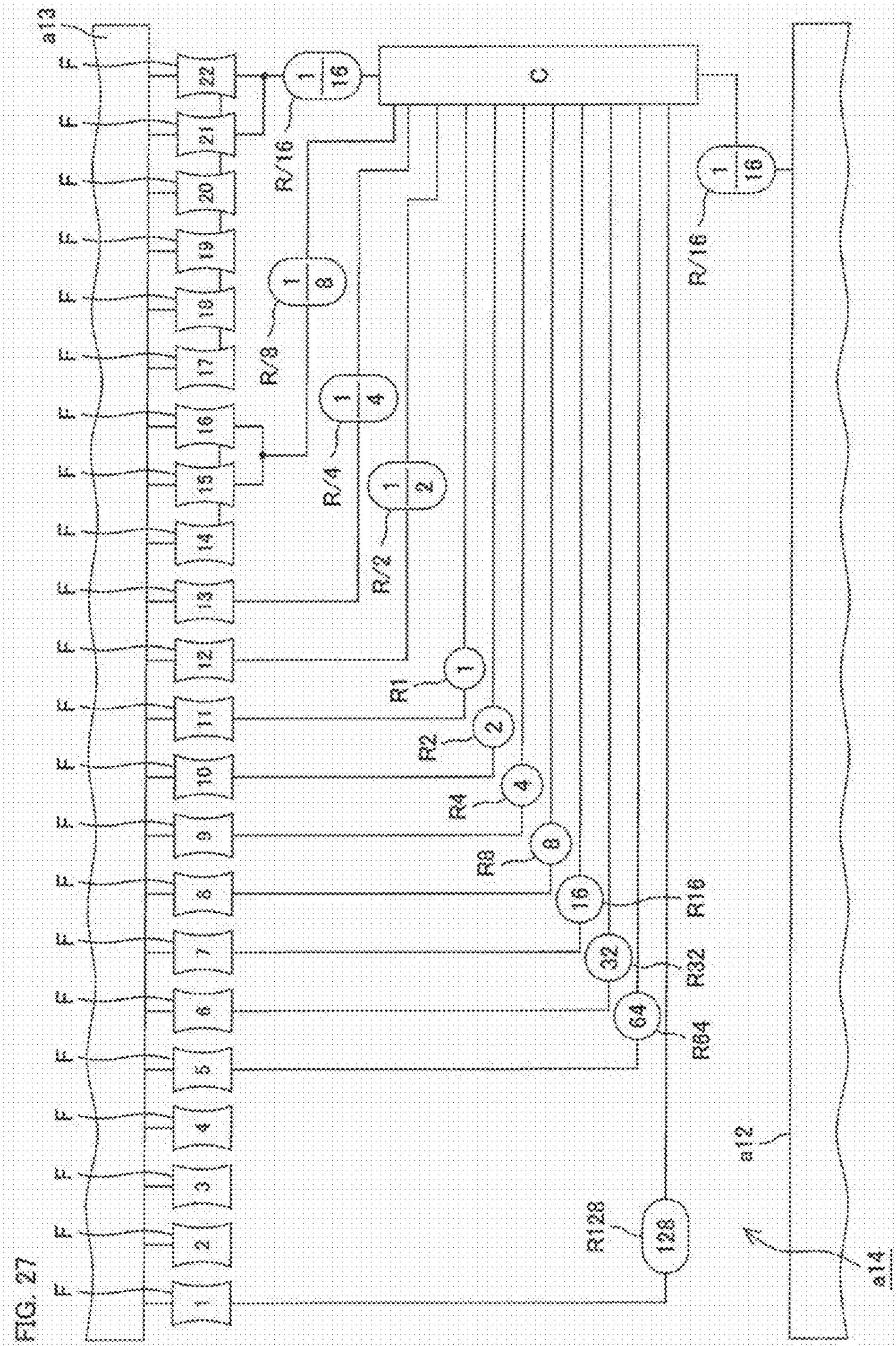
FIG. 27 is a schematic diagram showing the layout of a connection conductor film C and fuse films F which connect plural types of resistor units in the resistor circuit network a14 shown in FIG. 26, and the connection of the plural types of resistor units connected via the connection conductor film C and the fuse films F.

The materials for and the structures of the multiplicity of unit resistor bodies R of the resistor circuit network a14, and the materials for and the structures of the connection conductor film and the fuse films F are the same as those in the aforementioned chip resistor a10. Therefore, duplicate description will be omitted. FIG. 27 is a schematic diagram showing the connection of the plural types of resistor circuits in the resistor circuit network shown in FIG. 26, the layout of the fuse films F connecting the resistor circuits, and the connection of the plural types of resistor circuits to the fuse films F.

Referring to FIG. 27, one end of a reference resistor circuit R/16 of the resistor circuit network a14 is connected to the first connection electrode a12. The reference resistor circuit R/16 includes 16 unit resistor bodies R connected in parallel, and the other end of the reference resistor circuit R/16 is connected to the connection conductor film C to which the other resistor circuits are connected. A resistor circuit R128 including 128 unit resistor bodies R connected in series is connected at its opposite ends to a fuse film F1 and the connection conductor film C.

A resistor circuit R64 including 64 unit resistor bodies R connected in series is connected at its opposite ends to a fuse film F5 and the connection conductor film C. A resistor circuit R32 including 32 unit resistor bodies R connected in series is connected at its opposite ends to a fuse film F6 and the connection conductor film C. A resistor circuit R16 including 16 unit resistor bodies R connected in series is connected at its opposite ends to a fuse film F7 and the connection conductor film C.

A resistor circuit R8 including 8 unit resistor bodies R connected in series is connected at its opposite ends to a fuse film F8 and the connection conductor film C. A resistor circuit R4 including 4 unit resistor bodies R connected in series is connected at its opposite ends to a fuse film F9 and the connection conductor film C. A resistor circuit R2 including 2 unit resistor bodies R connected in series is connected at its opposite ends to a fuse film F10 and the connection conductor film C.

A resistor circuit R1 including a single unit resistor body R is connected at its opposite ends to a fuse film F11 and the connection conductor film C. A resistor circuit R/2 including 2 unit resistor bodies R connected in parallel is connected at its opposite ends to a fuse film F12 and the connection conductor film C. A resistor circuit R/4 including 4 unit resistor bodies R connected in parallel is connected at its opposite ends to a fuse film F13 and the connection conductor film C.

Fuse films F14, F15, F16 are electrically connected together, and a resistor circuit R/8 including 8 unit resistor bodies R connected in parallel is connected at its opposite ends to the fuse films F14, F15, F16 and the connection conductor film C. Fuse films F17, F18, F19, F20, F21 are electrically connected together, and a resistor circuit R/16 including 16 unit resistor bodies R connected in parallel is connected at its opposite ends to the fuse films F17 to F21 and the connection conductor film C.

The fuse films F include 21 fuse films F1 to F21, which are all connected to the second connection electrode a13. With this arrangement, when a fuse film F is fused off, a resistor circuit connected at its one end to that fuse film F is electrically isolated from the resistor circuit network a14.

Figure 28:
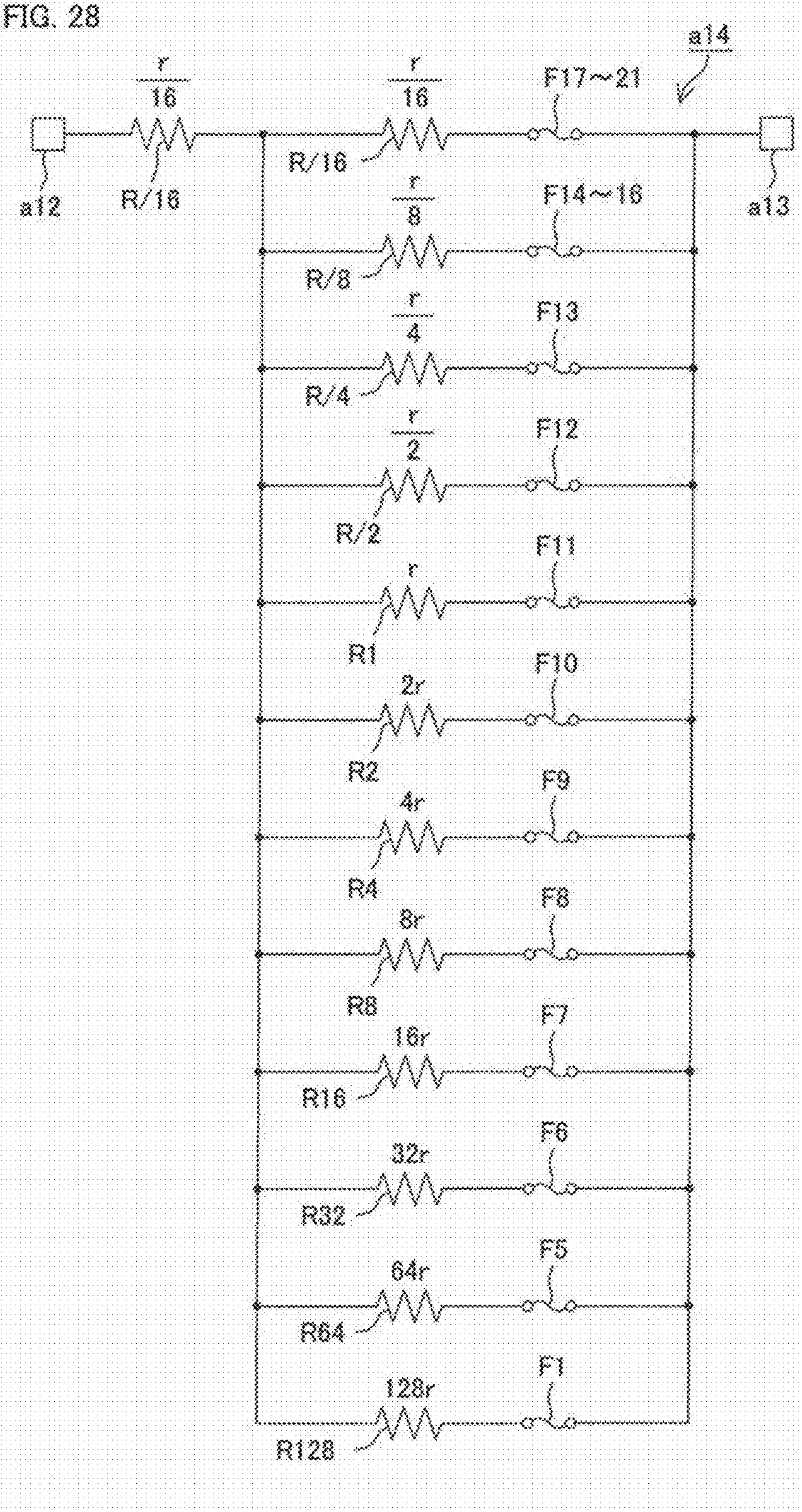
FIG. 28 is an electric circuit diagram of the resistor circuit network a14.

The configuration of FIG. 27, i.e., the configuration of the resistor circuit network a14 of the chip resistor a30, is represented by an electric circuit diagram shown in FIG. 28. With none of the fuse films F fused off, the resistor circuit network a14 is configured such that a parallel connection circuit including 12 types of resistor circuits R/16, R/8, R/4, R/2, R1, R2, R4, R8, R16, R32, R64, R128 is connected in series to the reference resistor circuit R/16 between the first connection electrode a12 and the second connection electrode a13.

The fuse films F are respectively connected in series to the 12 types of resistor circuits except the reference resistor circuit R/16. In the chip resistor a30 having this resistor circuit network a14, the fuse films F are selectively fused off, for example, by a laser beam according to the required resistance value. Thus, a resistor circuit associated with the fused fuse film F (a resistor circuit connected in series to the fused fuse film F) is electrically isolated from the resistor circuit network a14, whereby the resistance value of the chip resistor a10 can be adjusted.

In other words, the chip resistor a30 according to this example is also configured such that the plural types of resistor circuits can be selectively electrically isolated from the resistor circuit network by selectively fusing off the fuse films provided in association with the plural types of resistor circuits. Since the plural types of resistor circuits each have a predetermined resistance value, the resistance value of the resistor circuit network a14 can be controlled in a so-called digital manner to provide the chip resistor a30 having the required resistance value.

Further, the plural types of resistor circuits include plural types of serial resistor circuits which respectively include 1, 2, 4, 8, 16, 32, 64 and 128 unit resistor bodies R (whose number increases in a geometrically progressive manner) each having the same resistance value and connected in series, and plural types of parallel resistor circuits which respectively include 2, 4, 8 and 16 unit resistor bodies R (whose number increases in a geometrically progressive manner) each having the same resistance value and connected in parallel. Therefore, the overall resistance value of the resistor circuit network a14 can be finely and digitally adjusted at a desired resistance value by selectively fusing off the fuse films F.

Figure 29A:
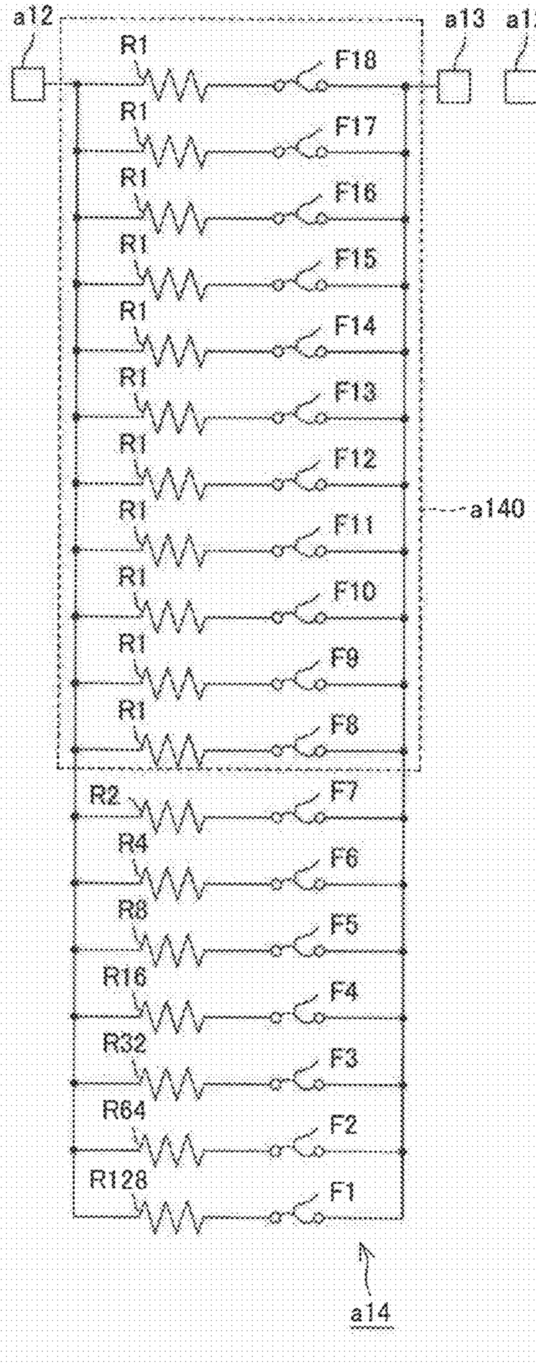
FIGS. 29A and 29B are electric circuit diagrams showing a modification of the electric circuit shown in FIG. 28.

In an electric circuit shown in FIG. 28, lower resistance resistor circuits out of the reference resistor circuit R/16 and the resistor circuits connected in parallel are liable to suffer from overcurrent. Therefore, the lower resistance resistor circuits should be designed to have a higher rated current in the setting of the resistance. For distribution of electric current, the connection configuration of the resistor circuit network may be changed from the electric circuit shown in FIG. 28 to an electric circuit configuration as shown in FIG. 29A. That is, the resistor circuit network is modified with the reference resistor circuit R/16 eliminated to include a circuit configuration a140 such that a plurality of unit resistor bodies R1 each having a minimum resistance value of r are connected in parallel.

Figure 29B:
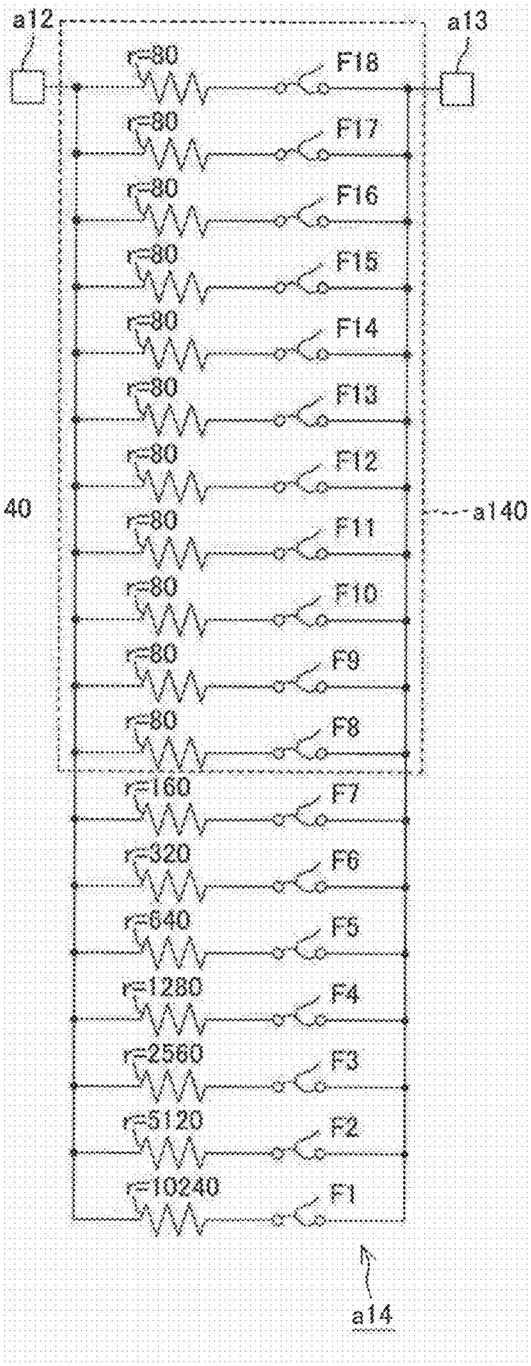
Figure 30:
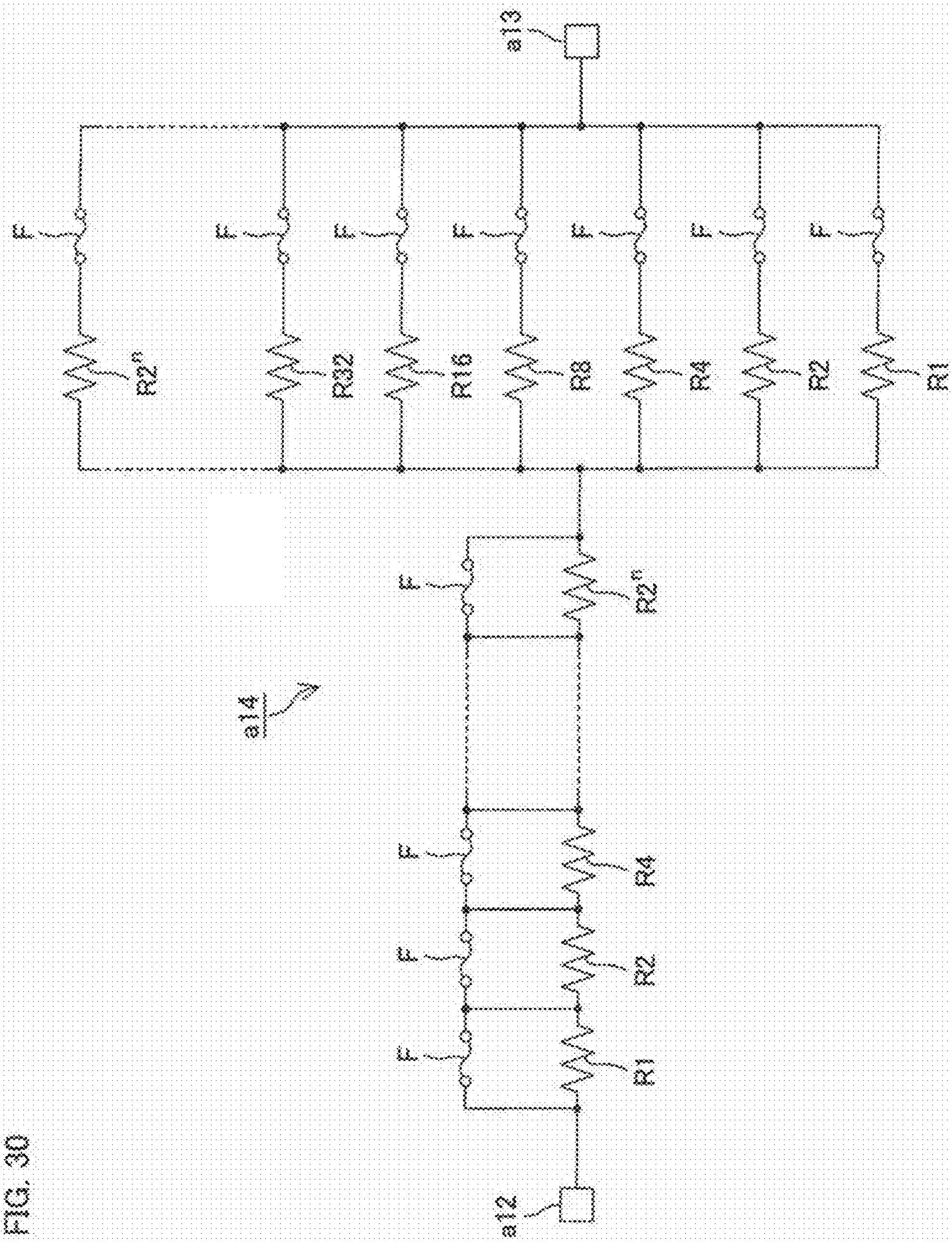
FIG. 30 is an electric circuit diagram of a resistor circuit network a14 according to another example of the first reference embodiment.

FIG. 29B is an electric circuit diagram with specific resistance values, showing a configuration a140 such that a plurality of serial connections each including a 80Ω unit resistor body and a fuse film F are connected in parallel. Thus, the electric current flowing through the resistor circuit can be distributed. FIG. 30 is an electric circuit diagram showing a circuit configuration of a resistor circuit network a14 provided in a chip resistor according further another example of the first reference embodiment. The resistor circuit network a14 shown in FIG. 30 has a characteristic circuit configuration such that serial connection of plural types of resistor circuits is connected in series to parallel connection of plural types of resistor circuits.

As in the previous example, a fuse film F is connected in parallel to each of the plural types of resistor circuits connected in series, and all the plural types of resistor circuits connected in series are short-circuited by the fuse films F. With a fuse film F fused off, therefore, a resistor circuit which has been short-circuited by that fuse film F is electrically incorporated in the resistor circuit network a14. On the other hand, a fuse film F is connected in series to each of the plural types of resistor circuits connected in parallel. With a fuse film F fused off, therefore, a resistor circuit connected in series to that fuse film F is electrically isolated from the parallel connection of the resistor circuits.

With this arrangement, for example, a resistance of smaller than 1 kΩ may be formed in the parallel connection side, and a resistor circuit of 1 kΩ or greater may be formed in the serial connection side. Thus, a resistor circuit having a resistance value in a wide range from a smaller resistance value on the order of several ohms to a greater resistance value on the order of several megaohms can be produced from a resistor circuit network a14 designed based on the same basic design concept. For more accurate setting of the resistance value, a fuse film associated with a resistor circuit having a resistance value closer to the required resistance value in the serial connection side may be preliminarily cut. Thus, the resistance value can be finely controlled by selectively fusing off the fuse films associated with the resistor circuits in the parallel connection side, whereby the resistance value can be more accurately set to the required resistance value.

Figure 31:
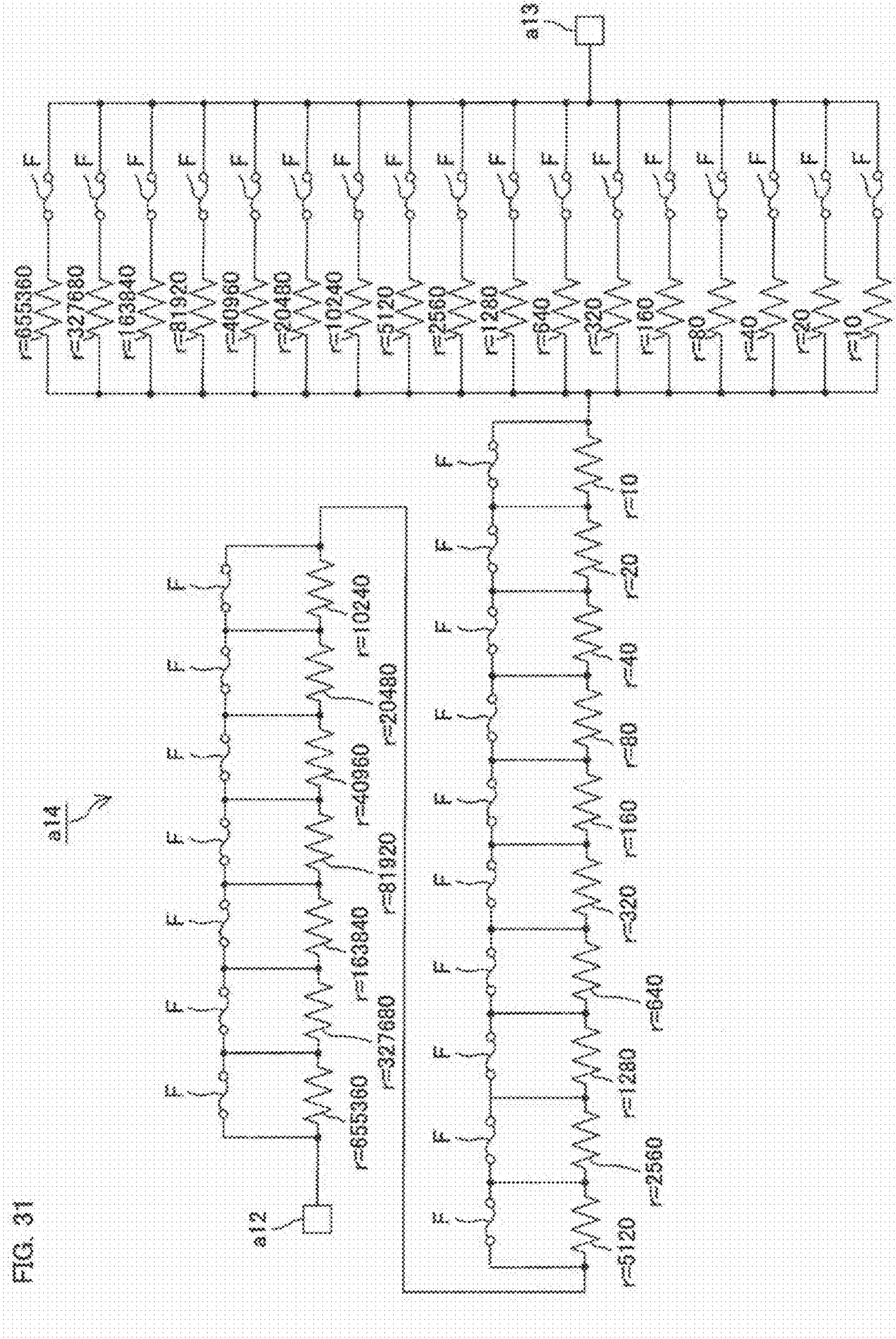
FIG. 31 is an electric circuit diagram showing an exemplary configuration of a resistor circuit network of the chip resistor with specific resistance values.

FIG. 31 is an electric circuit diagram showing an exemplary configuration of a resistor circuit network a14 of a chip resistor having a resistance value of 10Ω to 1 MΩ. The resistor circuit network a14 shown in FIG. 31 also has a circuit configuration such that serial connection of plural types of resistor circuits short-circuited by fuse films F is connected in series to parallel connection of plural types of resistor circuits each connected in series to a fuse film F.

In the resistor circuit shown in FIG. 31, the resistance can be set at a desired resistance value in a range of 10 to 1 kΩ within an accuracy of 1% in the parallel connection side. Further, the resistance can be set at a desired resistance value in a range of 1 k to 1 MΩ within an accuracy of 1% in the serial connection side. Where the resistor circuits in the serial connection side are used for the setting, the resistance can be advantageously adjusted at the desired resistance value with a higher accuracy by preliminarily fusing off a fuse film F associated with a resistor circuit having a resistance value closer to the desired resistance value.

In the above description, the fuse films F are located at the same level as the connection conductor films C, but an additional conductor film may be provided on the respective connection conductor films C to reduce the resistance values of the connection conductor films C. Alternatively, portions of the resistive film underlying the connection conductor films C may be obviated. Even in this case, the fusibility of the fuse films F is not reduced as long as the additional conductor film is not present on the fuse films F.

Figure 32A:
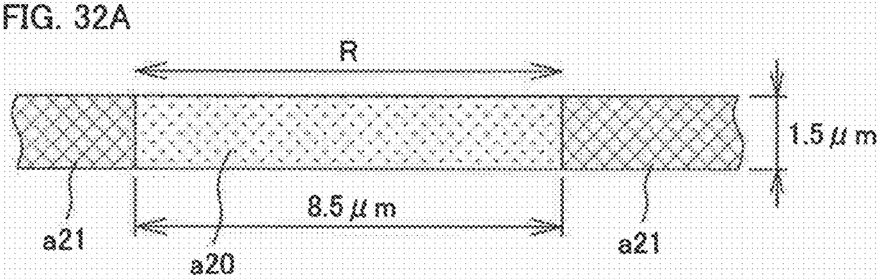
FIGS. 32A and 32B are schematic plan views for explaining the structure of a major portion of a chip resistor a90 according to further another example of the first reference embodiment.
Figure 32B:
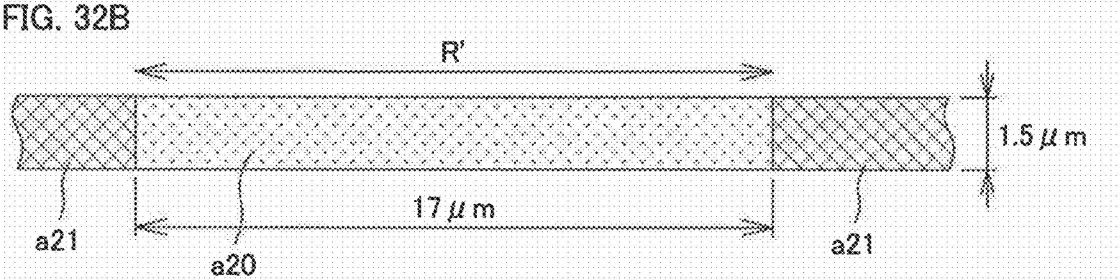

FIGS. 32A and 32B are schematic plan views for explaining the structure of a major portion of a chip resistor a90 according to further another example of the first reference embodiment. In the chip resistor a10 (see FIGS. 19A to 19B and 20) and the chip resistor a30 (see FIG. 26), for example, a resistive film line a20 and conductive film pieces a21 of a resistor circuit are configured in a relationship as shown in plan in FIG. 32A. That is, as shown in FIG. 32A, a portion of the resistive film line a20 defined between the conductive film pieces a21 spaced the predetermined distance R defines a unit resistor body R having a predetermined resistance value r. The conductive film pieces a21 are provided on the resistive film line a20 on opposite sides of the unit resistor body R to cause short circuit in the resistive film line a20.

In the chip resistor a10 and the chip resistor a30 described above, the portion of the resistive film line a20 defining the unit resistor body R has a length of, for example, 12 μm, and the resistive film line a20 has a width of, for example, 1.5 μm and a unit resistance (sheet resistance) of 10Ω/□. Therefore, the resistance value r of the unit resistor body R is r=80Ω. There is a demand for increasing the resistance of the chip resistor a10 shown in FIGS. 19A to 19B and 20, for example, by increasing the resistance value of the resistor circuit network a14 without increasing the area of the resistor circuit network a14.

In the chip resistor a90 according to this example, the layout of the resistor circuit network a14 is changed, and the unit resistor bodies of the respective resistor circuits of the resistor circuit network are each configured and dimensioned as shown in plan in FIG. 32B. Referring to FIG. 32B, the resistive film line a20 includes a resistive film line a20 linearly extending and having a width of 1.5 μm. A portion of the resistive film line a20 defined between conductive film pieces a21 spaced a predetermined distance R' defines a unit resistor body R' having a predetermined resistance value r'. The unit resistor body R' has a length of, for example, 17 μm. Thus, the unit resistor body R' has a resistance value r' of 160Ω which is generally twice that of the unit resistor body R shown in FIG. 32A.

Further, the conductive film pieces a21 provided on the resistive film line a20 each have the same length in FIGS. 32A and 32B. Therefore, the resistance of the chip resistor a90 can be increased by changing the layout of the unit resistor bodies R' of the respective resistor circuits of the resistor circuit network a14 so that the unit resistor bodies R' can be connected in series.

Figure 33:
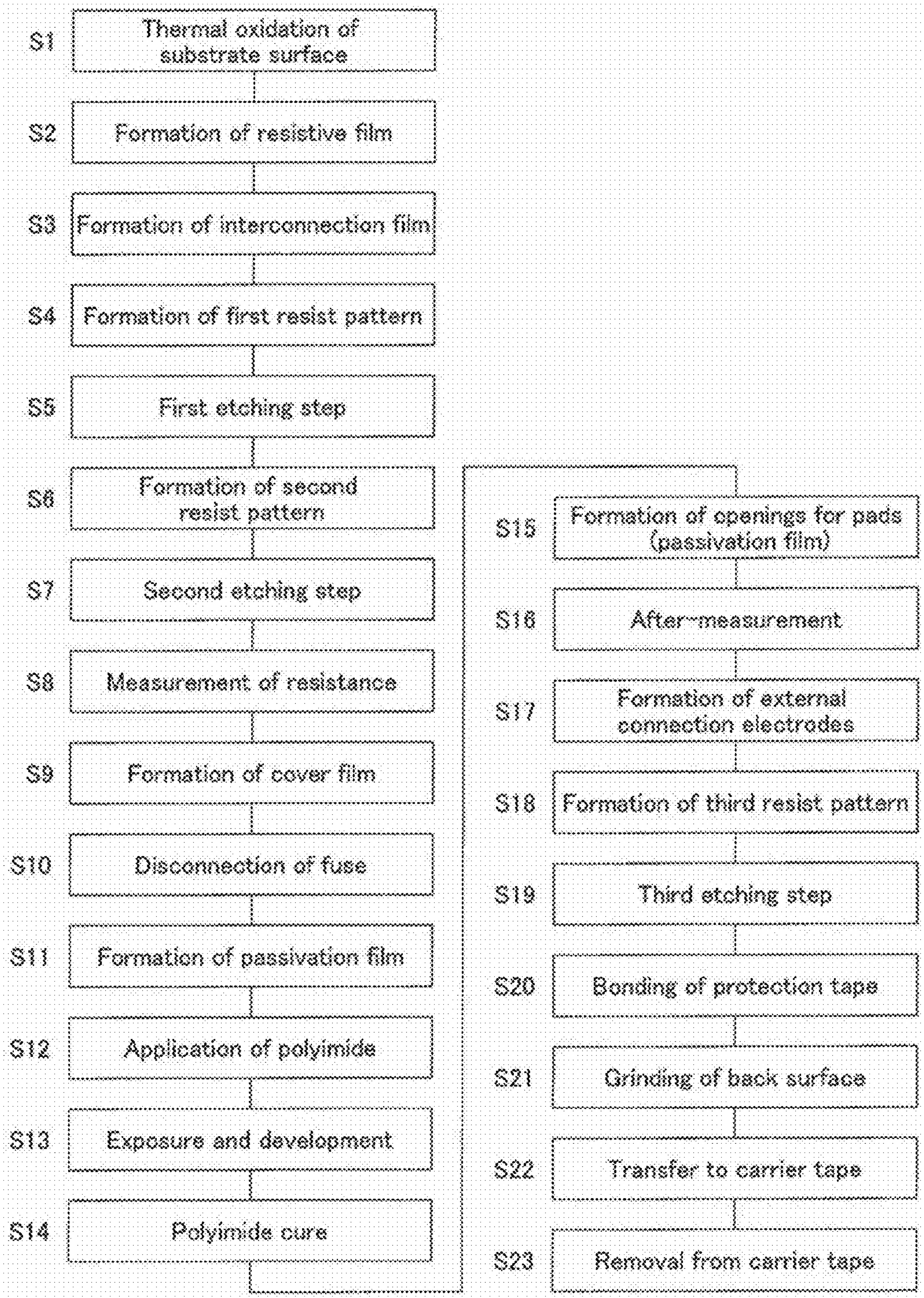
FIG. 33 is a flow diagram showing an exemplary production process for the chip resistor a10.

FIG. 33 is a flow diagram showing an exemplary production process for the chip resistor a10 described with reference to FIGS. 19A to 25. A production method for the chip resistor a10 will be described in detail according to the production process of the flow diagram and, as required, referring to FIGS. 19A to 25.

Step S1: First, a substrate a11 (in practice, a silicon wafer (see FIGS. 35A to 35F) before being divided into individual chip resistors a10) is placed in a predetermined treatment chamber, and a silicon dioxide ($SiO_2$) layer is formed as an insulative layer a19 in a surface of the substrate a11, for example, by a thermal oxidation method.

Step S2: Then, a resistive film a20 of at least one material selected from the group consisting of NiCr, NiCrAl, NiCrSi, NiCrSiAl, TaN, $TaSiO_2$, TiN, TiON and TiSiON (e.g., a resistive film a20 of TiN, TiON or TiSiON) is formed on the entire surface of the insulative layer a19, for example, by a sputtering method.

Step S3: In turn, an interconnection film a21 such as of aluminum (Al) is formed on the entire surface of the resistive film a20, for example, by a sputtering method. The total thickness of the resistive film a20 and the interconnection film a21 thus formed may be about 8000 Å. The interconnection film a21 may be formed from an aluminum-containing metal film such as of AlSi, AlSiCu or AlCu, rather than formed from Al. The processing accuracy can be improved by forming the interconnection film a21 from the aluminum-containing metal film such as of Al, AlSi, AlSiCu or AlCu.

Step S4: Subsequently, a resist pattern corresponding to the plan configuration of resistor circuit networks a14 (a layout pattern including conductor films C and fuse films F) is formed on the surface of the interconnection film a21 by a photolithography process (first resist pattern forming step).

Step S5: Then, a first etching step is performed. That is, the resistive film a20 and the interconnection film a21 formed in a double layer structure are etched, for example, by reactive ion etching (RIE) with the use of the first resist pattern formed in Step S4 as a mask. After the etching, the first resist pattern is removed.

Step S6: A second resist pattern is formed by a photolithography process. The second resist pattern formed in Step S6 is a pattern for selectively removing the interconnection film a21 formed on the resistive film a20 to define unit resistor bodies R (each indicated by a finely dotted area in FIG. 20).

Step S7: Only the interconnection film a21 is selectively etched, for example, by wet etching with the use of the second resist pattern formed in Step S6 as a mask (second etching step). After the etching, the second resist pattern is removed. Thus, the layout pattern of the resistor circuit networks a14 each shown in FIG. 20 is provided.

Step S8: At this stage, the resistance (overall resistance value) of each of the resistor circuit networks a14 formed on the substrate surface is measured. The measurement is performed, for example, by bringing multi-probe pins into contact with an end of the resistor circuit network a14 to be connected to the first connection electrode a12 and the fuse films and an end of the resistor circuit network a14 to be connected to the second connection electrode a13. Through the measurement, the initial state of each of the resistor circuit networks a14 thus produced is checked.

Step S9: Then, a cover film a22*a* of, for example, a nitride film is formed over the entire surface of the resistor circuit networks a14 formed on the substrate a11. The cover film a22*a* may be an oxide film ($SiO_2$ film) rather than the nitride film (SiN film). The formation of the cover film a22*a* may be achieved by a plasma CVD method. The cover film a22*a* may be, for example, a silicon nitride film (SiN film) having a thickness of about 3000 Å. The cover film a22*a* covers the interconnection film a21, the resistive film a20 and the fuse films F previously patterned.

Figure 34A:
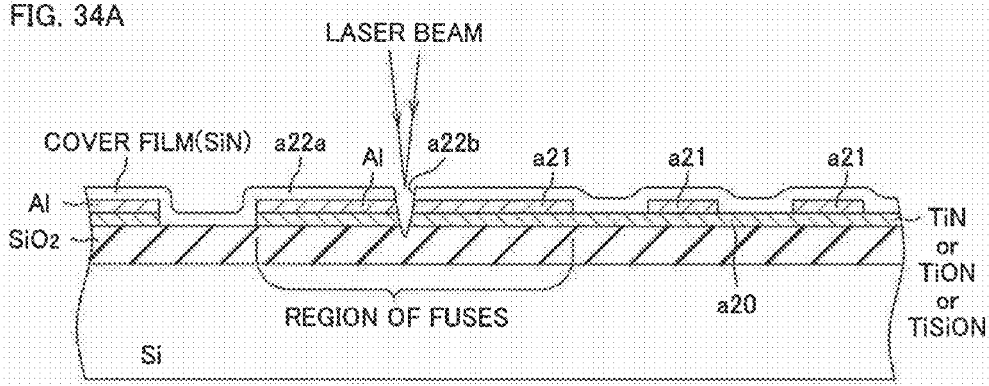
FIGS. 34A to 34C are schematic sectional views showing the step of fusing off a fuse film F, and a passivation film a22 and a resin film a23 to be formed after the fusing-off step.

Step S10: In this state, the fuse films F are selectively fused off by laser trimming for adjusting the resistance of each of the chip resistors a10 at a desired resistance value. That is, as shown in FIG. 34A, a laser beam is applied to a fuse film F selected according to the results of the measurement of the overall resistance value in Step S8 to fuse off the selected fuse film F and a portion of the resistive film a20 underlying the fuse film F. Thus, a resistor circuit which has been short-circuited by that fuse film F is incorporated into the resistor circuit network a14, so that the resistance of the resistor circuit network a14 can be adjusted at the desired resistance value. When the laser beam is applied to the fuse film F, the energy of the laser beam is accumulated around the fuse film F by the function of the cover film a22*a*, whereby the fuse film F and the underlying portion of the resistive film a20 are fused off.

Figure 34B:
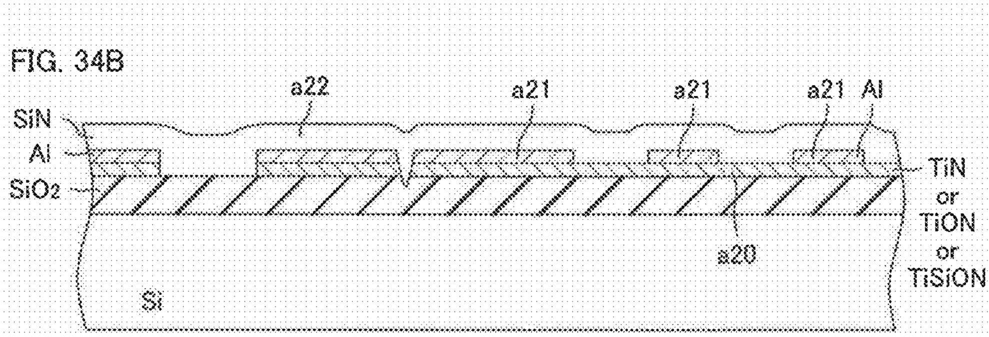

Step S11: Then, as shown in FIG. 34B, a silicon nitride film is deposited on the cover film a22*a*, for example, by a plasma CVD method, whereby a passivation film a22 is formed. The cover film a22*a* described above is finally unified with the passivation film a22 to form a part of the passivation film a22. The passivation film a22 formed after the fuse-off of the fuse film F and the underlying resistive film portion a20 partly enters a hole a22*b* formed in the cover film a22*a* when the cover film a22*a* is partly broken during the fuse-off of the fuse film F and the underlying resistive film portion a20, and protects broken surfaces of the fuse film F and the underlying resistive film portion a20. Therefore, the passivation film a22 prevents foreign matter and moisture from intruding into the fuse-off portion of the fuse film F. The passivation film a22 may have an overall thickness of, for example, about 1000 to about 20000 Å (e.g., about 8000 Å). As described above, the passivation film a22 may be a silicon oxide film.

Figure 34C:
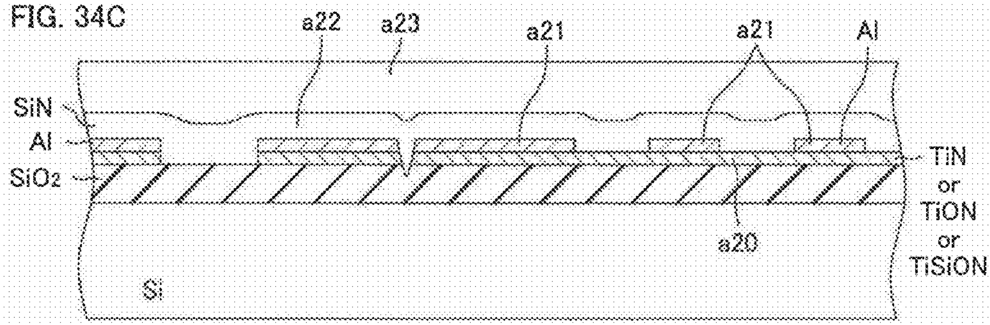

Step S12: Then, as shown in FIG. 34C, a resin film a23 is applied over the resulting substrate. A photosensitive polyimide coating film a23, for example, is used as the resin film a23.

Step S13: The resin film a23 is patterned by photolithography by exposing regions of the resin film a23 corresponding to openings for first and second connection electrodes a12, a13 and then developing the resulting resin film a23. Thus, pad openings for the first and second connection electrodes a12, a13 are formed in the resin film a23.

Step S14: Thereafter, the resin film a23 is heat-treated to be cured (polyimide curing). Thus, the polyimide film a23 is stabilized by the heat treatment. The heat treatment may be performed at a temperature of, for example, about 170° C. to about 700° C. As a result, the characteristic properties of the resistor bodies (the resistive film a20 and the patterned interconnection film a21) are advantageously stabilized.

Step S15: Then, the polyimide film a23 having the through-holes in regions to be formed with the first and second connection electrodes a12, a13 is used as a mask to etch the passivation film a22. Thus, pad openings for exposing portions of the interconnection film a21 to be formed with the first and second connection electrodes a12, a13 are formed in the passivation film a22. The etching of the passivation film a22 may be achieved by reactive ion etching (RIE).

Step S16: The resistance is measured (after-measurement is performed) with the multi-probe pins in contact with the portions of the interconnection film a21 exposed from each pair of pad openings for confirming that the chip resistors each have a desired resistance value. By performing the after-measurement, i.e., by sequentially performing the initial measurement, the fuse-off of the fuse film F (laser repair) and the after-measurement, the trimming process efficiency for the chip resistors a10 is significantly improved.

Step S17: The first and second connection electrodes a12, a13 are formed as external connection electrodes in the each pair of pad openings, for example, by an electroless plating method.

Step S18: Thereafter, a third resist pattern is formed by photolithography for separating the multiplicity of chip resistors (e.g., 500,000 chip resistors) formed on the wafer surface from each other. The resist film is configured such that the chip resistors a10, for example, shown in FIG. 36 can be protected on the wafer surface and a region of the wafer surface defined between the respective chip resistors a10 can be etched.

Step S19: Then, plasma dicing is performed. The plasma dicing is an etching method by which a trench having a predetermined depth as measured from the surface of the substrate a11 is formed between the chip resistors a10 in the substrate a11 with the use of the third resist pattern as a mask. Thereafter, the resist film is removed.

Figure 35A:
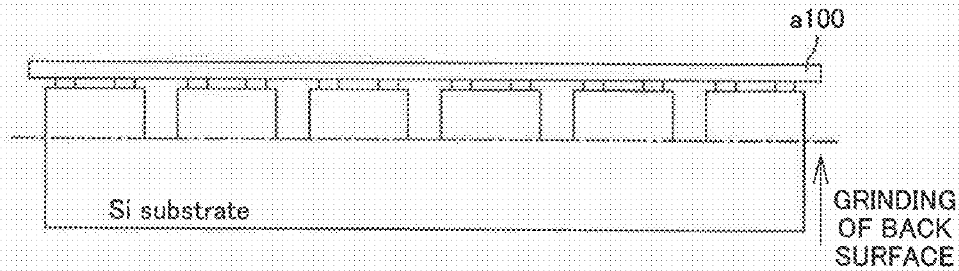
FIGS. 35A to 35F are schematic diagrams showing the step of separating individual chip resistors from a substrate.

Step S20: Then, a protective tape a100 is bonded to a front surface of the resulting substrate as shown in FIG. 35A.

Figure 35B:
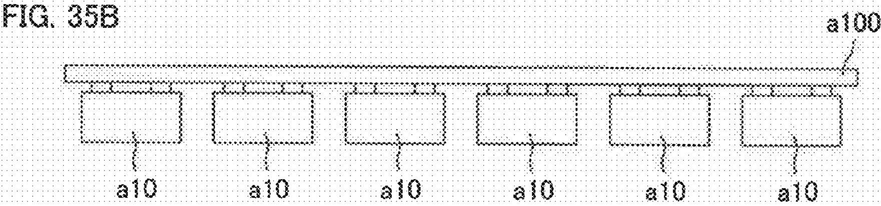

Step S21: Subsequently, a back surface of the silicon wafer is ground to separate the chip resistors a10 from each other (FIGS. 35A and 35B).

Figure 35C:
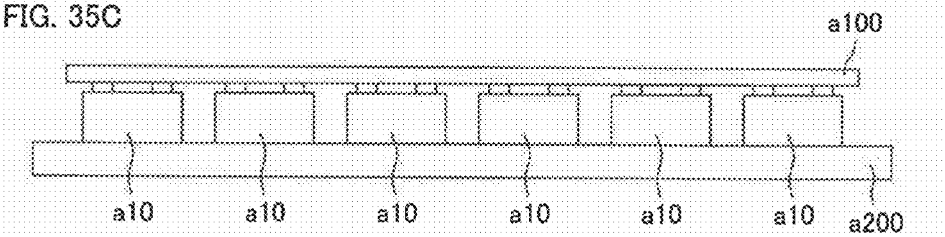
Figure 35D:
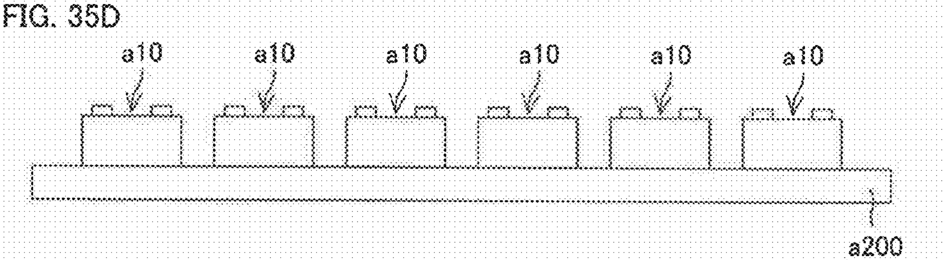

Step S22: Then, as shown in FIG. 35C, a carrier tape (thermally foamable sheet) a200 is bonded to the back surface, whereby the multiplicity of chip resistors a10 separated from each other are held in an array on the carrier tape a200. On the other hand, the protective tape is removed from the front surface (FIG. 35D).

Figure 35E:
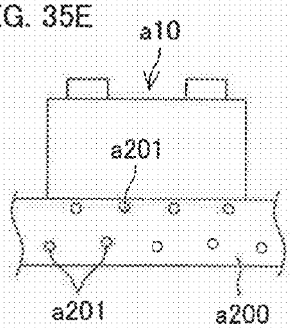
Figure 35F:
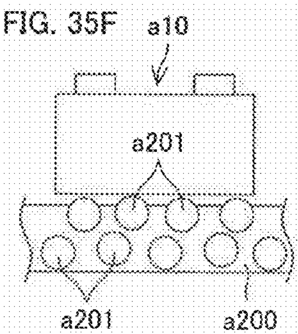
Figure 37:
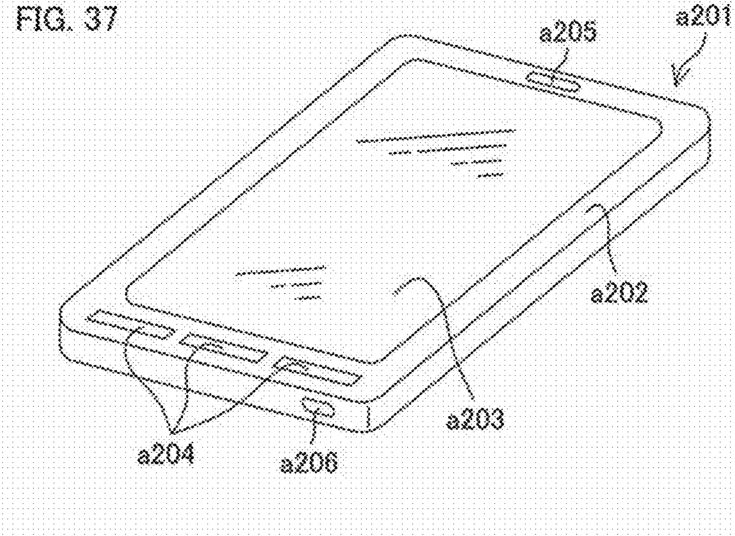
FIG. 37 is a perspective view showing the appearance of a smartphone as an exemplary electronic device which employs the chip resistor according to the first reference embodiment.

Step S23: When the thermally foamable sheet a200 is heated, thermally expandable particles a201 contained in the thermally foamable sheet a200 are expanded, whereby the chip resistors a10 bonded to the surface of the carrier tape a200 are removed from the carrier tape a200 to be separated from each other (FIGS. 35E and 35F). FIG. 37 is a perspective view showing the appearance of a smartphone as an exemplary electronic device which employs the chip component according to the first reference embodiment. The smartphone a201 includes electronic components provided in a housing a202 having a flat rectangular prismatic shape. The housing a202 has a pair of rectangular major surfaces on its front and back sides, and the pair of major surfaces are connected to each other by four side surfaces. A display screen of a display panel a203 such as a liquid crystal panel or an organic EL panel is exposed on one of the major surfaces of the housing a202. The display screen of the display panel a203 serves as a touch panel to provide an input interface to a user.

The display panel a203 has a rectangular shape occupying the most of the one major surface of the housing a202. Operation buttons a204 are provided alongside one shorter edge of the display panel a203. In this example, a plurality of operation buttons a204 (three operation buttons a204) are arranged alongside the shorter edge of the display panel a203. The user operates the smartphone a201 by operating the operation buttons a204 and the touch panel to call and execute a necessary function.

A speaker a205 is disposed adjacent the other shorter edge of the display panel a203. The speaker a205 serves as a reception port for a telephone function, and as an audio unit for playing music data and the like. On the other hand, a microphone a206 is provided adjacent the operation buttons a204 on one of the side surfaces of the housing a202. The microphone a206 serves as a transmission port for the telephone function, and as a microphone for recording.

Figure 38:
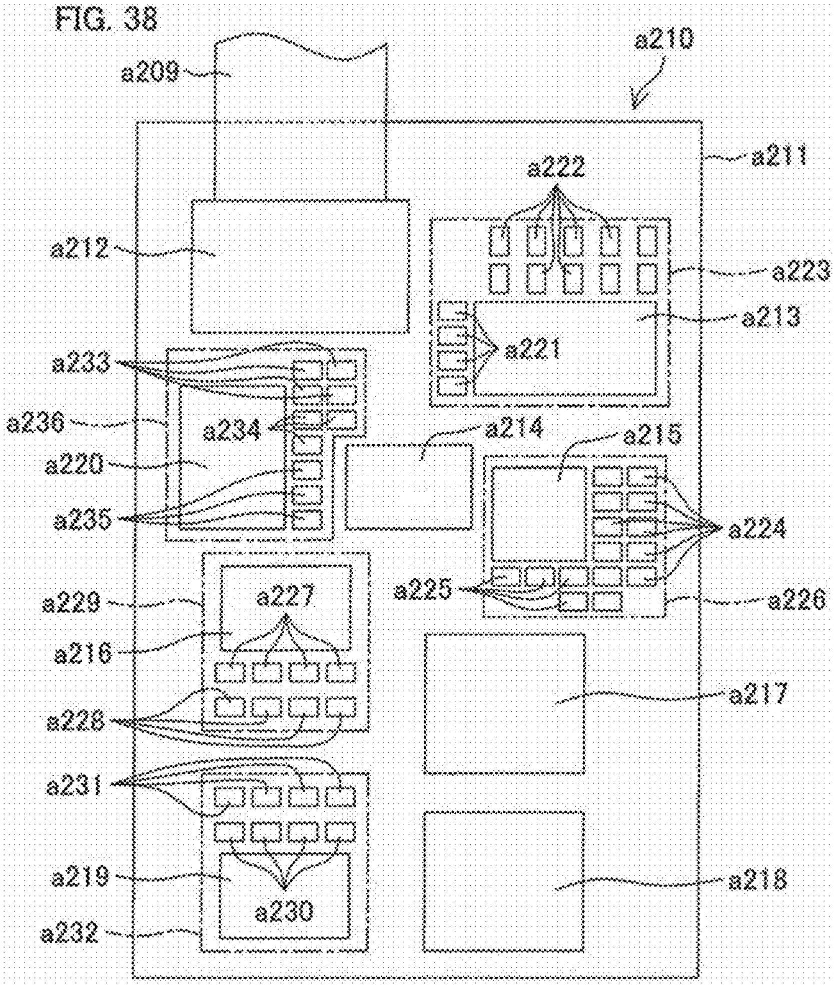
FIG. 38 is a schematic plan view showing the configuration of an electronic circuit assembly a210 accommodated in a housing a202.

FIG. 38 is a schematic plan view showing the configuration of an electronic circuit assembly a210 accommodated in the housing a202. The electronic circuit assembly a210 includes a wiring substrate a211, and circuit components mounted on a mount surface of the wiring substrate a211. The circuit components include a plurality of integrated circuit elements (ICs) a212 to a220, and a plurality of chip components. The ICs include a transmission IC a212, a so-called One-Seg TV receiving IC a213, a GPS receiving IC a214, an FM tuner IC a215, a power source IC a216, a flash memory a217, a microcomputer a218, a power source IC a219, and a base band IC a220. The chip components include chip inductors a221, a225, a235, chip resistors a222, a224, a233, chip capacitors a227, a230, a234, and chip diodes a228, a231. The chip resisters a222, a224, a233 each have a configuration according to the first reference embodiment.

The transmission IC a212 incorporates an electronic circuit which generates display control signals for the display panel a203 and receives signals inputted from the touch panel on the surface of the display panel a203. A flexible interconnection a209 is connected to the transmission IC a212 for connection to the display panel a203. The One-Seg TV receiving IC a213 incorporates an electronic circuit which serves as a receiver for receiving signals of so-called One-Seg broadcast (terrestrial digital television broadcast for mobile devices). The chip inductors a221 and the chip resistors a222 are provided adjacent the One-Seg TV receiving IC a213. The One-Seg TV receiving IC a213, the chip inductors a221 and the chip resistors a222 constitute a One-Seg broadcast receiving circuit a223. The chip inductors a221 each have an accurately adjusted inductance, and the chip resistors a222 each have an accurately adjusted resistance. Thus, the One-Seg broadcast receiving circuit a223 has a highly accurate circuit constant.

The GPS receiving IC a214 incorporates an electronic circuit which receives signals from a GPS satellite and outputs the positional information of the smartphone a201. The FM tuner IC a215, and the chip resistors a224 and the chip inductors a225, which are mounted adjacent the FM tuner IC a215 on the wiring substrate a211, constitute an FM broadcast receiving circuit a226. The chip resistors a224 each have an accurately adjusted resistance, and the chip inductors a225 each have an accurately adjusted inductance. Thus, the FM broadcast receiving circuit a226 has a highly accurate circuit constant.

The chip capacitors a227 and the chip diodes a228 are mounted adjacent the power source IC a216 on the mount surface of the wiring substrate a211. The power source IC a216, the chip capacitors a227 and the chip diodes a228 constitute a power source circuit a229. The flash memory a217 is a storage which stores an operating system program, data generated in the smartphone a201, and data and programs acquired from the outside by communication function.

The microcomputer a218 incorporates a CPU, a ROM and a RAM, and serves as a processing circuit which performs a variety of processing operations to execute functions of the smartphone a201. More specifically, the microcomputer a218 performs processing operations for image processing and a variety of application programs. The chip capacitors a230 and the chip diodes a231 are mounted adjacent the power source IC a219 on the mount surface of the wiring substrate a211. The power source IC a219, the chip capacitors a230 and the chip diodes a231 constitute a power source circuit a232.

The chip resistors a233, the chip capacitors a234 and the chip inductors a235 are mounted adjacent the base band IC a220 on the mount surface of the wiring substrate a211. The base band IC a220, the chip resistors a233, the chip capacitors a234 and the chip inductors a235 constitute a base band communication circuit a236. The base band communication circuit a236 provides communication functions for telephone communications and data communications.

With this arrangement, electric power properly controlled by the power source circuits a229, a232 is supplied to the transmission IC a212, the GPS receiving IC a214, the One-Seg broadcast receiving circuit a223, the FM broadcast receiving circuit a226, the base band communication circuit a236, the flash memory a217 and the microcomputer a218. The microcomputer a218 performs a processing operation in response to input signals inputted thereto via the transmission IC a212, and outputs display control signals from the transmission IC a212 to the display panel a203 to cause the display panel a203 to perform a variety of display operations.

When a command for receiving One-Seg broadcast is given by operating the touch panel or the operation buttons a204, the One-Seg broadcast is received by the function of the One-Seg broadcast receiving circuit a223. Then, a processing operation for outputting a received image on the display panel a203 and outputting a received sound from the speaker a205 is performed by the microcomputer a218. When the positional information of the smartphone a201 is required, the microcomputer a218 acquires positional information outputted from the GPS receiving IC a214 and performs a processing operation using the positional information.

Further, when a command for receiving FM broadcast is inputted by operating the touch panel or the operation buttons a204, the microcomputer a218 actuates the FM broadcast receiving circuit a226 and performs a processing operation for outputting a received sound from the speaker a205. The flash memory a217 is used for storing data acquired through communications, and for storing data generated by performing a processing operation by the microcomputer a218 or data generated by inputting from the touch panel. As required, the microcomputer a218 writes data in the flash memory a217 and reads data from the flash memory a217.

The functions of the telephone communications and the data communications are performed by the base band communication circuit a236. The microcomputer a218 controls the base band communication circuit a236 to perform operations for transmitting and receiving sounds and data.

Second Reference Embodiment of Present Invention

(1) Inventive Features of Second Reference Embodiment

The second reference embodiment has, for example, the following inventive features (B1) to (B16):

(B1) A chip resistor is provided, which includes: a substrate; a first electrode and a second electrode provided on the substrate; a first resistor circuit network including a plurality of first resistor elements which each include a first resistive film provided on the substrate, and a first interconnection film provided on the first resistive film in contact with the first resistive film, the first resistive film being made of a first material having a positive resistance temperature coefficient; a second resistor circuit network connected to the first resistor circuit network and including a plurality of second resistor elements which each include a second resistive film provided on the substrate, and a second interconnection film provided on the second resistive film in contact with the second resistive film, the second resistive film being made of a second material having a negative resistance temperature coefficient; a plurality of first fuses which respectively disconnectably connect the first resistor elements to the first electrode; and a plurality of second fuses which respectively disconnectably connect the second resistor elements to the second electrode.

With this arrangement, one or more of the first fuses are selectively disconnected to isolate desired one(s) of the first resistor elements from the first resistor circuit network or incorporate desired one(s) of the first resistor elements into the first resistor circuit network in the chip resistor. Similarly, one or more of the second fuses are selectively disconnected to isolate desired one(s) of the second resistor elements from the second resistor circuit network or incorporate desired one(s) of the second resistor elements into the second resistor circuit network. Thus, the resistance of the overall chip resistor can be adjusted at a desired resistance value. Therefore, the chip resistor can be easily and speedily adapted for a plurality of resistance values. That is, the chip resistor can be easily adapted for a plurality of resistance requirements based on the same structural design concept. The first resistor circuit network having a positive resistance temperature coefficient and the second resistor circuit network having a negative resistance temperature coefficient are connected to each other, whereby the absolute value of the resistance temperature coefficient of the overall chip resistor can be reduced. This improves the accuracy of the chip resistor.

(B2) In the chip resistor of the feature (B1), the first resistive film is made of TiON or TiONSi having an oxygen composition ratio controlled so as to have a positive resistance temperature coefficient, and the second resistive film is made of TiON or TiONSi having an oxygen composition ratio controlled so as to have a negative resistance temperature coefficient.

With this arrangement, the first resistive film having a positive resistance temperature coefficient and the second resistive film having a negative resistance temperature coefficient can be each formed of TiON or TiONSi having a properly controlled oxygen composition ratio.

(B3) In the chip resistor of the feature (B1) or (B2), the resistance temperature coefficient is not greater than 300 ppm/° C. in absolute value.

With this arrangement, the resistance temperature coefficient of the overall chip resistor has a smaller absolute value, i.e., 300 ppm/° C. or smaller. This improves the accuracy of the chip resistor.

(B4) The chip resistor of any of the features (B1) to (B3) further includes a third electrode which connects the first resistor circuit network and the second resistor circuit network to each other. With this arrangement, the resistance value of the overall first resistor circuit network is measured between the first electrode and the third electrode, and the resistance value of the overall second resistor circuit network is measured between the second electrode and the third electrode. Thus, resistances to be provided by the trimming in the first resistor circuit network and the second resistor circuit network are calculated based on the required resistance value of the overall chip resistor, and a first fuse and a second fuse to be disconnected for providing the resistances are selected.

(B5) The chip resistor of the feature (B4) further includes a protective film which covers the first resistor circuit network, the second resistor circuit network and the third electrode with the first electrode and the second electrode being exposed therefrom.

With this arrangement, the first resistor circuit network, the second resistor circuit network and the third electrode can be protected by the protective film.

(B6) In the chip resistor of the feature (B5), at least one of the first fuses and the second fuses is disconnected, and a disconnection surface of the disconnected fuse is covered with the protective film.

With this arrangement, the protective film prevents foreign matter and moisture from entering the disconnected portion of the fuse, thereby improving the reliability of the chip resistor.

(B7) The protective film may be made of SiN.

(B8) The chip resistor of any one of the features (B5) to (B7) further includes a resin film covering the protective film.

With this arrangement, the first resistor circuit network, the second resistor circuit network and the third electrode can be protected doubly by the protective film and the resin film.

(B9) The resin film may be made of a polyimide.

(B10) In the chip resistor of the feature (B8) or (B9), the first electrode and the second electrode are exposed from the resin film.

With this arrangement, the chip resistor can be electrically connected to a mount substrate via the first electrode and the second electrode exposed from the resin film when being mounted on the mount substrate.

(B11) The first interconnection film and the second interconnection film may be made of Al.

(B12) The first fuse and the second fuse may be made of Al.

(B13) In the chip resistor of any one of the features (B1) to (B12), the first electrode and the second electrode each include an Ni layer and an Au layer, and the Au layer is exposed on an outermost surface.

With this arrangement, the Au layer covers the surface of the Ni layer of each of the electrodes, thereby preventing oxidation of the Ni layer.

(B14) In the chip resistor of the feature (B13), the first electrode and the second electrode each further include a Pd layer provided between the Ni layer and the Au layer. With this arrangement, even if the Au layer has a through-hole (pin hole) because of its smaller thickness, the Pd layer provided between the Ni layer and the Au layer closes the through-hole. This prevents the Ni layer from being exposed to the outside through the through-hole and oxidized.

(B15) A circuit assembly preferably includes the chip resistor.

(B16) An electronic device preferably includes the chip resistor.

(2) Examples of Second Reference Embodiment of Present Invention

Examples of the second reference embodiment will hereinafter be described in detail with reference to the attached drawings. Reference characters shown in FIGS. 39A to 54 are effective only in FIGS. 39A to 54, so that components designated by these reference characters may be different from those designated by the same reference characters in other embodiments.

Figure 39A:
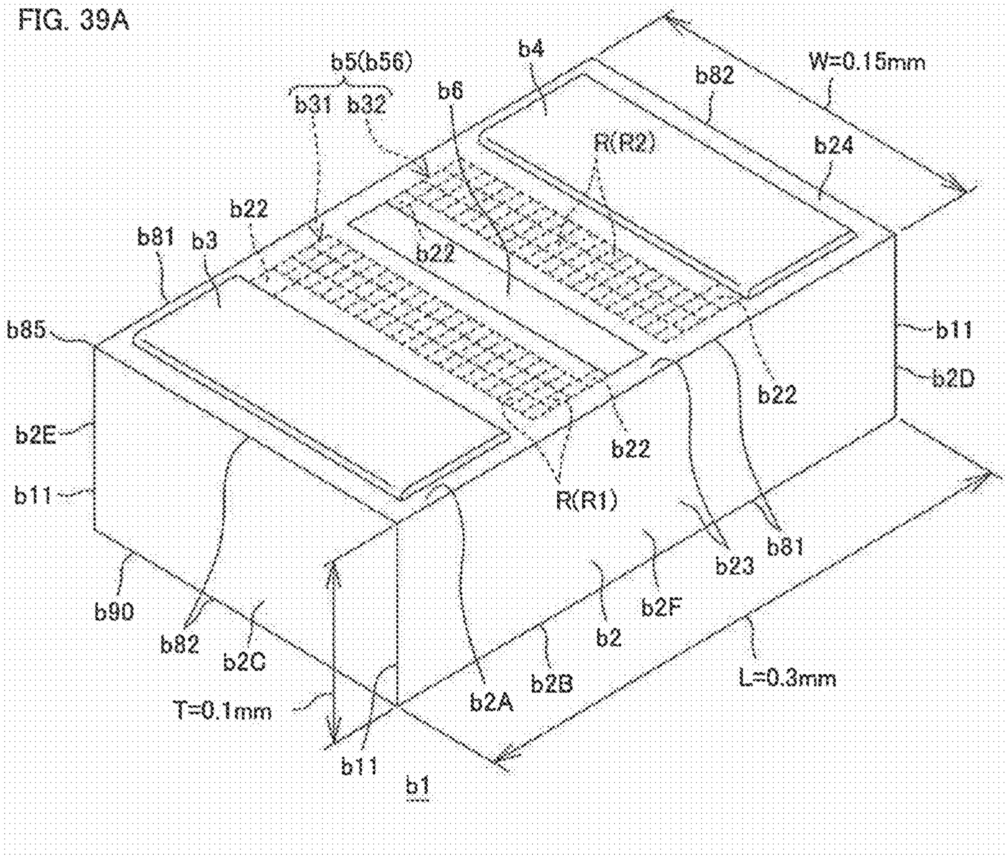
FIG. 39A is a schematic perspective view for explaining the construction of a chip resistor according to an example of a second reference embodiment.

FIG. 39A is a schematic perspective view for explaining the construction of a chip resistor according to an example of the second reference embodiment. The chip resistor b1 is a minute chip component, and has a rectangular prismatic shape as shown in FIG. 39A. The chip resistor b1 has a rectangular plan shape defined by two perpendicularly intersecting edges (a longer edge b81 and a shorter edge b82), one of which has a length of not greater than 0.4 mm and the other of which has a length of not greater than 0.2 mm. More preferably, the chip resistor b1 is dimensioned such as to have a length L (a length of the longer edge b81) of about 0.3 mm, a width W (a length of the shorter edge b82) of about 0.15 mm, and a thickness T of about 0.1 mm.

The chip resistor b1 is obtained by forming a multiplicity of chip resistors b1 in a lattice form on a substrate, then forming a trench in the substrate, and grinding a back surface of the substrate (or dividing the substrate along the trench) to separate the chip resistors b1 from each other. The chip resistor b1 principally includes a substrate b2 which constitutes a main body of the chip resistor b1, a first electrode b3 and a second electrode b4 serving as a pair of external connection electrodes, and a device portion b5 connected to the outside via the first electrode b3 and the second electrode b4.

The substrate b2 has a generally rectangular prismatic chip shape. An upper surface of the substrate b2 as seen in FIG. 39A is a front surface b2A. The front surface b2A is a surface of the substrate b2 on which the device portion b5 is provided, and has a generally rectangular shape. A surface of the substrate b2 opposite from the front surface b2A with respect to the thickness of the substrate b2 is a back surface b2B. The front surface b2A and the back surface b2B have substantially the same size and substantially the same shape, and are parallel to each other. The front surface b2A has a rectangular edge portion b85 defined along a pair of longer edges b81 and a pair of shorter edges b82 thereof, and the back surface b2B has a rectangular edge portion b90 defined along a pair of longer edges b81 and a pair of shorter edges b82 thereof. The edge portion b85 and the edge portion b90 coincide with each other when being seen in a normal direction perpendicular to the front surface b2A (back surface b2B).

In addition to the front surface b2A and the back surface b2B, the substrate b2 has side surfaces (i.e., a side surface b2C, a side surface b2D, a side surface b2E and a side surface b2F). The side surfaces intersect (specifically, orthogonally intersect) the front surface b2A and the back surface b2B to connect the front surface b2A and the back surface b2B to each other. The side surface b2C is disposed between shorter edges b82 of the front surface b2A and the back surface b2B on one of longitudinally opposite sides (on a left front side in FIG. 39A). The side surface b2D is disposed between shorter edges b82 of the front surface b2A and the back surface b2B on the other of the longitudinally opposite sides (on a right rear side in FIG. 39A). The side surfaces b2C, b2D are longitudinally opposite end faces of the substrate b2. The side surface b2E is disposed between longer edges b81 of the front surface b2A and the back surface b2B on one of widthwise opposite sides (on a left rear side in FIG. 39A). The side surface b2F is disposed between longer edges b81 of the front surface b2A and the back surface b2B on the other of the widthwise opposite sides (on a right front side in FIG. 39A). The side surfaces b2E, b2F are widthwise opposite end faces of the substrate b2. The side surfaces b2C, b2D intersect (specifically, orthogonally intersect) the side surfaces b2E, b2F. Therefore, a right angle is defined between adjacent ones of the front surface b2A to the side surface b2F.

The front surface b2A and the side surfaces b2C to b2F of the substrate b2 are entirely covered with a passivation film b23 (protective film). More strictly, therefore, the front surface b2A and the side surfaces b2C to b2F are entirely located on an inner side (back side) of the passivation film b23, and are not exposed to the outside in FIG. 39A. Further, the chip resistor b1 has a resin film b24. The resin film b24 covers the entire passivation film b23 on the front surface b2A (the edge portion b85 and a portion inward of the edge portion b85). The passivation film b23 and the resin film b24 will be detailed later.

The first electrode b3 and the second electrode b4 are provided inward of the edge portion b85 (in spaced relation from the edge portion b85) on the front surface b2A of the substrate b2, and projects from the resin film b24 on the front surface b2A to be partly exposed from the resin film b24. In other words, the resin film b24 covers the front surface b2A (strictly, the passivation film b23 on the front surface b2A) with the first electrode b3 and the second electrode b4 being exposed therefrom. The first electrode b3 and the second electrode b4 each have a structure such that an Ni (nickel) layer, a Pd (palladium) layer and an Au (gold) layer are stacked in this order on the front surface b2A. The first electrode b3 and the second electrode b4 are spaced from each other longitudinally of the front surface b2A, and are each elongated widthwise of the front surface b2A. On the front surface b2A, the first electrode b3 is disposed closer to the side surface b2C, and the second electrode b4 is disposed closer to the side surface b2D in FIG. 39A. The first electrode b3 and the second electrode b4 have substantially the same size and substantially the same shape as seen in plan in the normal direction.

The device portion b5 is a circuit element, which is provided between the first electrode b3 and the second electrode b4 on the front surface b2A of the substrate b2, and is covered with the passivation film b23 and the resin film b24 from the upper side. In this example, the device portion b5 is a resistor portion b56. The resistor portion b56 is a resistor circuit network including a plurality of (unit) resistor bodies R each having the same resistance value and arranged in an matrix array on the front surface b2A. The resistor bodies R are each made of TiON (titanium oxide nitride) or TiONSi (TiSiON).

The chip resistor b1 includes a third electrode b6 in addition to the first electrode b3 and the second electrode b4. The third electrode b6 is provided on the front surface b2A, and has a rectangular shape elongated widthwise of the front surface b2A. In FIG. 39A, the third electrode b6 has substantially the same length as the first electrode b3 and the second electrode b4, and a smaller width than the first electrode b3 and the second electrode b4, for example, about a half the widths of the first electrode b3 and the second electrode b4. The third electrode b6 has a smaller thickness than the first electrode b3 and the second electrode b4.

The third electrode b6 is provided between the first electrode b3 and the second electrode b4 and equidistantly spaced from the first electrode b3 and the second electrode b4 on the front surface b2A. Thus, the device portion b5 (resistor portion b56) on the front surface b2A is divided in a first resistor circuit network b31 adjacent to the first electrode b3 and a second resistor circuit network b32 adjacent to the second electrode b4 by the third electrode b6.

The first resistor circuit network b31 is electrically connected to a portion of an interconnection film b22 to be described later, and electrically connected to the first electrode b3 and the third electrode b6 via the interconnection film portion b22. The second resistor circuit network b32 is electrically connected to a portion of the interconnection film b22, and electrically connected to the second electrode b4 and the third electrode b6 via the interconnection film portion b22. That is, the third electrode b6 is provided between the first resistor circuit network b31 and the second resistor circuit network b32 to connect the first resistor circuit network b31 and the second resistor circuit network b32 to each other. In other words, the first resistor circuit network b31 and the second resistor circuit network b32 are connected to each other via the third electrode b6.

Figure 39B:
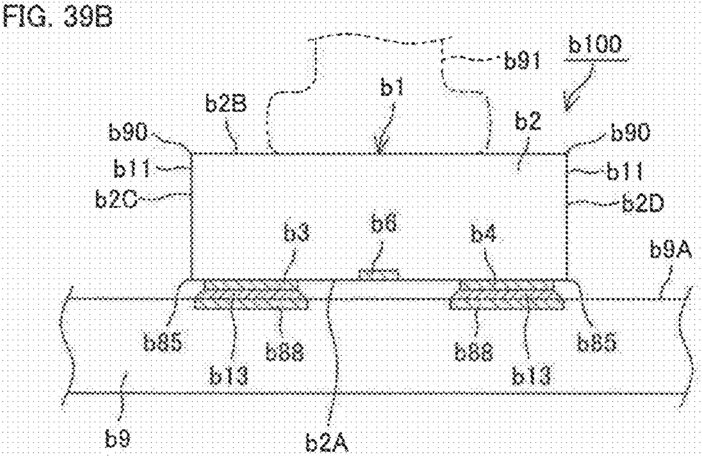
FIG. 39B is a schematic sectional view of a circuit assembly taken longitudinally of the chip resistor, which is mounted on a circuit substrate.

As described above, the first electrode b3 and the second electrode b4 are partly exposed from the resin film b24, while the third electrode b6 thinner than the first electrode b3 and the second electrode b4 is covered with the passivation film b23 and the resin film b24 and is not exposed to the outside. FIG. 39B is a schematic sectional view of a circuit assembly taken longitudinally of the chip resistor, which is mounted on a mount substrate. In FIG. 39B, only major portions are illustrated in section.

As shown in FIG. 39B, the chip resistor b1 is mounted on the mount substrate b9. In this state, the chip resistor b1 and the mount substrate b9 constitute a circuit assembly b100. In FIG. 39B, an upper surface of the mount substrate b9 serves as a mount surface b9A. A pair of lands b88 (two lands b88) connected to an internal circuit (not shown) of the mount substrate b9 are provided on the mount surface b9A. The lands b88 are each made of, for example, Cu. Solder pieces b13 are provided on surfaces of the respective lands b88 as projecting from the surfaces.

When the chip resistor b1 is to be mounted on the mount substrate b9, a suction nozzle b91 of an automatic mounting machine (not shown) sucks the back surface b2B of the chip resistor b1 and is moved to transport the chip resistor b1. At this time, the suction nozzle b91 sucks a generally longitudinally middle portion of the back surface b2B. Then, the suction nozzle b91 sucking the chip resistor b1 is moved to the mount substrate b9. At this time, the front surface b2A of the chip resistor b1 is opposed to the mount surface b9A of the mount substrate b9. In this state, the suction nozzle b91 is moved to be pressed against the mount substrate b9, whereby the first electrode b3 of the chip resistor b1 is brought into contact with the solder piece b13 on one of the lands b88 and the second electrode b4 is brought into contact with the solder piece b13 on the other land b88. Then, the solder pieces b13 are heated to be melted. When the solder pieces b13 are thereafter cooled to be solidified, the first electrode b3 is bonded to the one land b88 and the second electrode b4 is bonded to the other land b88 by the respective solder pieces b13. That is, the first electrode b3 and the second electrode b4 are soldered to the two lands b88. Thus, the chip resistor b1 is mounted on the mount substrate b9 (through flip-chip connection), whereby the circuit assembly b100 is completed. The first electrode b3 and the second electrode b4 functioning as the external connection electrodes are desirably formed of gold (Au) or surface-plated with gold as will be described later for improvement of solder wettability and for improvement of reliability.

Figure 40:
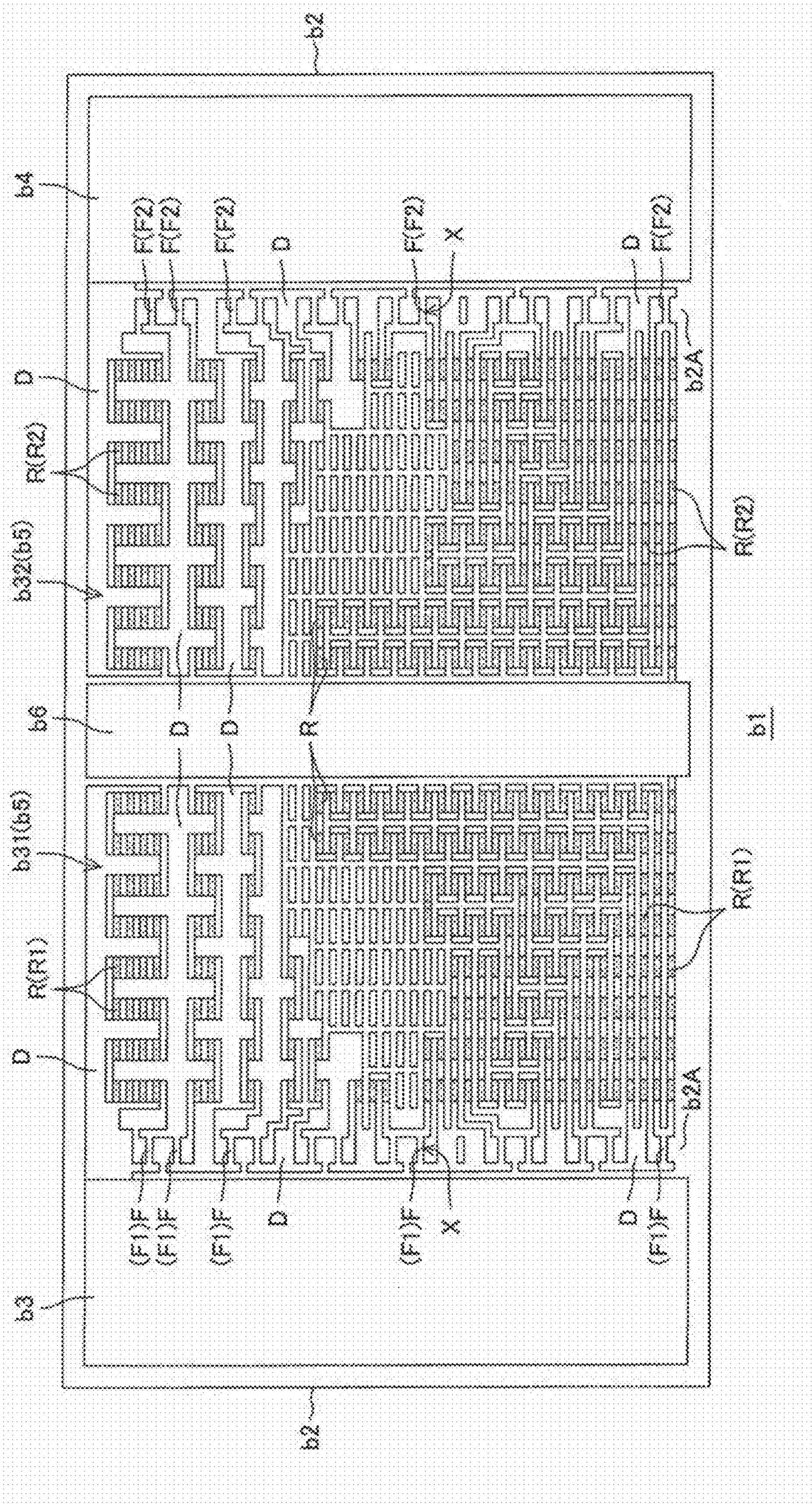
FIG. 40 is a plan view of the chip resistor showing the layout of a first electrode, a second electrode and a device portion, and the structure of the device portion as viewed in plan.

The construction of the chip resistor b1 will be further detailed. FIG. 40 is a plan view of the chip resistor showing the layout of the first electrode, the second electrode, the third electrode and the device portion, and the structure (layout pattern) of the device portion as viewed in plan. In FIG. 40, the chip resistor b1 is illustrated such that the ratio of the length L to the width W thereof is different from that in FIGS. 39A to 39B for convenience of description.

Referring to FIG. 40, the first resistor circuit network b31 and the second resistor circuit network b32 of the device portion b5 each include, for example, 352 resistor bodies R in total with 8 resistor bodies R aligned in each row (longitudinally of the substrate b2) and with 44 resistor bodies R aligned in each column (widthwise of the substrate b2). These resistor bodies R are device elements constituting each of the first resistor circuit network b31 and the second resistor circuit network b32. Here, the first resistor circuit network b31 and the second resistor circuit network b32 are different in the characteristic property (resistance temperature coefficient to be described later) of the resistor bodies R. In the following description, therefore, the resistor bodies R of the first resistor circuit network b31 are each hereinafter sometimes referred to as "first resistor body R1", and the resistor bodies R of the second resistor circuit network b32 are each hereinafter sometimes referred to as "second resistor body R2".

In each the first resistor circuit network b31 and the second resistor circuit network b32, the multiplicity of resistor bodies R are grouped in predetermined numbers, and a predetermined number of resistor bodies R (1 to 64 resistor bodies R) in each group are electrically connected to one another, whereby plural types of resistor circuits are formed. The plural types of resistor circuits thus formed are connected to one another in a predetermined form via conductor films D (film interconnections made of a conductor). Further, a plurality of disconnectable (fusible) fuses F are provided on the front surface b2A of the substrate b2 for electrically incorporating the resistor circuits into the device portion b5 (the first resistor circuit network b31 or the second resistor circuit network b32) or electrically isolating the resistor circuits from the device portion b5. The fuses F and the conductor films D are arranged in a linear region alongside an inner edge of each of the first electrode b3 and the second electrode b4. More specifically, the fuses F and the conductor films D are arranged in adjacent relation in a linear arrangement direction alongside the inner edge of each of the first electrode b3 and the second electrode b4. The fuses F arranged alongside the inner edge of the first electrode b3 (sometimes referred to as "first fuses F1") disconnectably (separably) connect the plural types of resistor circuits (each including a plurality of first resistor bodies R1) to the first electrode b3 (between the first electrode b3 and the third electrode b6). The fuses F arranged alongside the inner edge of the second electrode b4 (sometimes referred to as "second fuses F2") disconnectably (separably) connect the plural types of resistor circuits (each including a plurality of second resistor bodies R2) to the second electrode b4 (between the second electrode b4 and the third electrode b6).

Figure 41A:
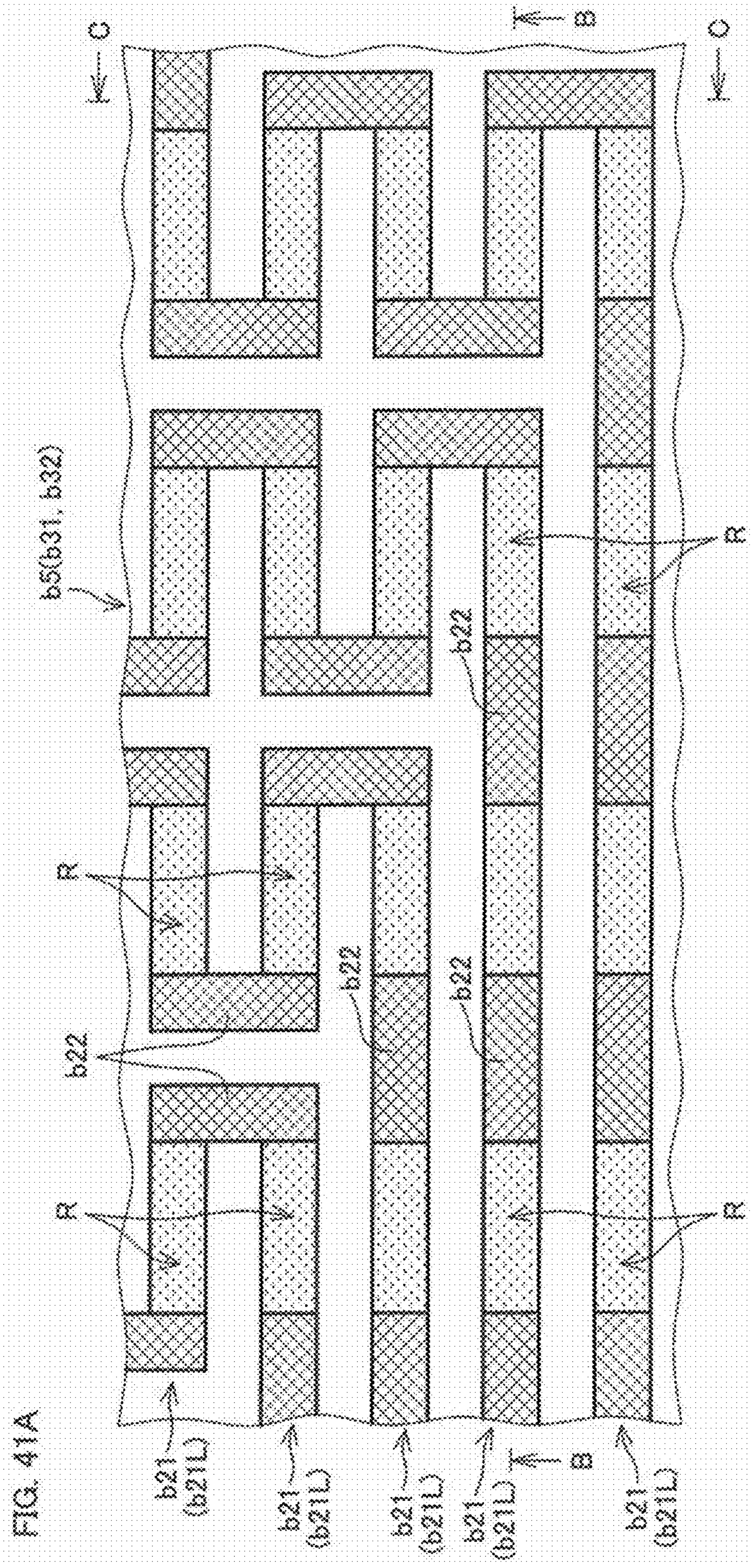
FIG. 41A is a plan view illustrating a part of the device portion shown in FIG. 40 on an enlarged scale.
Figure 41B:
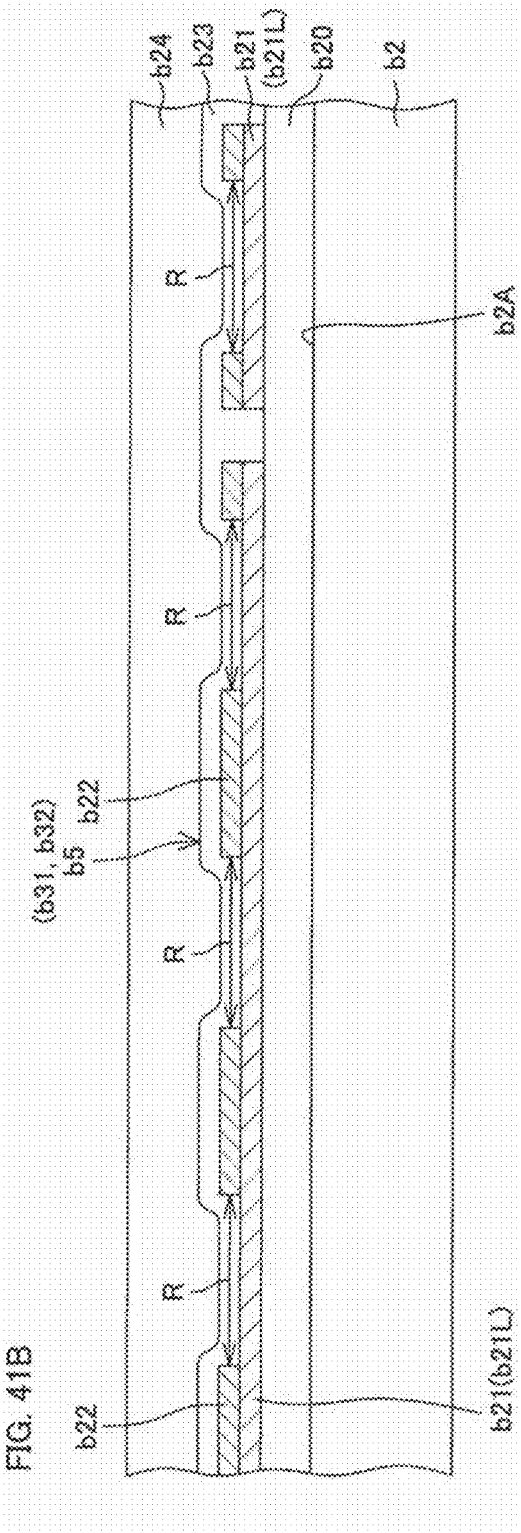
FIG. 41B is a longitudinal vertical sectional view taken along a line B-B in FIG. 41A for explaining the structure of resistor bodies of the device portion.
Figure 41C:
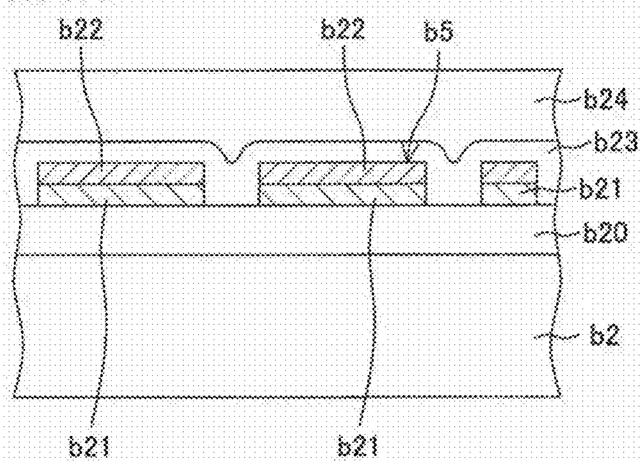
FIG. 41C is a widthwise vertical sectional view taken along a line C-C in FIG. 41A for explaining the structure of the resistor bodies of the device portion.

FIG. 41A is a plan view illustrating a part of the device portion shown in FIG. 40 on an enlarged scale. FIG. 41B is a longitudinal vertical sectional view taken along a line B-B in FIG. 41A for explaining the structure of the resistor bodies of the device portion. FIG. 41C is a widthwise vertical sectional view taken along a line C-C in FIG. 41A for explaining the structure of the resistor bodies of the device portion. Referring to FIGS. 41A, 41B and 41C, the structure of the resistor bodies R will be described.

The chip resistor b1 includes an insulative layer b20 and a resistive film b21 in addition to the interconnection film b22, the passivation film b23 and the resin film b24 described above (see FIGS. 41B and 41C). The insulative layer b20, the resistive film b21, the interconnection film b22, the passivation film b23 and the resin film b24 are provided on the substrate b2 (on the front surface b2A). The insulative layer b20 is made of $SiO_2$ (silicon oxide). The insulative layer b20 covers the entire front surface b2A of the substrate b2. The insulative layer b20 has a thickness of about 10000 Å.

The resistive film b21 is provided on the insulative layer b20. Since the resistor bodies R are formed from the resistive film b21, a part of the resistive film b21 present in the first resistor circuit network b31 is referred to as "first resistive film b21A" and a part of the resistive film b21 present in the second resistor circuit network b32 is referred to as "second resistive film b21B" (see FIGS. 43A and 43B to be described later) as in the case of the designation of the resistor bodies R. The resistive film b21 is made of TiN, TiON or TiSiON. The resistive film b21 has a thickness of about 2000 Å. The resistive film b21 includes a plurality of resistive film portions (hereinafter referred to as "resistive film lines b21L") extending linearly parallel to each other between the first electrode b3 and the third electrode b6 and between the second electrode b4 and the third electrode b6. Some of the resistive film lines b21L are cut at predetermined positions with respect to a line extending direction (see FIG. 41A).

Portions of the interconnection film b22 are provided on the resistive film lines b21L. The interconnection film portions b22 are each made of Al (aluminum) or an alloy (AlCu alloy) of aluminum and Cu (copper). The interconnection film portions b22 each have a thickness of about 8000 Å. The interconnection film portions b22 are spaced a predetermined distance R from one another in the line extending direction on the resistive film lines b21L, and contact the resistive film lines b21L. As in the case of the designation of the resistive film b21, a part of the interconnection film b22 present in the first resistor circuit network b31 is referred to as "first interconnection film b22A" and a part of the interconnection film b22 present in the second resistor circuit network b32 is referred to as "second interconnection film b22B." Therefore, portions of the first interconnection film b22A are provided in contact with the resistive film lines b21L of the first resistive film b21A in the first resistor circuit network b31, and portions of the second interconnection film b22B are provided in contact with the resistive film lines b21L of the second resistive film b21B in the second resistor circuit network b32 (see FIGS. 43A and 43B). In this example, however, the first interconnection film b22A and the second interconnection film b22B are made of the same material (Al) and have no difference in characteristic properties.

Figure 42A:
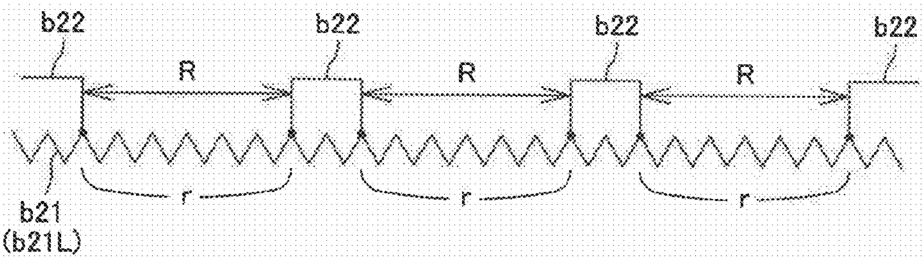
FIGS. 42A to 42C are diagrams showing the electrical characteristic features of a resistive film line and an interconnection film by way of circuit symbols and electric circuit diagrams.
Figure 42B:
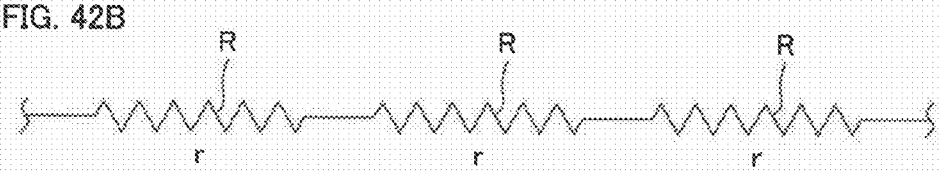
Figure 42C:
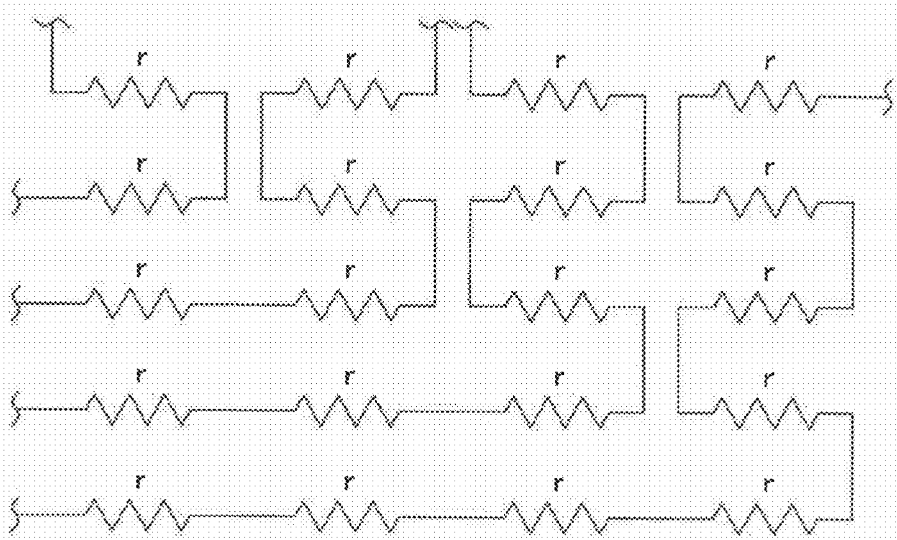

In FIGS. 42A to 42C, the electrical characteristic features of the resistive film lines b21L and the interconnection film portions b22 of this arrangement are shown by way of circuit symbols. As shown in FIG. 42A, portions of each of the resistive film lines b21L present between the interconnection film portions b22 spaced the predetermined distance R from one another each serve as a single resistor body R having a predetermined resistance value r. The interconnection film portions b22, which electrically connect adjacent resistor bodies R to each other, cause short circuit in regions of the resistive film lines b21A on which the interconnection film portions b22 are provided. Thus, a resistor circuit is provided, in which the resistor bodies R each having a resistance r are connected in series as shown in FIG. 42B.

Further, adjacent resistive film lines b21L are connected to each other by the resistive film b21 and the interconnection film b22, so that the first resistor circuit network b31 and the second resistor circuit network b32 of the device portion b5 shown in FIG. 41A each constitute a resistor circuit (including resistor bodies R each having a unit resistance as described above) shown in FIG. 42C. Thus, the resistive film b21 and the interconnection film b22 form the resistor bodies R and the resistor circuits (i.e., the first resistor circuit network b31 and the second resistor circuit network b32 of the device portion b5). The resistor bodies R are constituted by a resistive film line b21L (resistive film b21) and a plurality of interconnection film portions b22 provided on the resistive film line b21L and spaced the predetermined distance in the line extending direction. Particularly, the first resistor bodies R1 in the first resistor circuit network b31 are constituted by the first resistive film b21A and the first interconnection film b22A, and the second resistor bodies R2 in the second resistor circuit network b32 are constituted by the second resistive film b21B and the second interconnection film b22B (see FIGS. 43A and 43B). In the first resistor circuit network b31 and the second resistor circuit network b32, portions of the resistive film lines b21L not provided with the interconnection film portions b22 spaced the predetermined distance R from one another each define a single resistor body R. The portions of the resistive film lines b21L defining the resistor bodies R each have the same shape and the same size. Therefore, the multiplicity of resistor bodies R arranged in the matrix array on the substrate b2 each have the same resistance value.

Figure 43A:
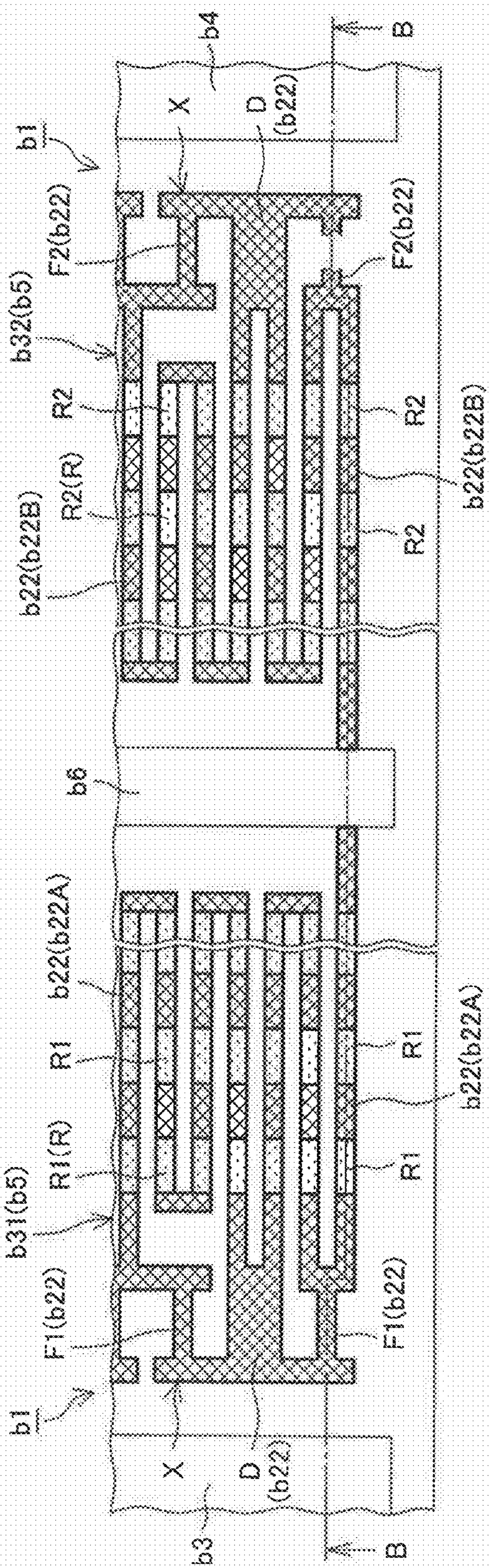
FIG. 43A is an enlarged partial plan view illustrating a region of the chip resistor including fuses shown in a part of the plan view of FIG. 40 on an enlarged scale.

The interconnection film portions b22 provided on the resistive film lines b21L define the resistor bodies R, and also serve as conductor films D for connecting the resistor bodies R to one another to provide the resistor circuits (see FIG. 40). FIG. 43A is an enlarged partial plan view illustrating a region of the chip resistor including the fuses shown in a part of the plan view of FIG. 40 on an enlarged scale, and FIG. 43B is a diagram showing a sectional structure taken along a line B-B in FIG. 43A.

Figure 43B:
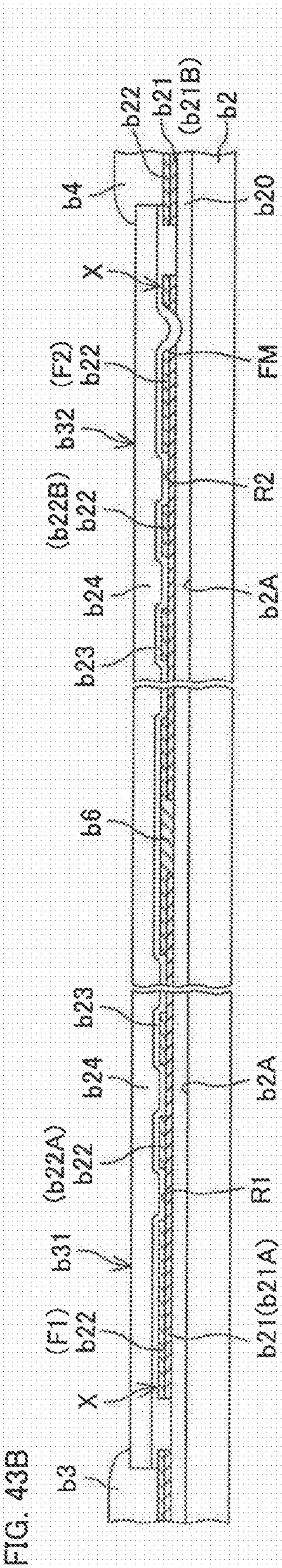
FIG. 43B is a diagram showing a sectional structure taken along a line B-B in FIG. 43A.

As shown in FIGS. 43A and 43B, the fuses F and the conductor films D described above are formed from the same interconnection film b22 as the interconnection film portions b22 provided on the resistive film b21 for the resistor bodies R in the first resistor circuit network b31 and the second resistor circuit network b32. That is, the fuses F and the conductor films D are formed of Al or the AlCu alloy, which is the same metal material as for the interconnection film portions b22 provided on the resistive film lines b21L to define the resistor bodies R, and provided at the same level as the interconnection film portions b22. As described above, the interconnection film b22 is also used for the conductor films D for electrically connecting the plurality of resistor bodies R to form the resistor circuits.

That is, the interconnection film portions b22 for defining the resistor bodies R, the interconnection film portions b22 for the fuses F (the first fuses F1 and the second fuses F2) and the conductor films D, and the interconnection film portions b22 for connecting the device portion b5 (the first resistor circuit network b31 and the second resistor circuit network b32) to the first electrode b3 and the second electrode b4 are formed of the same metal material (Al or the AlCu alloy) and provided at the same level on the resistive film b21. It is noted that the fuses F are different (discriminated) from the other interconnection film portions b22 in that the fuses F are thinner for easy disconnection and no circuit element is present around the fuses F.

Regions of the interconnection film b22 in which the fuses F (the first fuses F1 and the second fuses F2) are disposed are herein referred to as "trimming regions X" (see FIGS. 40 and 43(*a*)). The trimming regions X respectively linearly extend alongside the inner edges of the first electrode b3 and the second electrode b4, and not only the fuses F but also some of the conductor films D are present in the trimming regions X. The resistive film b21 is partly present below the trimming regions X of the interconnection film b22 (see FIG. 43B). The fuses F are each spaced a greater distance from the surrounding interconnection film portions b22 than the other interconnection film portions b22 present outside the trimming regions X.

The fuses F each do not simply designate a part of the interconnection film portion b22, but may each designate a fuse element which is a combination of a part of the resistor body R (resistive film b21) and a part of the interconnection film portion b22 on the resistive film b21. In the above description, the fuses F are located at the same level as the conductor films D, but an additional conductor film may be provided on the respective conductor films D to reduce the resistance values of the conductor films D as a whole. Even in this case, the fusibility of the fuses F is not reduced as long as the additional conductor film is not present on the fuses F.

Referring to FIG. 43B, the aforementioned resistive film b21 is discontinuous along a boundary between the first resistor circuit network b31 and the second resistor circuit network b32, and a portion of the interconnection film b22 covering the boundary is present directly on the insulative layer b20 as extending linearly widthwise of the substrate b2. The interconnection film portion b22 covering the boundary serves as the third electrode b6 described above. In FIGS. 43A and 43B, a second fuse F2 present on the line B-B is disconnected by way of example. As shown in FIG. 43B, the passivation film b23 partly enters a disconnected portion of the second fuse F2, and disconnection surfaces FM of the second fuse F2 are covered with the passivation film b23.

Figure 44:
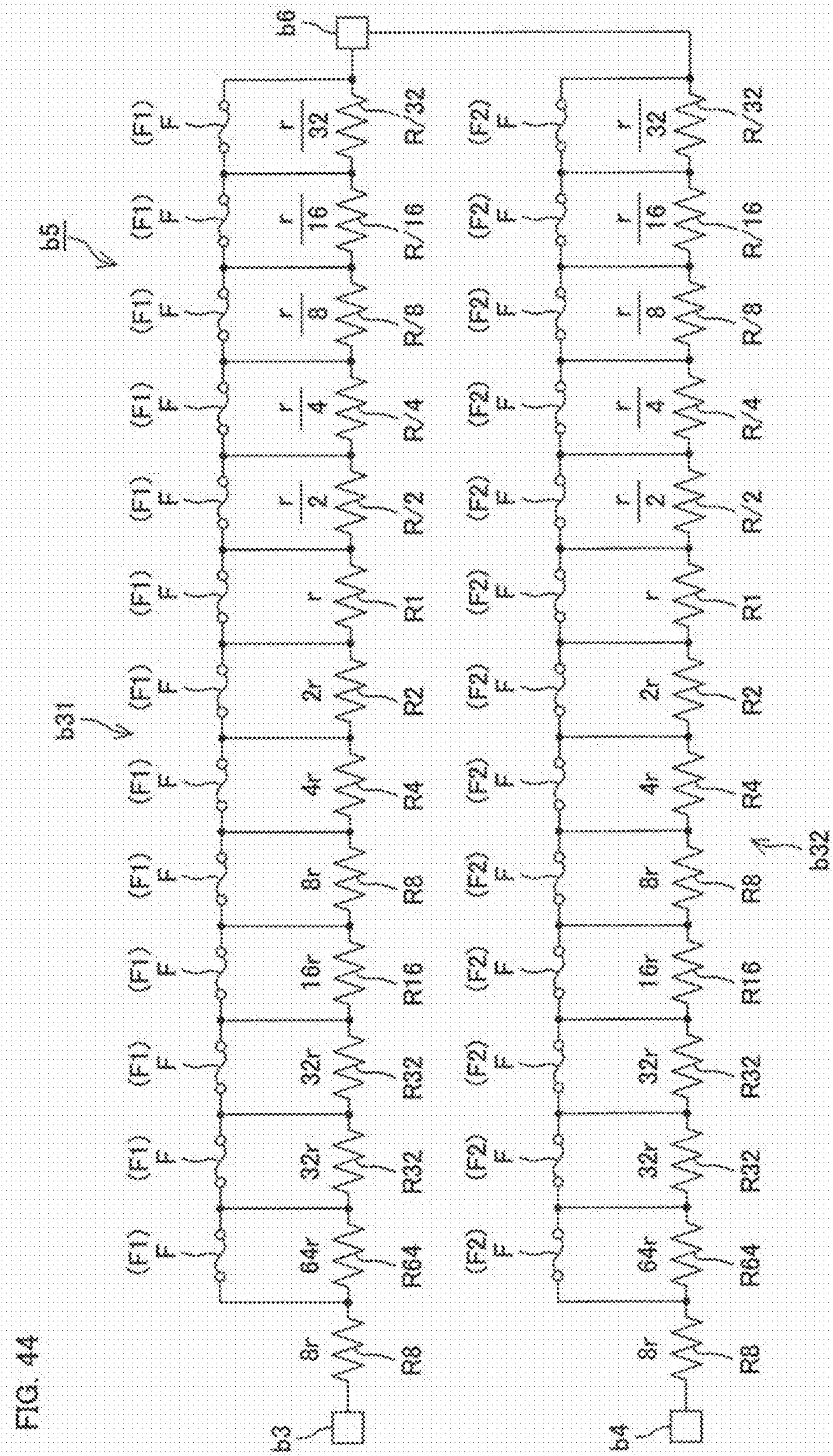
FIG. 44 is an electric circuit diagram of the device portion according to the example of the second reference embodiment.

FIG. 44 is an electric circuit diagram of the device portion according to the example of the second reference embodiment. Referring to FIG. 44, the first resistor circuit network b31 and the second resistor circuit network b32 of the device portion b5 each include a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32, which are connected in series in this order from the first electrode b3 or the second electrode b4. The reference resistor circuit R8 and the resistor circuits R64 to R2 each include resistor bodies R in the same number as the suffix number of the reference character (e.g., 64 resistor bodies for the resistor circuit R64), wherein the resistor bodies R are connected in series. The resistor circuit R1 includes a single resistor body R. The resistor circuits R/2 to R/32 each include resistor bodies R in the same number as the suffix number of the reference character (e.g., 32 resistor bodies for the resistor circuit R/32), wherein the resistor bodies R are connected in parallel. The suffix number of the reference character for the designation of the resistor circuit has the same definition in FIGS. 45 and 46 to be described later.

A single fuse F is connected in parallel to each of the resistor circuits R64 to R/32 except the reference resistor circuit R8. The fuses F are connected in series to one another directly or via the conductor films D (see FIG. 43A). With none of the fuses F fused off as shown in FIG. 44, the first resistor circuit network b31 and the second resistor circuit network b32 constitute a resistor circuit such that the reference resistor circuit R8 (including 8 resistor bodies R connected in series) provided between the first electrode b3 and the third electrode b6 is connected in series to the reference resistor circuit R8 provided between the second electrode b4 and the third electrode b6. Where the resistor bodies R each have a resistance value r of r=8Ω, for example, the chip resistor b1 is configured such that the first electrode b3 and the second electrode b4 are connected to each other through the two resistor circuits (two reference resistor circuits R8) each having a resistance value of 8r=64Ω.

With none of the fuses F fused off in each of the first resistor circuit network b31 and the second resistor circuit network b32, the plural types of resistor circuits except the reference resistor circuit R8 are short-circuited. That is, 12 types of 13 resistor circuits R64 to R/32 are connected in series to the reference resistor circuit R8, but are short-circuited by the fuses F connected in parallel thereto in each of the first resistor circuit network b31 and the second resistor circuit network b32. Therefore, each of the resistor circuits is not electrically incorporated in the device portion b5 (in the first resistor circuit network b31 and the second resistor circuit network b32).

In the chip resistor b1 according to this example, the fuses F are selectively fused off, for example, by a laser beam according to the required resistance value. Thus, a resistor circuit connected in parallel to a fused fuse F is incorporated in the device portion b5 (in the first resistor circuit network b31 and the second resistor circuit network b32). Therefore, the device portion b5 has an overall resistance value which is controlled by connecting, in series, resistor circuits incorporated by fusing off the corresponding fuses F.

Particularly, the plural types of resistor circuits include plural types of serial resistor circuits which respectively include 1, 2, 4, 8, 16, 32, . . . resistor bodies R (whose number increases in a geometrically progressive manner with a geometric ratio of 2) each having the same resistance value and connected in series, and plural types of parallel resistor circuits which respectively include 2, 4, 8, 16, . . . resistor bodies R (whose number increases in a geometrically progressive manner with a geometric ratio of 2) each having the same resistance value and connected in parallel. Therefore, the overall resistance value of the device portion b5 (resistor portion b56) can be digitally and finely controlled to a desired resistance value by selectively fusing off the fuses F (or the fuse elements described above). Thus, the chip resistor b1 can have the desired resistance value.

Figure 45:
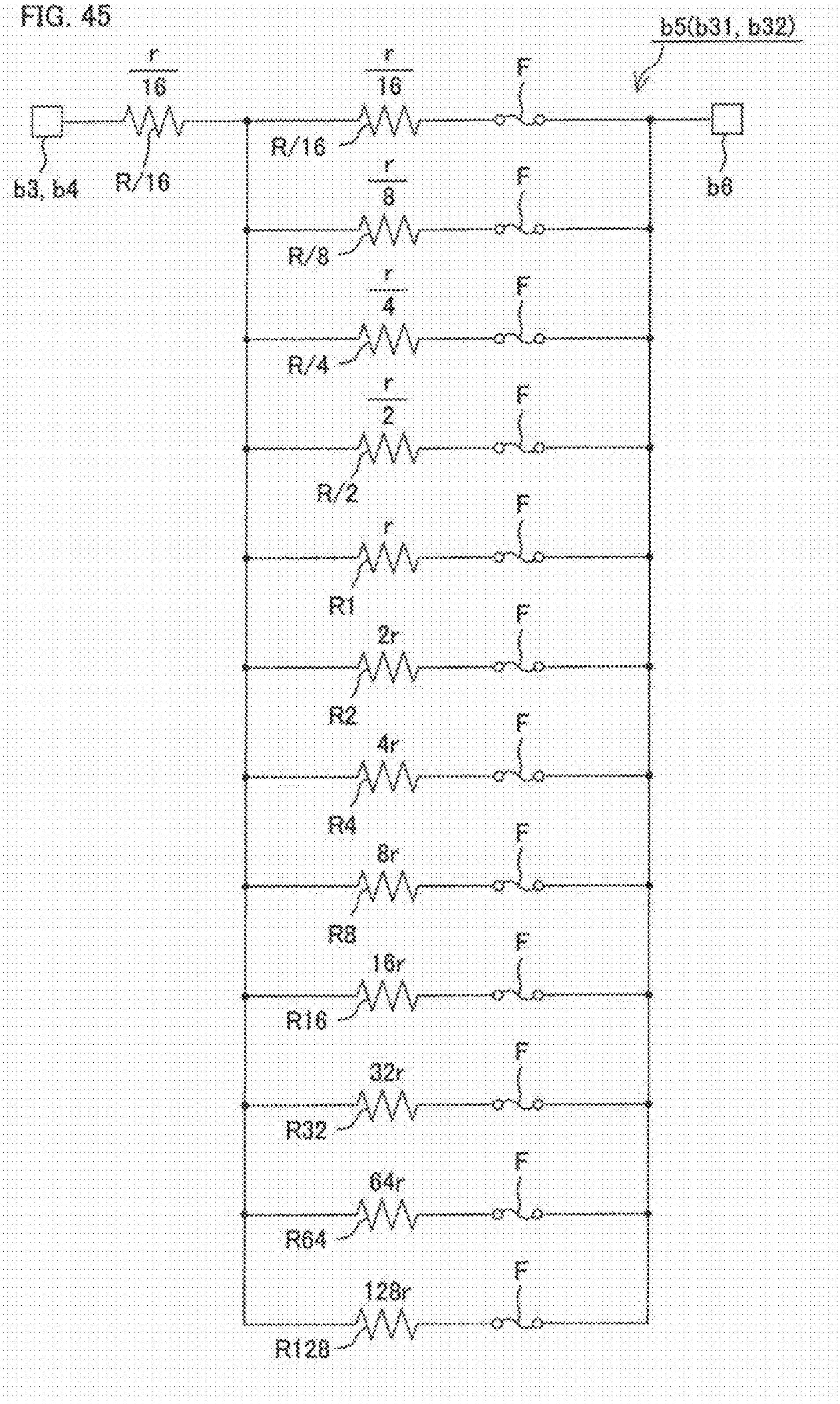
FIG. 45 is an electric circuit diagram of a device portion according to another example of the second reference embodiment.

FIG. 45 is an electric circuit diagram of a device portion according to another example of the second reference embodiment. The first resistor circuit network b31 and the second resistor circuit network b32 may be each configured as shown in FIG. 45, rather than by connecting the resistor circuits R64 to R/32 in series to the reference resistor circuit R8 as shown in FIG. 44. More specifically, the first resistor circuit network b31 and the second resistor circuit network b32 may each include a circuit configured such that a parallel connection circuit including 12 types of resistor circuits R/16, R/8, R/4, R/2, R1, R2, R4, R8, R16, R32, R64, R128 is connected in series to a reference resistor circuit R/16 between the first electrode b3 and the third electrode b6 or between the second electrode b4 and the third electrode b6.

In this case, a fuse F is connected in series to each of the 12 types of resistor circuits except the reference resistor circuit R/16 in each of the first resistor circuit network b31 and the second resistor circuit network b32. With none of the fuses F fused off, all the resistor circuits are electrically incorporated in the device portion b5 (in the first resistor circuit network b31 and the second resistor circuit network b32). The fuses F are selectively fused off, for example, by a laser beam according to the required resistance value. Thus, a resistor circuit associated with a fused fuse F (a resistor circuit connected in series to the fused fuse F) is electrically isolated from the device portion b5 (the first resistor circuit network b31 or the second resistor circuit network b32) to control the overall resistance value of the chip resistor b1.

Figure 46:
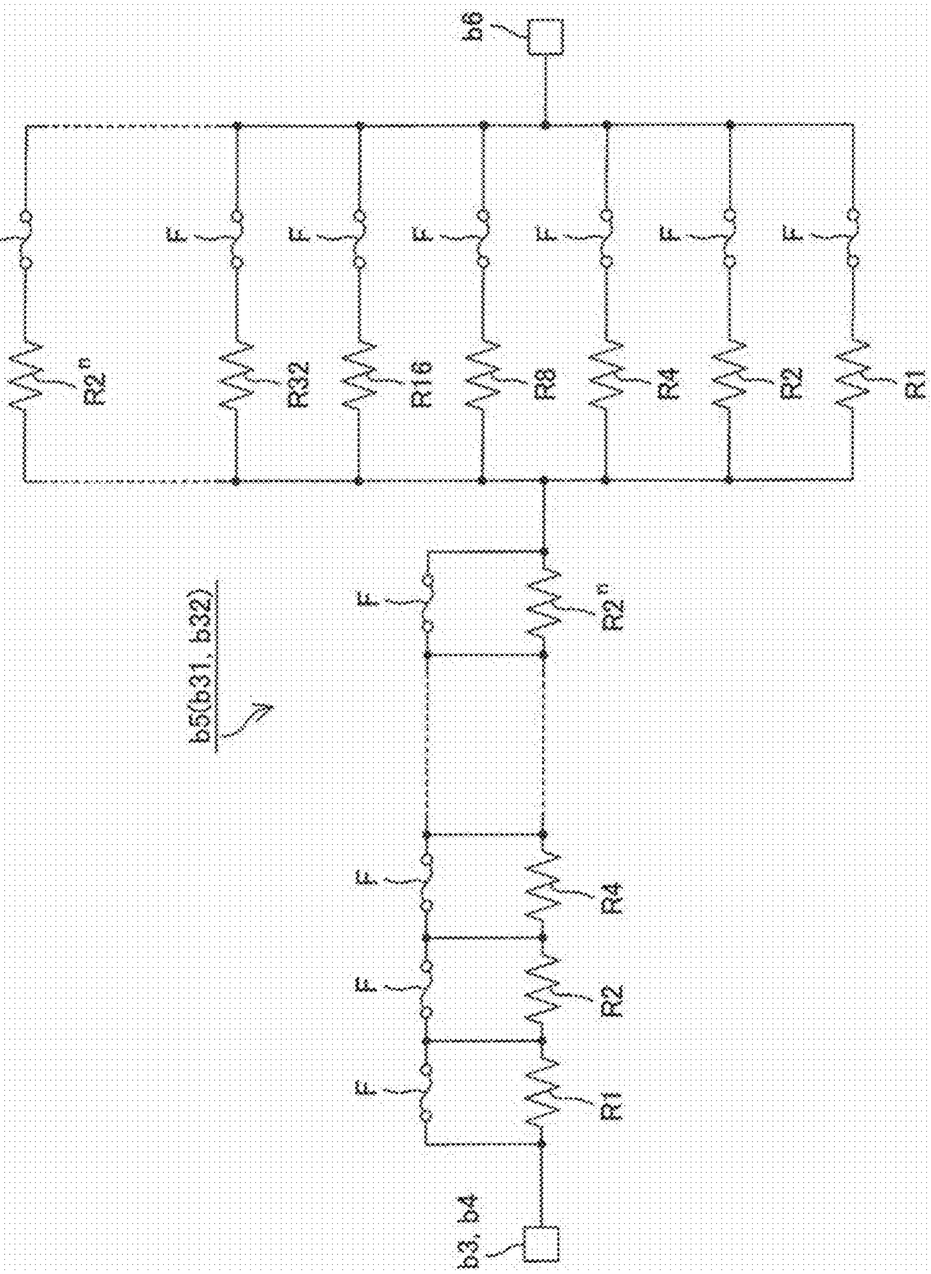
FIG. 46 is an electric circuit diagram of a device portion according to further another example of the second reference embodiment.

FIG. 46 is an electric circuit diagram of a device portion according to further another example of the second reference embodiment. The device portion b5 shown in FIG. 46 has a characteristic configuration such that a serial connection circuit including plural types of resistor circuits is connected in series to a parallel connection circuit including plural types of resistor circuits in each of the first resistor circuit network b31 and the second resistor circuit network b32. As in the previous example, a fuse F is connected in parallel to each of the plural types of resistor circuits connected in series, and all the plural types of resistor circuits connected in series are short-circuited by the fuses F in each of the first resistor circuit network b31 and the second resistor circuit network b32. With a fuse F fused off, therefore, a resistor circuit which has been short-circuited by that fuse F is electrically incorporated in the device portion b5.

On the other hand, a fuse F is connected in series to each of the plural types of resistor circuits connected in parallel in each of the first resistor circuit network b31 and the second resistor circuit network b32. With a fuse F fused off, therefore, a resistor circuit which has been connected in series to that fuse F is electrically isolated from the parallel connection resistor circuits. With this arrangement, for example, a resistance of smaller than 1 kΩ may be formed in the parallel connection side, and a resistor circuit of 1 kΩ or greater may be formed in the serial connection side. Thus, a resistor circuit having a resistance value in a wide range from a smaller resistance value on the order of several ohms to a greater resistance value on the order of several megaohms can be produced from a resistor circuit network (the first resistor circuit network b31 and the second resistor circuit network b32) designed based on the same basic design concept. That is, the chip resistor b1 can be easily and speedily customized to have any of plural resistance values by selectively disconnecting one or more of the fuses F. In other words, the chip resistor b1 can be customized based on the same design concept so as to have various resistance values by selectively combining the resistor bodies R having different resistance values.

Figure 47:
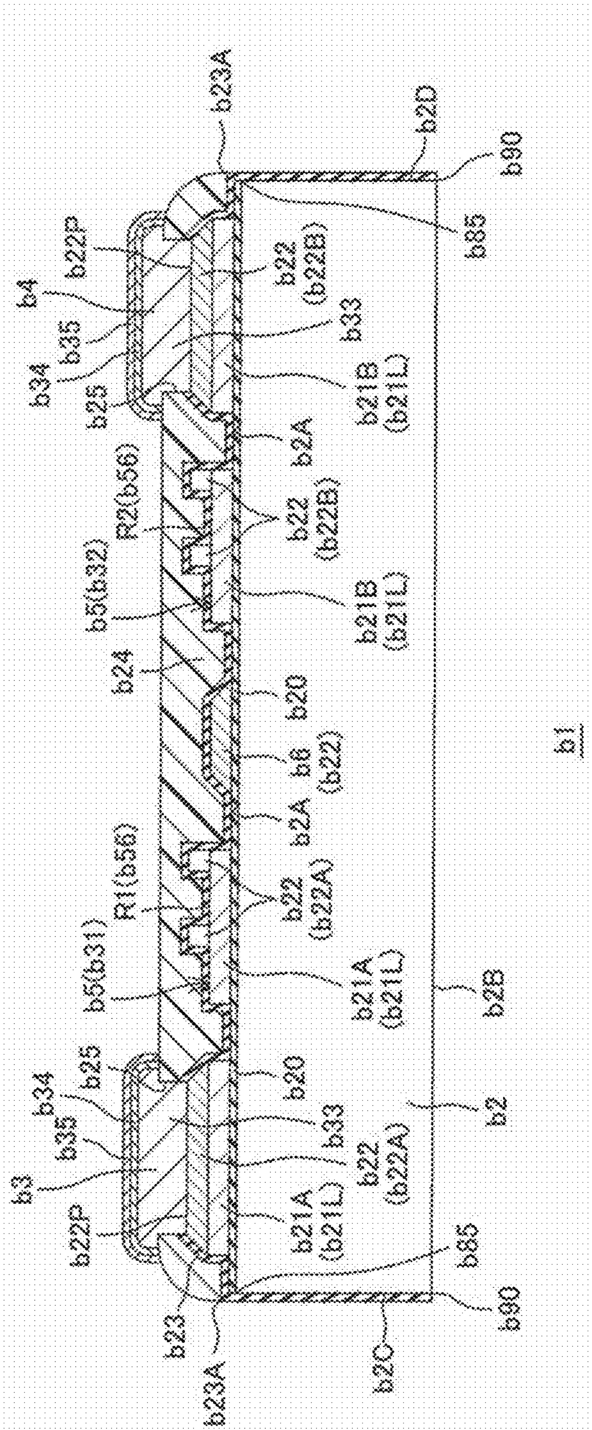
FIG. 47 is a schematic sectional view of the chip resistor.

In the chip resistor b1, as described above, the connection of the plurality of resistor bodies R (resistor circuits) can be changed in each of the trimming regions X. FIG. 47 is a schematic sectional view of the chip resistor. Referring next to FIG. 47, the chip resistor b1 will be described in greater detail. In FIG. 47, the device portion b5 described above is simplified, and components other than the substrate b2 are hatched for convenience of description.

The passivation film b23 and the resin film b24 will be described. The passivation film b23 is made of, for example, SiN (silicon nitride), and has a thickness of 1000 Å to 5000 Å (here, about 3000 Å). The passivation film b23 is provided over the front surface b2A and the side surfaces b2C to b2F. A portion of the passivation film b23 present on the front surface b2A covers the resistive film b21 and the interconnection film portions b22 present on the resistive film b21 (i.e., both of the first resistor circuit network b31 and the second resistor circuit network b32 of the device portion b5) from the front side (from the upper side in FIG. 47), thereby covering the upper surfaces of the resistor bodies R of the device portion b5. Thus, the passivation film portion b23 also covers the trimming regions X of the interconnection film b22 (the fuses F) (see FIG. 43B). Further, the passivation film portion b23 contacts the device portion b5 (the interconnection film b22 and the resistive film b21), and also contacts the insulative layer b20 in a region not formed with the resistive film b21. Thus, the passivation film portion b23 present on the front surface b2A covers the front surface b2A from above the device portion b5 (the first resistor circuit network b31 and the second resistor circuit network b32), the fuses F, the third electrode b6 and the insulative layer b20, thereby protecting the first resistor circuit network b31, the second resistor circuit network b32 and the third electrode b6. On the front surface b2A, the passivation film portion b23 prevents an unintended short circuit which may be a short circuit other than that occurring between the interconnection film portions b22 present between the resistor bodies R (an unintended short circuit which may occur between adjacent resistive film lines b21A).

On the other hand, portions of the passivation film b23 present on the respective side surfaces b2C to b2F function as protective layers which respectively protect the side surfaces b2C to b2F. The edge portion b85 described above is present on the boundaries between the front surface b2A and the side surfaces b2C to b2F, and the passivation film b23 also covers the boundaries (the edge portion b85). A portion of the passivation film b23 covering the edge portion b85 (overlying the edge portion b85) is herein referred to as an edge portion b23A. Since the passivation film b23 is a very thin film, the passivation film portions b23 covering the side surfaces b2C to b2F are regarded as a part of the substrate b2 in this example. Therefore, the passivation film portions b23 covering the side surfaces b2C to b2F are regarded as the side surfaces b2C to b2F themselves.

Together with the passivation film b23, the resin film b24 protects the front surface b2A of the chip resistor b1. The resin film b24 is made of a resin such as a polyimide. The resin film b24 has a thickness of about 5 μm. The resin film b24 is provided on the passivation film portion b23 present on the front surface b2A to cover the entire surface of the passivation film portion b23 (including the resistive film b21 and the interconnection film b22 covered with the passivation film portion b23). Therefore, the first resistor circuit network b31, the second resistor circuit network b32 and the third electrode b6 are protected doubly by the passivation film b23 and the resin film b24. An edge portion of the resin film b24 coincides with the edge portion b23A of the passivation film b23 (the edge portion b85 of the front surface b2A) as seen in plan.

The resin film b24 has two openings b25 respectively formed therein at two positions spaced from each other as seen in plan. The openings b25 are through-holes extending continuously thicknesswise through the resin film b24 and the passivation film b23. Therefore, not only the resin film b24 but also the passivation film b23 has the openings b25. The interconnection film b22 is partly exposed from the respective openings b25. The parts of the interconnection film b22 exposed from the respective openings b25 serve as pad regions b22P for the external connection.

One of the two openings b25 is completely filled with the first electrode b3, and the other opening b25 is completely filled with the second electrode b4. The first electrode b3 and the second electrode b4 each have an Ni layer b33, a Pd layer b34 and an Au layer b35 provided in this order from the front surface b2A. In each of the first electrode b3 and the second electrode b4, therefore, the Pd layer b34 is disposed between the Ni layer b33 and the Au layer b35. The Ni layer b33 occupies the most of each of the first electrode b3 and the second electrode b4, and the Pd layer b34 and the Au layer b35 are much thinner than the Ni layer b33. When the chip resistor b1 is mounted on the mount substrate b9 (see FIG. 39B), the Ni layer b33 functions to connect the solder b13 to Al of the pad region b22P of the interconnection film b22 in each of the openings b25.

In each of the first electrode b3 and the second electrode b4, the surface of the Ni layer b33 is covered with the Au layer b35, so that the oxidation of the Ni layer b33 can be prevented. Even if the Au layer b35 of each of the first electrode b3 and the second electrode b4 has a through-hole (pin hole) because of its smaller thickness, the Pd layer b34 provided between the Ni layer b33 and the Au layer b35 closes the through-hole. This prevents the Ni layer b33 from being exposed to the outside through the through-hole and oxidized.

The Au layers b35 are respectively exposed on the outermost surfaces of the first electrode b3 and the second electrode b4 to the outside from the openings b25 of the resin film b24. The first electrode b3 is kept in contact with and electrically connected to the pad region b22P of the interconnection film b22 present in the one opening b25 through the one opening b25. The second electrode b4 is kept in contact with and electrically connected to the pad region b22P of the interconnection film b22 present in the other opening b25 through the other opening b25. The Ni layers b33 of the first electrode b3 and the second electrode b4 are respectively connected to the pad regions b22P. Thus, the first electrode b3 and the second electrode b4 are electrically connected to the device portion b5. Here, the pad region b22P in contact with the first electrode b3 is regarded as a part of the first electrode b3, and the pad region b22P in contact with the second electrode b4 is regarded as a part of the second electrode b4. The interconnection film b22 serves as interconnections connected to the assembly of the resistor bodies R (resistor portion b56), the first electrode b3, the second electrode b4 and the third electrode b6.

Thus, the resin film b24 and the passivation film b23 formed with the openings b25 cover the front surface b2A with the first electrode b3 and the second electrode b4 being exposed from the respective openings b25. Therefore, the chip resistor b1 is electrically connected to the mount substrate b9 through the first electrode b3 and the second electrode b4 exposed from the resin film b24 when being mounted on the mount substrate b9 (see FIG. 39B).

The interconnection film portion b22 (the third electrode b6 described above) present between the first resistor circuit network b31 and the second resistor circuit network b32 is covered with the passivation film b23 and the resin film b24.

FIGS. 48A to 48M are schematic sectional views showing a production method for the chip resistor shown in FIG. 47.

Figure 48A:
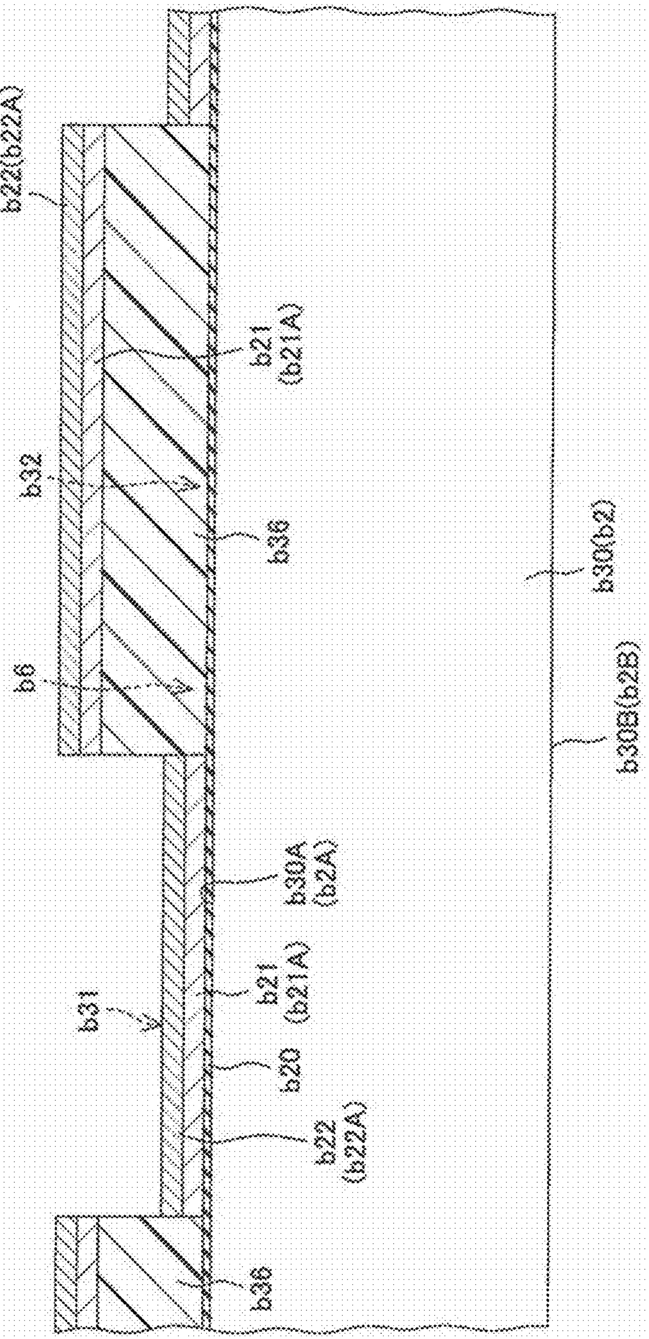
FIG. 48A is a schematic sectional view showing a production method for the chip resistor shown in FIG. 47.

First, as shown in FIG. 48A, a substrate b30 is prepared as a material for the substrate b2. In this case, a front surface b30A of the substrate b30 corresponds to the front surface b2A of the substrate b2, and a back surface b30B of the substrate b30 corresponds to the back surface b2B of the substrate b2. Then, an insulative layer b20 of $SiO_2$ or the like is formed in the front surface b30A of the substrate b30 by thermally oxidizing the front surface b30A of the substrate b30.

In turn, a resist pattern b36 is formed on the insulative layer b20. The resist pattern b36 covers regions of the insulative layer b20 to be formed with second resistor circuit networks b32 and third electrodes b6, but does not cover the other region (regions to be formed with first resistor circuit networks b31). Subsequently, a first resistive film b21A of TiON or TiONSi is formed by a sputtering process. In the regions formed with the resist pattern b36, the first resistive film b21A is formed on the resist pattern b36. In the regions not formed with the resist pattern b36, the first resistive film b21A is formed on the insulative layer b20. This sputtering process is performed while supplying oxygen and nitrogen. At this time, nitrogen and oxygen bombard a Ti target, whereby Ti atoms are ejected from the target. The Ti atoms are combined with nitrogen atoms and oxygen atoms to generate TiON, which is deposited on the insulative layer b20 and the resist pattern b36 to form the first resistive film b21A. Where the substrate b30 is a silicon substrate, TiON deposited on the insulative layer b20 at this time is combined with Si of the substrate b30 underlying the insulative layer b20, and the first resistive film b21A of TiONSi is formed on the insulative layer b20.

The flow rate of oxygen to be supplied during the sputtering process is controlled according to an intended resistance temperature coefficient. The resistance temperature coefficient is one of the temperature characteristics of the resistive film b21, and is solely dependent on a substance constituting the resistive film b21. Therefore, it is difficult to adjust the resistance temperature coefficient of the resistive film b21 after the completion of the resistive film b21. Therefore, the oxygen flow rate is controlled during the sputtering process for the formation of the resistive film b21, whereby the composition of TiON or TiONSi constituting the resistive film b21 is controlled to adjust the resistance temperature coefficient at a desired value.

More specifically, a higher oxygen flow rate in the sputtering process promotes the combination of the Ti atoms and the oxygen atoms, thereby correspondingly increasing the oxygen composition ratio of TiON or TiONSi of the completed resistive film b21. As the oxygen composition ratio (i.e., the oxygen flow rate) is increased, the resistance temperature coefficient of the resistive film b21 is reduced. That is, the temperature characteristics (resistance temperature coefficient) of the resistor bodies R can be controlled by controlling the oxygen flow rate.

In this sputtering process, the oxygen flow rate is controlled (at a lower level) so that the completed first resistive film b21A has a positive resistance temperature coefficient (preferably a positive resistance temperature coefficient of not greater than 300 ppm/° C.). Thus, the completed first resistive film b21A is made of TiON or TiONSi (first material) having an oxygen composition ratio controlled for the positive resistance temperature coefficient.

After the first resistive film b21A is thus formed, a first interconnection film b22A of aluminum (Al) is formed on the first resistive film b21A in contact with the first resistive film b21A by another sputtering process. Thereafter, portions of the first resistive film b21A and the first interconnection film b22A on the resist pattern b36 are lifted off (removed) together with the resist pattern b36. Thus, the other portions of the first resistive film b21A and the first interconnection film b22A remain on the regions to be formed with the first resistor circuit networks b31.

Figure 48B:
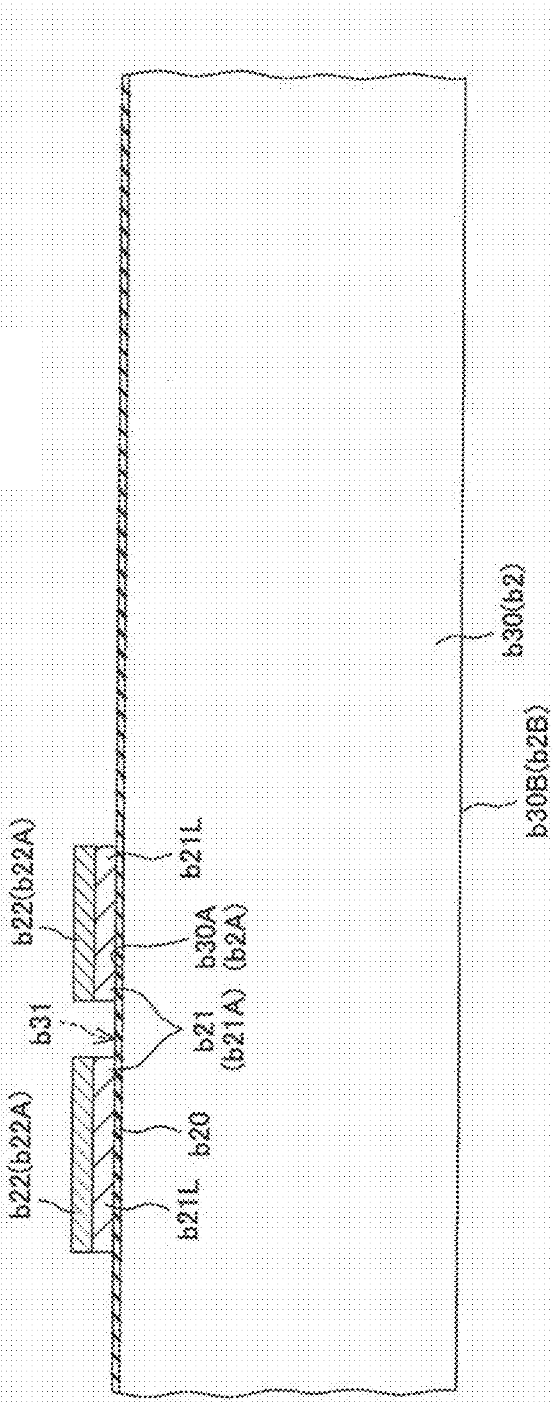
FIG. 48B is a schematic sectional view showing a process step subsequent to that shown in FIG. 48A.

Thereafter, the first resistive film b21A and the first interconnection film b22A are selectively removed to be patterned as shown in FIG. 48B by utilizing a photolithography process and dry etching such as RIE (Reactive Ion Etching). Thus, resistive film lines b21L of the first resistive film b21A each having a predetermined width (see FIG. 41A) are arranged at a predetermined interval in a column direction as seen in plan in the regions to be formed with the first resistor circuit networks b31. At this time, the resistive film lines b21L and the interconnection film portions b22 are partly cut, and fuses F and conductor films D are formed in the trimming regions X (see FIG. 40). The dry etching makes it possible to highly accurately form the resistive film lines b21L (later serving as resistor bodies R) and the fuses F.

Figure 48C:
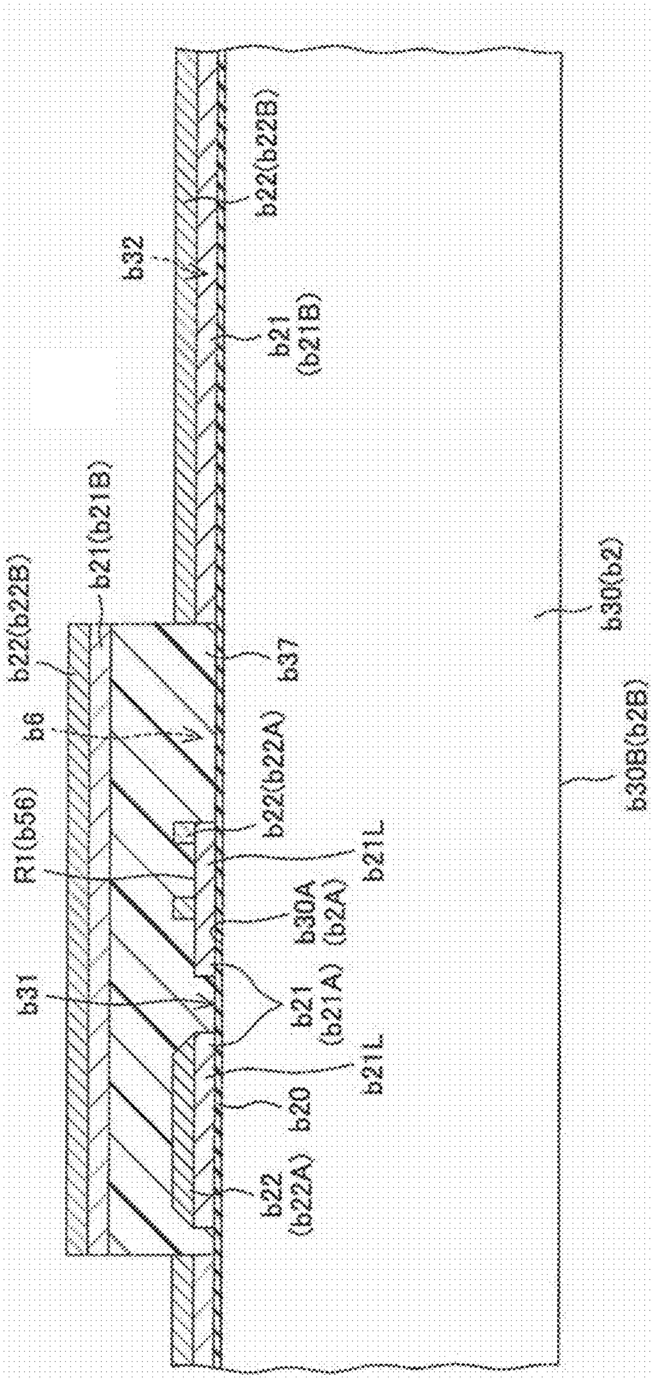
FIG. 48C is a schematic sectional view showing a process step subsequent to that shown in FIG. 48B.

In turn, the first interconnection film portions b22A provided on the respective resistive film lines b21L of the first resistive film b21A are selectively removed as shown in FIG. 48C, for example, by wet etching. As a result, the first resistor circuit networks b31 are provided, which are each configured such that interconnection film portions b22 are spaced a predetermined distance R from one another on the resistive film lines b21L of the first resistive film b21A. At this time, the overall resistance value of each of the first resistor circuit networks b31 may be measured in order to check if the first resistive film b21A and the first interconnection film b22A are formed as each having intended dimensions.

In turn, a resist pattern b37 is formed on the insulative layer b20 and the first resistor circuit networks b31. The resist pattern b37 covers the regions of the insulative layer b20 formed with the first resistor circuit networks b31 and the regions of the insulative layer b20 to be formed with the third electrodes b6, but does not cover the other region (the regions to be formed with the second resistor circuit networks b32). Subsequently, a second resistive film b21B of TiON or TiONSi is formed by a sputtering process. In the regions formed with the resist pattern b37, the second resistive film b21B is formed on the resist pattern b37. In the regions not formed with the resist pattern b37, the second resistive film b21B is formed on the insulative layer b20. This sputtering process is performed in substantially the same manner as the sputtering process performed for the formation of the first resistive film b21A. In this sputtering process, the oxygen flow rate is controlled as in the sputtering process performed for the formation of the first resistive film b21A. In this sputtering process, however, the oxygen flow rate is controlled (at a higher level) so that the completed second resistive film b21B has a negative resistance temperature coefficient (preferably a negative resistance temperature coefficient of not less than −300 ppm/° C.) unlike in the sputtering process performed for the formation of the first resistive film b21A. Thus, the completed second resistive film b21B is made of TiON or TiONSi (second material) having an oxygen composition ratio controlled for the negative resistance temperature coefficient.

Thus, the first resistive film b21A having a positive resistance temperature coefficient and the second resistive film b21B having a negative resistance temperature coefficient are each made of TiON or TiONSi having a controlled oxygen composition ratio. After the second resistive film b21B is thus formed, a second interconnection film b22B of aluminum (Al) is formed on the second resistive film b21B in contact with the second resistive film b21B by further another sputtering process.

Thereafter, portions of the second resistive film b21B and the second interconnection film b22B on the resist pattern b37 are lifted off (removed) together with the resist pattern b37. Thus, the other portions of the second resistive film b21B and the second interconnection film b22B remain on the regions to be formed with the second resistor circuit networks b32.

Figure 48D:
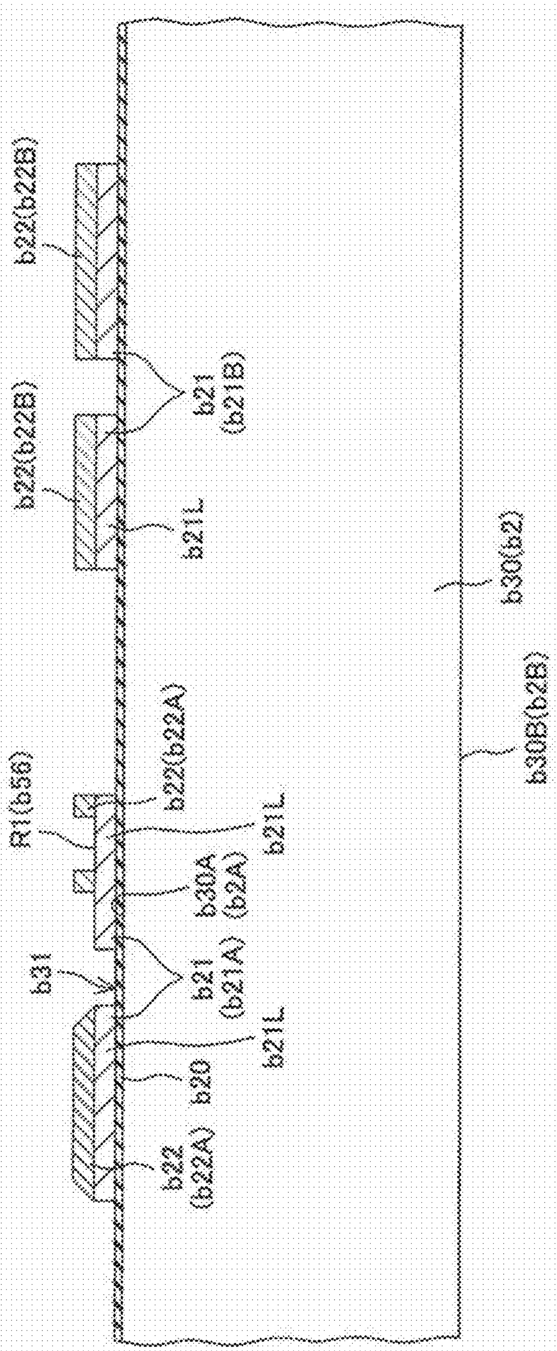
FIG. 48D is a schematic sectional view showing a process step subsequent to that shown in FIG. 48C.

Thereafter, the second resistive film b21B and the second interconnection film b22B are selectively removed to be patterned as shown in FIG. 48D by utilizing a photolithography process and dry etching such as RIE. Thus, resistive film lines b21L of the second resistive film b21B each having a predetermined width (see FIG. 41A) are arranged at a predetermined interval in a column direction as seen in plan in the regions to be formed with the second resistor circuit networks b32. At this time, the resistive film lines b21L and the interconnection film portions b22 are partly cut, and fuses F and conductor films D are formed in the trimming regions X (see FIG. 40).

Figure 48E:
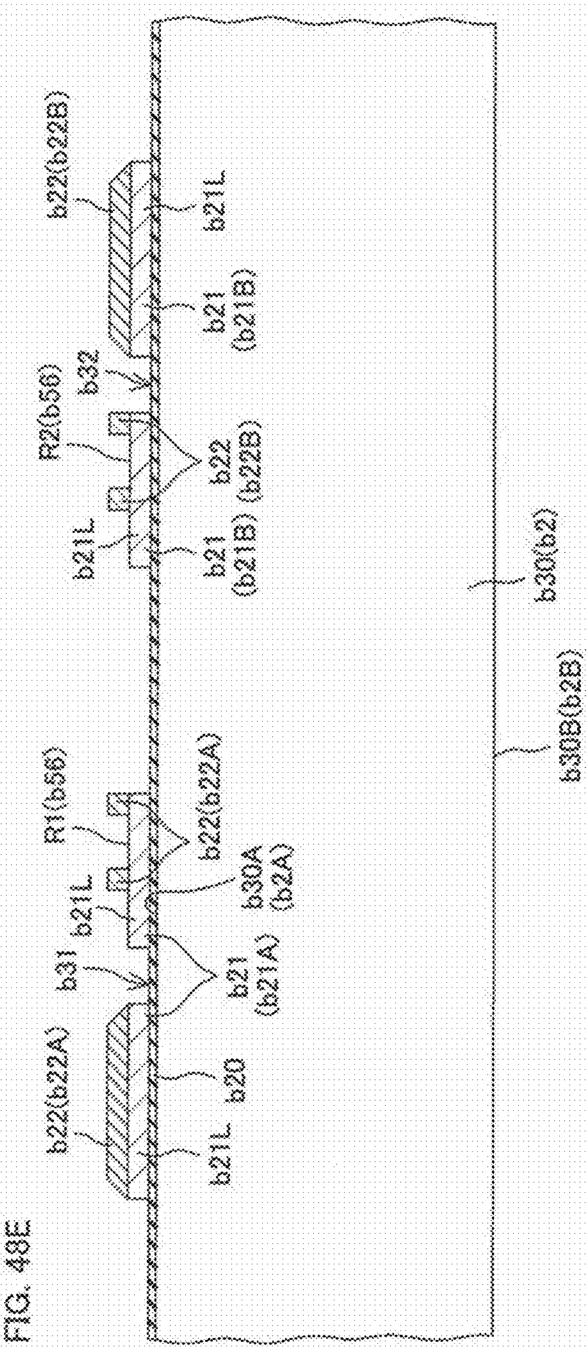
FIG. 48E is a schematic sectional view showing a process step subsequent to that shown in FIG. 48D.

In turn, the second interconnection film portions b22B provided on the respective resistive film lines b21L of the second resistive film b21B are selectively removed as shown in FIG. 48E, for example, by wet etching. As a result, the second resistor circuit networks b32 are provided, which are each configured such that interconnection film portions b22 are spaced a predetermined distance R from one another on the resistive film lines b21L of the second interconnection film b22B. At this time, the overall resistance value of each of the second resistor circuit networks b32 may be measured in order to check if the second resistive film b21B and the second interconnection film b22B are formed as each having intended dimensions.

Figure 48F:
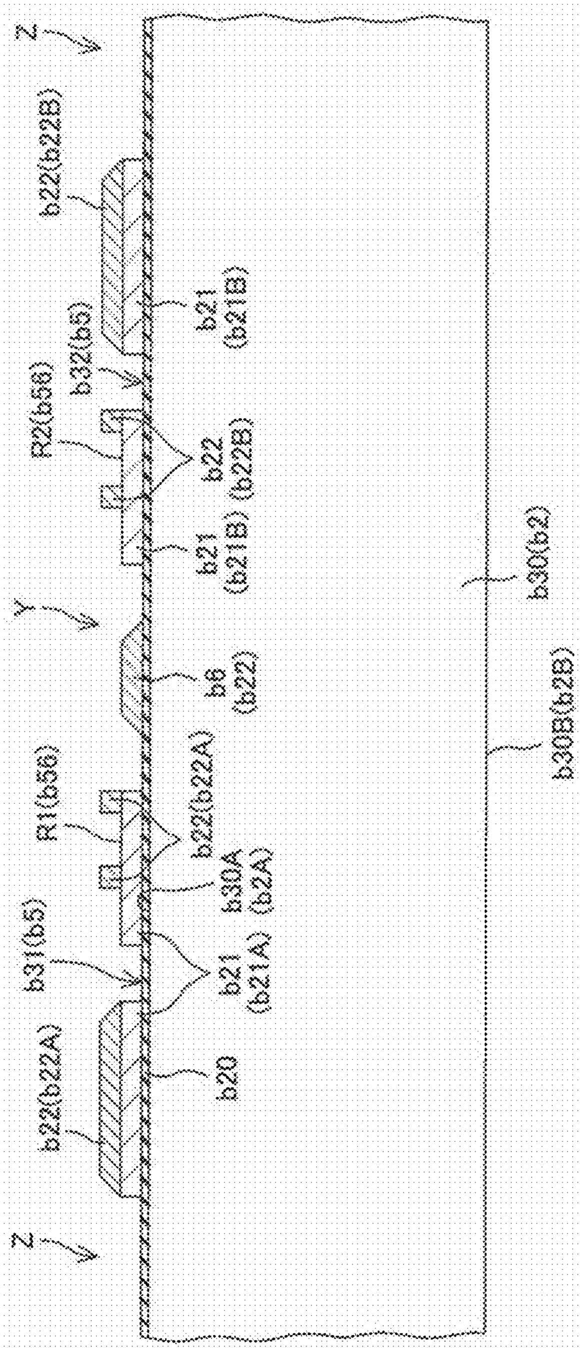
FIG. 48F is a schematic sectional view showing a process step subsequent to that shown in FIG. 48E.

Then, as shown in FIG. 48F, interconnection film portions b22 of aluminum (Al) are formed on regions of the insulative layer b20 each present along a boundary between the first resistor circuit network b31 and the second resistor circuit network b32. At this time, the interconnection film portions b22 are formed on the boundary regions by the sputtering of Al with a region of the substrate b30 other than these regions being covered with a resist pattern (not shown). The interconnection film portions b22 formed on the boundary regions each serve as the third electrode b6.

Upon completion of the third electrode b6, the first resistor circuit network b31 and the second resistor circuit network b32 are electrically connected in series to the third electrode b6, whereby the entire device portion b5 is completed. By the connection between the first resistor circuit network b31 having a positive resistance temperature coefficient and the second resistor circuit network b32 having a negative resistance temperature coefficient, the resistance temperature coefficient of the first resistor circuit network b31 and the resistance temperature coefficient of the second resistor circuit network b32 offset each other. Thus, the resistance temperature coefficient of the overall device portion b5 has a very small absolute value, i.e., not greater than 300 ppm/° C. Although the resistance temperature coefficient can be controlled by the control of the oxygen flow rate, the reduction of the absolute value of the resistance temperature coefficient only by controlling the oxygen flow rate (the conditions for the formation of the resistive film b21) has limitation. In this example, however, the absolute value of the resistance temperature coefficient of the overall device portion b5 can be reduced by the offset between the positive resistance temperature coefficient of the first resistor circuit network b31 and the negative resistance temperature coefficient of the second resistor circuit network b32.

In this example, the first interconnection film b22A, the second interconnection film b22B and the interconnection film b22 for the third electrodes b6 are made of the same material. Therefore, the first interconnection film b22A, the second interconnection film b22B and the interconnection film b22 for the third electrodes b6 may be simultaneously formed after the first resistive film b21A and the second resistive film b21B are formed (and etched).

Referring to FIG. 48F, a multiplicity of such device portions b5 (each including an assembly of the first resistor circuit network b31 and the second resistor circuit network b32 connected to each other) are formed on the front surface b30A of the substrate b30 according to the number of the chip resistors b1 to be formed on the single substrate b30. Regions of the substrate b30 respectively formed with the device portions b5 are each herein referred to as a chip component region Y. Therefore, a plurality of chip component regions Y (i.e., the device portions b5) are formed (defined) on the front surface b30A of the substrate b30. The chip component regions Y each correspond to a single complete chip resistor b1 (see FIG. 47) as seen in plan. A region of the front surface b30A of the substrate b30 defined between adjacent chip component regions Y is herein referred to as a boundary region Z. The boundary region Z is a zone configured in a lattice shape as seen in plan. The chip component regions Y are respectively disposed in lattice areas defined by the lattice-shaped boundary region Z. Since the boundary region Z has a very small width on the order of 1 μm to 60 μm (e.g., 20 μm), a multiplicity of chip component regions Y can be defined on the substrate b30. This allows for mass production of the chip resistors b1.

Figure 48G:
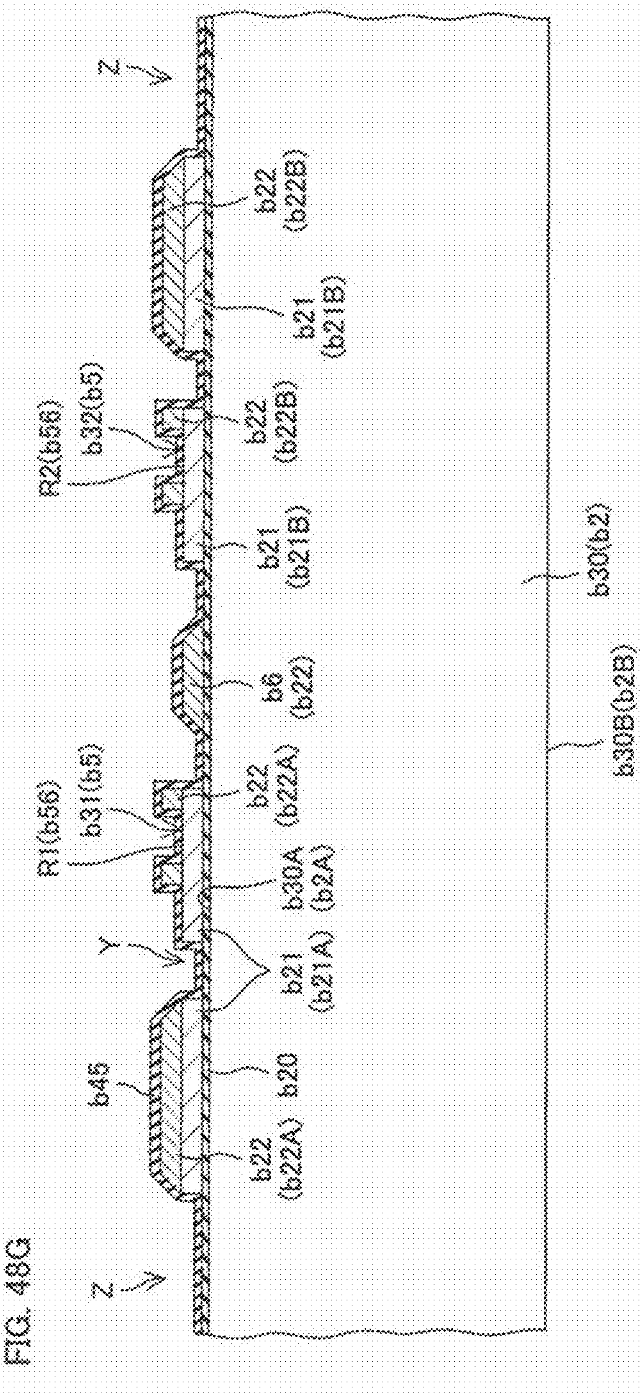
FIG. 48G is a schematic sectional view showing a process step subsequent to that shown in FIG. 48F.

Then, as shown in FIG. 48G, an insulative film b45 of SiN is formed over the entire front surface b30A of the substrate b30 by a CVD (Chemical Vapor Deposition) method. The insulative film b45 entirely covers the insulative layer b20 and the device portions b5 (the resistive film b21 and the interconnection film b22) present on the insulative layer b20, and contacts the insulative layer b20 and the device portions b5. Therefore, the insulative film b45 also covers the trimming regions X of the interconnection film b22 (see FIG. 40). Since the insulative film b45 is formed over the entire front surface b30A of the substrate b30, the insulative film b45 extends to a region other than the trimming regions X on the front surface b30A. Thus, the insulative film b45 serves as a protective film for protecting the entire front surface b30A (including the device portions b5 on the front surface b30A).

Figure 48H:
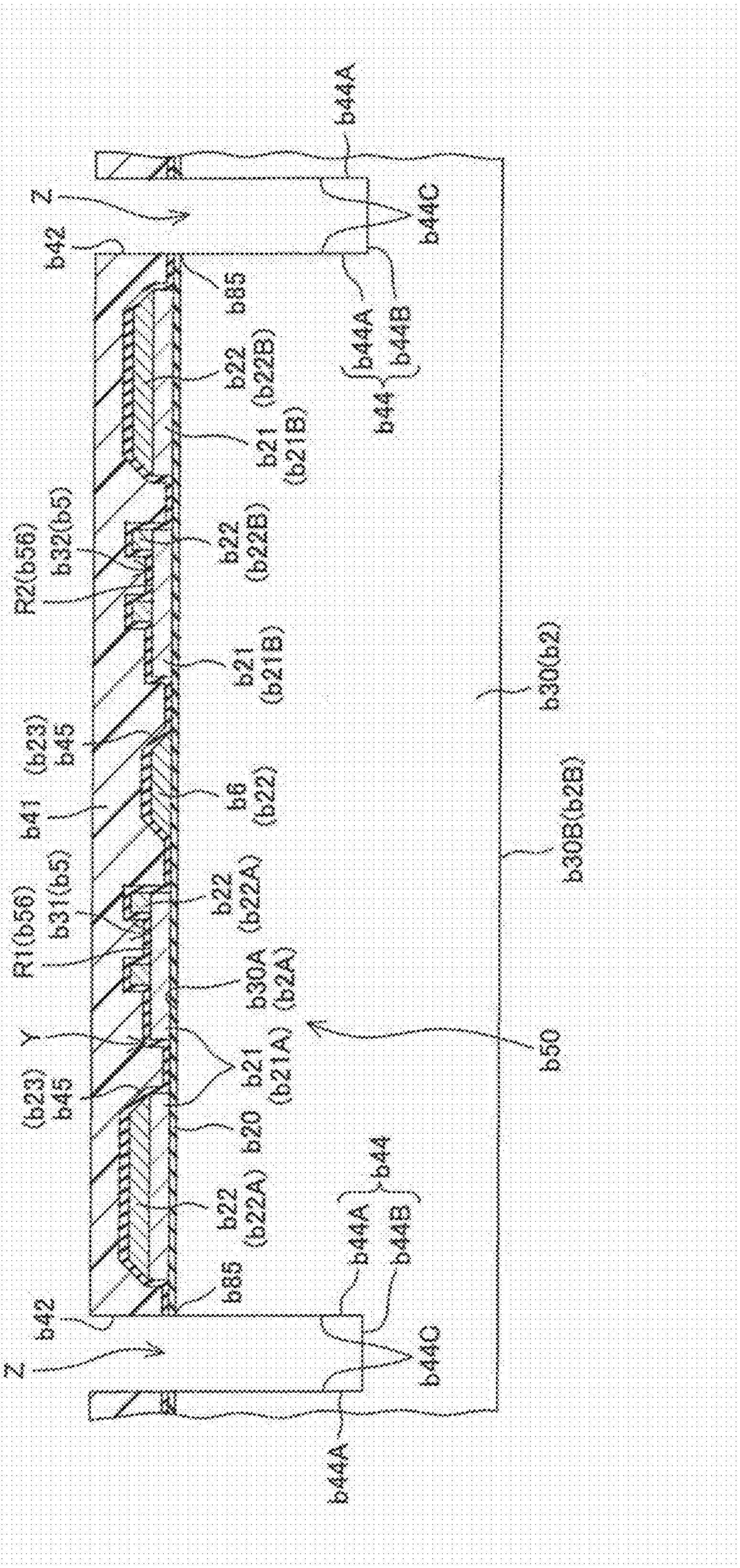
FIG. 48H is a schematic sectional view showing a process step subsequent to that shown in FIG. 48G.
Figure 48:
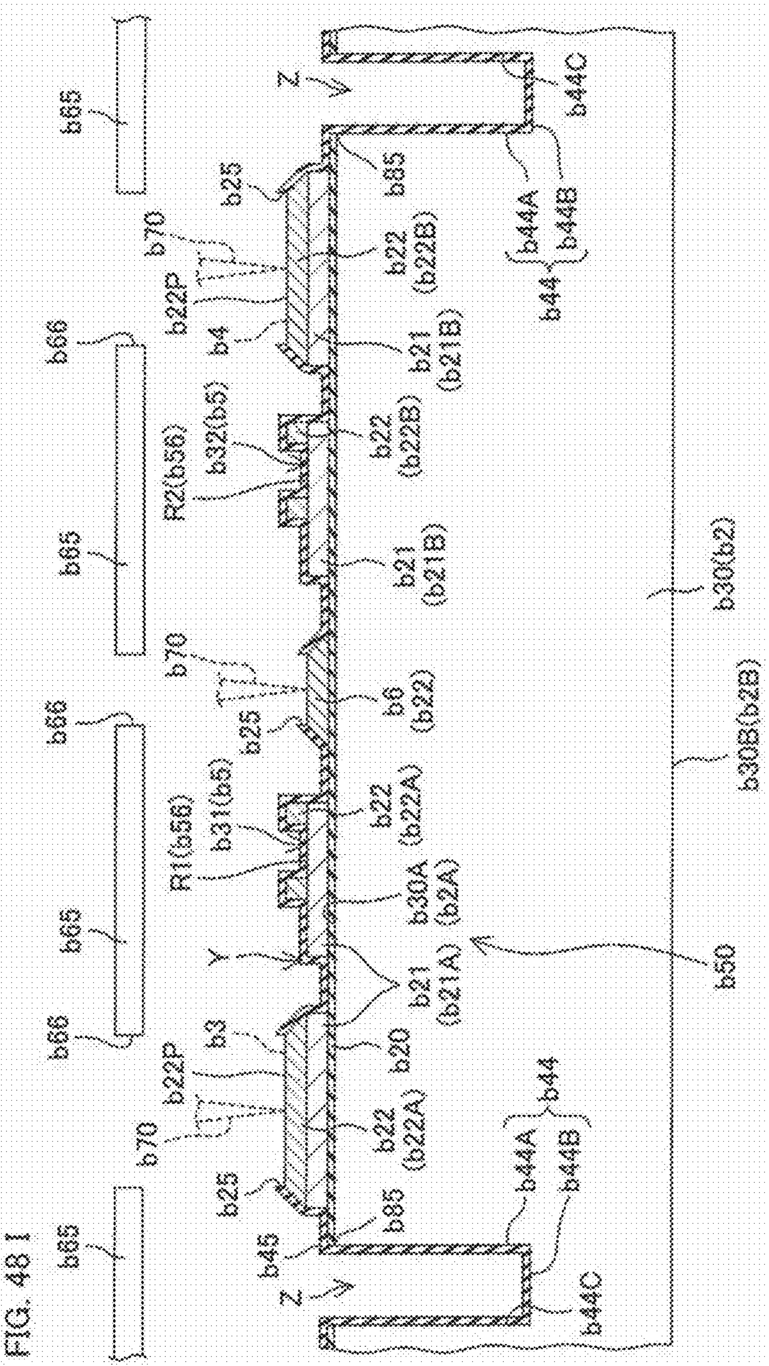
FIG. 48I is a schematic sectional view showing a process step subsequent to that shown in FIG. 48H.
FIG. 48J is a schematic sectional view showing a process step subsequent to that shown in FIG. 48I.
FIG. 48K is a schematic sectional view showing a process step subsequent to that shown in FIG. 48J.
FIG. 48L is a schematic sectional view showing a process step subsequent to that shown in FIG. 48K.
FIG. 48M is a schematic sectional view showing a process step subsequent to that shown in FIG. 48L.
Figure 49:
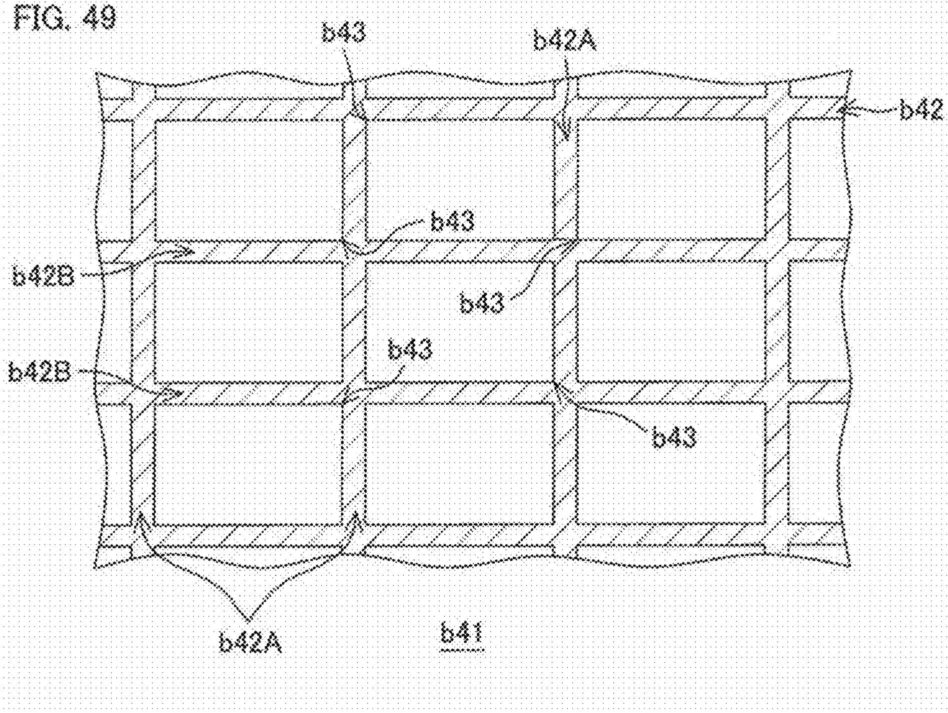
FIG. 49 is a schematic plan view showing a part of a resist pattern to be used for forming a trench in the step of FIG. 48H.

In turn, as shown in FIG. 48H, a resist pattern b41 is formed over the entire front surface b30A of the substrate b30 to entirely cover the insulative film b45. The resist pattern b41 has an opening b42. FIG. 49 is a schematic plan view showing a part of the resist pattern to be used for forming a trench in the process step of FIG. 48H.

Referring to FIG. 49, the opening b42 of the resist pattern b41 is aligned with (or corresponds to) a region (i.e., the boundary region Z, hatched in FIG. 49) between the contours of adjacent chip resistors b1 (i.e., the chip component regions Y described above) as seen in plan when the chip resistors b1 are arranged in a matrix array (or in a lattice form). As a whole, the opening b42 has a lattice shape including linear portions b42A and linear portions b42B orthogonally crossing each other.

The linear portions b42A and the linear portions b42B of the opening b42 of the resist pattern b41 are connected to each other as crossing orthogonally to each other (without any curvature). Therefore, the linear portions b42A and the linear portions b42B interest each other at an angle of about 90 degrees as seen in plan to form angled intersection portions b43. Referring to FIG. 48H, parts of the insulative film b45, the insulative layer b20 and the substrate b30 are selectively removed by plasma etching with the use of the resist pattern b41 as a mask. Thus, a portion of the substrate b30 is removed from the boundary region Z defined between the adjacent device portions b5 (chip component regions Y). As a result, a trench b44 is formed in the position (boundary region Z) corresponding to the opening b42 of the resist pattern b41 as seen in plan as extending through the insulative film b45 and the insulative layer b20 into the substrate b30 to a depth halfway the thickness of the substrate b30 from the front surface b30A of the substrate b30. The trench b44 is defined by pairs of side walls b44A opposed to each other, and a bottom wall b44B extending between lower edges of the paired side walls b44A (edges of the paired side walls b44A on the side of the back surface b30B of the substrate b30). The trench b44 has a depth of about 100 μm as measured from the front surface b30A of the substrate b30, and a width of about 20 μm (as measured between the opposed side walls b44A) which is constant throughout the depth.

The trench b44 of the substrate b30 has a lattice shape as a whole corresponding to the shape of the opening b42 (see FIG. 49) of the resist pattern b41 as seen in plan. On the front surface b30A of the substrate b30, rectangular frame-like portions of the trench b44 (the boundary region Z) respectively surround the chip component regions Y in which the device portions b5 are respectively provided. Portions of the substrate b30 respectively formed with the device portions b5 are semi-finished products b50 of the chip resistors b1. The semi-finished products b50 are respectively located in the chip component regions Y surrounded by the trench b44 on the front surface b30A of the substrate b30. These semi-finished products b50 are arranged in a matrix array. By thus forming the trench b44, the substrate b30 is divided into a plurality of substrates b2 respectively defined by the chip component regions Y.

After the trench b44 is formed as shown in FIG. 48H, the resist pattern b41 is removed, and the insulative film b45 is selectively etched off with the use of a mask b65 as shown in FIG. 48I. The mask b65 has openings b66 formed in association with portions of the insulative film b45 aligned with the pad regions b22P (see FIG. 47) and the third electrodes b6 as seen in plan. Thus, the portions of the insulative film b45 aligned with the openings b66 are etched off, whereby openings b25 are formed in these portions of the insulative film b45. Thus, the pad regions b22P and the third electrodes b6 are exposed from the insulative film b45 in the openings b25. The semi-finished products b50 each have three openings b25.

After the three openings b25 are formed in the insulative film b45 of each of the semi-finished products b50, probes b70 of a resistance measuring device (not shown) are brought into contact with the pad regions b22P and the third electrode b6 in the respective openings b25 to measure the resistance value of the first resistor circuit network b31, the resistance value of the second resistor circuit network b32 and the overall resistance value of the device portion b5. Based on the results of the measurement, a fuse F to be disconnected (at least one of the first fuses F1 and the second fuses F2) is selected from the plurality of fuses F.

Subsequently, a laser beam (not shown) is applied to the (selected) fuse F (see FIG. 40) through the insulative film b45, whereby the fuse F in the trimming region X of the interconnection film b22 is trimmed by the laser beam to be disconnected (fused off). Thus, the overall resistance value of the semi-finished product b50 (i.e., the chip resistor b1) can be controlled, as described above, by selectively fusing off (trimming) the fuse F for the required resistance value.

Figure 50:
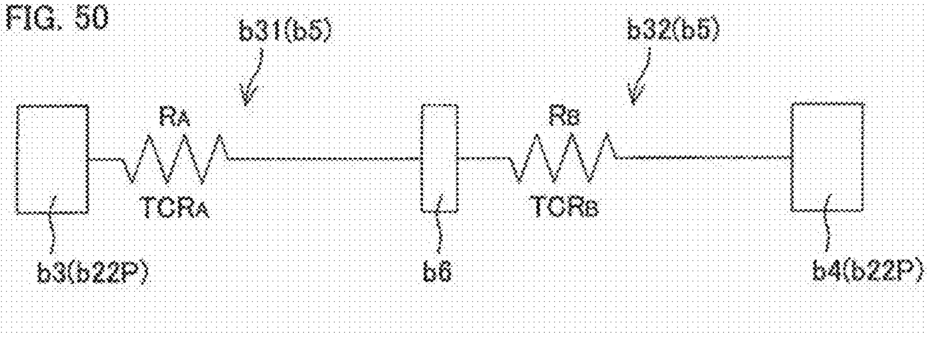
FIG. 50 is an electric circuit diagram of the device portion before trimming.
Figure 51:
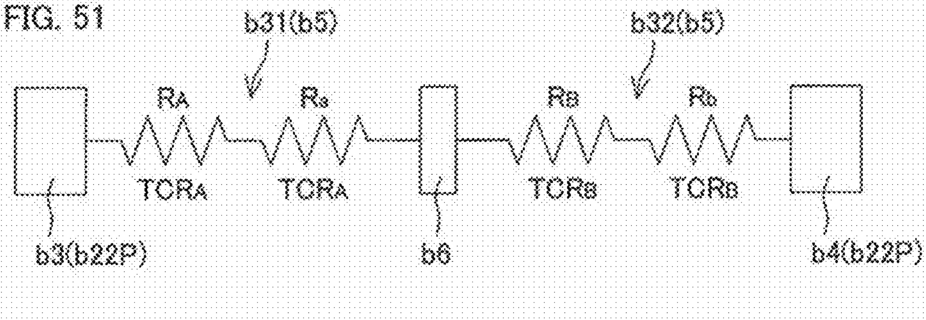
FIG. 51 is an electric circuit diagram of the device portion after trimming.

FIG. 50 is an electric circuit diagram of the device portion before trimming. FIG. 51 is an electric circuit diagram of the device portion after trimming. Referring to FIGS. 50 and 51, a trimming process will be described in detail. In FIGS. 50 and 51, $R_A$ designates an initial overall resistance value of the first resistor circuit network b31 (before trimming), and $R_B$ designates an initial overall resistance value of the second resistor circuit network b32 (before trimming). $R_a$ designates a resistance change (more specifically, a resistance increase) to be caused in the first resistor circuit network b31 by the trimming based on the required resistance value R of the overall chip resistor b1 (the total resistance value of first resistor bodies R1 to be incorporated into the first resistor circuit network b31 by the trimming). $R_b$ designates a resistance change (more specifically, a resistance increase) to be caused in the second resistor circuit network b32 by the trimming based on the required resistance value R (the total resistance value of second resistor bodies R2 to be incorporated into the second resistor circuit network b32 by the trimming). Further, $TCR_A$ designates a resistance temperature coefficient intrinsic to the first resistive film b21A of the first resistor circuit network b31, and $TCR_B$ designates a resistance temperature coefficient intrinsic to the second resistive film b21B of the second resistor circuit network b32.

Here, the required resistance value R is the sum of $R_A$, $R_a$, $R_B$ and $R_b$ (a value changed by the sum of $R_a$ and $R_b$ from the initial sum of $R_A$ and $R_B$), and is represented by the following equation (1):

$$\text{Required resistance value } R=R_A+R_a+R_B+R_b \quad (1)$$

It is herein assumed, for example, that the required resistance value R of the overall chip resistor b1 is 2000Ω at any temperature and the resistance temperature coefficient TCR of the overall chip resistor b1 is controlled to 0 ppm/° C. Where the resistance temperature coefficient TCR is controlled to 0 ppm/° C., for example, the chip resistor b1 has an overall resistance value $R_{25}$ of 2000Ω at an ordinary temperature (25° C.), and an overall resistance value $R_{125}$ of 2000Ω at 125° C. Therefore, $R_a$ and $R_b$ are calculated so that TCR=0 ppm/° C. and $R_{25}=R_{125}=2000\Omega$, and the trimming process is performed to provide the calculated $R_a$ and $R_b$.

Referring to FIG. 50, $R_A$ and $R_B$ are measured at 25° C. and at 125° C. in this case. More specifically, the probes b70 (see FIG. 48I) are respectively brought into contact with the first electrode b3 (a pad region b22P to be connected to the first electrode b3) and the third electrode b6 to measure a resistance value $R_A$ between the first electrode b3 and the third electrode b6 (i.e., the resistance value of the first resistor circuit network b31) at the respective temperatures. Further, the probes b70 are respectively brought into contact with the second electrode b4 (a pad region b22P to be connected to the second electrode b4) and the third electrode b6 to measure a resistance value $R_B$ between the second electrode b4 and the third electrode b6 (i.e., the resistance value of the second resistor circuit network b32) at the respective temperatures. $R_A$ at 25° C. is herein referred to as $R_{A25}$ (this definition is also applied to $R_{a25}$), and $R_A$ at 125° C. is herein referred to as $R_{A125}$ (this definition is also applied to $R_{a125}$). Similarly, $R_B$ at 25° C. is herein referred to as $R_{B25}$ (this definition is also applied to $R_{b25}$), and $R_B$ at 125° C. is herein referred to as $R_{B125}$ (this definition is also applied to $R_{b125}$). Here, $R_{A25}$ is 800.0Ω, $R_{A125}$ is 840.0Ω, $R_{B25}$ is 700.0Ω, and $R_{B125}$ is 672.0Ω according to the results of the measurement.

Subsequently, $TCR_A$ is calculated by substituting $R_A$ measured at 25° C. and at 125° C. into the following equation (2), and $TCR_B$ is calculated by substituting $R_B$ measured at 25° C. and at 125° C. into the following equation (3):

$$\begin{aligned} TCR_A &= (R_{A125}-R_{A25})/(R_{A25}\cdot\Delta\text{temp}) \\ &= (R_{a125}-R_{a25})/(R_{a25}\cdot\Delta\text{temp}) \end{aligned} \quad (2)$$

$$\begin{aligned} TCR_B &= (R_{B125}-R_{B25})/(R_{B25}\cdot\Delta\text{temp}) \\ &= (R_{b125}-R_{b25})/(R_{b25}\cdot\Delta\text{temp}) \end{aligned} \quad (3)$$

wherein Δtemp=100° C. (=125° C.−25° C.).

Then, $TCR_A$ is calculated from the equation (2) based on the results of the measurement of $R_{A25}$ and $R_{A125}$ to obtain $TCR_A$=500 ppm/° C. Further, $TCR_B$ is calculated from the equation (3) based on the results of the measurement of $R_{B25}$ and $R_{B125}$ to obtain $TCR_B$=−400 ppm/° C. Next, $R_a$ and $R_b$ are calculated from the equations (1) to (3). Where a temperature condition of 25° C. is taken into consideration and the required resistance value R at 25° C. is expressed as $R_{25}$, the following equation (4) is derived from the equation (1):

$$R_{25}=R_{A25}+R_{a25}+R_{B25}+R_{b25} \tag{4}$$

Where a temperature condition of 125° C. is taken into consideration and the required resistance value R at 125° C. is expressed as $R_{125}$, the following equation (5) is derived from the equation (1):

$$R_{125}=R_{A125}+R_{a125}+R_{B125}+R_{b125} \tag{5}$$

The following equations (6) and (7) are derived from the equation (2), and the equation (8) is provided by combining the equations (6) and (7) together. Further, the following equations (9) and (10) are derived from the equation (3), and the equation (11) is provided by combining the equations (9) and (10) together.

$$R_{A125}=R_{A25}\cdot\Delta\text{temp}\cdot TCR_A+R_{A25} \tag{6}$$

$$R_{a125}=R_{a25}\cdot\Delta\text{temp}\cdot TCR_A+R_{a25} \tag{7}$$

$$R_{A125}+R_{a125}=TCR_A\cdot(R_{A25}+R_{a25})\cdot\Delta\text{temp}+(R_{A25}+R_{a25}) \tag{8}$$

$$R_{B125}=R_{B25}\cdot\Delta\text{temp}\cdot TCR_B+R_{B25} \tag{9}$$

$$R_{b125}=R_{b25}\cdot\Delta\text{temp}\cdot TCR_B+R_{b25} \tag{10}$$

$$R_{B125}+R_{b125}=TCR_B\cdot(R_{B25}+R_{b25})\cdot\Delta\text{temp}+(R_{B25}+R_{b25}) \tag{11}$$

Further, the equations (8) and (11) are substituted into the equation (5) to provide the following equation (12):

$$R_{125}=R_{A125}+R_{a125}+R_{B125}+R_{b125}=TCR_A\cdot(R_{A25}+R_{a25})\cdot\Delta\text{temp}+(R_{A25}+R_{a25})+TCR_B\cdot(R_{B25}+R_{b25})\cdot\Delta\text{temp}+(R_{B25}+R_{b25}) \tag{12}$$

Then, $R_{a25}$ and $R_{b25}$ are calculated by substituting $TCR_A$ (=500 ppm/° C.), $TCR_B$ (=−400 ppm/° C.), $R_{A25}$ (=800.0Ω), $R_{B25}$ (=700.0Ω) and Δtemp (=100° C.) into simultaneous equations (4) and (12). It is herein assumed that $R_{25}=R_{125}$ (=2000Ω).

As a result of the calculation, $R_{a25}$ is 88.9Ω, and $R_{b25}$ is 411.1Ω. Then, one or more first fuses F1 (first fuses F1 to be trimmed in order to provide $R_{a25}$=88.9Ω) are selected so that $R_{a25}$=88.9Ω can be provided in the first resistor circuit network b31 at an ordinary temperature. Similarly, one or more second fuses F2 (second fuses F2 to be trimmed in order to provide $R_{b25}$=411.1Ω) is selected so that $R_{b25}$=411.1Ω can be provided in the second resistor circuit network b32 at an ordinary temperature.

With the provision of the third electrode b6, the overall resistance value $R_A$ of the first resistor circuit network b31 can be measured between the first electrode b3 and the third electrode b6, and the overall resistance value $R_B$ of the second resistor circuit network b32 can be measured between the second electrode b4 and the third electrode b6. Thus, the resistance values $R_a$ and $R_b$ to be respectively provided in the first resistor circuit network b31 and the second resistor circuit network b32 by the trimming are calculated based on the required resistance value R of the overall chip resistor b1, and the first fuses F1 and the second fuses F2 to be disconnected to provide the resistance values are selected.

Then, the first fuses F1 and the second fuses F2 thus selected are disconnected (trimmed) by a laser beam. Thus, the chip resistor b1 can be produced, which has a required resistance value R of 2000Ω and a resistance temperature coefficient TCR of 0 ppm/° C. Referring again to FIG. 48I, the insulative film b45 serves as a cover film for covering the device portions b5 in the trimming process, thereby preventing short circuit which may otherwise occur when a debris occurring during the fuse-off adheres to any of the device portions b5. Further, the insulative film b45 covers the fuses F (resistive film b21), so that the selected fuses F can be reliably fused off by accumulating the energy of the laser beam therein.

Figure 48J:
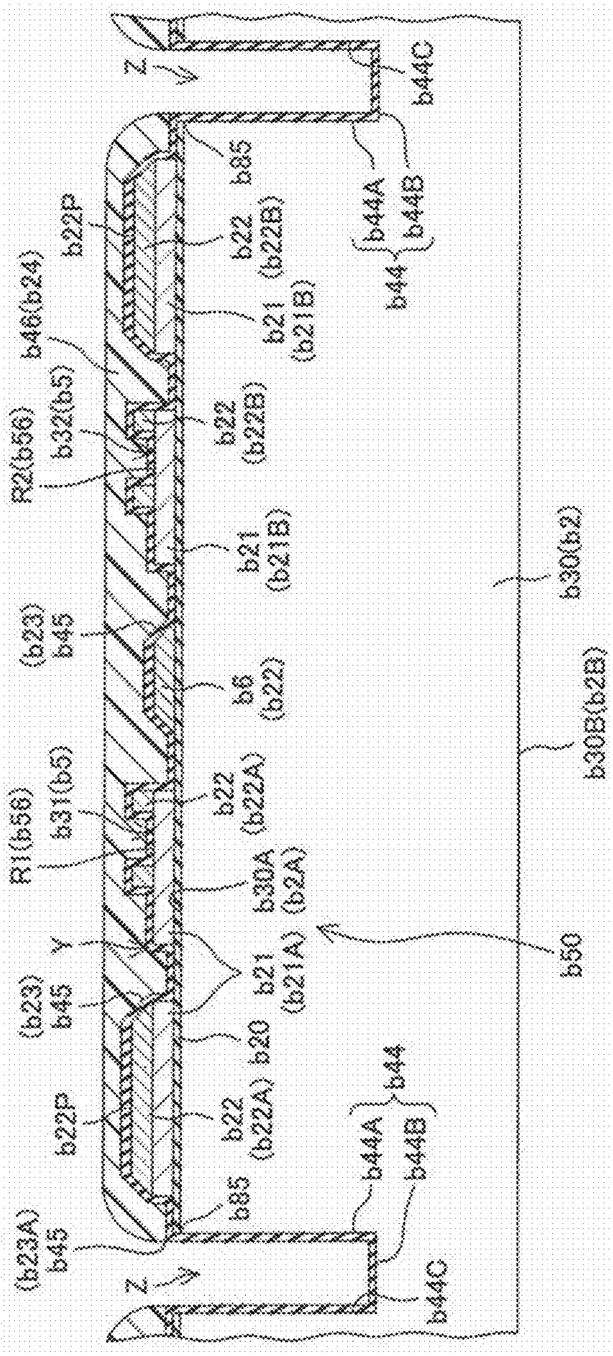

Thereafter, SiN is further deposited on the insulative film b45 by the CVD method to thicken the insulative film b45. At this time, as shown in FIG. 48J, the insulative film b45 is also formed on the entire inner peripheral surface of the trench b44 (the wall surfaces b44C of the side walls b44A and an upper surface of the bottom wall b44B). The insulative film b45 finally has a thickness of 1000 Å to 5000 Å (here, about 3000 Å) (in a state shown in FIG. 48J). At this time, the insulative film b45 partly enters the openings b25 to close the openings b25.

A newly deposited SiN portion (a newly formed portion of the insulative film b45) partly enters a hole formed in the cover film (insulative film b45) when the cover film is partly broken during the fuse-off to cover and protect broken surfaces FM (see FIG. 43B) of the disconnected fuse F (at least one of the first fuses F1 and the second fuses F2). Therefore, the insulative film b45 (finally serving as the passivation film b23) prevents foreign matter and moisture from intruding into the disconnected portion of the fuse F (see a disconnected second fuse F2 in FIG. 43B), thereby improving the reliability of the chip resistor b1.

After the insulative film b45 is formed, a liquid photosensitive resin of a polyimide is sprayed over the resulting substrate b30 from above the insulative film b45. Thus, a photosensitive resin film b46 is formed as shown in FIG. 48J. At this time, the liquid is applied to the substrate b30 via a mask (not shown) having a pattern which covers only the trench b44 as seen in plan so as to prevent the liquid from entering the trench b44. As a result, the liquid photosensitive resin is applied only on the substrate b30 to form the resin film b46 on the substrate b30. The resin film b46 on the front surface b30A has a flat surface extending along the front surface b30A.

Since the liquid does not enter the trench b44, the resin film b46 is not formed in the trench b44. The formation of the resin film b46 may be achieved by spin-coating with the liquid or applying a photosensitive resin sheet on the front surface b30A of the substrate b30, rather than by spraying the liquid photosensitive resin. In turn, the resin film b46 is heat-treated (cured). Thus, the resin film b46 is thermally shrunk to a smaller thickness, and hardened to have a stable film quality.

Figure 48K:
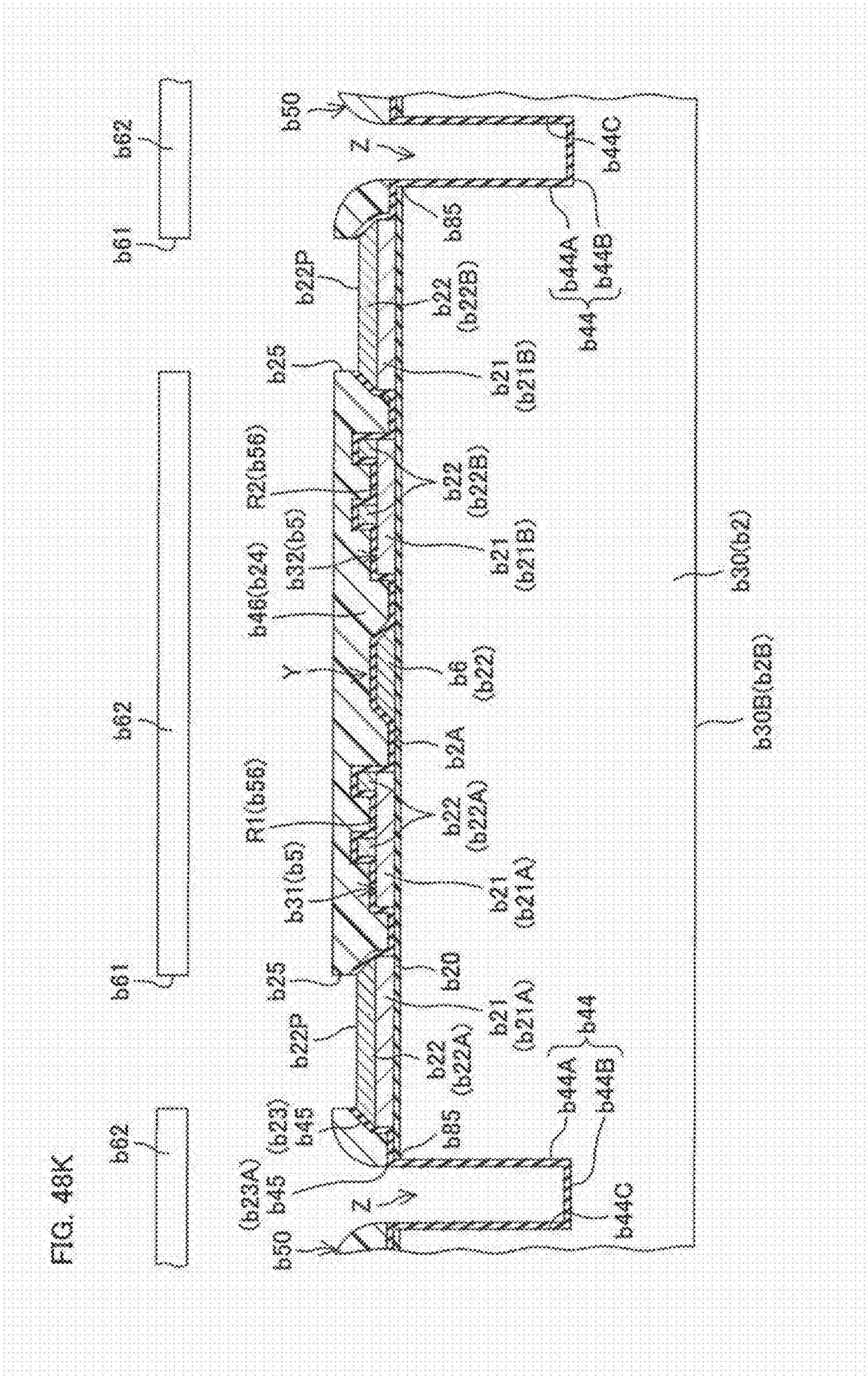

In turn, as shown in FIG. 48K, parts of the resin film b46 aligned with the pad regions b22P of the interconnection film b22 (openings b25) on the front surface b30A as seen in plan are selectively removed by patterning the resin film b46. More specifically, the resin film b46 is exposed to light with the use of a mask b62 of a pattern having openings b61 aligned with (corresponding to) the pad regions b22P as seen in plan, and then developed in the pattern. Thus, the parts of the resin film b46 are removed from above the pad regions b22P. Then, parts of the insulative film b45 on the pad regions b22P are removed by RIE using a mask not shown, whereby the openings b25 are uncovered to expose the pad regions b22P.

Figure 48L:
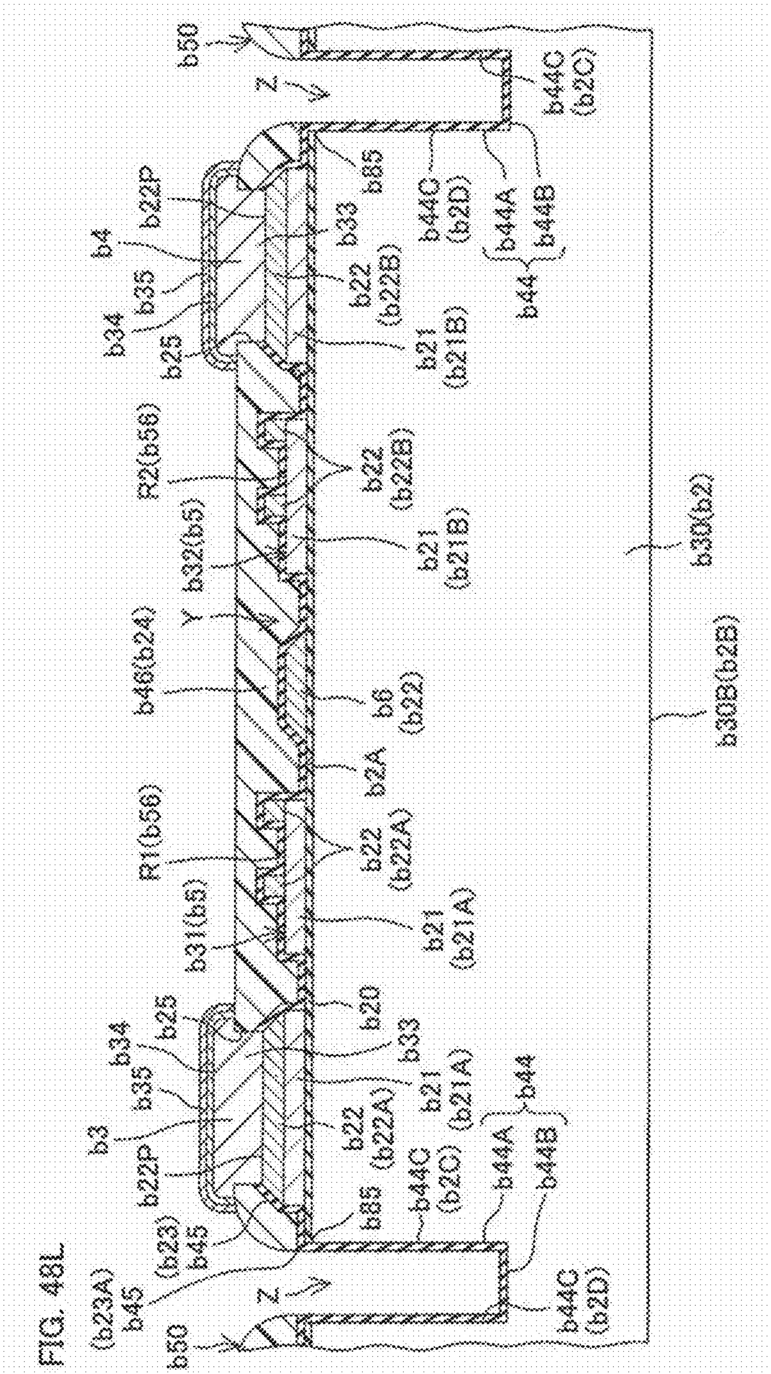
Figure 52:
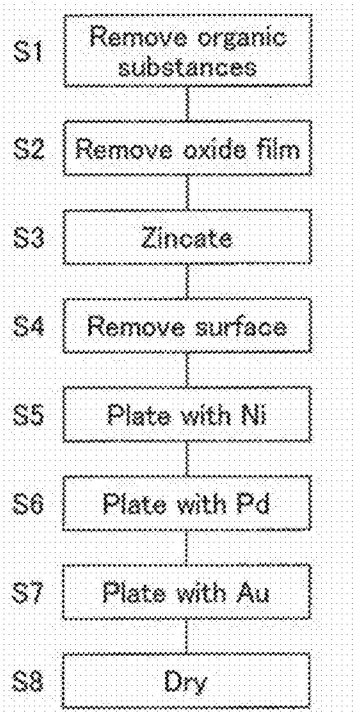
FIG. 52 is a diagram for explaining a process for producing the first electrode and the second electrode.

In turn, Ni/Pd/Au multilayer films are formed in the openings b25 on the pad regions b22P by depositing Ni, Pd and Au by electroless plating, whereby the first and second electrodes b3, b4 are formed on the pad regions b22P as shown in FIG. 48L. FIG. 52 is a diagram for explaining a production process for the first and second electrodes.

Referring to FIG. 52, more specifically, surfaces of the pad regions b22P are cleaned (to be degreased), whereby organic substances (smut such as carbon smut and greasy dirt) are removed from the surfaces (Step S1). Then, oxide films are removed from the surfaces (Step S2). In turn, the surfaces are zincated, whereby Al (of the interconnection film b22) in the surfaces is replaced with Zn (Step S3). Subsequently, Zn in the surfaces is removed by nitric acid or the like, whereby Al is newly exposed on the pad regions b22P (Step S4).

Then, the pad regions b22P are immersed in a plating liquid, whereby the new Al surfaces of the pad regions b22P are plated with Ni. Thus, Ni in the plating liquid is chemically reduced to be deposited on the surfaces, whereby Ni layers b33 are respectively formed on the surfaces (Step S5). In turn, surfaces of the Ni layers b33 are plated with Pd by immersing the Ni layers b33 in another plating liquid. Thus, Pd in the plating liquid is chemically reduced to be deposited on the surfaces of the Ni layers b33, whereby Pd layers b34 are respectively formed on the surfaces of the Ni layers b33 (Step S6).

Then, surfaces of the Pd layers b34 are plated with Au by immersing the Pd layers b34 in further another plating liquid. Thus, Au in the plating liquid is chemically reduced to be deposited on the surfaces of the Pd layers b34, whereby Au layers b35 are respectively formed on the surfaces of the Pd layers b34 (Step S7). Thus, the first and second electrodes b3, b4 are formed. After the first and second electrodes b3, b4 thus formed are dried (Step S8), the process for producing the first and second electrodes b3, b4 is completed. Between the consecutive steps, a rinsing step is performed as required for rinsing the semi-finished products b50 with water. Further, the zincation may be performed a plurality of times.

FIG. 48L shows the semi-finished product b50 formed with the first electrode b3 and the second electrode b4. As described above, the first and second electrodes b3, b4 are formed by the electroless plating. As compared with a case in which electrolytic plating is employed for the formation of the first and second electrodes b3, b4, therefore, the number of process steps required for the formation of the first and second electrodes b3, b4 can be reduced (e.g., a lithography step, a resist mask removing step and the like required for the electrolytic plating can be obviated), thereby improving the productivity of the chip resistor b1. Further, the electroless plating does not require a resist mask which may be required for the electrolytic plating. This improves the positional accuracy of the first and second electrodes b3, b4 and hence the yield without the possibility of displacement of the first and second electrodes b3, b4 due to offset of the resist mask.

Figure 48M:
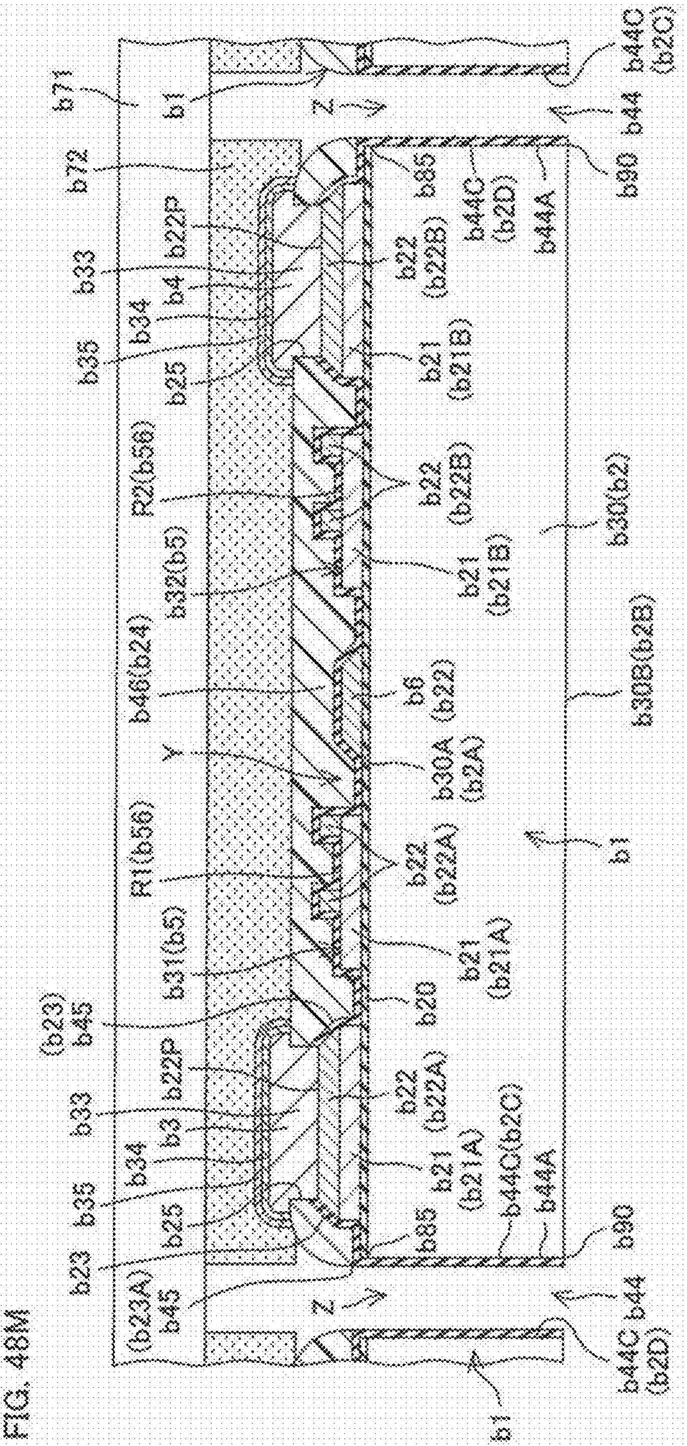

Thus, the first and second electrodes b3, b4 are formed. After a continuity test is performed between the first electrode b3 and the second electrode b4, the substrate b30 is ground from the back surface b30B. More specifically, as shown in FIG. 48M, a thin-plate support tape b71 of PET (polyethylene terephthalate) having an adhesive surface b72 is applied to the semi-finished products b50 with the adhesive surface b72 bonded to the first and second electrodes b3, b4 of the respective semi-finished products b50 (i.e., on the side of the front surface b30A) after the formation of the trench b44. Thus, the semi-finished products b50 are supported by the support tape b71. Here, a laminate tape, for example, may be used as the support tape b71.

With the semi-finished products b50 supported by the support tape b71, the substrate b30 is ground from the back surface b30B. After the substrate b30 is thinned to the bottom wall b44B of the trench b44 (see FIG. 48L) by the grinding, nothing connects the adjacent semi-finished products b50. Therefore, the substrate b30 is divided into the individual semi-finished products b50 along the trench b44. Thus, the chip resistors b1 are completed. That is, the substrate b30 is divided (split) along the trench b44 (i.e., along the boundary region Z), whereby the individual chip resistors b1 are separated from each other. Alternatively, the chip resistors b1 may be separated from each other by etching the substrate b30 from the back surface b30B to the bottom wall b44B of the trench b44.

The wall surfaces b44C of the side walls b44A of the trench b44 provide the side surfaces b2C to b2F of the substrates b2 of the respective completed chip resistors b1, and the back surface b30B provides the back surfaces b2B of the respective chip resistors b1. That is, the step of forming the trench b44 by the etching as described above (see FIG. 48H) is involved in the step of forming the side surfaces b2C to b2F. Further, the insulative film b45 provides the passivation films b23 of the respective chip resistors b1, and the divided resin film b46 provides the resin films b24 of the respective chip resistors b1.

As described above, the chip resistors b1 (chip components) formed in the respective chip component regions Y defined on the substrate b30 are simultaneously separated from each other (the individual chip resistors b1 can be simultaneously provided) by forming the trench b44 in the substrate b30 and then grinding the substrate b30 from the back surface b30B. This reduces the time required for the production of the plurality of chip resistors b1, thereby improving the productivity of the chip resistors b1.

The back surface b2B of the substrate b2 of each of the completed chip resistors b1 may be polished or etched to be mirror-finished. In the chip resistor b1, as described above, desired first resistor bodies R1 can be isolated from the first resistor circuit network b31 or incorporated into the first resistor circuit network b31 by selectively disconnecting one or more first fuses F1. Similarly, desired second resistor bodies R2 can be isolated from the second resistor circuit network b32 or incorporated into the second resistor circuit network b32 by selectively disconnecting one or more second fuses F2. In this manner, the resistance of the overall chip resistor b1 can be adjusted at a desired value, so that the chip resistor b1 can be easily and speedily adapted for any of plural resistance values. That is, the chip resistor b1 can be easily adapted for plural resistance requirements based on the same design configuration. The resistance value of the chip resistor b1 adjusted in this manner is highly accurate with its tolerance being not greater than 1% in absolute value.

The resistance temperature coefficient of the overall chip resistor b1 can be controlled to have a reduced absolute value by connecting the first resistor circuit network b31 having a positive resistance temperature coefficient and the second resistor circuit network b32 having a negative resistance temperature coefficient to each other. This improves the accuracy of the chip resistor b1. Particularly, the chip resistor b1 has an overall resistance temperature coefficient of not greater than 300 ppm/° C. in absolute value, so that the accuracy of the chip resistor b1 can be improved.

While the chip resistor b1 according to the second reference embodiment has thus been described, the second reference embodiment may be embodied in other forms. In the aforementioned examples, the chip resistor b1 includes a plurality of resistor circuits having different resistance values defined by the geometric progression with a geometric ratio r (0<r, r≠1) of r=2 by way of example, but the geometric ratio for the geometric progression may have a value other than 2.

The insulative layer b20 is provided on the front surface of the substrate b2. Where the substrate b2 is an insulative substrate, however, the insulative layer b20 may be obviated. In the first electrode b3 and the second electrode b4, the Pd layer b34 to be provided between the Ni layer b33 and the Au layer b35 may be obviated. If the Au layer b35 is free from the pin hole described above, the Pd layer b34 may be obviated with proper adhesion between the Ni layer b33 and the Au layer b35.

Figure 53:
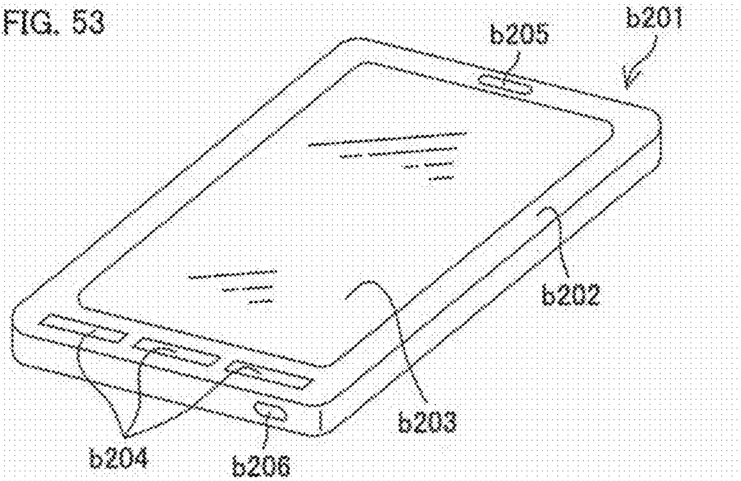
FIG. 53 is a perspective view showing the appearance of a smartphone as an exemplary electronic device which employs the chip resistor according to the second reference embodiment.

FIG. 53 is a perspective view showing the appearance of a smartphone as an exemplary electronic device which employs the chip component according to the second reference embodiment. The smartphone b201 includes electronic components provided in a housing b202 having a flat rectangular prismatic shape. The housing b202 has a pair of rectangular major surfaces on its front and back sides, and the pair of major surfaces are connected to each other by four side surfaces. A display screen of a display panel b203 such as a liquid crystal panel or an organic EL panel is exposed on one of the major surfaces of the housing b202. The display screen of the display panel b203 serves as a touch panel to provide an input interface to a user.

The display panel b203 has a rectangular shape occupying the most of the one major surface of the housing b202. Operation buttons b204 are provided alongside one shorter edge of the display panel b203. In this example, a plurality of operation buttons b204 (three operation buttons b204) are arranged alongside the shorter edge of the display panel b203. The user operates the smartphone b201 by operating the operation buttons b204 and the touch panel to call and execute a necessary function.

A speaker b205 is disposed adjacent the other shorter edge of the display panel b203. The speaker b205 serves as a reception port for a telephone function, and as an audio unit for playing music data and the like. On the other hand, a microphone b206 is provided adjacent the operation buttons b204 on one of the side surfaces of the housing b202. The microphone b206 serves as a transmission port for the telephone function, and as a microphone for recording.

Figure 54:
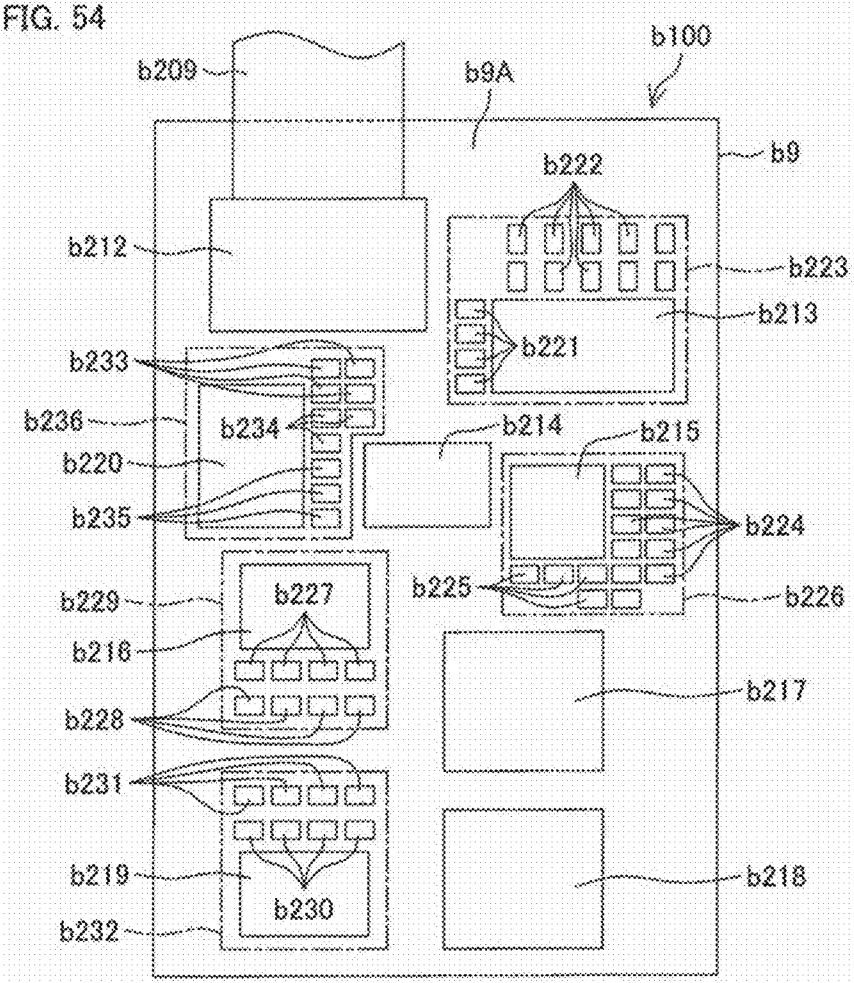
FIG. 54 is a schematic plan view showing the configuration of a circuit assembly accommodated in a housing of the smartphone.

FIG. 54 is a schematic plan view showing the configuration of a circuit assembly b100 accommodated in the housing b202. The circuit assembly b100 includes a mount substrate b9, and circuit components mounted on a mount surface b9A of the mount substrate b9. The circuit components include a plurality of integrated circuit elements (ICs) b212 to b220, and a plurality of chip components. The ICs include a transmission IC b212, a so-called One-Seg TV receiving IC b213, a GPS receiving IC b214, an FM tuner IC b215, a power source IC b216, a flash memory b217, a microcomputer b218, a power source IC b219, and a base band IC b220. The chip components include chip inductors b221, b225, b235, chip resistors (corresponding to the chip resistor of the second reference embodiment) b222, b224, b233, chip capacitors b227, b230, b234, and chip diodes b228, b231.

The transmission IC b212 incorporates an electronic circuit which generates display control signals for the display panel b203 and receives signals inputted from the touch panel on the surface of the display panel b203. A flexible interconnection b209 is connected to the transmission IC b212 for connection to the display panel b203. The One-Seg TV receiving IC b213 incorporates an electronic circuit which serves as a receiver for receiving signals of so-called One-Seg broadcast (terrestrial digital television broadcast for mobile devices). The chip inductors b221 and the chip resistors b222 are provided adjacent the One-Seg TV receiving IC b213. The One-Seg TV receiving IC b213, the chip inductors b221 and the chip resistors b222 constitute a One-Seg broadcast receiving circuit b223. The chip inductors b221 each have an accurately adjusted inductance, and the chip resistors b222 each have an accurately adjusted resistance. Thus, the One-Seg broadcast receiving circuit b223 has a highly accurate circuit constant.

The GPS receiving IC b214 incorporates an electronic circuit which receives signals from a GPS satellite and outputs the positional information of the smartphone b201. The FM tuner IC b215, and the chip resistors b224 and the chip inductors b225, which are mounted adjacent the FM tuner IC b215 on the mount substrate b9, constitute an FM broadcast receiving circuit b226. The chip resistors b224 each have an accurately adjusted resistance, and the chip inductors b225 each have an accurately adjusted inductance. Thus, the FM broadcast receiving circuit b226 has a highly accurate circuit constant.

The chip capacitors b227 and the chip diodes b228 are mounted adjacent the power source IC b216 on the mount surface of the mount substrate b9. The power source IC b216, the chip capacitors b227 and the chip diodes b228 constitute a power source circuit b229. The flash memory b217 is a storage which stores an operating system program, data generated in the smartphone b201, and data and programs acquired from the outside by communication function.

The microcomputer b218 incorporates a CPU, a ROM and a RAM, and serves as a processing circuit which performs a variety of processing operations to execute functions of the smartphone b201. More specifically, the microcomputer b218 performs processing operations for image processing and a variety of application programs. The chip capacitors b230 and the chip diodes b231 are mounted adjacent the power source IC b219 on the mount surface of the mount substrate b9. The power source IC b219, the chip capacitors b230 and the chip diodes b231 constitute a power source circuit b232.

The chip resistors b233, the chip capacitors b234 and the chip inductors b235 are mounted adjacent the base band IC b220 on the mount surface b9A of the mount substrate b9. The base band IC b220, the chip resistors b233, the chip capacitors b234 and the chip inductors b235 constitute a base band communication circuit b236. The base band communication circuit b236 provides communication functions for telephone communications and data communications.

With this arrangement, electric power properly controlled by the power source circuits b229, b232 is supplied to the transmission IC b212, the GPS receiving IC b214, the One-Seg broadcast receiving circuit b223, the FM broadcast receiving circuit b226, the base band communication circuit b236, the flash memory b217 and the microcomputer b218. The microcomputer b218 performs a processing operation in response to input signals inputted thereto via the transmission IC b212, and outputs display control signals from the transmission IC b212 to the display panel b203 to cause the display panel b203 to perform a variety of display operations.

When a command for receiving One-Seg broadcast is given by operating the touch panel or the operation buttons b204, the One-Seg broadcast is received by the function of the One-Seg broadcast receiving circuit b223. Then, a processing operation for outputting a received image on the display panel b203 and outputting a received sound from the speaker b205 is performed by the microcomputer b218. When the positional information of the smartphone b201 is required, the microcomputer b218 acquires positional information outputted from the GPS receiving IC b214 and performs a processing operation using the positional information.

Further, when a command for receiving FM broadcast is inputted by operating the touch panel or the operation buttons b204, the microcomputer b218 actuates the FM broadcast receiving circuit b226 and performs a processing operation for outputting a received sound from the speaker b205. The flash memory b217 is used for storing data acquired through communications, and for storing data generated by performing a processing operation by the microcomputer b218 or data generated by inputting from the touch panel. As required, the microcomputer b218 writes data in the flash memory b217 and reads data from the flash memory b217.

The functions of the telephone communications and the data communications are performed by the base band communication circuit b236. The microcomputer b218 controls the base band communication circuit b236 to perform operations for transmitting and receiving sounds and data.

Third Reference Embodiment of Present Invention

(1) Inventive Features of Third Reference Embodiment

The third reference embodiment has, for example, the following inventive features (C1) to (C17):

(C1) A chip resistor is provided, which includes: a substrate; a pair of electrodes provided on the substrate; a plurality of resistor elements provided between the pair of electrodes, the resistor elements each including a resistive film provided on the substrate and made of a material having a resistance temperature coefficient of not less than 200 ppm/° C. in absolute value, and an interconnection film provided in contact with the resistive film; and a plurality of fuses which are disconnectably connect the resistor elements between the pair of electrodes.

With this arrangement, one or more of the fuses are selectively disconnected to isolate a desired number of resistor elements from between the pair of electrodes and to incorporate a desired number of resistor elements into between the pair of electrodes. Thus, the resistance of the overall chip resistor can be accurately adjusted at a target value. Further, the resistive film of the resistor elements is made of the material having a resistance temperature coefficient of not less than 200 ppm/° C. in absolute value, so that the chip resistor is improved in the sensitivity to the temperature of the resistor elements. As a result, the chip resistor permits more accurate adjustment of the resistance value and is suitable for detection of the temperature.

(C2) The chip resistor of the feature (C1) is a temperature sensor.

With this arrangement, the chip resistor can be used as the temperature sensor.

(C3) In the chip resistor of the feature (C1) or (C2), the resistive film is made of TiON or TiONSi having an oxygen composition ratio controlled so that the resistance temperature coefficient is not less than 200 ppm/° C. in absolute value. With this arrangement, the resistive film having a resistance temperature coefficient of not less than 200 ppm/° C. in absolute value can be made of TiON or TiONSi having a controlled oxygen composition ratio.

(C4) The resistive film may comprise at least one of TiON, TiONSi, Pt, Ni and Cu.

(C5) The fuses are preferably made of Al.

(C6) The chip resistor of any one of the features (C1) to (C5) further includes a passivation film provided on the substrate to cover a front surface of the substrate from above the resistor elements and the fuses.

With this arrangement, the front surface of the substrate, the resistor elements and the fuses are protected by the passivation film.

(C7) The chip resistor of the feature (C6) further includes a protection resin film provided on the passivation film with the electrodes being exposed therefrom. With this arrangement, the front surface of the substrate, the resistor elements and the fuses are protected doubly by the passivation film and the protection resin film.

(C8) A chip resistor production method is provided, which includes the steps of: forming a resistive film of a material having a resistance temperature coefficient of not less than 200 ppm/° C. in absolute value on a substrate; forming an interconnection film on the resistive film; patterning the interconnection film and the resistive film by etching to form a plurality of resistor elements and a plurality of fuses which respectively disconnectably connect the resistor elements; measuring a total resistance value of the resistor elements; selecting a to-be-disconnected fuse from the plurality of fuses based on the measured total resistance value; and disconnecting the selected fuses.

In this method, the resistance of the overall chip resistor (the total resistance value) can be accurately adjusted at a target value by selectively disconnecting one or more of the fuses. Further, the resistive film of the resistor elements is made of the material having a resistance temperature coefficient of not less than 200 ppm/° C. in absolute value, so that the chip resistor is improved in the sensitivity to the temperature of the resistor elements. As a result, the chip resistor permits more accurate adjustment of the resistance value and is suitable for detection of the temperature.

(C9) In the chip resistor production method of the feature (C8), the chip resistor is a temperature sensor.

In this method, the chip resistor can be used as the temperature sensor.

(C10) In the chip resistor production method of the feature (C8) or (C9), the resistive film forming step includes the step of forming the resistive film from TiON or TiONSi while controlling an oxygen composition ratio of TiON or TiONSi so that the chip resistor has a resistance temperature coefficient of not less than 200 ppm/° C. in absolute value.

In this method, the resistive film having a resistance temperature coefficient of not less than 200 ppm/° C. in absolute value can be formed of TiON or TiONSi having a controlled oxygen composition ratio.

(C11) The resistive film forming step may include the step of forming the resistive film from at least one of TiON, TiONSi, Pt, Ni and Cu.

(C12) In the chip resistor production method of any one of the features (C8) to (C11), the etching is reactive ion etching.

In this method, the resistor elements and the fuses can be formed with higher accuracy.

(C13) The fuses are preferably made of Al.

(C14) The chip resistor production method of any one of the features (C8) to (C13) further includes the step of forming a passivation film on the substrate to cover a front surface of the substrate from above the resistor elements and the fuses.

In this method, the front surface of the substrate, the resistor elements and the fuses are protected by the passivation film.

(C15) The chip resistor production method of the feature (C14) further includes the step of forming a protection resin film on the passivation film with the electrodes being exposed from the protection resin film. In this method, the front surface of the substrate, the resistor elements and the fuses are protected doubly by the passivation film and the protection resin film.

(C16) A circuit assembly preferably includes the chip resistor.

(C17) An electronic device preferably includes the chip resistor.

(2) Examples of Third Reference Embodiment of Present Invention

Examples of the third reference embodiment will hereinafter be described in detail with reference to the attached drawings. Reference characters shown in FIGS. 55A to 70 are effective only in FIGS. 55A to 70, so that components designated by these reference characters may be different from those designated by the same reference characters in other embodiments.

Figure 55A:
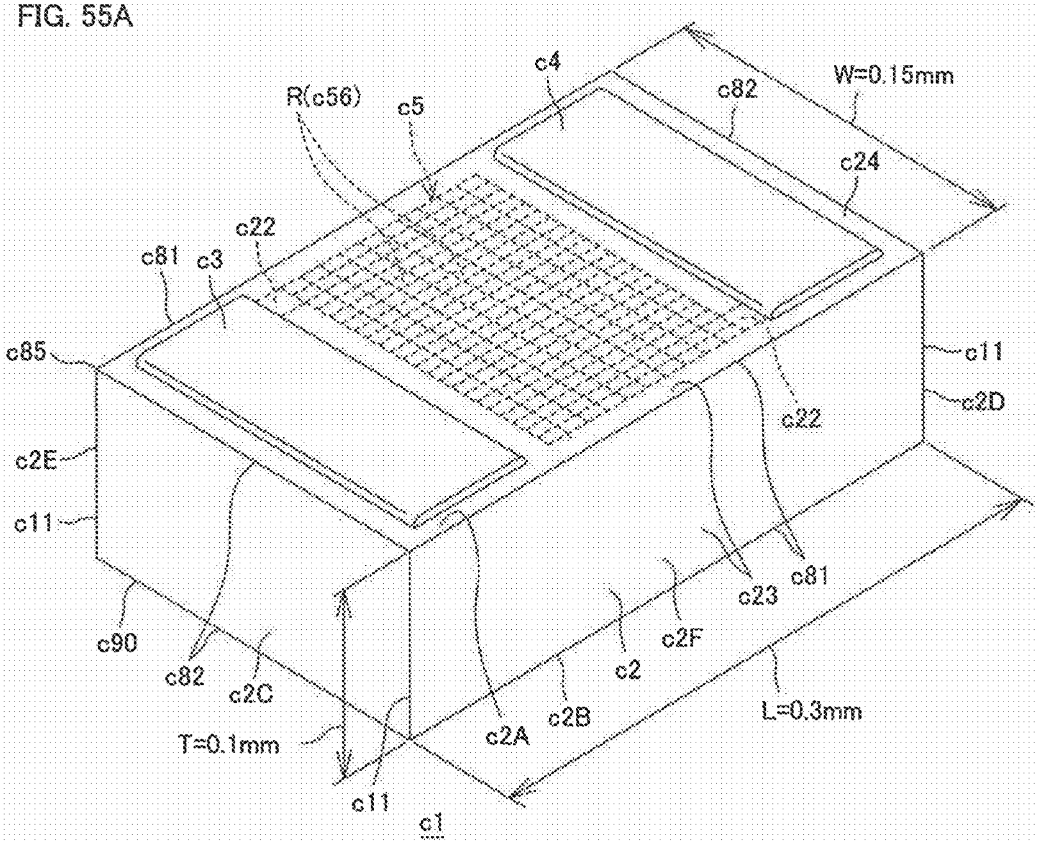
FIG. 55A is a schematic perspective view for explaining the construction of a chip resistor according to an example of a third reference embodiment.

FIG. 55A is a schematic perspective view for explaining the construction of a chip resistor according to an example of the third reference embodiment. The chip resistor c1 is a minute chip component, and has a rectangular prismatic shape as shown in FIG. 55A. The chip resistor c1 has a rectangular plan shape defined by two perpendicularly intersecting edges (a longer edge c81 and a shorter edge c82), one of which has a length of not greater than 0.4 mm and the other of which has a length of not greater than 0.2 mm. More preferably, the chip resistor c1 is dimensioned such as to have a length L (a length of the longer edge c81) of about 0.3 mm, a width W (a length of the shorter edge c82) of about 0.15 mm, and a thickness T of about 0.1 mm.

The chip resistor c1 is obtained by forming a multiplicity of chip resistors c1 in a lattice form on a substrate, then forming a trench in the substrate, and grinding a back surface of the substrate (or dividing the substrate along the trench) to separate the chip resistors c1 from each other. The chip resistor c1 principally includes a substrate c2 which constitutes a main body of the chip resistor c1, a first connection electrode c3 and a second connection electrode c4 serving as a pair of external connection electrodes, and a device portion c5 connected to the outside via the first connection electrode c3 and the second connection electrode c4.

The substrate c2 has a generally rectangular prismatic chip shape. An upper surface of the substrate c2 as seen in FIG. 55A is a front surface c2A. The front surface c2A is a surface of the substrate c2 on which the device portion c5 is provided, and has a generally rectangular shape. A surface of the substrate c2 opposite from the front surface c2A with respect to the thickness of the substrate c2 is a back surface c2B. The front surface c2A and the back surface c2B have substantially the same size and substantially the same shape, and are parallel to each other. The front surface c2A has a rectangular edge portion c85 defined along a pair of longer edges c81 and a pair of shorter edges c82 thereof, and the back surface c2B has a rectangular edge portion c90 defined along a pair of longer edges c81 and a pair of shorter edges c82 thereof. The edge portion c85 and the edge portion c90 coincide with each other when being seen in a normal direction perpendicular to the front surface c2A (back surface c2B).

In addition to the front surface c2A and the back surface c2B, the substrate c2 has side surfaces (i.e., a side surface c2C, a side surface c2D, a side surface c2E and a side surface c2F). The side surfaces intersect (specifically, orthogonally intersect) the front surface c2A and the back surface c2B to connect the front surface c2A and the back surface c2B to each other. The side surface c2C is disposed between shorter edges c82 of the front surface c2A and the back surface c2B on one of longitudinally opposite sides (on a left front side in FIG. 55A). The side surface c2D is disposed between shorter edges c82 of the front surface c2A and the back surface c2B on the other of the longitudinally opposite sides (on a right rear side in FIG. 55A). The side surfaces c2C, c2D are longitudinally opposite end faces of the substrate c2. The side surface c2E is disposed between longer edges c81 of the front surface c2A and the back surface c2B on one of widthwise opposite sides (on a left rear side in FIG. 55A). The side surface c2F is disposed between longer edges c81 of the front surface c2A and the back surface c2B on the other of the widthwise opposite sides (on a right front side in FIG. 55A). The side surfaces c2E, c2F are widthwise opposite end faces of the substrate c2. The side surfaces c2C, c2D intersect (specifically, orthogonally intersect) the side surfaces c2E, c2F. Therefore, a right angle is defined between adjacent ones of the front surface c2A to the side surface c2F.

The front surface c2A and the side surfaces c2C to c2F of the substrate c2 are entirely covered with a passivation film c23. More strictly, therefore, the front surface c2A and the side surfaces c2C to c2F are entirely located on an inner side (back side) of the passivation film c23, and are not exposed to the outside in FIG. 55A. Further, the chip resistor c1 has a resin film c24 (protection resin film). The resin film c24 covers the entire passivation film c23 on the front surface c2A (the edge portion c85 and a portion inward of the edge portion c85). The passivation film c23 and the resin film c24 will be detailed later.

The first connection electrode c3 and the second connection electrode c4 are provided inward of the edge portion c85 (in spaced relation from the edge portion c85) on the front surface c2A of the substrate c2, and is partly exposed from the resin film c24 on the front surface. In other words, the resin film c24 covers the front surface c2A (strictly, the passivation film c23 on the front surface c2A) with the first connection electrode c3 and the second connection electrode c4 being exposed therefrom. The first connection electrode c3 and the second connection electrode c4 each have a structure such that an Ni (nickel) layer, a Pd (palladium) layer and an Au (gold) layer are stacked in this order on the front surface c2A. The first connection electrode c3 and the second connection electrode c4 are spaced from each other longitudinally of the front surface c2A, and are each elongated widthwise of the front surface c2A. On the front surface c2A, the first connection electrode c3 is disposed closer to the side surface c2C, and the second connection electrode c4 is disposed closer to the side surface c2D in FIG. 55A. The first connection electrode c3 and the second connection electrode c4 have substantially the same size and substantially the same shape as seen in plan in the normal direction.

The device portion c5 is a circuit element, which is provided between the first connection electrode c3 and the second connection electrode c4 on the front surface c2A of the substrate c2, and is covered with the passivation film c23 and the resin film c24 from the upper side. In this example, the device portion c5 is a resistor portion c56. The resistor portion c56 is a circuit network including a plurality of (unit) resistor bodies R each having the same resistance value and arranged in an matrix array on the front surface c2A. The resistor bodies R are each made of TiON (titanium oxide nitride) or TiONSi (TiSiON). The device portion c5 is electrically connected to portions of an interconnection film c22 to be described later, and is electrically connected to the first connection electrode c3 and the second connection electrode c4 via the interconnection film portions c22. That is, the device portion c5 (a plurality of resistor bodies R) are provided on the substrate c2, and connected between the first connection electrode c3 and the second connection electrode c4.

Figure 55B:
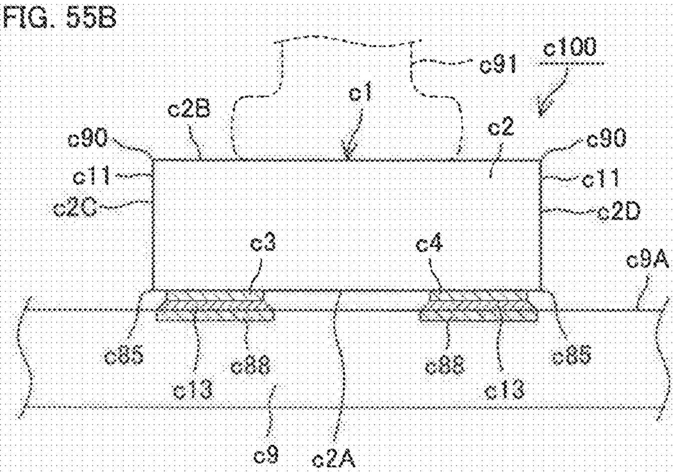
FIG. 55B is a schematic sectional view of a circuit assembly taken longitudinally of the chip resistor, which is mounted on a mount substrate.

FIG. 55B is a schematic sectional view of a circuit assembly taken longitudinally of the chip resistor, which is mounted on a mount substrate. In FIG. 55B, only major portions are illustrated in section.

As shown in FIG. 55B, the chip resistor c1 is mounted on the mount substrate c9. In this state, the chip resistor c1 and the mount substrate c9 constitute the circuit assembly c100. In FIG. 55B, an upper surface of the mount substrate c9 serves as a mount surface c9A. A pair of lands c88 (two lands c88) connected to an internal circuit (not shown) of the mount substrate c9 are provided on the mount surface c9A. The lands c88 are each made of, for example, Cu. Solder pieces c13 are provided on surfaces of the respective lands c88 as projecting from the surfaces.

When the chip resistor c1 is to be mounted on the mount substrate c9, a suction nozzle c91 of an automatic mounting machine (not shown) sucks the back surface c2B of the chip resistor c1 and is moved to transport the chip resistor c1. At this time, the suction nozzle c91 sucks a generally longitudinally middle portion of the back surface c2B. Then, the suction nozzle c91 sucking the chip resistor c1 is moved to the mount substrate c9. At this time, the front surface c2A of the chip resistor c1 is opposed to the mount surface c9A of the mount substrate c9. In this state, the suction nozzle c91 is moved to be pressed against the mount substrate c9, whereby the first connection electrode c3 of the chip resistor c1 is brought into contact with the solder piece c13 on one of the lands c88 and the second connection electrode c4 is brought into contact with the solder piece c13 on the other land c88. Then, the solder pieces c13 are heated to be melted. When the solder pieces c13 are thereafter cooled to be solidified, the first connection electrode c3 is bonded to the one land c88 and the second connection electrode c4 is bonded to the other land c88 by the respective solder pieces c13. That is, the first connection electrode c3 and the second connection electrode c4 are soldered to the two lands c88. Thus, the chip resistor c1 is mounted on the mount substrate c9 (through flip-chip connection), whereby the circuit assembly c100 is completed. The first connection electrode c3 and the second connection electrode c4 functioning as the external connection electrodes are desirably formed of gold (Au) or surface-plated with gold as will be described later for improvement of solder wettability and for improvement of reliability.

Figure 56:
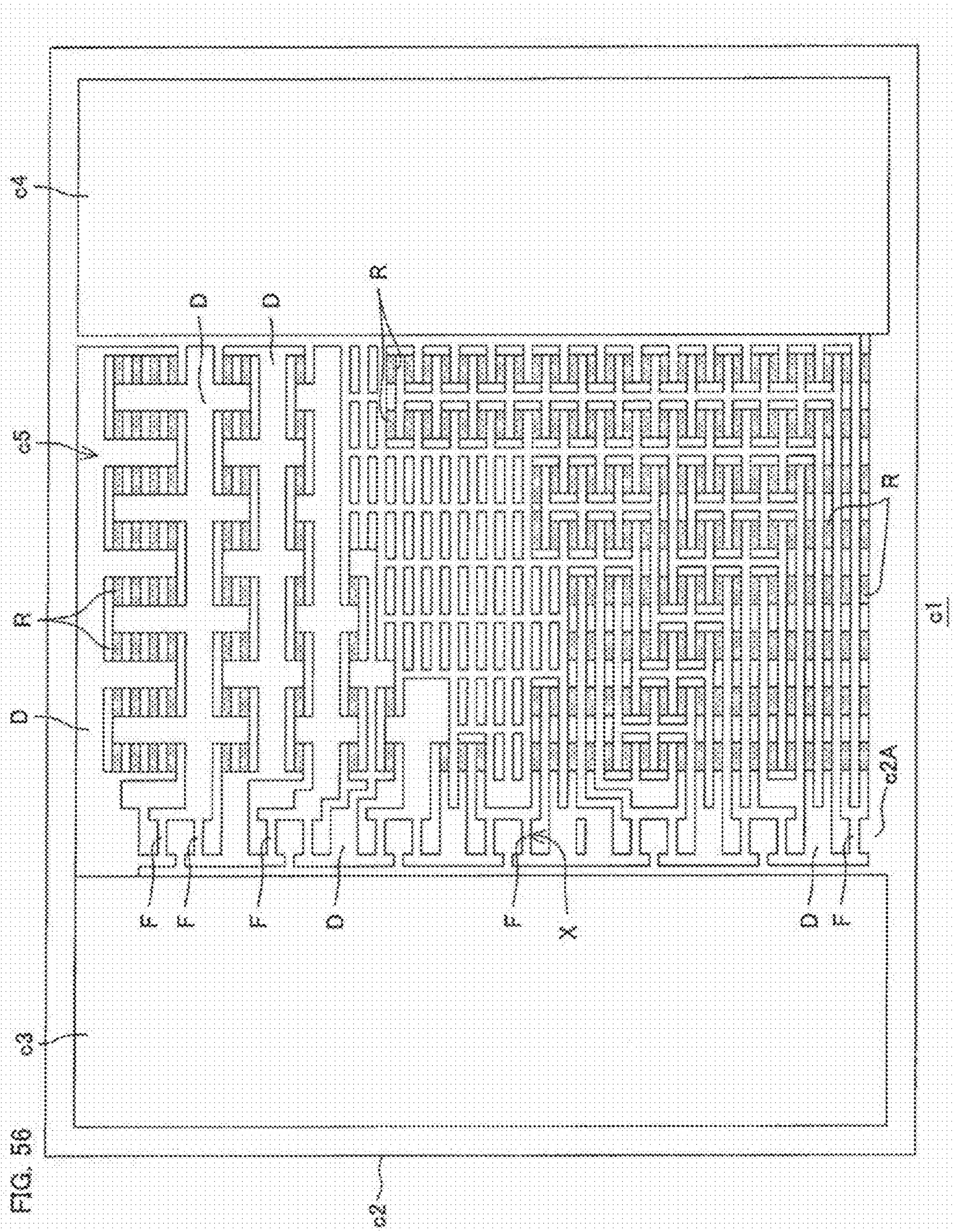
FIG. 56 is a plan view of the chip resistor showing the layout of a first connection electrode, a second connection electrode and a device portion, and the structure of the device portion as viewed in plan.

Next, other arrangement of the chip resistor c1 will be mainly described. FIG. 56 is a plan view of the chip resistor showing the layout of the first connection electrode, the second connection electrode and the device portion, and the structure (layout pattern) of the device portion as viewed in plan. Referring to FIG. 56, the device portion c5 is a resistor circuit network. More specifically, the device portion c5 includes 352 resistor bodies R in total with 8 resistor bodies R aligned in each row (longitudinally of the substrate c2) and with 44 resistor bodies R aligned in each column (widthwise of the substrate c2). These resistor bodies R are device elements constituting the resistor circuit network.

The multiplicity of resistor bodies R are grouped in predetermined numbers, and a predetermined number of resistor bodies R (1 to 64 resistor bodies R) in each group are electrically connected to one another, whereby plural types of resistor circuits are formed. The plural types of resistor circuits thus formed are connected to one another in a predetermined form via conductor films D (film interconnections made of a conductor). Further, a plurality of disconnectable (fusible) fuses F are provided on the front surface c2A of the substrate c2 for electrically incorporating the resistor circuits into the device portion c5 or electrically isolating the resistor circuits from the device portion c5. The fuses F and the conductor films D are arranged in a linear region alongside an inner edge of the first connection electrode c3. More specifically, the fuses F and the conductor films D are arranged in adjacent relation in a linear arrangement direction. The fuses F disconnectably (separably) connect the plural types of resistor circuits (each including a plurality of resistor bodies R) between the first connection electrode c3 and the second connection electrode c4 (strictly, with respect to the first connection electrode c3).

Figure 57A:
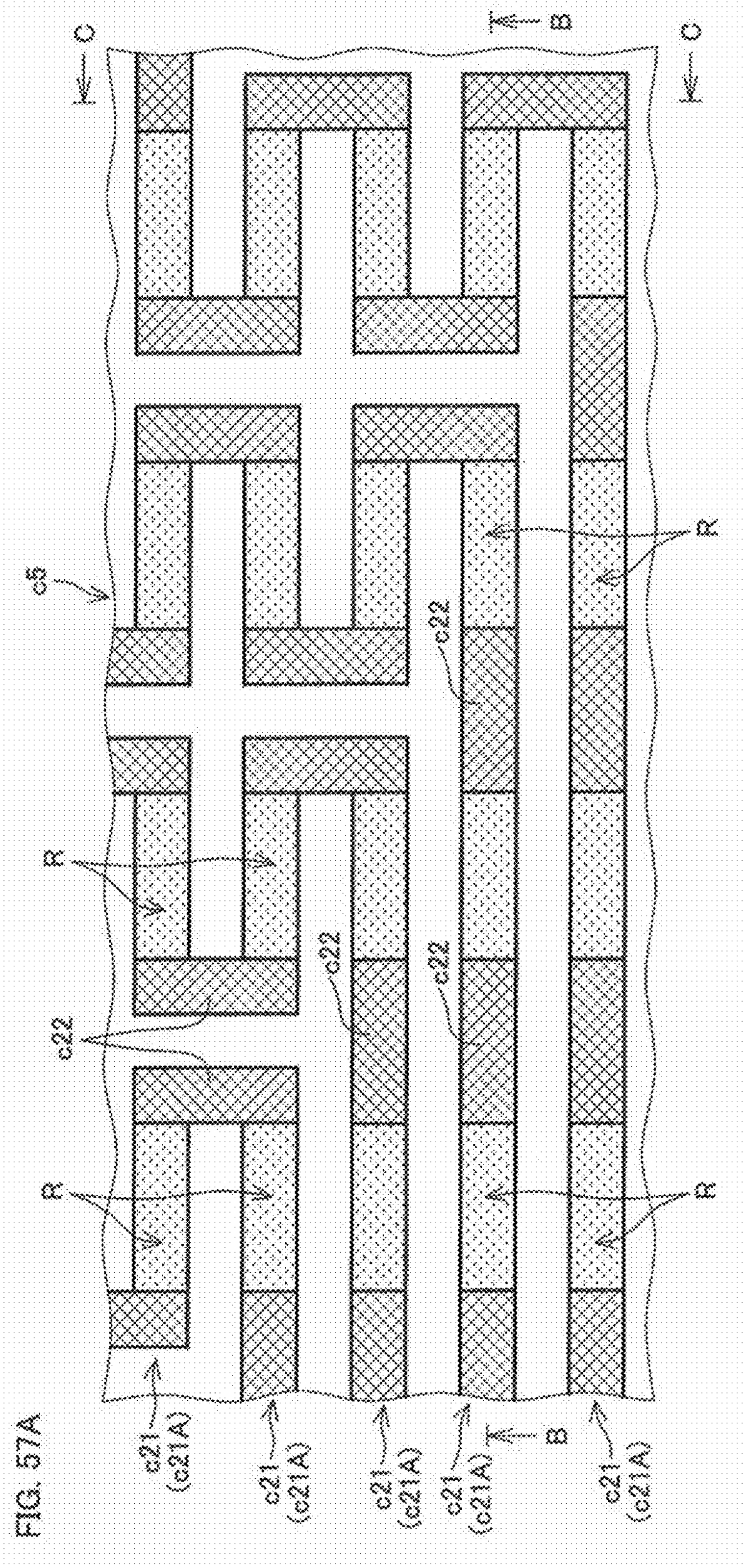
FIG. 57A is a plan view illustrating a part of the device portion shown in FIG. 56 on an enlarged scale.
Figure 57B:
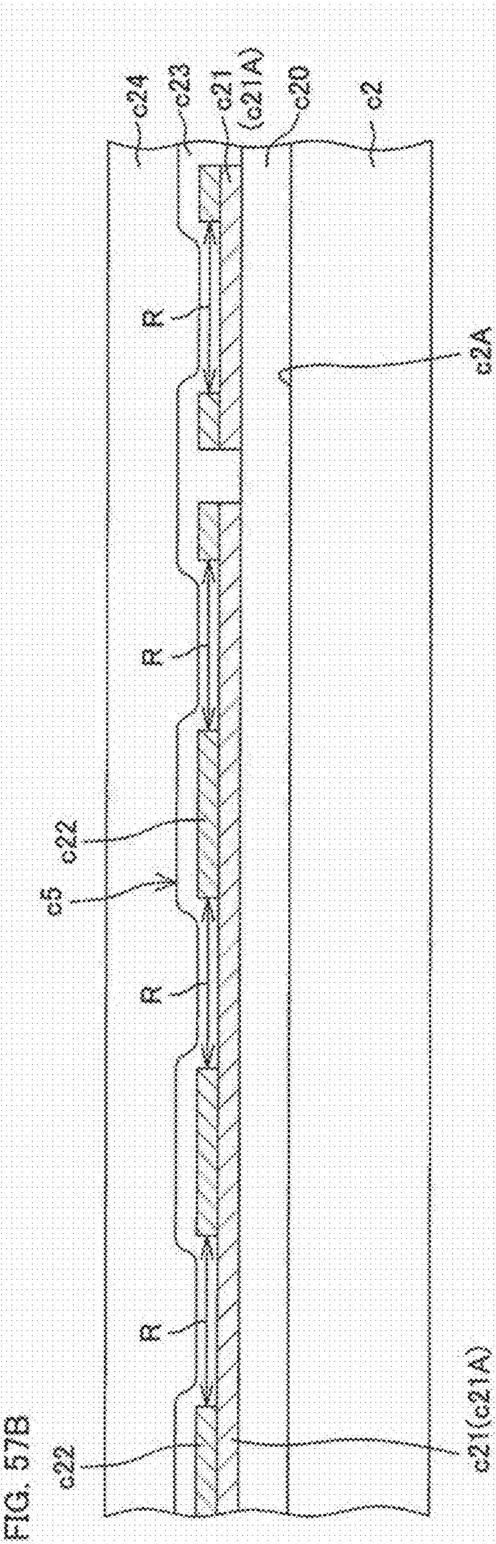
FIG. 57B is a longitudinal vertical sectional view taken along a line B-B in FIG. 57A for explaining the structure of resistor bodies of the device portion.
Figure 57C:
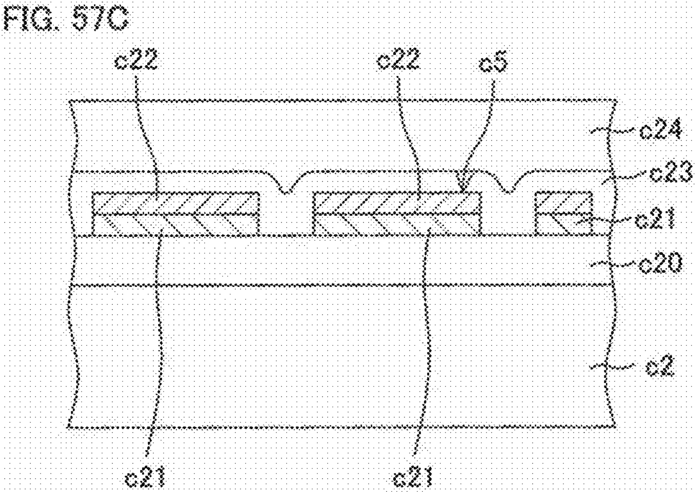
FIG. 57C is a widthwise vertical sectional view taken along a line C-C in FIG. 57A for explaining the structure of the resistor bodies of the device portion.

FIG. 57A is a plan view illustrating a part of the device portion shown in FIG. 56 on an enlarged scale. FIG. 57B is a longitudinal vertical sectional view taken along a line B-B in FIG. 57A for explaining the structure of the resistor bodies of the device portion. FIG. 57C is a widthwise vertical sectional view taken along a line C-C in FIG. 57A for explaining the structure of the resistor bodies of the device portion. Referring to FIGS. 57A, 57B and 57C, the structure of the resistor bodies R will be described.

The chip resistor c1 includes an insulative layer c20 and a resistive film c21 in addition to the interconnection film c22, the passivation film c23 and the resin film c24 described above (see FIGS. 57B and 57C). The insulative layer c20, the resistive film c21, the interconnection film c22, the passivation film c23 and the resin film c24 are provided on the substrate c2 (on the front surface c2A). The insulative layer c20 is made of $SiO_2$ (silicon oxide). The insulative layer c20 covers the entire front surface c2A of the substrate c2. The insulative layer c20 has a thickness of about 10000 Å.

The resistive film c21 is provided on the insulative layer c20. The resistive film c21 is made of TiN, TiON or TiONSi. The resistive film c21 has a thickness of about 2000 Å. The resistive film c21 includes a plurality of resistive film portions (hereinafter referred to as "resistive film lines c21A") extending linearly parallel to each other between the first connection electrode c3 and the second connection electrode c4. Some of the resistive film lines c21A are cut at predetermined positions with respect to a line extending direction (see FIG. 57A).

Portions of the interconnection film c22 are provided on the resistive film lines c21A. The interconnection film portions c22 are each made of Al (aluminum) or an alloy (AlCu alloy) of aluminum and Cu (copper). The interconnection film portions c22 each have a thickness of about 8000 Å. The interconnection film portions c22 are provided on the resistive film lines c21A in contact with the resistive film lines c21A, and spaced a predetermined distance R from one another in the line extending direction.

Figure 58A:
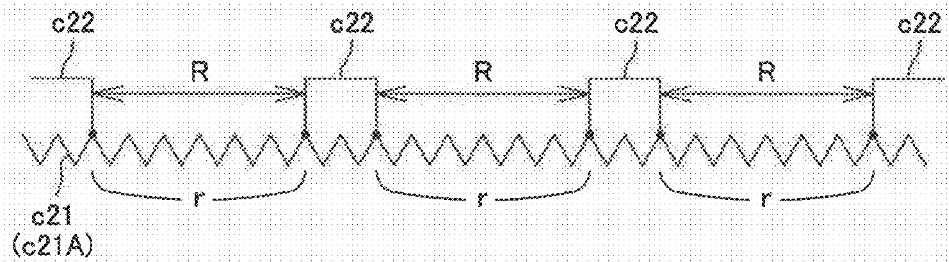
FIGS. 58A to 58C are diagrams showing the electrical characteristic features of a resistive film line and an interconnection film by way of circuit symbols and electric circuit diagrams.
Figure 58B:
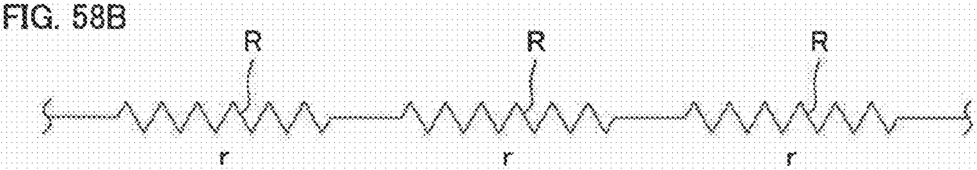
Figure 58C:
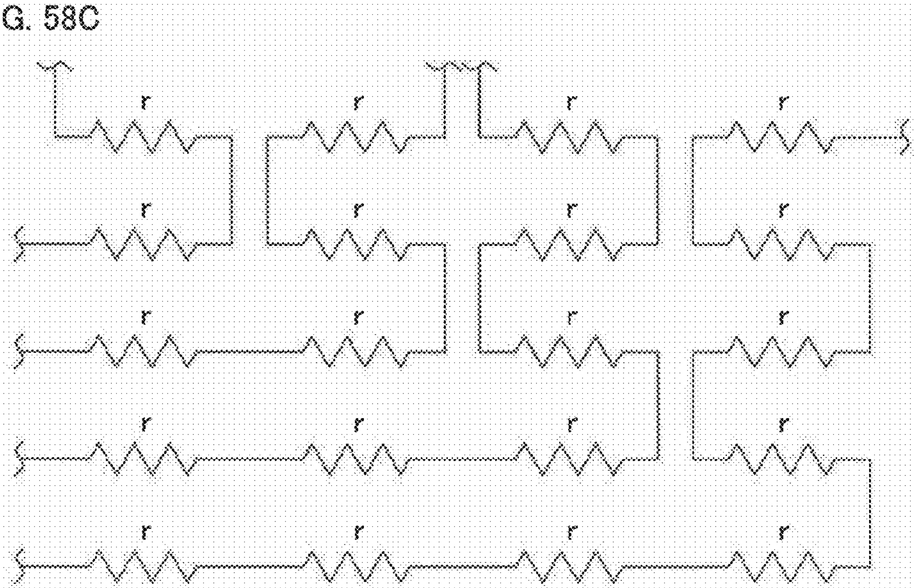

In FIGS. 58A to 58C, the electrical characteristic features of the resistive film lines c21A and the interconnection film portions c22 of this arrangement are shown by way of circuit symbols. As shown in FIG. 58A, portions of each of the resistive film lines c21A present between the interconnection film portions c22 spaced the predetermined distance R from one another each serve as a single resistor body R having a predetermined resistance value r. The interconnection film portions c22, which electrically connect adjacent resistor bodies R to each other, cause short circuit in regions of the resistive film lines c21A on which the interconnection film portions c22 are provided. Thus, a resistor circuit is provided, in which the resistor bodies R each having a resistance r are connected in series as shown in FIG. 58B.

Further, adjacent resistive film lines c21A are connected to each other by the resistive film c21 and the interconnection film c22, so that the resistor circuit network of the device portion c5 shown in FIG. 57A constitute a resistor circuit (including resistor bodies R each having a unit resistance as described above) shown in FIG. 58C. Thus, the resistive film c21 and the interconnection film c22 form the resistor bodies R and the resistor circuits (i.e., the device portion c5). The resistor bodies R are each constituted by a resistive film line c21A (resistive film c21) and a plurality of interconnection film portions c22 provided on the resistive film line c21A and spaced the predetermined distance in the line extending direction, and portions of the resistive film lines c21A not provided with the interconnection film portions c22 spaced the predetermined distance R from one another each define a single resistor body R. The portions of the resistive film lines c21A defining the resistor bodies R each have the same shape and the same size. Therefore, the multiplicity of resistor bodies R arranged in the matrix array on the substrate c2 each have the same resistance value.

Figure 59A:
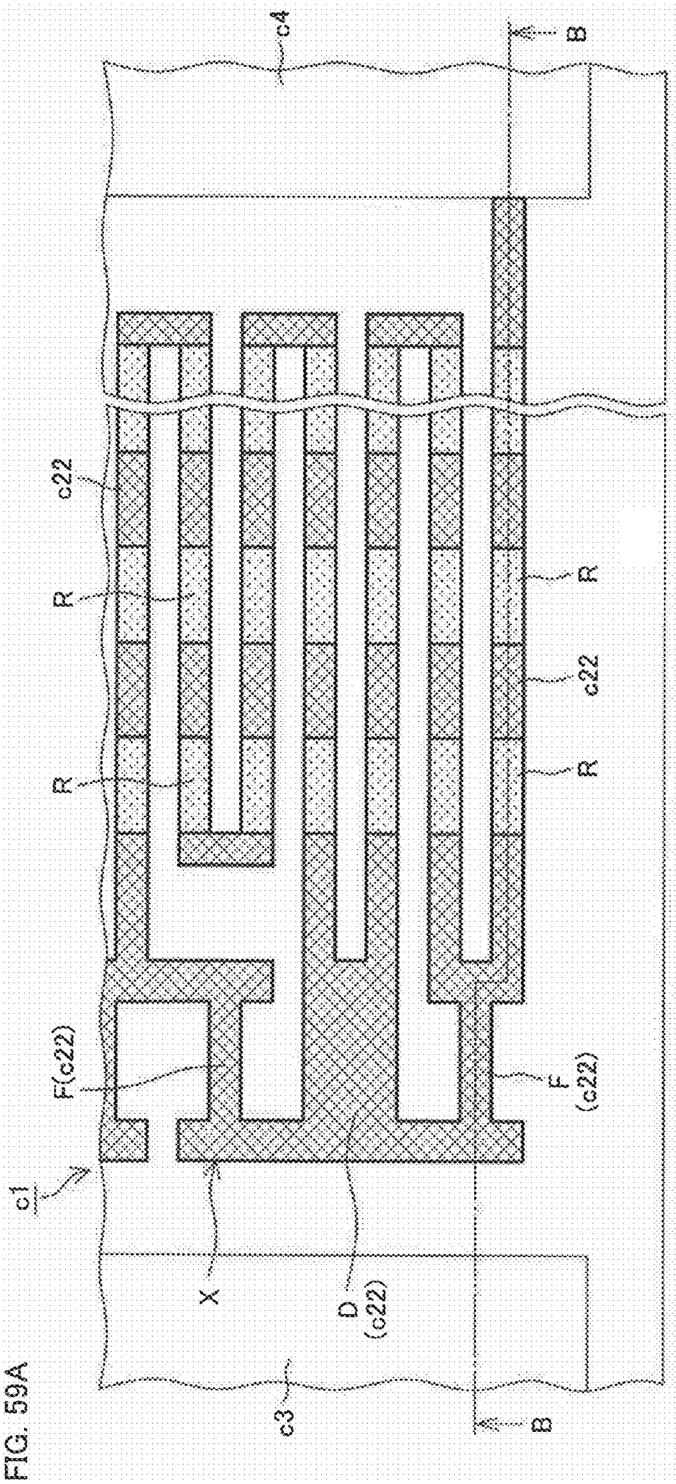
FIG. 59A is an enlarged partial plan view illustrating a region of the chip resistor including fuses shown in a part of the plan view of FIG. 56 on an enlarged scale.

The interconnection film portions c22 provided on the resistive film lines c21A define the resistor bodies R, and also serve as conductor films D for connecting the resistor bodies R to one another to provide the resistor circuits (see FIG. 56). FIG. 59A is an enlarged partial plan view illustrating a region of the chip resistor including the fuses shown in a part of the plan view of FIG. 56 on an enlarged scale, and FIG. 59B is a diagram showing a sectional structure taken along a line B-B in FIG. 59A.

Figure 59B:
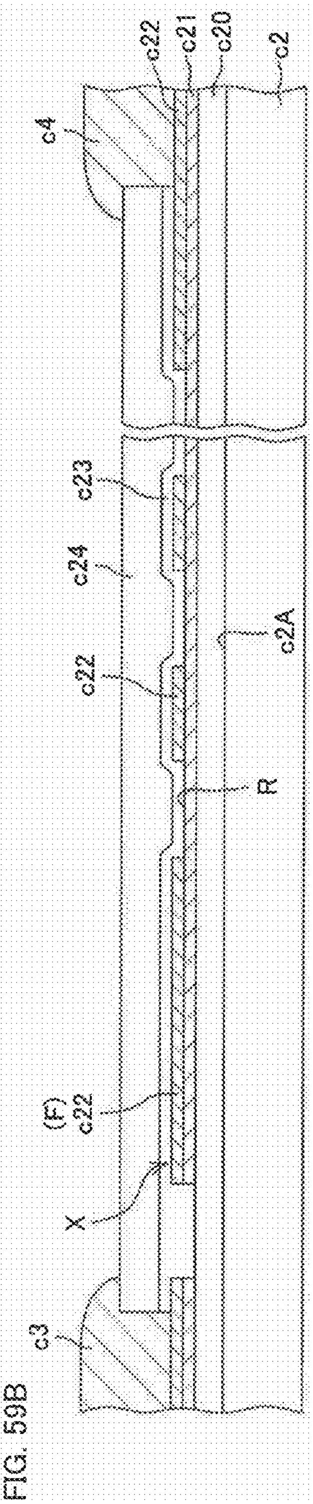
FIG. 59B is a diagram showing a sectional structure taken along a line B-B in FIG. 59A.

As shown in FIGS. 59A and 59B, the fuses F and the conductor films D described above are formed from the same interconnection film c22 as the interconnection film portions c22 provided on the resistive film c21 for the resistor bodies R. That is, the fuses F and the conductor films D are formed of Al or the AlCu alloy, which is the same metal material as for the interconnection film portions c22 provided on the resistive film lines c21A to define the resistor bodies R, and provided at the same level as the interconnection film portions c22. As described above, the interconnection film c22 is also used for the conductor films D for electrically connecting the plurality of resistor bodies R to form the resistor circuits.

That is, the interconnection film portions c22 for defining the resistor bodies R, the interconnection film portions c22 for the fuses F and the conductor films D, and the interconnection film portions c22 for connecting the device portion c5 to the first connection electrode c3 and the second connection electrode c4 are formed of the same metal material (Al or the AlCu alloy) and provided at the same level on the resistive film c21. It is noted that the fuses F are different (discriminated) from the other interconnection film portions c22 in that the fuses F are thinner for easy disconnection and no circuit element is present around the fuses F.

A region of the interconnection film c22 in which the fuses F are disposed is herein referred to as "trimming region X" (see FIGS. 56 and 59(*a*)). The trimming region X linearly extends alongside the inner edge of the first connection electrode c3, and not only the fuses F but also some of the conductor films D are present in the trimming region X. The resistive film c21 is partly present below the trimming region X of the interconnection film c22 (see FIG. 59B). The fuses F are each spaced a greater distance from the surrounding interconnection film portions c22 than the other interconnection film portions c22 present outside the trimming region X.

The fuses F each do not simply designate a part of the interconnection film portion c22, but may each designate a fuse element which is a combination of a part of the resistor body R (resistive film c21) and a part of the interconnection film portion c22 on the resistive film c21. In the above description, the fuses F are located at the same level as the conductor films D, but an additional conductor film may be provided on the respective conductor films D to reduce the resistance values of the conductor films D as a whole. Even in this case, the fusibility of the fuses F is not reduced as long as the additional conductor film is not present on the fuses F.

Figure 60:
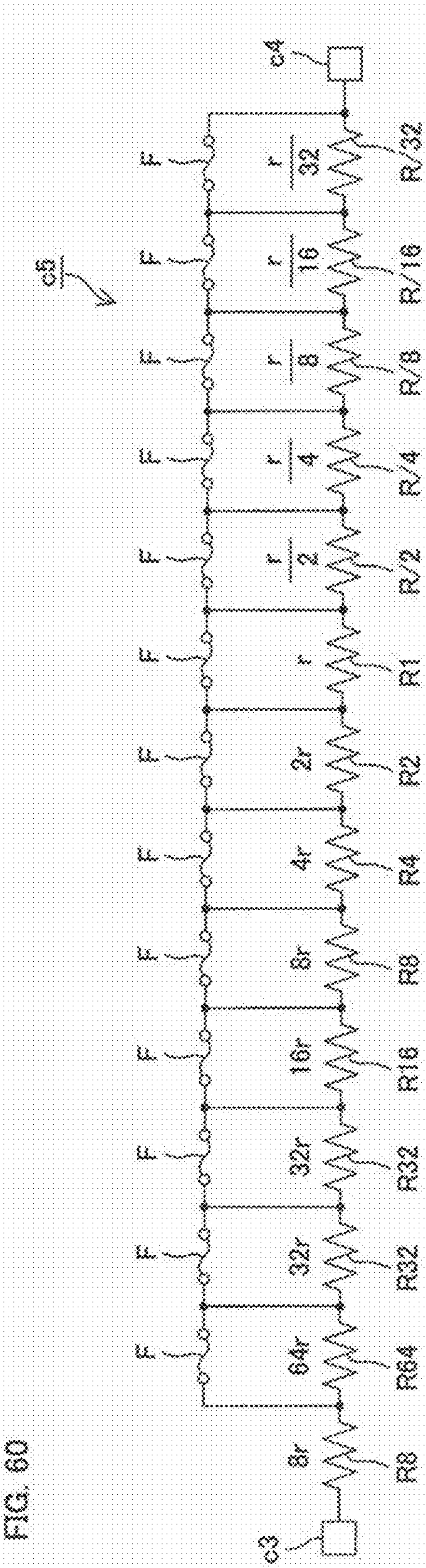
FIG. 60 is an electric circuit diagram of the device portion according to the example of the third reference embodiment.

FIG. 60 is an electric circuit diagram of the device portion according to the example of the third reference embodiment. Referring to FIG. 60, the device portion c5 includes a reference resistor circuit R8, a resistor circuit R64, two resistor circuits R32, a resistor circuit R16, a resistor circuit R8, a resistor circuit R4, a resistor circuit R2, a resistor circuit R1, a resistor circuit R/2, a resistor circuit R/4, a resistor circuit R/8, a resistor circuit R/16 and a resistor circuit R/32, which are connected in series in this order from the first connection electrode c3. The reference resistor circuit R8 and the resistor circuits R64 to R2 each include resistor bodies R in the same number as the suffix number of the reference character (e.g., 64 resistor bodies for the resistor circuit R64), wherein the resistor bodies R are connected in series. The resistor circuit R1 includes a single resistor body R. The resistor circuits R/2 to R/32 each include resistor bodies R in the same number as the suffix number of the reference character (e.g., 32 resistor bodies for the resistor circuit R/32), wherein the resistor bodies R are connected in parallel. The suffix number of the reference character for the designation of the resistor circuit has the same definition in FIGS. 61 and 62 to be described later.

A single fuse F is connected in parallel to each of the resistor circuits R64 to R/32 except the reference resistor circuit R8. The fuses F are connected in series to one another directly or via the conductor films D (see FIG. 59A). With none of the fuses F fused off as shown in FIG. 60, the device portion c5 provides a resistor circuit such that the reference resistor circuit R8 including 8 resistor bodies R connected in series is provided between the first connection electrode c3 and the second connection electrode c4. Where the resistor bodies R each have a resistance value r of r=8Ω, for example, the chip resistor c1 is configured such that the first connection electrode c3 and the second connection electrode c4 are connected to each other through the resistor circuit (reference resistor circuit R8) having a resistance value of 8r=64Ω.

With none of the fuses F fused off, the plural types of resistor circuits except the reference resistor circuit R8 are short-circuited. That is, 12 types of 13 resistor circuits R64 to R/32 are connected in series to the reference resistor circuit R8, but are short-circuited by the fuses F connected in parallel thereto. Therefore, each of the resistor circuits is not electrically incorporated in the device portion c5.

In the chip resistor c1 according to this example, the fuses F are selectively fused off, for example, by a laser beam according to the required resistance value. Thus, a resistor circuit connected in parallel to a fused fuse F is incorporated in the device portion c5. Therefore, the device portion c5 has an overall resistance value which is controlled by connecting, in series, resistor circuits incorporated by fusing off the corresponding fuses F.

Particularly, the plural types of resistor circuits include plural types of serial resistor circuits which respectively include 1, 2, 4, 8, 16, 32, . . . resistor bodies R (whose number increases in a geometrically progressive manner with a geometric ratio of 2) each having the same resistance value and connected in series, and plural types of parallel resistor circuits which respectively include 2, 4, 8, 16, . . . resistor bodies R (whose number increases in a geometrically progressive manner with a geometric ratio of 2) each having the same resistance value and connected in parallel. Therefore, the overall resistance value of the device portion c5 (resistor portion c56) can be digitally and finely controlled to a desired resistance value by selectively fusing off the fuses F (or the fuse elements described above). Thus, the chip resistor c1 can have the desired resistance value.

Figure 61:
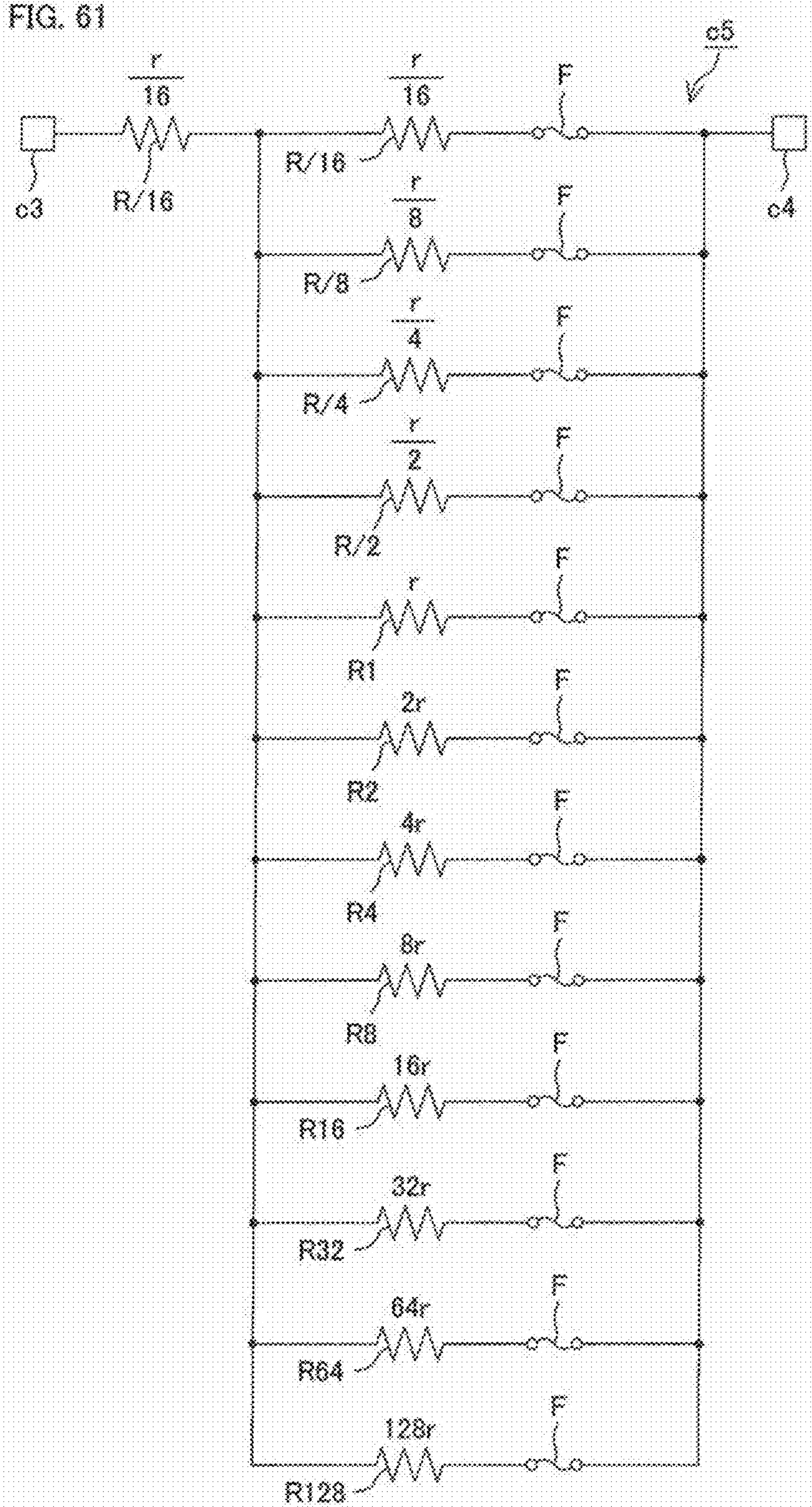
FIG. 61 is an electric circuit diagram of a device portion according to another example of the third reference embodiment.

FIG. 61 is an electric circuit diagram of a device portion according to another example of the third reference embodiment. The device portion c5 may be configured as shown in FIG. 61, rather than by connecting the resistor circuits R64 to R/32 in series to the reference resistor circuit R8 as shown in FIG. 60. More specifically, the device portion c5 may include a circuit configured such that a parallel connection circuit including 12 types of resistor circuits R/16, R/8, R/4, R/2, R1, R2, R4, R8, R16, R32, R64, R128 is connected in series to a reference resistor circuit R/16 between the first connection electrode c3 and the second connection electrode c4.

In this case, a fuse F is connected in series to each of the 12 types of resistor circuits except the reference resistor circuit R/16. With none of the fuses F fused off, all the resistor circuits are electrically incorporated in the device portion c5. The fuses F are selectively fused off, for example, by a laser beam according to the required resistance value. Thus, a resistor circuit associated with a fused fuse F (a resistor circuit connected in series to the fused fuse F) is electrically isolated from the device portion c5 to control the overall resistance value of the chip resistor c1.

Figure 62:
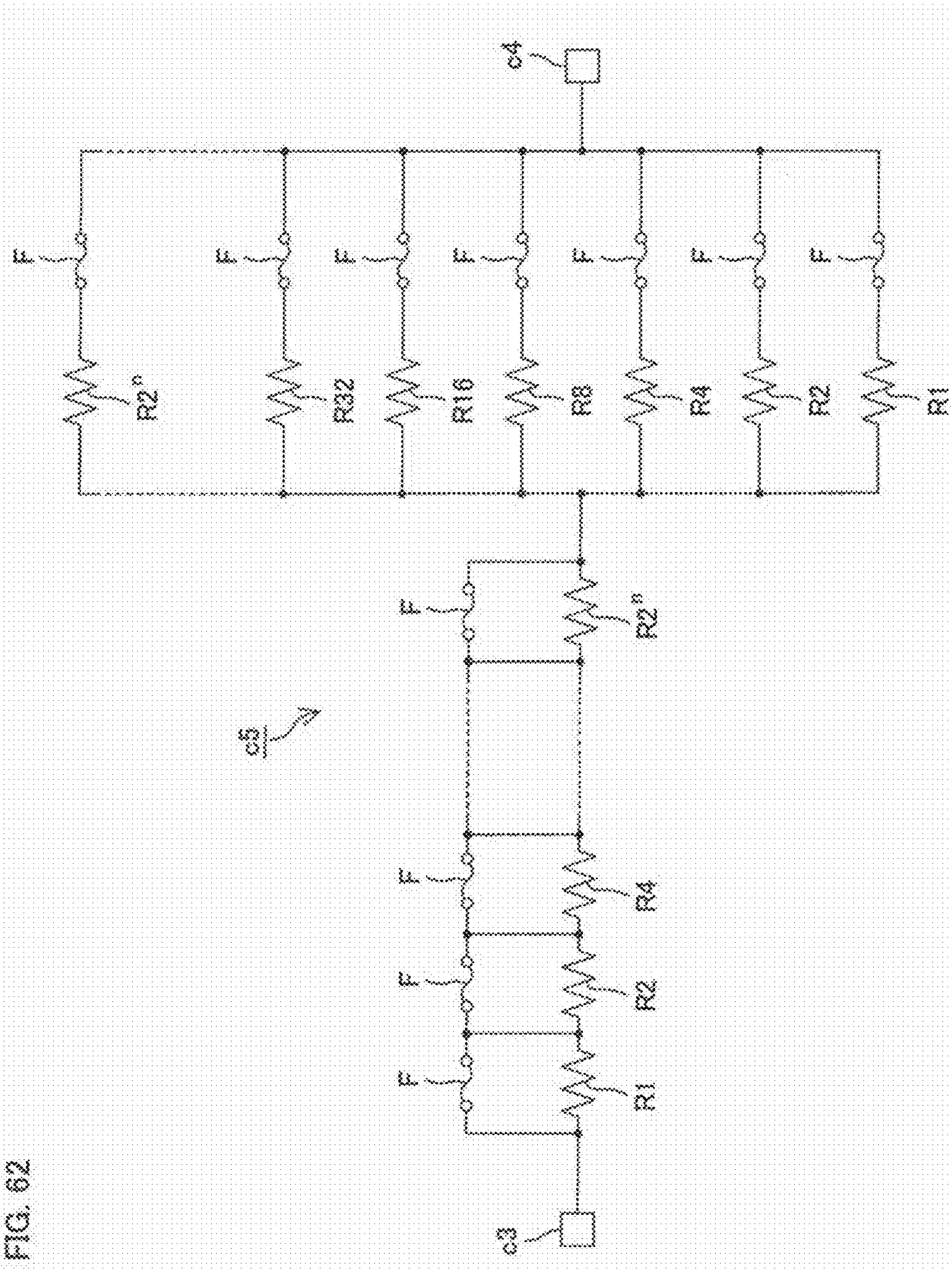
FIG. 62 is an electric circuit diagram of a device portion according to further another example of the third reference embodiment.

FIG. 62 is an electric circuit diagram of a device portion according to further another example of the third reference embodiment. The device portion c5 shown in FIG. 62 has a characteristic configuration such that a serial connection circuit including plural types of resistor circuits is connected in series to a parallel connection circuit including plural types of resistor circuits. As in the previous example, a fuse F is connected in parallel to each of the plural types of resistor circuits connected in series, and all the plural types of resistor circuits connected in series are short-circuited by the fuses F. With a fuse F fused off, therefore, a resistor circuit which has been short-circuited by that fuse F is electrically incorporated in the device portion c5.

On the other hand, a fuse F is connected in series to each of the plural types of resistor circuits connected in parallel. With a fuse F fused off, therefore, a resistor circuit which has been connected in series to that fuse F is electrically isolated from the parallel connection resistor circuits. With this arrangement, for example, a resistance of smaller than 1 kΩ may be formed in the parallel connection side, and a resistor circuit of 1 kΩ or greater may be formed in the serial connection side. Thus, a resistor circuit having a resistance value in a wide range from a smaller resistance value on the order of several ohms to a greater resistance value on the order of several megaohms can be produced from a resistor circuit network designed based on the same basic design concept. That is, the chip resistor c1 can be easily and speedily customized to have any of plural resistance values by selectively disconnecting one or more of the fuses F. In other words, the chip resistor c1 can be customized based on the same design concept so as to have various resistance values by selectively combining the resistor bodies R having different resistance values.

Figure 63:
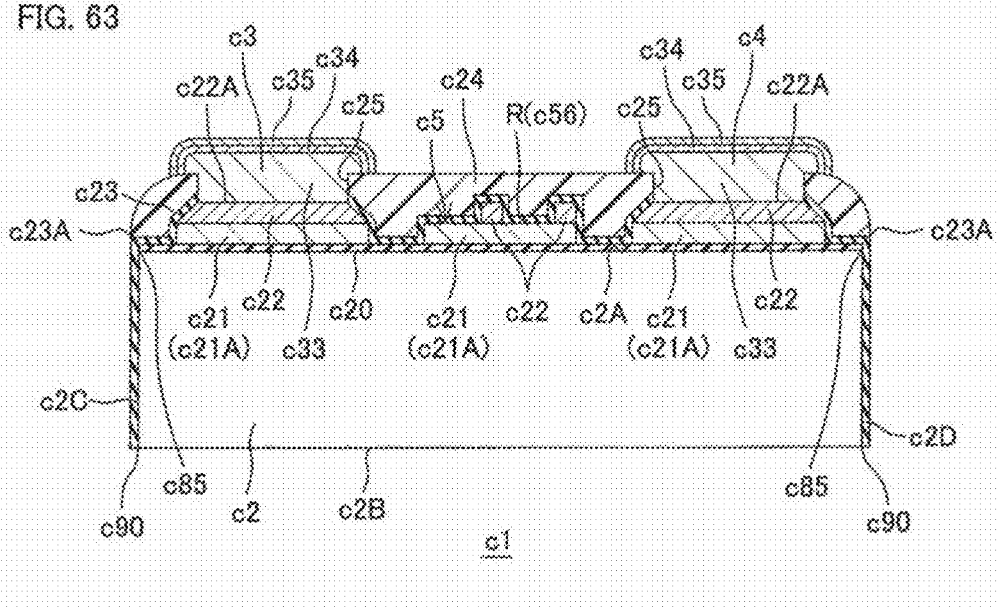
FIG. 63 is a schematic sectional view of the chip resistor.

In the chip resistor c1, as described above, the connection of the plurality of resistor bodies R (resistor circuits) can be changed in the trimming region X. FIG. 63 is a schematic sectional view of the chip resistor. Referring next to FIG. 63, the chip resistor c1 will be described in greater detail. In FIG. 63, the device portion c5 described above is simplified, and components other than the substrate c2 are hatched for convenience of description.

The passivation film c23 and the resin film c24 will be described. The passivation film c23 is made of, for example, SiN (silicon nitride), and has a thickness of 1000 Å to 5000 Å (here, about 3000 Å). The passivation film c23 is provided over the front surface c2A and the side surfaces c2C to c2F. A portion of the passivation film c23 present on the front surface c2A covers the resistive film c21 and the interconnection film portions c22 present on the resistive film c21 (i.e., the device portion c5) from the front side (from the upper side in FIG. 63), thereby covering the upper surfaces of the resistor bodies R of the device portion c5. Thus, the passivation film portion c23 also covers the trimming region X of the interconnection film c22 (the fuses F) (see FIG. 59B). Further, the passivation film portion c23 contacts the device portion c5 (the interconnection film c22 and the resistive film c21), and also contacts the insulative layer c20 in a region not formed with the resistive film c21. Thus, the passivation film portion c23 present on the front surface c2A covers the front surface c2A from above the device c5, the fuses F and the insulative layer c20, thereby protecting the front surface c2A of the substrate c2, the resistor bodies R and the fuses F. On the front surface c2A, the passivation film portion c23 prevents an unintended short circuit which may be a short circuit other than that occurring between the interconnection film portions c22 present between the resistor bodies R (an unintended short circuit which may occur between adjacent resistive film lines c21A).

On the other hand, portions of the passivation film c23 present on the respective side surfaces c2C to c2F function as protective layers which respectively protect the side surfaces c2C to c2F. The edge portion c85 described above is present on the boundaries between the front surface c2A and the side surfaces c2C to c2F, and the passivation film c23 also covers the boundaries (the edge portion c85). A portion of the passivation film c23 covering the edge portion c85 (overlying the edge portion c85) is herein referred to as an edge portion c23A. Since the passivation film c23 is a very thin film, the passivation film portions c23 covering the side surfaces c2C to c2F are regarded as a part of the substrate c2 in this example. Therefore, the passivation film portions c23 covering the side surfaces c2C to c2F are regarded as the side surfaces c2C to c2F themselves.

Together with the passivation film c23, the resin film c24 protects the front surface c2A of the chip resistor c1. The resin film c24 is made of a resin such as a polyimide. The resin film c24 has a thickness of about 5 μm. The resin film c24 is provided on the passivation film portion c23 present on the front surface c2A to cover the entire surface of the passivation film portion c23 (including the resistive film c21 and the interconnection film c22 covered with the passivation film portion c23). Therefore, the front surface c2A of the substrate c2, the resistor bodies R and the fuses F are protected doubly by the passivation film c23 and the resin film c24. An edge portion of the resin film c24 coincides with the edge portion c23A of the passivation film c23 (the edge portion c85 of the front surface c2A) as seen in plan.

The resin film c24 has two openings c25 respectively formed at two positions spaced from each other as seen in plan. The openings c25 are through-holes extending continuously thicknesswise through the resin film c24 and the passivation film c23. Therefore, not only the resin film c24 but also the passivation film c23 has the openings c25. The interconnection film c22 is partly exposed from the respective openings c25. The parts of the interconnection film c22 exposed from the respective openings c25 serve as pad regions c22A for the external connection.

One of the two openings c25 is completely filled with the first connection electrode c3, and the other opening c25 is completely filled with the second connection electrode c4. The first connection electrode c3 and the second connection electrode c4 each have an Ni layer c33, a Pd layer c34 and an Au layer c35 provided in this order from the front surface c2A. In each of the first connection electrode c3 and the second connection electrode c4, therefore, the Pd layer c34 is disposed between the Ni layer c33 and the Au layer c35. The Ni layer c33 occupies the most of each of the first connection electrode c3 and the second connection electrode c4, and the Pd layer c34 and the Au layer c35 are much thinner than the Ni layer c33. When the chip resistor c1 is mounted on the mount substrate c9 (see FIG. 55B), the Ni layer c33 functions to connect the solder c13 to Al of the pad region c22A of the interconnection film c22 in each of the openings c25.

In each of the first connection electrode c3 and the second connection electrode c4, the surface of the Ni layer c33 is covered with the Au layer c35, so that the oxidation of the Ni layer c33 can be prevented. Even if the Au layer c35 of each of the first connection electrode c3 and the second connection electrode c4 has a through-hole (pin hole) because of its smaller thickness, the Pd layer c34 provided between the Ni layer c33 and the Au layer c35 closes the through-hole. This prevents the Ni layer c33 from being exposed to the outside through the through-hole and oxidized.

The Au layers c35 are respectively exposed on the outermost surfaces of the first connection electrode c3 and the second connection electrode c4 to the outside from the openings c25 of the resin film c24. The first connection electrode c3 is kept in contact with and electrically connected to the pad region c22A of the interconnection film c22 present in the one opening c25 through the one opening c25. The second connection electrode c4 is kept in contact with and electrically connected to the pad region c22A of the interconnection film c22 present in the other opening c25 through the other opening c25. The Ni layers c33 of the first connection electrode c3 and the second connection electrode c4 are respectively connected to the pad regions c22A. Thus, the first connection electrode c3 and the second connection electrode c4 are electrically connected to the device portion c5. The interconnection film c22 serves as interconnections connected to the assembly of the resistor bodies R (resistor portion c56), the first connection electrode c3 and the second connection electrode c4.

Thus, the resin film c24 and the passivation film c23 formed with the openings c25 cover the front surface c2A with the first connection electrode c3 and the second connection electrode c4 being exposed from the respective openings c25. Therefore, the electrical connection between the chip resistor c1 and the mount substrate c9 is achieved through the first connection electrode c3 and the second connection electrode c4 projecting from the surface of the resin film c24 through the openings c25 (see FIG. 55B).

Figure 64A:
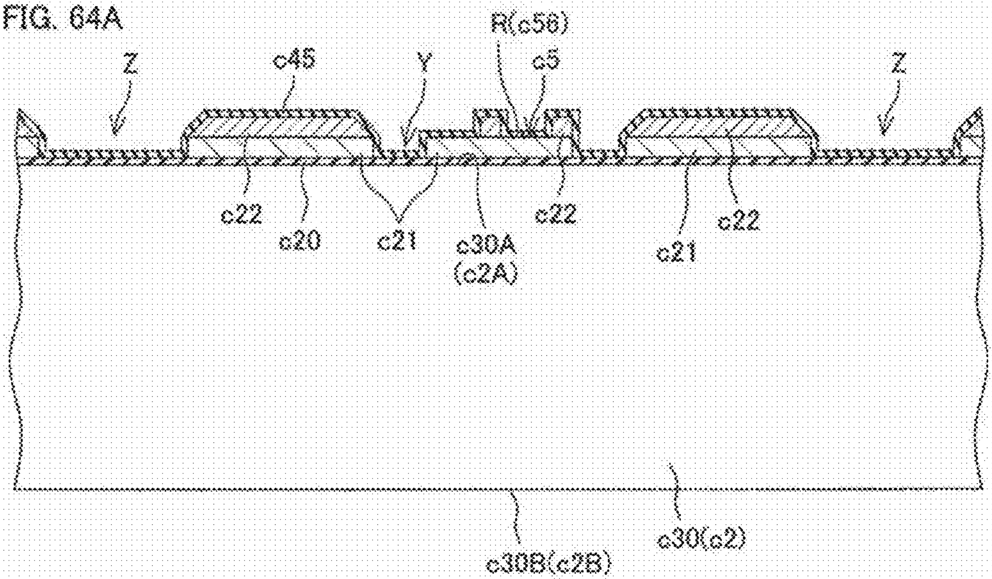
FIG. 64A is a schematic sectional view showing a production method for the chip resistor shown in FIG. 63.

FIGS. 64A to 64G are schematic sectional views showing a production method for the chip resistor shown in FIG. 63. First, as shown in FIG. 64A, a substrate c30 is prepared as a material for the substrate c2. In this case, a front surface c30A of the substrate c30 corresponds to the front surface c2A of the substrate c2, and a back surface c30B of the substrate c30 corresponds to the back surface c2B of the substrate c2.

Figure 65:
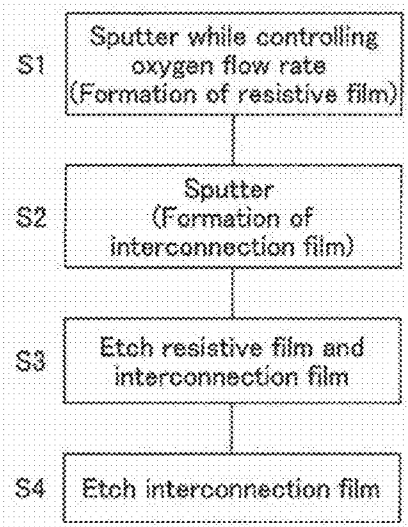
FIG. 65 is a diagram for explaining a device portion production process.

Then, an insulative layer c20 of $SiO_2$ or the like is formed in the front surface c30A of the substrate c30 by thermally oxidizing the front surface c30A of the substrate c30, and a device portion c5 (resistor bodies R and interconnection film portions c22 connected to the resistor bodies R) is formed on the insulative layer c20. FIG. 65 is a diagram for explaining a production process for the device portion. Referring to FIG. 65, more specifically, a resistive film c21 of TiON or TiONSi is formed on the entire surface of the insulative layer c20 by a sputtering process (Step S1). The sputtering process is performed while supplying oxygen and nitrogen. At this time, nitrogen and oxygen bombard a Ti target, whereby Ti atoms are ejected from the target. The Ti atoms are combined with nitrogen atoms and oxygen atoms to generate TiON, which is deposited on the insulative layer c20 to form the resistive film c21. Where the substrate c30 is a silicon substrate, TiON deposited on the insulative layer c20 at this time is combined with Si of the substrate c30 underlying the insulative layer c20, and the resistive film c21 of TiONSi is formed on the insulative layer c20.

Figure 66:
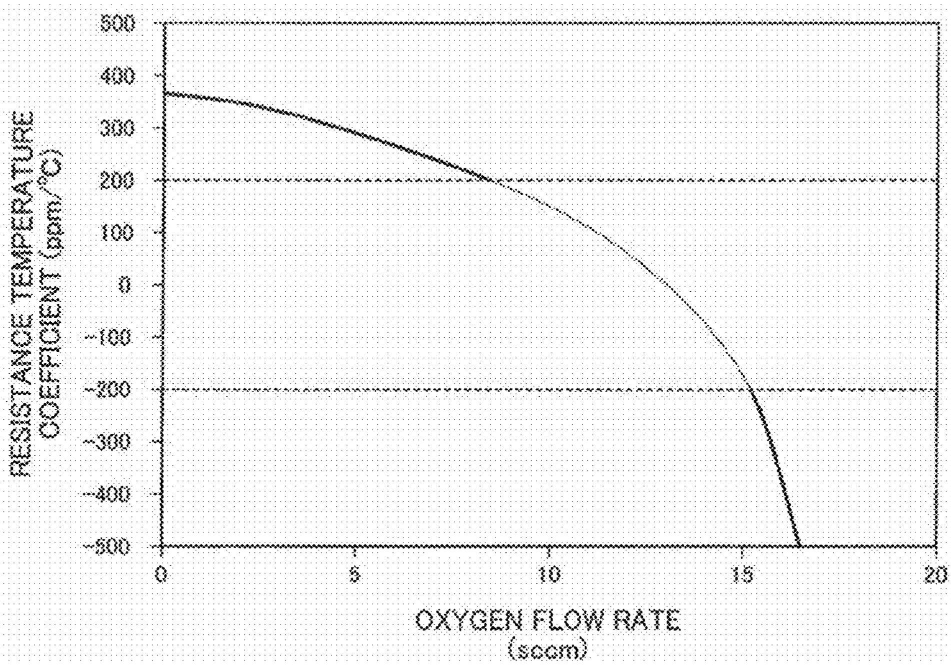
FIG. 66 is a graph showing a relationship between the flow rate of oxygen used in a sputtering step of the device portion production process and the resistance temperature coefficient of a completed resistive film.

The flow rate of oxygen to be supplied during the sputtering process is controlled according to an intended resistance temperature coefficient. FIG. 66 is a graph showing a relationship between the flow rate of oxygen in the sputtering process and the resistance temperature coefficient of the resistive film in the device portion production process. Here, the resistance temperature coefficient is one of the temperature characteristics of the resistive film c21 (resistor bodies R), and is solely dependent on a substance constituting the resistive film c21. Therefore, the oxygen flow rate is controlled during the sputtering process, whereby the composition of TiON or TiONSi constituting the resistive film c21 is controlled to adjust the resistance temperature coefficient at a desired value.

More specifically, a higher oxygen flow rate in the sputtering process promotes the combination of the Ti atoms and the oxygen atoms, thereby correspondingly increasing the oxygen composition ratio of TiON or TiONSi of the completed resistive film c21. Referring to FIG. 66, as the oxygen composition ratio (i.e., the oxygen flow rate) is increased, the resistance temperature coefficient of the resistive film c21 is reduced from a positive value to a negative value. It is herein found that, where the resistance temperature coefficient is not less than 200 ppm/° C. in absolute value (see ranges indicated by bold solid curves in FIG. 66), a change in the resistance of the resistive film c21 (i.e., the resistor bodies R) with respect to a temperature change increases. That is, where the resistance temperature coefficient is not less than 200 ppm/° C. in absolute value, the sensitivity to the temperature of the resistor bodies R is increased (the temperature characteristic of the resistor bodies R is improved). It is also found that the temperature characteristic (resistance temperature coefficient) of the resistor bodies R can be controlled by controlling the oxygen flow rate.

In the sputtering process, the oxygen flow rate is controlled so that the completed resistive film c21 has a resistance temperature coefficient of not less than 200 ppm/° C. in absolute value (Step S1 described above). In FIG. 66, more specifically, the oxygen flow rate is controlled at not greater than 7 sccm ($11.83\times10^{-4}$ Pa·m$^3$/sec in the SI unit) where the resistance temperature coefficient is to be adjusted at not less than +200 ppm/° C. Further, the oxygen flow rate is controlled at not less than 15 sccm ($25.35\times10^{-4}$ Pa·m$^3$/sec in the SI unit) where the resistance temperature coefficient is to be adjusted at not greater than −200 ppm/° C. Thus, the completed resistive film c21 is made of TiON or TiONSi having an oxygen composition ratio controlled for a resistance temperature coefficient of not less than 200 ppm/° C. in absolute value. In other words, the resistive film c21 having a resistance temperature coefficient of not less than 200 ppm/° C. in absolute value can be formed of TiON or TiONSi having a controlled oxygen composition ratio.

Referring to FIG. 65, after the resistive film c21 is thus formed, an interconnection film c22 of aluminum (Al) is formed on the resistive film c21 in contact with the resistive film c21 by another sputtering process different from that of Step S1 (Step S2). Thereafter, the resistive film c21 and the interconnection film c22 are selectively removed to be patterned by utilizing a photolithography process and dry etching such as RIE (Reactive Ion Etching) (Step S3). Thus, as shown in FIG. 57A, resistive film lines c21A of the resistive film c21 each having a predetermined width are arranged at a predetermined interval in a column direction as seen in plan. At this time, the resistive film lines c21A and the interconnection film portions c22 are partly cut, and fuses F and conductor films D are formed in the trimming region X (see FIG. 56). The dry etching makes it possible to highly accurately form the resistive film lines c21A (later serving as resistor bodies R) and the fuses F.

Referring back to FIG. 65, in turn, the interconnection film portions c22 provided on the respective resistive film lines c21A are selectively removed, for example, by wet etching (Step S4). As a result, the device portion c5 (plural resistor bodies R) is provided, which is configured such that interconnection film portions c22 are spaced a predetermined distance R from one another on the resistive film lines c21A. At this time, the overall resistance value of the device portion c5 may be measured in order to check if the resistive film c21 and the interconnection film c22 are formed as each having intended dimensions.

Referring to FIG. 64A, a multiplicity of such device portions c5 are formed on the front surface c30A of the substrate c30 according to the number of the chip resistors c1 to be formed on the single substrate c30. Regions of the substrate c30 respectively formed with the device portions c5 (the aforementioned resistor portions c56) are each herein referred to as a chip component region Y. Therefore, a plurality of chip component regions Y (i.e., the device portions c5) each having the resistor portion c56 are formed (defined) on the front surface c30A of the substrate c30. The chip component regions Y each correspond to a single complete chip resistor c1 (see FIG. 63) as seen in plan. A region of the front surface c30A of the substrate c30 defined between adjacent chip component regions Y is herein referred to as a boundary region Z. The boundary region Z is a zone configured in a lattice shape as seen in plan. The chip component regions Y are respectively disposed in lattice areas defined by the lattice-shaped boundary region Z. Since the boundary region Z has a very small width on the order of 1 μm to 60 μm (e.g., 20 μm), a multiplicity of chip component regions Y can be defined on the substrate c30. This allows for mass production of the chip resistors c1.

Then, as shown in FIG. 64A, an insulative film c45 of SiN is formed over the entire front surface c30A of the substrate c30 by a CVD (Chemical Vapor Deposition) method. The insulative film c45 entirely covers the insulative layer c20 and the device portions c5 (the resistive film c21 and the interconnection film c22) present on the insulative layer c20, and contacts the insulative layer c20 and the device portions c5. Therefore, the insulative film c45 also covers the trimming regions X of the interconnection film c22 (see FIG. 56). Since the insulative film c45 is formed over the entire front surface c30A of the substrate c30, the insulative film c45 extends to a region other than the trimming regions X on the front surface c30A. Thus, the insulative film c45 serves as a protective film for protecting the entire front surface c30A (including the device portions c5 on the front surface c30A).

Figure 64B:
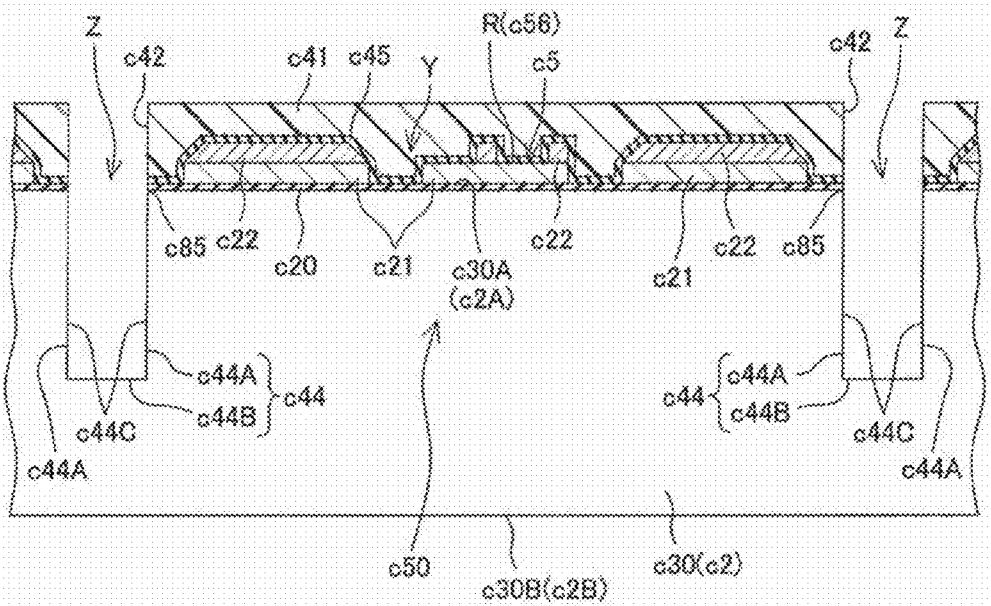
FIG. 64B is a schematic sectional view showing a process step subsequent to that shown in FIG. 64A.
Figure 67:
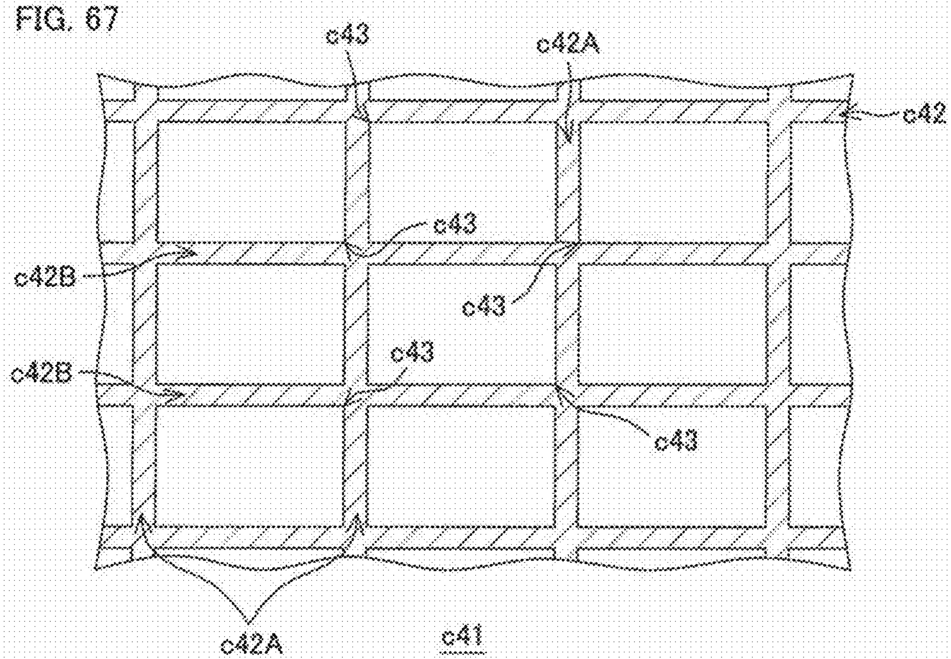
FIG. 67 is a schematic plan view showing a part of a resist pattern to be used for forming a trench in the step of FIG. 64B.

In turn, as shown in FIG. 64B, a resist pattern c41 is formed over the entire front surface c30A of the substrate c30 to entirely cover the insulative film c45. The resist pattern c41 has an opening c42. FIG. 67 is a schematic plan view showing a part of the resist pattern to be used for forming a trench in the process step of FIG. 64B.

Referring to FIG. 67, the opening c42 of the resist pattern c41 is aligned with (or corresponds to) a region (i.e., the boundary region Z, hatched in FIG. 67) between the contours of adjacent chip resistors c1 (i.e., the chip component regions Y described above) as seen in plan when the chip resistors c1 are arranged in a matrix array (or in a lattice form). As a whole, the opening c42 has a lattice shape including linear portions c42A and linear portions c42B orthogonally crossing each other.

The linear portions c42A and the linear portions c42B of the opening c42 of the resist pattern c41 are connected to each other as crossing orthogonally to each other (without any curvature). Therefore, the linear portions c42A and the linear portions c42B interest each other at an angle of about 90 degrees as seen in plan to form angled intersection portions c43. Referring to FIG. 64B, parts of the insulative film c45, the insulative layer c20 and the substrate c30 are selectively removed by plasma etching with the use of the resist pattern c41 as a mask. Thus, a portion of the substrate c30 is removed from the boundary region Z defined between the adjacent device portions c5 (chip component regions Y). As a result, a trench c44 is formed in the position (boundary region Z) corresponding to the opening c42 of the resist pattern c41 as seen in plan as extending through the insulative film c45 and the insulative layer c20 into the substrate c30 to a depth halfway the thickness of the substrate c30 from the front surface c30A of the substrate c30. The trench c44 is defined by pairs of side walls c44A opposed to each other, and a bottom wall c44B extending between lower edges of the paired side walls c44A (edges of the paired side walls c44A on the side of the back surface c30B of the substrate c30). The trench c44 has a depth of about 100 μm as measured from the front surface c30A of the substrate c30, and a width of about 20 μm (as measured between the opposed side walls c44A) which is constant throughout the depth.

The trench c44 of the substrate c30 has a lattice shape as a whole corresponding to the shape of the opening c42 (see FIG. 67) of the resist pattern c41 as seen in plan. On the front surface c30A of the substrate c30, rectangular frame-like portions of the trench c44 (the boundary region Z) respectively surround the chip component regions Y in which the device portions c5 are respectively provided. Portions of the substrate c30 respectively formed with the device portions c5 are semi-finished products c50 of the chip resistors c1. The semi-finished products c50 are respectively located in the chip component regions Y surrounded by the trench c44 on the front surface c30A of the substrate c30. These semi-finished products c50 are arranged in a matrix array. By thus forming the trench c44, the substrate c30 is divided into a plurality of substrates c2 respectively defined by the chip component regions Y.

Figure 64C:
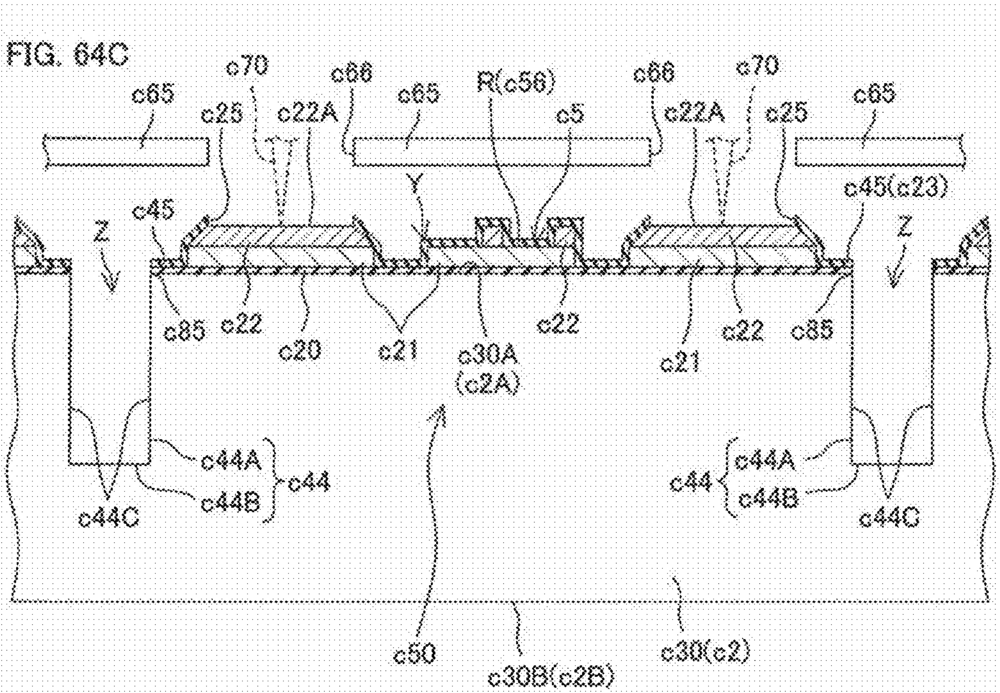
FIG. 64C is a schematic sectional view showing a process step subsequent to that shown in FIG. 64B.

After the trench c44 is formed as shown in FIG. 64B, the resist pattern c41 is removed, and the insulative film c45 is selectively etched off with the use of a mask c65 as shown in FIG. 64C. The mask c65 has openings c66 formed in association with portions of the insulative film c45 aligned with the pad regions c22A (see FIG. 63) as seen in plan. Thus, the portions of the insulative film c45 aligned with the openings c66 are etched off, whereby openings c25 are formed in these portions of the insulative film c45. Thus, the pad regions c22A are exposed from the insulative film c45 in the openings c25. The semi-finished products c50 each have two openings c25.

After the two openings c25 are formed in the insulative film c45 of each of the semi-finished products c50, probes c70 of a resistance measuring device (not shown) are brought into contact with the pad regions c22A in the respective openings c25 to measure the overall resistance value of the device portion c5 (the total resistance value of the resistor bodies R). Based on the results of the measurement, a fuse F to be disconnected is selected from the plurality of fuses F.

Subsequently, a laser beam (not shown) is applied to a (selected) fuse F (see FIG. 56) through the insulative film c45, whereby the fuse F in the trimming region X of the interconnection film c22 is trimmed by the laser beam to be disconnected (fused off). Thus, the overall resistance value of the semi-finished product c50 (i.e., the chip resistor c1) can be controlled, as described above, by selectively fusing off (trimming) the fuse F for the required resistance value. At this time, the insulative film c45 serves as a cover film which covers the device portions c5, thereby preventing a short circuit which may otherwise occur when a debris occurring during the fuse-off adheres to any of the device portions c5. Further, the insulative film c45 covers the fuses F (resistive film c21), so that the selected fuse F can be reliably fused off by accumulating the energy of the laser beam therein.

Figure 64D:
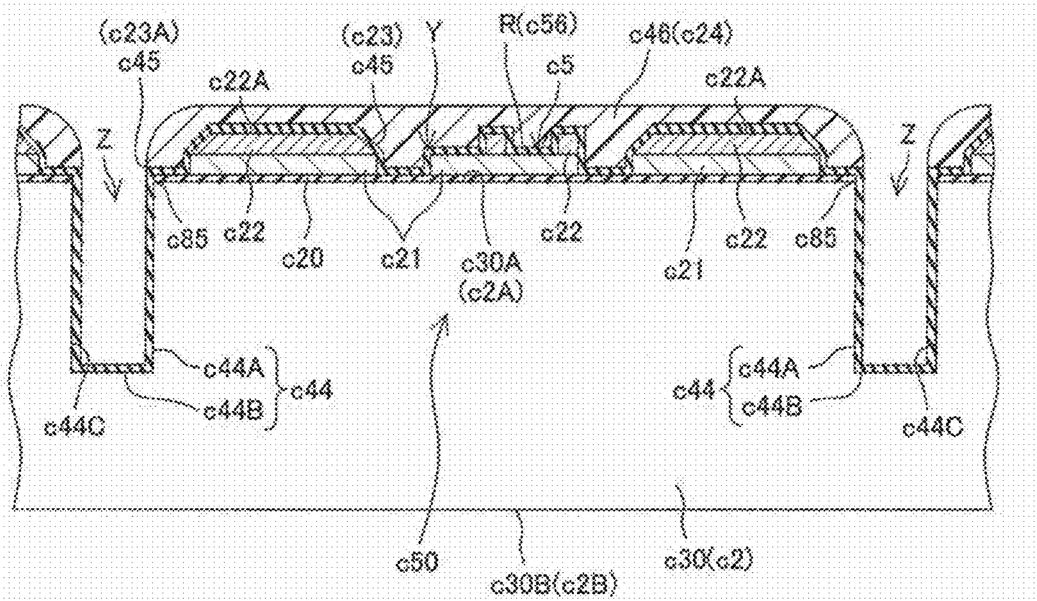
FIG. 64D is a schematic sectional view showing a process step subsequent to that shown in FIG. 64C.

Thereafter, SiN is further deposited on the insulative film c45 by the CVD method to thicken the insulative film c45. At this time, as shown in FIG. 64D, the insulative film c45 is also formed on the entire inner peripheral surface of the trench c44 (the wall surfaces c44C of the side walls c44A and an upper surface of the bottom wall c44B). The insulative film c45 finally has a thickness of 1000 Å to 5000 Å (here, about 3000 Å) (in a state shown in FIG. 64D). At this time, the insulative film c45 partly enters the openings c25 to close the openings c25.

Thereafter, a liquid photosensitive resin of a polyimide is sprayed over the resulting substrate c30 from above the insulative film c45. Thus, a photosensitive resin film c46 is formed as shown in FIG. 64D. At this time, the liquid is applied to the substrate c30 via a mask (not shown) having a pattern which covers only the trench c44 as seen in plan so as to prevent the liquid from entering the trench c44. As a result, the liquid photosensitive resin is applied only on the substrate c30 to form the resin film c46 on the substrate c30. The resin film c46 on the front surface c30A has a flat surface extending along the front surface c30A.

Since the liquid does not enter the trench c44, the resin film c46 is not formed in the trench c44. The formation of the resin film c46 may be achieved by spin-coating with the liquid or applying a photosensitive resin sheet on the front surface c30A of the substrate c30, rather than by spraying the liquid photosensitive resin. In turn, the resin film c46 is heat-treated (cured). Thus, the resin film c46 is thermally shrunk to a smaller thickness, and hardened to have a stable film quality.

Figure 64E:
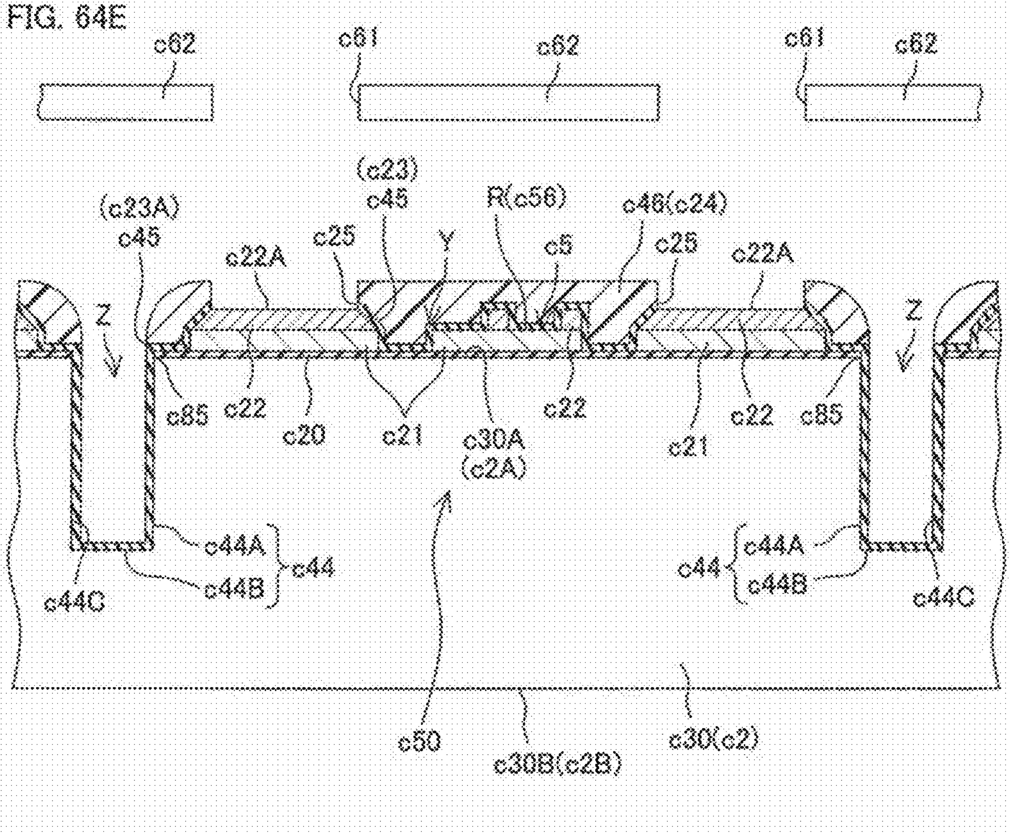
FIG. 64E is a schematic sectional view showing a process step subsequent to that shown in FIG. 64D.

In turn, as shown in FIG. 64E, parts of the resin film c46 aligned with the pad regions c22A of the interconnection film c22 (openings c25) on the front surface c30A as seen in plan are selectively removed by patterning the resin film c46. More specifically, the resin film c46 is exposed to light with the use of a mask c62 of a pattern having openings c61 aligned with (corresponding to) the pad regions c22A as seen in plan, and then developed in the pattern. Thus, the parts of the resin film c46 are removed from above the pad regions c22A. Then, parts of the insulative film c45 on the pad regions c22A are removed by RIE using a mask not shown, whereby the openings c25 are uncovered to expose the pad regions c22A.

Figure 64F:
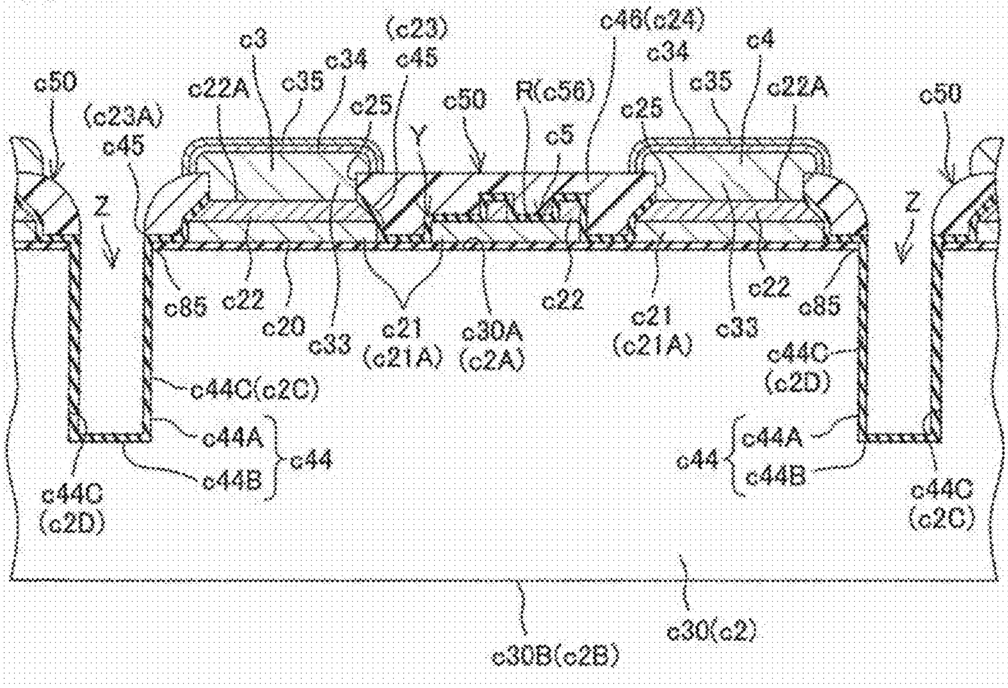
FIG. 64F is a schematic sectional view showing a process step subsequent to that shown in FIG. 64E.
Figure 68:
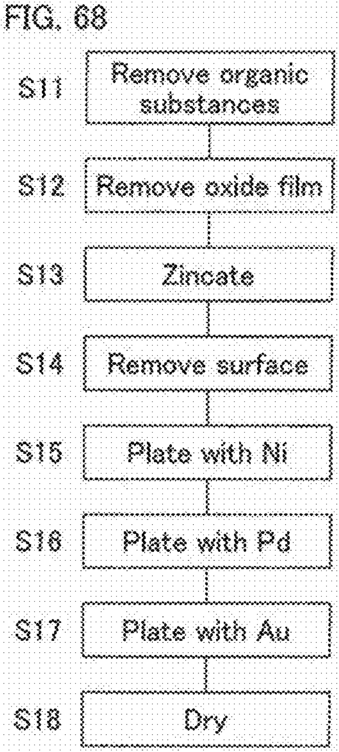
FIG. 68 is a diagram for explaining a process for producing the first connection electrode and the second connection electrode.

In turn, Ni/Pd/Au multilayer films are formed in the openings c25 on the pad regions c22A by depositing Ni, Pd and Au by electroless plating, whereby the first and second connection electrodes c3, c4 are formed on the pad regions c22A as shown in FIG. 64F. FIG. 68 is a diagram for explaining a production process for the first and second connection electrodes.

Referring to FIG. 68, more specifically, surfaces of the pad regions c22A are cleaned (to be degreased), whereby organic substances (smut such as carbon smut and greasy dirt) are removed from the surfaces (Step S11). Then, oxide films are removed from the surfaces (Step S12). In turn, the surfaces are zincated, whereby Al (of the interconnection film c22) in the surfaces is replaced with Zn (Step S13). Subsequently, Zn in the surfaces is removed by nitric acid or the like, whereby Al is newly exposed on the pad regions c22A (Step S14).

Then, the pad regions c22A are immersed in a plating liquid, whereby the new Al surfaces of the pad regions c22A are plated with Ni. Thus, Ni in the plating liquid is chemically reduced to be deposited on the surfaces, whereby Ni layers c33 are respectively formed on the surfaces (Step S15). In turn, surfaces of the Ni layers c33 are plated with Pd by immersing the Ni layers c33 in another plating liquid. Thus, Pd in the plating liquid is chemically reduced to be deposited on the surfaces of the Ni layers c33, whereby Pd layers c34 are respectively formed on the surfaces of the Ni layers c33 (Step S16).

Then, surfaces of the Pd layers c34 are plated with Au by immersing the Pd layers c34 in further another plating liquid. Thus, Au in the plating liquid is chemically reduced to be deposited on the surfaces of the Pd layers c34, whereby Au layers c35 are respectively formed on the surfaces of the Pd layers c34 (Step S17). Thus, the first and second connection electrodes c3, c4 are formed. After the first and second connection electrodes c3, c4 thus formed are dried (Step S18), the process for producing the first and second connection electrodes c3, c4 is completed. Between the consecutive steps, a rinsing step is performed as required for rinsing the semi-finished products c50 with water. Further, the zincation may be performed a plurality of times.

FIG. 64F shows the semi-finished product c50 formed with the first connection electrode c3 and the second connection electrode c4. As described above, the first and second connection electrodes c3, c4 are formed by the electroless plating. As compared with a case in which electrolytic plating is employed for the formation of the first and second connection electrodes c3, c4, therefore, the number of process steps required for the formation of the first and second connection electrodes c3, c4 can be reduced (e.g., a lithography step, a resist mask removing step and the like required for the electrolytic plating can be obviated), thereby improving the productivity of the chip resistor c1. Further, the electroless plating does not require a resist mask which may be required for the electrolytic plating. This improves the positional accuracy of the first and second connection electrodes c3, c4 and hence the yield without the possibility of displacement of the first and second connection electrodes c3, c4 due to offset of the resist mask.

Figure 64G:
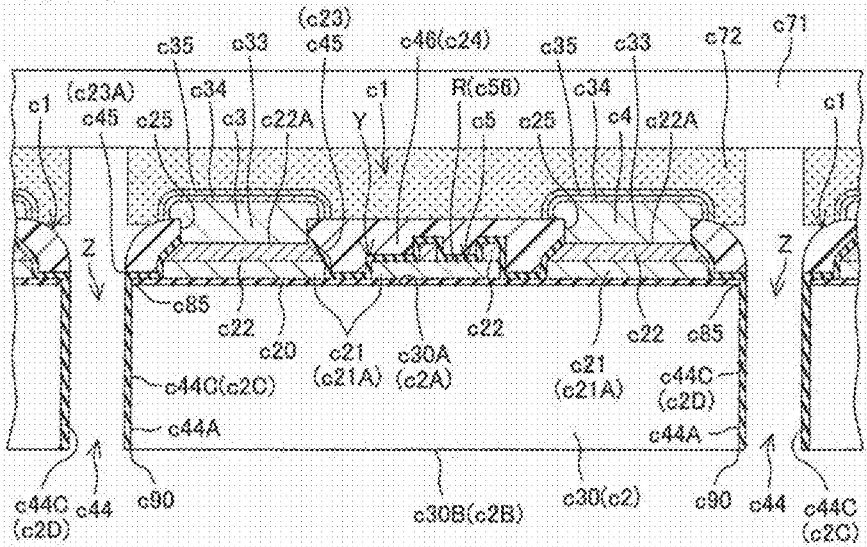
FIG. 64G is a schematic sectional view showing a process step subsequent to that shown in FIG. 64F.

Thus, the first and second connection electrodes c3, c4 are formed. After a continuity test is performed between the first connection electrode c3 and the second connection electrode c4, the substrate c30 is ground from the back surface c30B. More specifically, as shown in FIG. 64G, a thin-plate support tape c71 of PET (polyethylene terephthalate) having an adhesive surface c72 is applied to the semi-finished products c50 with the adhesive surface c72 bonded to the first and second connection electrodes c3, c4 of the respective semi-finished products c50 (i.e., on the side of the front surface c30A) after the formation of the trench c44. Thus, the semi-finished products c50 are supported by the support tape c71. Here, a laminate tape, for example, may be used as the support tape c71.

With the semi-finished products c50 supported by the support tape c71, the substrate c30 is ground from the back surface c30B. After the substrate c30 is thinned to the bottom wall c44B of the trench c44 (see FIG. 64F) by the grinding, nothing connects the adjacent semi-finished products c50. Therefore, the substrate c30 is divided into the individual semi-finished products c50 along the trench c44. Thus, the chip resistors c1 are completed. That is, the substrate c30 is divided (split) along the trench c44 (i.e., along the boundary region Z), whereby the individual chip resistors c1 are separated from each other. Alternatively, the chip resistors c1 may be separated from each other by etching the substrate c30 from the back surface c30B to the bottom wall c44B of the trench c44.

The wall surfaces c44C of the side walls c44A of the trench c44 provide the side surfaces c2C to c2F of the substrates c2 of the respective completed chip resistors c1, and the back surface c30B provides the back surfaces c2B of the respective chip resistors c1. That is, the step of forming the trench c44 by the etching as described above (see FIG. 64B) is involved in the step of forming the side surfaces c2C to c2F. Further, the insulative film c45 provides the passivation films c23 of the respective chip resistors c1, and the divided resin film c46 provides the resin films c24 of the respective chip resistors c1.

As described above, the chip resistors c1 (chip components) formed in the respective chip component regions Y defined on the substrate c30 are simultaneously separated from each other (the individual chip resistors c1 can be simultaneously provided) by forming the trench c44 in the substrate c30 and then grinding the substrate c30 from the back surface c30B. This reduces the time required for the production of the plurality of chip resistors c1, thereby improving the productivity of the chip resistors c1.

The back surface c2B of the substrate c2 of each of the completed chip resistors c1 may be polished or etched to be mirror-finished. As described above, a desired number of resistor bodies R can be isolated from the device portion c5 or incorporated into the device portion c5 between the first connection electrode c3 and the second connection electrode c4 by selectively disconnecting one or more of the fuses F. Thus, the resistance of the overall chip resistor c1 (the overall device portion c5) can be adjusted at a target value. Further, the resistive film c21 of the resistor bodies R is made of the material having a resistance temperature coefficient of not less than 200 ppm/° C. in absolute value, so that the chip resistor c1 is improved in sensitivity to the temperature of the resistor bodies R. As a result, the chip resistor c1 can be provided, which permits more accurate adjustment of the resistance value and is suitable for detection of the temperature.

Thus, the chip resistor c1 is suitable for the detection of the temperature and, therefore, can be used as a temperature sensor. With a voltage applied between the first connection electrode c3 and the second connection electrode c4 in the chip resistor c1, more specifically, the resistance value of the device portion c5 (the resistor portion c56 including the assembly of the resistor bodies R) varies with the temperature. Therefore, the temperature can be detected by measuring the resistance value.

While the chip resistor c1 according to the third reference embodiment has thus been described, the third reference embodiment may be embodied in other forms. Where the chip resistor c1 is to be used as a temperature sensor, the resistive film c21 of the resistor bodies R is merely required to be made of a material having a resistance temperature coefficient of not less than 200 ppm/° C. in absolute value, and Pt, Ni or Cu may be used as the material instead of TiOn and TiOnSi. That is, the resistive film c21 may comprise one or more of TiON, TiONSi, Pt, Ni and Cu. Where Pt, Ni or Cu is used, it is difficult to control the temperature characteristics (resistance temperature coefficient) of the resistor bodies R by controlling the oxygen flow rate unlike in the case of TiON and TiONSi.

In the aforementioned examples, the chip resistor c1 includes a plurality of resistor circuits having different resistance values defined by the geometric progression with a geometric ratio r ($0<r$, $r\neq1$) of r=2 by way of example, but the geometric ratio for the geometric progression may have a value other than 2. Further, the insulative layer c20 is provided on the front surface of the substrate c2 but, where the substrate c2 is an insulative substrate, the insulative layer c20 may be obviated.

Figure 69:
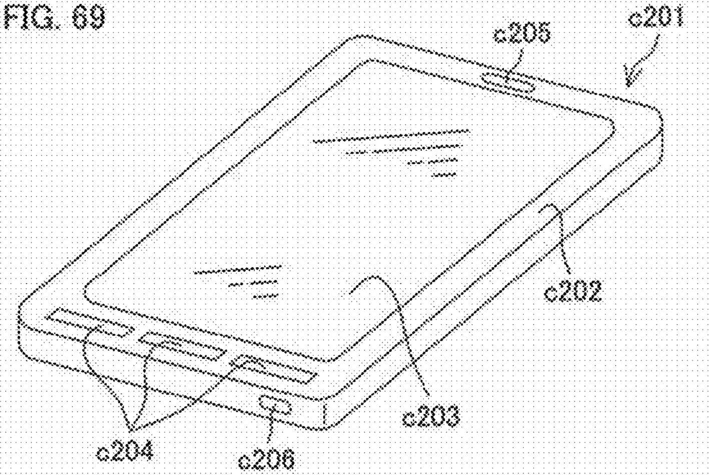
FIG. 69 is a perspective view showing the appearance of a smartphone as an exemplary electronic device which employs the chip resistor according to the third reference embodiment.

In the first connection electrode c3 and the second connection electrode c4, the Pd layer c34 to be provided between the Ni layer c33 and the Au layer c35 may be obviated. If the Au layer c35 is free from the pin hole described above, the Pd layer c34 may be obviated with proper adhesion between the Ni layer c33 and the Au layer c35. FIG. 69 is a perspective view showing the appearance of a smartphone as an exemplary electronic device which employs the chip component according to the third reference embodiment. The smartphone c201 includes electronic components provided in a housing c202 having a flat rectangular prismatic shape. The housing c202 has a pair of rectangular major surfaces on its front and back sides, and the pair of major surfaces are connected to each other by four side surfaces. A display screen of a display panel c203 such as a liquid crystal panel or an organic EL panel is exposed on one of the major surfaces of the housing c202. The display screen of the display panel c203 serves as a touch panel to provide an input interface to a user.

The display panel c203 has a rectangular shape occupying the most of the one major surface of the housing c202. Operation buttons c204 are provided alongside one shorter edge of the display panel c203. In this example, a plurality of operation buttons c204 (three operation buttons c204) are arranged alongside the shorter edge of the display panel c203. The user operates the smartphone c201 by operating the operation buttons c204 and the touch panel to call and execute a necessary function.

A speaker c205 is disposed adjacent the other shorter edge of the display panel c203. The speaker c205 serves as a reception port for a telephone function, and as an audio unit for playing music data and the like. On the other hand, a microphone c206 is provided adjacent the operation buttons c204 on one of the side surfaces of the housing c202. The microphone c206 serves as a transmission port for the telephone function, and as a microphone for recording.

Figure 70:
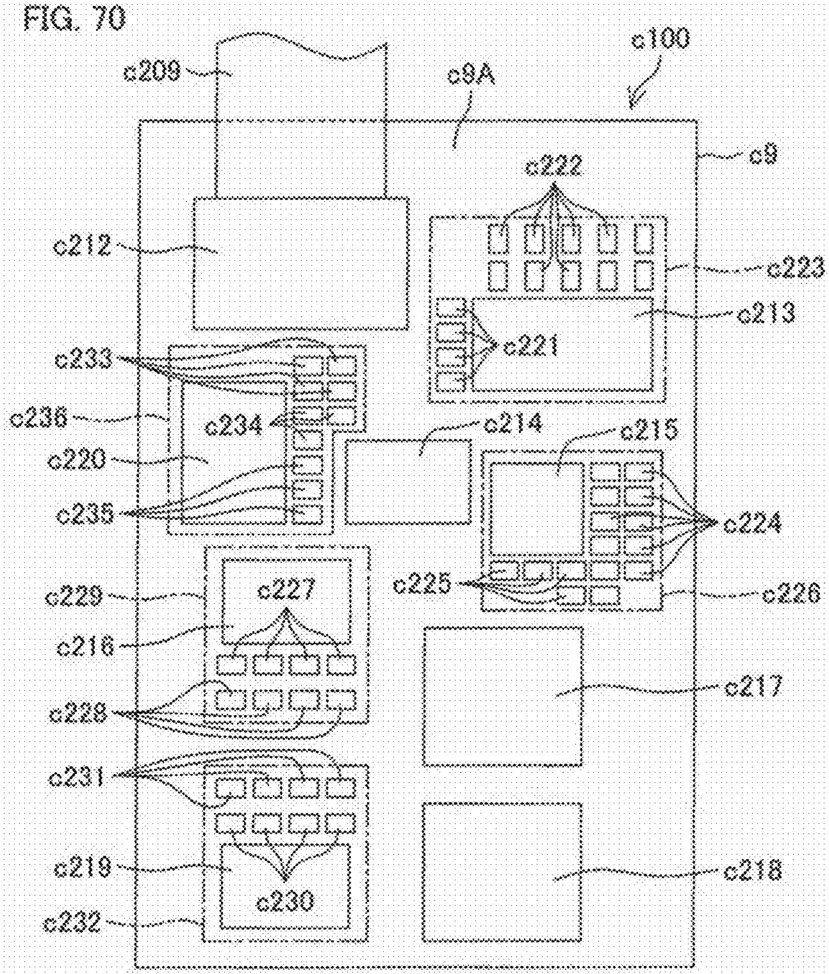
FIG. 70 is a schematic plan view showing the configuration of a circuit assembly accommodated in a housing of the smartphone.

FIG. 70 is a schematic plan view showing the configuration of a circuit assembly c100 accommodated in the housing c202. The circuit assembly c100 includes a mount substrate c9, and circuit components mounted on a mount surface c9A of the mount substrate c9. The circuit components include a plurality of integrated circuit elements (ICs) c212 to c220, and a plurality of chip components. The ICs include a transmission IC c212, a so-called One-Seg TV receiving IC c213, a GPS receiving IC c214, an FM tuner IC c215, a power source IC c216, a flash memory c217, a microcomputer c218, a power source IC c219, and a base band IC c220. The chip components include chip inductors c221, c225, c235, chip resistors (corresponding to the chip resistor of the third reference embodiment) c222, c224, c233, chip capacitors c227, c230, c234, and chip diodes c228, c231.

The transmission IC c212 incorporates an electronic circuit which generates display control signals for the display panel c203 and receives signals inputted from the touch panel on the surface of the display panel c203. A flexible interconnection c209 is connected to the transmission IC c212 for connection to the display panel c203. The One-Seg TV receiving IC c213 incorporates an electronic circuit which serves as a receiver for receiving signals of so-called One-Seg broadcast (terrestrial digital television broadcast for mobile devices). The chip inductors c221 and the chip resistors c222 are provided adjacent the One-Seg TV receiving IC c213. The One-Seg TV receiving IC c213, the chip inductors c221 and the chip resistors c222 constitute a One-Seg broadcast receiving circuit c223. The chip inductors c221 each have an accurately adjusted inductance, and the chip resistors c222 each have an accurately adjusted resistance. Thus, the One-Seg broadcast receiving circuit c223 has a highly accurate circuit constant.

The GPS receiving IC c214 incorporates an electronic circuit which receives signals from a GPS satellite and outputs the positional information of the smartphone c201. The FM tuner IC c215, and the chip resistors c224 and the chip inductors c225, which are mounted adjacent the FM tuner IC c215 on the mount substrate c9, constitute an FM broadcast receiving circuit c226. The chip resistors c224 each have an accurately adjusted resistance, and the chip inductors c225 each have an accurately adjusted inductance. Thus, the FM broadcast receiving circuit c226 has a highly accurate circuit constant.

The chip capacitors c227 and the chip diodes c228 are mounted adjacent the power source IC c216 on the mount surface of the mount substrate c9. The power source IC c216, the chip capacitors c227 and the chip diodes c228 constitute a power source circuit c229. The flash memory c217 is a storage which stores an operating system program, data generated in the smartphone c201, and data and programs acquired from the outside by communication function.

The microcomputer c218 incorporates a CPU, a ROM and a RAM, and serves as a processing circuit which performs a variety of processing operations to execute functions of the smartphone c201. More specifically, the microcomputer c218 performs processing operations for image processing and a variety of application programs. The chip capacitors c230 and the chip diodes c231 are mounted adjacent the power source IC c219 on the mount surface of the mount substrate c9. The power source IC c219, the chip capacitors c230 and the chip diodes c231 constitute a power source circuit c232.

The chip resistors c233, the chip capacitors c234 and the chip inductors c235 are mounted adjacent the base band IC c220 on the mount surface c9A of the mount substrate c9. The base band IC c220, the chip resistors c233, the chip capacitors c234 and the chip inductors c235 constitute a base band communication circuit c236. The base band communication circuit c236 provides communication functions for telephone communications and data communications.

With this arrangement, electric power properly controlled by the power source circuits c229, c232 is supplied to the transmission IC c212, the GPS receiving IC c214, the One-Seg broadcast receiving circuit c223, the FM broadcast receiving circuit c226, the base band communication circuit c236, the flash memory c217 and the microcomputer c218. The microcomputer c218 performs a processing operation in response to input signals inputted thereto via the transmission IC c212, and outputs display control signals from the transmission IC c212 to the display panel c203 to cause the display panel c203 to perform a variety of display operations.

When a command for receiving One-Seg broadcast is given by operating the touch panel or the operation buttons c204, the One-Seg broadcast is received by the function of the One-Seg broadcast receiving circuit c223. Then, a processing operation for outputting a received image on the display panel c203 and outputting a received sound from the speaker c205 is performed by the microcomputer c218. When the positional information of the smartphone c201 is required, the microcomputer c218 acquires positional information outputted from the GPS receiving IC c214 and performs a processing operation using the positional information.

Further, when a command for receiving FM broadcast is inputted by operating the touch panel or the operation buttons c204, the microcomputer c218 actuates the FM broadcast receiving circuit c226 and performs a processing operation for outputting a received sound from the speaker c205. The flash memory c217 is used for storing data acquired through communications, and for storing data generated by performing a processing operation by the microcomputer c218 or data generated by inputting from the touch panel. As required, the microcomputer c218 writes data in the flash memory c217 and reads data from the flash memory c217.

The functions of the telephone communications and the data communications are performed by the base band communication circuit c236. The microcomputer c218 controls the base band communication circuit c236 to perform operations for transmitting and receiving sounds and data.

REFERENCE SIGNS LIST

10, 30: Chip resistor, 11: Substrate (silicon substrate), 12: First connection electrode (external connection electrode), 13: Second connection electrode (external connection electrode), 14: resistor circuit network, 20, 103: resistive film (resistive film line), 21: Conductive film (Intersection film), F: Fuse film, C: Connection conductor film

The invention claimed is:

1. A chip resistor, comprising:

a substrate;

a plurality of resistor elements each having a resistive film provided on the substrate and an interconnection film provided on the resistive film in contact with the resistive film;

an electrode provided on the substrate; and a plurality of fuses disconnectably connecting the plurality of resistor elements to the electrode, wherein the resistive film is made of at least one material selected from the group consisting of NiCr, NiCrAl, NiCrSi, NiCrSiAl, TaN, $TaSiO_2$, TiN, TiNO and TiSiON; and wherein the plurality of resistor elements each include a linear element, and conductive film pieces provided on the resistive film and spaced a predetermined distance from each other in a linear element extending direction, and a portion of the resistive film not provided with the conductive film pieces spaced the predetermined distance from each other functions as a single unit resistor body.

2. The chip resistor according to claim 1, wherein the resistive film has a temperature coefficient of less than 1000 ppm/° C.

3. The chip resistor according to claim 2, wherein the temperature coefficient of the resistive film is 50 ppm/° C. to 200 ppm/° C.

4. The chip resistor according to claim 1, wherein the resistive film has a thickness of 300 Å to 1 μm.

5. The chip resistor according to claim 1, wherein the linear element has a line width of 1 μm to 1.5 μm.

6. The chip resistor according to claim 1, wherein the conductive film pieces provided on the resistive film and the fuses are metal films provided at the same level and made of the same material.

7. The chip resistor according to claim 1, wherein unit resistor bodies are connected in series to one another to form a resistor circuit.

8. The chip resistor according to claim 7, wherein the resistor circuit includes plural types of resistor circuits which include plural types of serial resistor circuits each including unit resistor bodies whose number is defined by an increasing geometric progression, the unit resistor bodies being connected in series to one another and having the same resistance value.

9. The chip resistor according to claim 7, wherein the resistor circuit includes plural types of resistor circuits which include plural types of parallel resistor circuits each including unit resistor bodies whose number is defined by an increasing geometric progression, the unit resistor bodies being connected in parallel to one another and having the same resistance value.

10. The chip resistor according to claim 7, wherein the resistor circuit includes plural types of resistor circuits which include plural types of serial resistor circuits and parallel resistor circuits, the serial resistor circuits each includes unit resistor bodies whose number is defined by an increasing geometric progression, the unit resistor bodies of each of the serial resistor circuits being connected in series to one another and having the same resistance value, the parallel resistor circuits each includes unit resistor bodies whose number is defined by an increasing geometric progression, the unit resistor bodies of each of the parallel resistor circuits being connected in parallel to one another and having the same resistance value.

* * * * *